(12) United States Patent
Atanackovic

(10) Patent No.: US 11,456,361 B1
(45) Date of Patent: Sep. 27, 2022

(54) ULTRAWIDE BANDGAP SEMICONDUCTOR DEVICES INCLUDING MAGNESIUM GERMANIUM OXIDES

(71) Applicant: Silanna UV Technologies Pte Ltd, Singapore (SG)

(72) Inventor: Petar Atanackovic, Henley Beach South (AU)

(73) Assignee: Silanna UV Technologies Pte Ltd, Singapore (SG)

( * ) Notice: Subject to any disclaimer, the term of this patent is extended or adjusted under 35 U.S.C. 154(b) by 0 days.

(21) Appl. No.: 17/651,712

(22) Filed: Feb. 18, 2022

Related U.S. Application Data

(63) Continuation of application No. PCT/IB2021/060414, filed on Nov. 10, 2021.

(51) Int. Cl.
*H01L 29/24* (2006.01)
*H01L 33/26* (2010.01)
*H01L 31/032* (2006.01)

(52) U.S. Cl.
CPC ............ *H01L 29/24* (2013.01); *H01L 31/032* (2013.01); *H01L 33/26* (2013.01)

(58) Field of Classification Search
CPC ........ H01L 29/24; H01L 31/032; H01L 33/26
See application file for complete search history.

(56) References Cited

U.S. PATENT DOCUMENTS

| | | | |
|---|---|---|---|
| 4,652,143 A | 3/1987 | Wickersheim et al. | |
| 5,625,202 A | 4/1997 | Chai | |
| 5,879,811 A | 3/1999 | Tanaka et al. | |
| 6,914,268 B2 | 7/2005 | Shei et al. | |
| 6,977,397 B2 | 12/2005 | Ichinose et al. | |
| 7,359,415 B1 | 4/2008 | Alfano et al. | |
| 7,393,411 B2 | 7/2008 | Ichinose et al. | |
| 7,727,865 B2 | 6/2010 | Ichinose et al. | |
| 9,105,473 B2 | 8/2015 | Ueda et al. | |
| 9,548,678 B2 | 1/2017 | Schuh et al. | |
| 10,636,916 B2 | 4/2020 | Shih et al. | |

(Continued)

FOREIGN PATENT DOCUMENTS

WO 2019155444 A1 8/2019

OTHER PUBLICATIONS

Petricevic et. al. "Room-temperature near-infrared tunable laser operation of Cr4+:Ca2GeO4", Optics Letters vol. 21, Issue 21, pp. 1750-1752 (1996), Optica Publishing (Year: 1996).*

(Continued)

*Primary Examiner* — Sitaramarao S Yechuri
(74) *Attorney, Agent, or Firm* — MLO, a professional corp.

(57) ABSTRACT

Various forms of $Mg_xGe_{1-x}O_{2-x}$ are disclosed, where the $Mg_xGe_{1-x}O_{2-x}$ are epitaxial layers formed on a substrate comprising a substantially single crystal substrate material. The epitaxial layer of $Mg_xGe_{1-x}O_{2-x}$ has a crystal symmetry compatible with the substrate material. Semiconductor structures and devices comprising the epitaxial layer of $Mg_xGe_{1-x}O_{2-x}$ are disclosed, along with methods of making the epitaxial layers and semiconductor structures and devices.

14 Claims, 85 Drawing Sheets

(56) References Cited

U.S. PATENT DOCUMENTS

| | | | |
|---|---|---|---|
| 11,175,447 B1 | 11/2021 | Pynn et al. | |
| 2001/0011743 A1 | 8/2001 | Arita et al. | |
| 2006/0150891 A1 | 7/2006 | Ichinose et al. | |
| 2007/0166967 A1 | 7/2007 | Ichinose et al. | |
| 2008/0008964 A1 | 1/2008 | Chan et al. | |
| 2008/0083905 A1* | 4/2008 | Alfano | H01S 3/0627 252/301.4 R |
| 2010/0140642 A1* | 6/2010 | Arai | H05B 33/14 257/101 |
| 2012/0091548 A1 | 4/2012 | Sukegawa et al. | |
| 2012/0306834 A1* | 12/2012 | Ueda | H01L 21/02565 345/55 |
| 2015/0171222 A1 | 6/2015 | Sasagawa et al. | |
| 2015/0179445 A1 | 6/2015 | Sasaki et al. | |
| 2016/0149074 A1 | 5/2016 | Atanackovic et al. | |
| 2016/0149075 A1 | 5/2016 | Atanackovic | |
| 2018/0315886 A1 | 11/2018 | Gaevski et al. | |
| 2020/0075799 A1 | 3/2020 | Atanackovic et al. | |
| 2020/0168454 A1 | 5/2020 | Dargis et al. | |
| 2020/0194560 A1 | 6/2020 | Takizawa et al. | |
| 2020/0411648 A1 | 12/2020 | Yamazaki | |
| 2021/0126091 A1 | 4/2021 | Chang et al. | |
| 2021/0351321 A1 | 11/2021 | Atanackovic | |
| 2021/0388526 A1 | 12/2021 | Zhao et al. | |
| 2022/0115544 A1 | 4/2022 | Miyake | |

OTHER PUBLICATIONS

He at al., "Red-light emission induced by Mn-doped magnesium fluorogermanate," J. Phys. D: Appl. Phys. 48, Oct. 2015, 475101 (6pp).

Katayama et al., "Effect of $Bi_2O_3$ doping on persistent luminescence of $MgGeO_3:Mn^{2+}$ phosphor," Optical Society of America, Mar. 2014, 11 pages.

Ozima, "Structure of Orthopyroxene-Type and Clinopyroxene-Type Magnesium Germanium Oxide $MgGeO_3$," International Union of Crystallography, Jun. 1983, pp. 1169-1172.

Rehman, et al., "Growth of $Mg_2GeO_4$ nano-crystals on Si substrate and modulation of Seebeck coefficient by post growth annealing technique," Ceramics International, May 2019, 4 pages.

St. Senz, et al., "The effect of stress on cubic-to-tetragonal phase transitions in $Mg_2TiO_4$ and $Mg_2GeO_4$ spinel films," Philosophical Magazine, Aug. 2001. 4 pages. Abstract Only.

Sullivan et al., "Oxy-Fluoride Phosphors for Solid State Lighting," ECS Journal of Solid State Science and Technology, 2013, Published Nov. 2012, pp. R3088-R3099.

Bhuiyan et al., "MOCVD epitaxy of b-$(Al_xGa 1-x)_2O_3$ thin films on (010) $Ga_2O_3$ substrates and N-type doping," Applied Physics Letters 115 (2019) 120602.

Bhuiyan et al., "MOCVD Epitaxy of Ultrawide Bandgap f3 $(Al_xGa1-x)_2O_3$ with High-Al Composition on (100) f3 $Ga_2O_3$ Substrates," Crystal Growth & Design 20 (2020) pp. 6722-6730.

Notice of Allowance and Fees dated Apr. 8, 2022 for U.S. Appl. No. 16/990,349.

Notice of Allowance and Fees dated Jun. 15, 2022 for U.S. Appl. No. 17/658,501.

Office Action dated Jun. 13, 2022 for U.S. Appl. No. 17/658,510.

Office Action dated Jun. 9, 2022 for U.S. Appl. No. 17/652,031.

Office Action dated Jun. 9, 2022 for U.S. Appl. No. 17/653,824.

Oshima et al., $\alpha$-$Al_2O_3/Ga_2O_3$ superlattices coherently grown on r-plane sapphire, Applied Physics Express, 11, 065501, Apr. 2018.

Ranga et al., "MOVPE-grown Si-doped f3-$(Al0.26Ga0.74)_2O_3$ thin films and heterostructures," Template for APEX (2014).

Shuo-Huang Yuan et al 2018 Jpn. J. Appl. Phys. 57 070301 (Year: 2018).

Vaidya et al., "Enhancement Mode f3-$(Al_xGa1-x)_2O_3/Ga_2O_3$ Heterostructure FET (HFET) With High Transconductance and Cutoff Frequency," IEEE Electron Device Letters 42 (2021) pp. 1444-1447.

Office Action dated Jun. 22, 2022 for U.S. Appl. No. 17/651,713.

Office Action dated Jun. 24, 2022 for U.S. Appl. No. 17/652,028.

Office Action dated Jul. 22, 2022 for U.S. Appl. No. 17/653,828.

Office Action dated Jul. 25, 2022 for U.S. Appl. No. 17/658,506.

Office Action dated Jul. 26, 2022 for U.S. Appl. No. 17/651,713.

* cited by examiner

400

$$Mg\left[\frac{\#Mg/cell}{N_{cations/cell}}\right] Ge\left[\frac{\#Ge/cell}{N_{cations/cell}}\right] O\left[\frac{N_{anions/cell}}{N_{cations/cell}}\right]$$

| x | 1-x | 2-x | $Mg_xGe_{1-x}O_{2-x}$ |
|---|-----|-----|------------------------|
| 0 | 1 | 2 | $GeO_2$ |
| 1/5 | 4/5 | 9/5 | $MgGe_4O_9$ |
| 1/4 | 3/4 | 7/4 | $MgGe_3O_7$ |
| 1/3 | 2/3 | 5/3 | $MgGe_2O_5$ |
| 2/5 | 3/5 | 8/5 | $Mg_2Ge_3O_8$ |
| 1/2 | 1/2 | 3/2 | $Mg_1Ge_1O_3$ |
| 3/5 | 2/5 | 7/5 | $Mg_3Ge_2O_7$ |
| 2/3 | 1/3 | 4/3 | $Mg_2GeO_4$ |
| 3/4 | 1/4 | 5/4 | $Mg_3GeO_5$ |
| 4/5 | 1/5 | 6/5 | $Mg_4GeO_6$ |
| 1 | 1 | 1 | MgO |

*FIG. 4*

| $Mg_xGe_{1-x}O_{2-x}$ | Unit Cell Configuration ||||||||| Atoms/ |
|---|---|---|---|---|---|---|---|---|---|---|
| x | Structure | Space Group | Symmetry | # Ge sites | Ge bonding | # Mg sites | Mg bonding | # O Sites | Tot.Cation | Unit cell |
| 2/3 | $Mg_2GeO_4$ | Fd3m | cubic | 8 | $T_d$ | 16 | $O_h$ | 32 | 24 | 56 |
| 2/3 | $Mg_2GeO_4$ | Pnma | orthorhombic | 4 | $T_d$ | 8 | $O_h$ | 16 | 12 | 28 |
| 1/2 | $MgGeO_3$ | C2/c | monoclinic | 8 | $T_d$ | 8 | $O_h$ | 24 | 16 | 40 |
| 14/19 | $Mg_{14}Ge_5O_{24}$ | Pbam | orthorhombic | 10 | $T_d + O_h$ | 28 | $O_h$ | 48 | 38 | 86 |
| 1/2 | $MgGeO_3$ | Pbca | orthorhombic | 16 | $T_d$ | 16 | $O_h$ | 48 | 32 | 80 |
| 1/2 | $MgGeO_3$ | R3 | trigonal | 6 | $O_h$ | 6 | $O_h$ | 18 | 12 | 30 |

510 { (first three rows)
520 { (last three rows)

Mg2GeO4 (Pnma)

MgGeO3 (C2/c)

Mg2GeO4 (Fd3m)

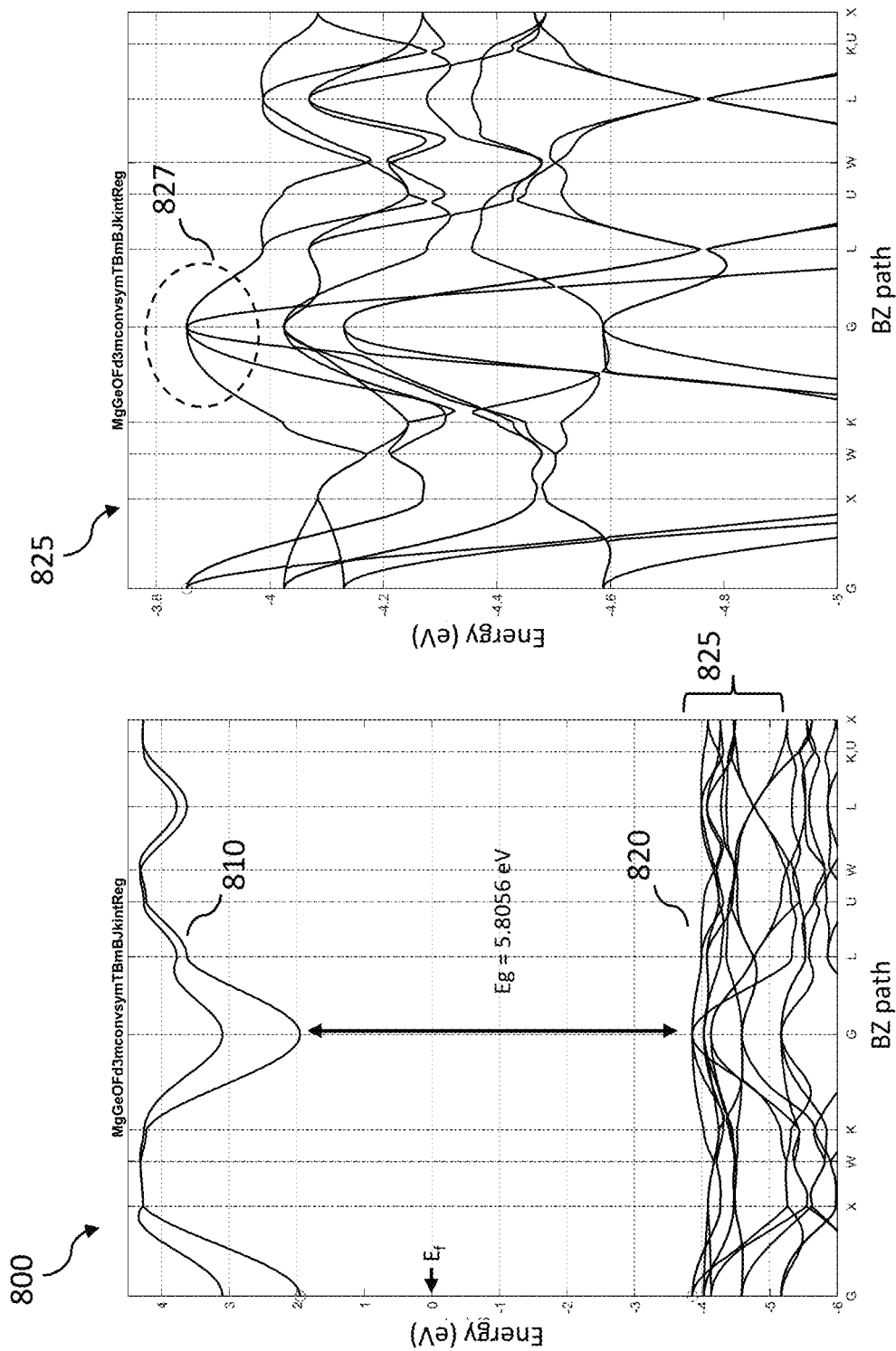

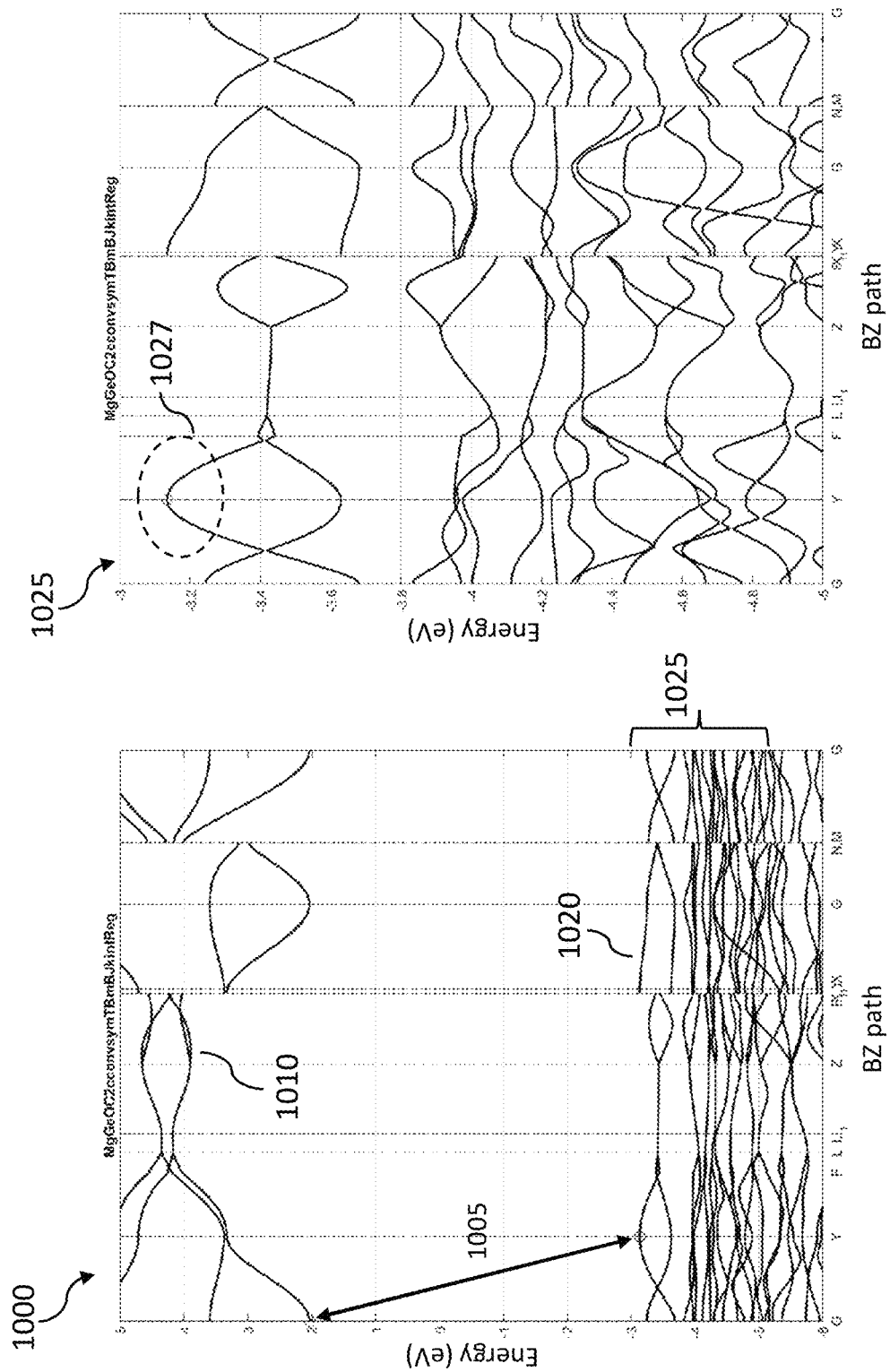

| a (Å) | b (Å) | c (Å) | α (°) | β (°) | γ (°) |
|---|---|---|---|---|---|
| 8.51300 | 8.51300 | 8.19000 | 90.0000 | 90.0000 | 90.0000 |

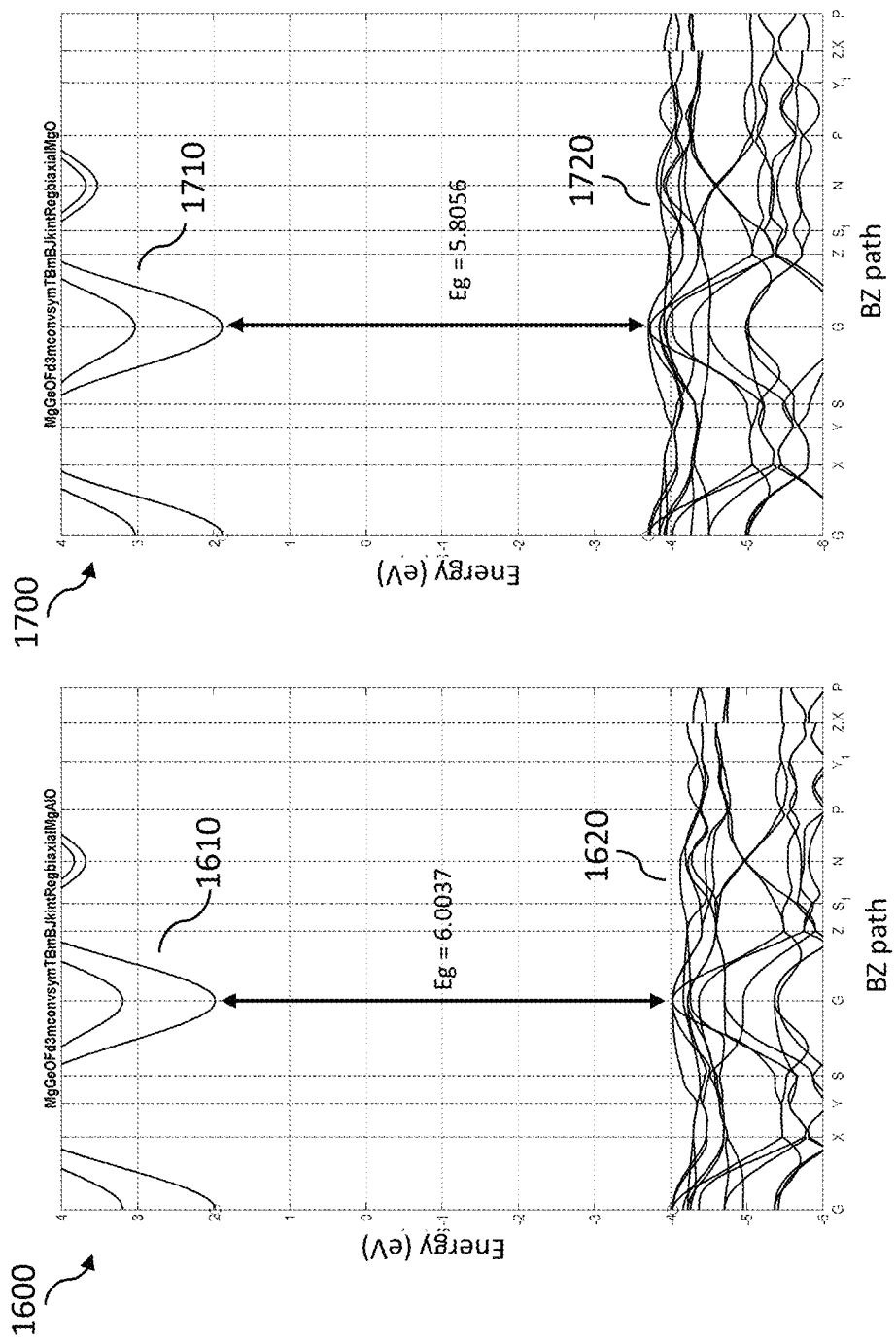

| cation | x_pos | y_pos | z_pos |
|---|---|---|---|
| Mg0 | 0.125 | 0.125 | 0.125 |
| Mg1 | 0.625 | 0.875 | 0.375 |
| Mg2 | 0.875 | 0.875 | 0.125 |
| Mg3 | 0.375 | 0.125 | 0.375 |
| Mg4 | 0.125 | 0.625 | 0.625 |
| Mg5 | 0.625 | 0.375 | 0.875 |
| Mg6 | 0.875 | 0.375 | 0.625 |
| Mg7 | 0.375 | 0.625 | 0.875 |
| Mg8 | 0.625 | 0.125 | 0.625 |
| Mg9 | 0.125 | 0.875 | 0.875 |
| Mg10 | 0.375 | 0.875 | 0.625 |
| Mg11 | 0.875 | 0.125 | 0.875 |
| Mg12 | 0.625 | 0.625 | 0.125 |
| Mg13 | 0.125 | 0.375 | 0.375 |
| Mg14 | 0.375 | 0.375 | 0.125 |
| Mg15 | 0.875 | 0.625 | 0.375 |
| Ge16 | 0.25 | 0.75 | 0.25 |
| Ge17 | 0 | 0 | 0.5 |
| Ge18 | 0.25 | 0.25 | 0.75 |
| Ge19 | 0 | 0.5 | 0 |
| Ge20 | 0.75 | 0.75 | 0.75 |
| Ge21 | 0.5 | 0 | 0 |
| Ge22 | 0.75 | 0.25 | 0.25 |
| Ge23 | 0.5 | 0.5 | 0.5 |

FIG. 18A

| anion | x_pos | y_pos | z_pos |
|---|---|---|---|
| O24 | 0.625169 | 0.125169 | 0.374831 |
| O25 | 0.124831 | 0.375169 | 0.124831 |
| O26 | 0.375169 | 0.375169 | 0.375169 |
| O27 | 0.375169 | 0.124831 | 0.124831 |
| O28 | 0.874831 | 0.125169 | 0.125169 |
| O29 | 0.125169 | 0.874831 | 0.125169 |
| O30 | 0.124831 | 0.124831 | 0.375169 |
| O31 | 0.374831 | 0.874831 | 0.374831 |
| O32 | 0.625169 | 0.625169 | 0.874831 |
| O33 | 0.124831 | 0.875169 | 0.624831 |
| O34 | 0.375169 | 0.875169 | 0.875169 |
| O35 | 0.375169 | 0.624831 | 0.624831 |
| O36 | 0.874831 | 0.625169 | 0.625169 |
| O37 | 0.125169 | 0.374831 | 0.625169 |
| O38 | 0.124831 | 0.624831 | 0.875169 |
| O39 | 0.374831 | 0.374831 | 0.874831 |
| O40 | 0.125169 | 0.125169 | 0.874831 |
| O41 | 0.624831 | 0.375169 | 0.624831 |
| O42 | 0.875169 | 0.375169 | 0.875169 |
| O43 | 0.875169 | 0.124831 | 0.624831 |
| O44 | 0.374831 | 0.125169 | 0.625169 |
| O45 | 0.625169 | 0.874831 | 0.625169 |
| O46 | 0.624831 | 0.124831 | 0.875169 |
| O47 | 0.874831 | 0.874831 | 0.874831 |
| O48 | 0.125169 | 0.625169 | 0.374831 |
| O49 | 0.624831 | 0.875169 | 0.124831 |
| O50 | 0.875169 | 0.875169 | 0.375169 |
| O51 | 0.875169 | 0.624831 | 0.124831 |
| O52 | 0.374831 | 0.625169 | 0.125169 |
| O53 | 0.625169 | 0.374831 | 0.125169 |
| O54 | 0.624831 | 0.624831 | 0.375169 |
| O55 | 0.874831 | 0.374831 | 0.374831 |

FIG. 18B

Single Ge-site Ga substitution doping of GeMg$_2$O$_4$ Fd3m $Ga_1Mg_{16}Ge_7O_{32}$

| No. | Atom | Label | x | y | z | Ge_i→Ga_i | E-k | E$_{gap}$ (eV) | E$_{fermi}$ | E$_{Formation}$ |
|---|---|---|---|---|---|---|---|---|---|---|
| 17 | Ge | Ge16 | 0.25 | 0.75 | 0.25 | Ga16 | direct | 5.6652 | p-type | -324.33 |
| 18 | Ge | Ge17 | 0 | 0 | 0.5 | Ga17 | direct | 5.6651 | p-type | -324.32 |
| 19 | Ge | Ge18 | 0.25 | 0.25 | 0.75 | Ga18 | direct | 5.6657 | p-type | -324.32 |
| 20 | Ge | Ge19 | 0 | 0.5 | 0 | Ga19 | direct | 5.6893 | p-type | -324.41 |
| 21 | Ge | Ge20 | 0.75 | 0.75 | 0.75 | Ga20 | direct | 5.6702 | p-type | -324.43 |
| 22 | Ge | Ge21 | 0.5 | 0 | 0 | Ga21 | direct | 5.6647 | p-type | -324.32 |
| 23 | Ge | Ge22 | 0.75 | 0.25 | 0.25 | Ga22 | direct | 5.665 | p-type | -324.32 |
| 24 | Ge | Ge23 | 0.5 | 0.5 | 0.5 | Ga23 | direct | 5.6869 | p-type | -324.34 |
| | | | | | | | Eg_ave= | 5.67151 | | |
| | | | | | | | ΔEg= | 0.0246 | | |

FIG. 19

2200 Single Mg-site Ga substitution doping of GeMg$_2$O$_4$ Fd3m

2220 Ga$_1$Mg$_{15}$Ge$_8$O$_{32}$

| No. | Atom | Label | x | y | z | Mg_i→Ga_i | E-k | E$_{gap}$ (eV) | E$_{fermi}$ | E$_{Formation}$ |
|---|---|---|---|---|---|---|---|---|---|---|
| 1 | Mg | Mg0 | 0.125 | 0.125 | 0.125 | Ga0 | direct | 5.2763 | n-type | -327.57 |
| 2 | Mg | Mg1 | 0.625 | 0.875 | 0.375 | Ga1 | direct | 5.2897 | n-type | -327.53 |
| 3 | Mg | Mg2 | 0.875 | 0.875 | 0.125 | Ga2 | direct | 5.2967 | n-type | -327.26 |
| 4 | Mg | Mg3 | 0.375 | 0.125 | 0.375 | Ga3 | | | | |
| 5 | Mg | Mg4 | 0.125 | 0.625 | 0.625 | Ga4 | | | | |
| 6 | Mg | Mg5 | 0.625 | 0.375 | 0.875 | Ga5 | | | | |
| 7 | Mg | Mg6 | 0.875 | 0.375 | 0.625 | Ga6 | | | | |
| 8 | Mg | Mg7 | 0.375 | 0.625 | 0.875 | Ga7 | | | | |
| 9 | Mg | Mg8 | 0.625 | 0.125 | 0.625 | Ga8 | | | | |
| 10 | Mg | Mg9 | 0.125 | 0.875 | 0.875 | Ga9 | | | | |
| 11 | Mg | Mg10 | 0.375 | 0.875 | 0.625 | Ga10 | | | | |
| 12 | Mg | Mg11 | 0.875 | 0.125 | 0.875 | Ga11 | | | | |
| 13 | Mg | Mg12 | 0.625 | 0.625 | 0.125 | Ga12 | | | | |
| 14 | Mg | Mg13 | 0.125 | 0.375 | 0.375 | Ga13 | | | | |
| 15 | Mg | Mg14 | 0.375 | 0.375 | 0.125 | Ga14 | | | | |
| 16 | Mg | Mg15 | 0.875 | 0.625 | 0.375 | Ga15 | | | | |

FIG. 22

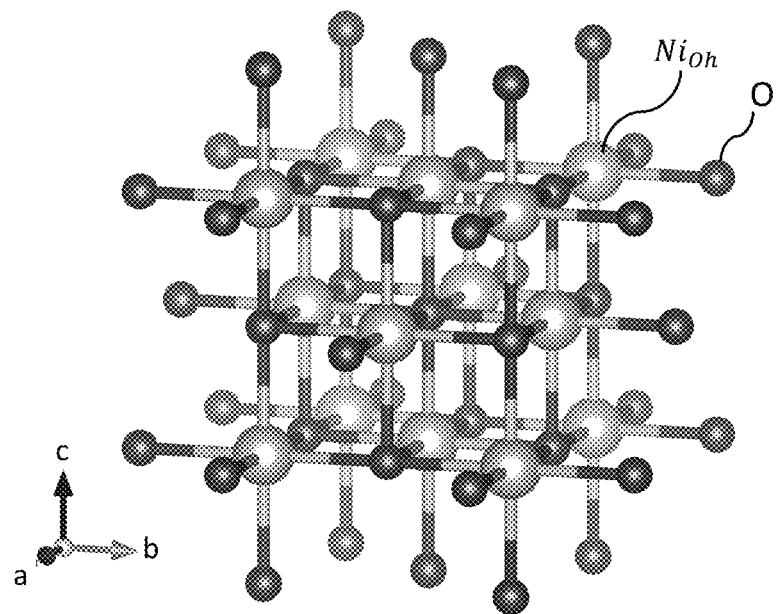
FIG. 31
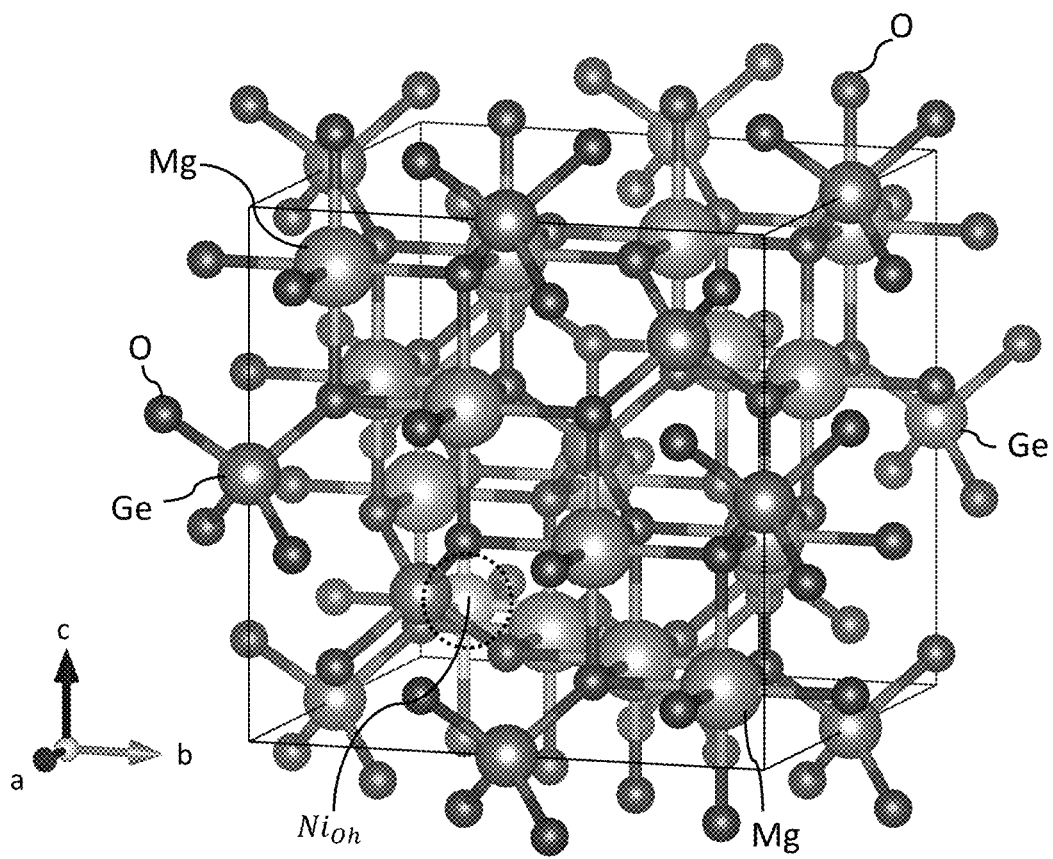
Mg1 → Ni1    FIG. 32

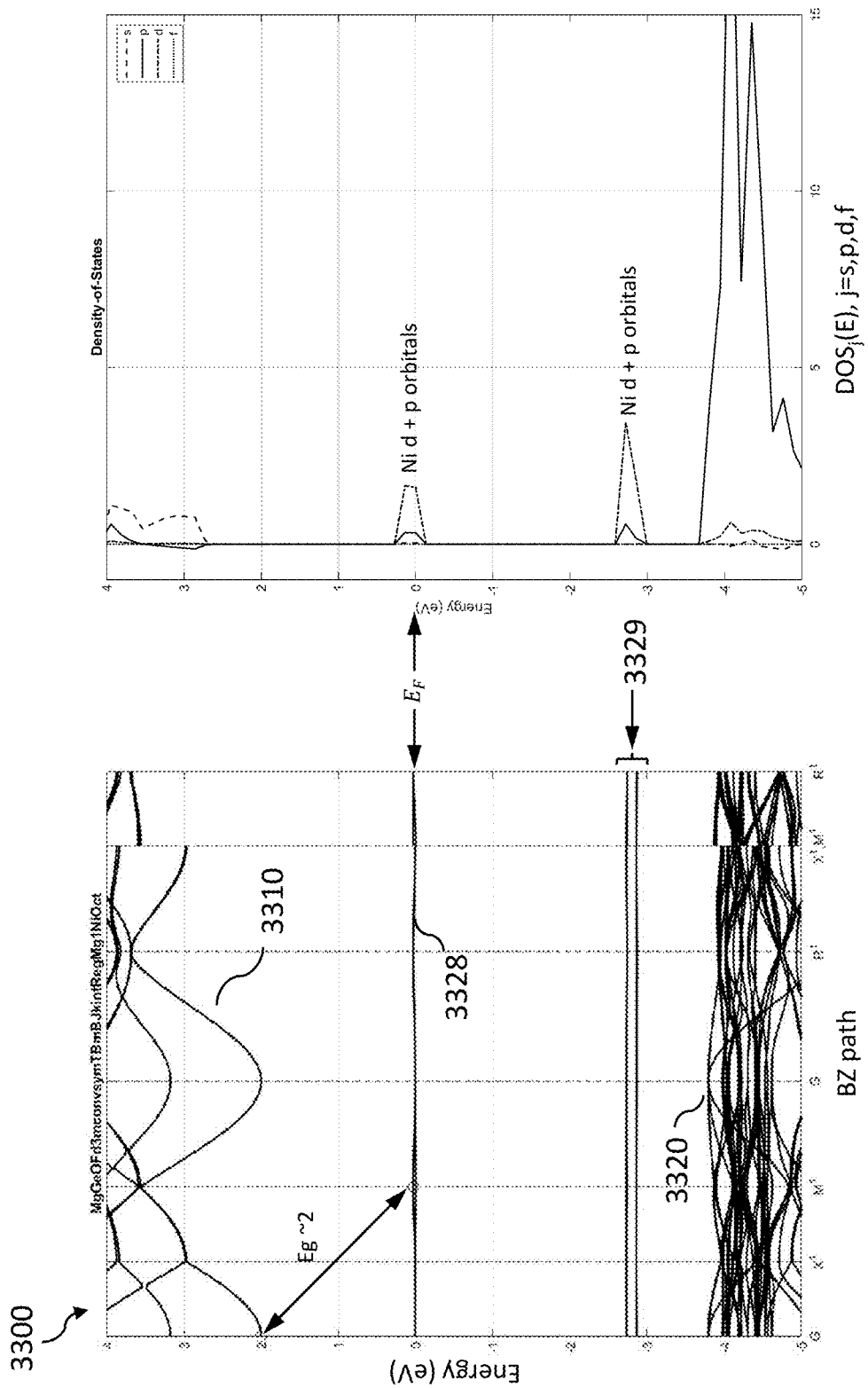

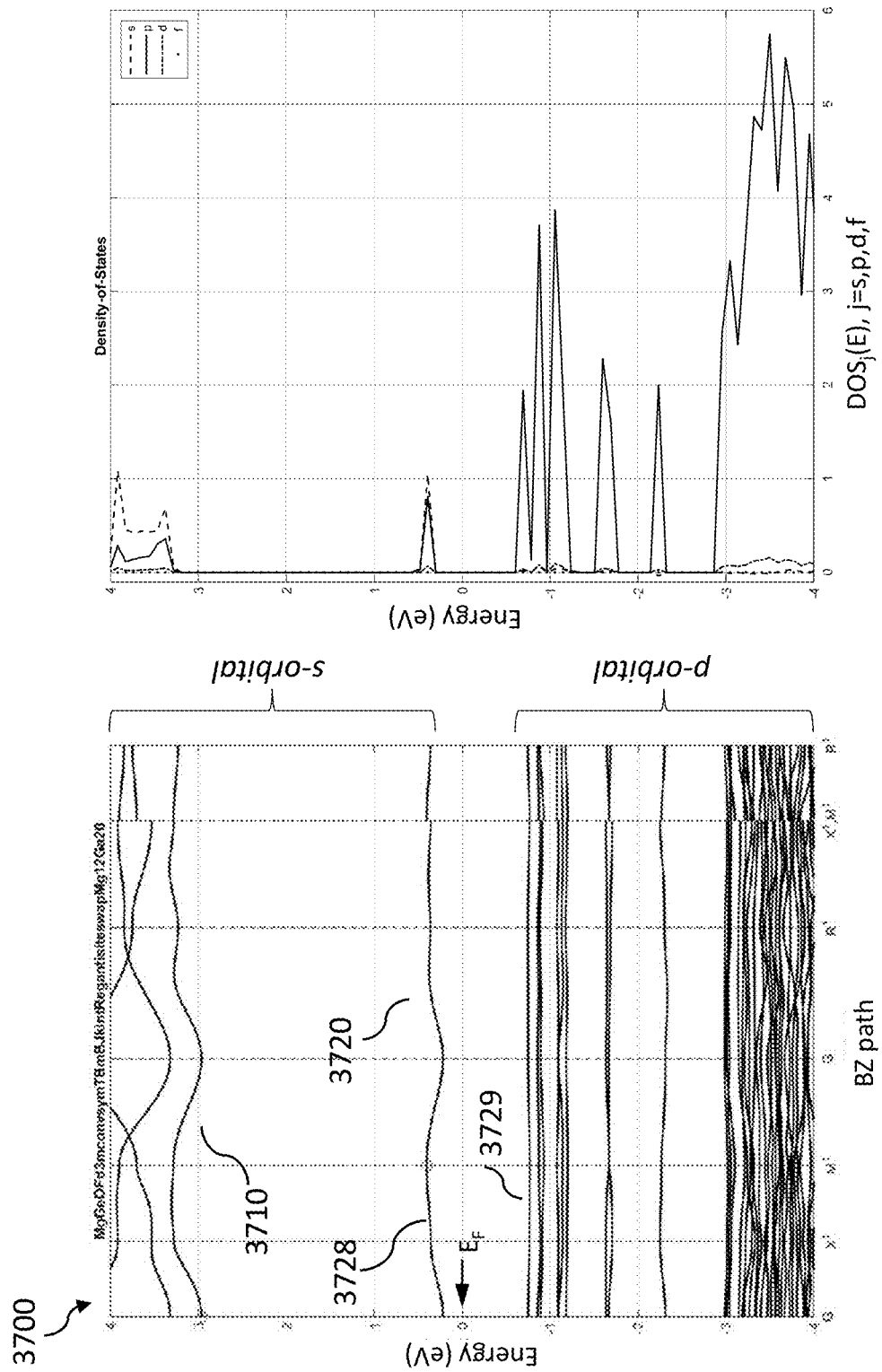

| formula | SG | N_Mg | N_Ge | N_O | Mg:Ge | Cations/Anions | Vol (Ang³) | Vol/atom | Mg_x | Ge_y | O_z |
|---|---|---|---|---|---|---|---|---|---|---|---|
| Mg_2 Ge_1 O_4 | Pnma | 8 | 4 | 16 | 2.0 | 3/4 | 316.7 | 11.3 | 2/3 | 1/3 | 1 1/3 |
| Mg_1 Ge_1 O_3 | C2c | 8 | 8 | 24 | 1.0 | 2/3 | 452.7 | 11.3 | 1/2 | 1/2 | 1 1/2 |
| Mg_17 Ge_7 O_32 | Fd3m→P-43m | 17 | 7 | 32 | 2.4 | 3/4 | 582.2 | 10.4 | 17/24 | 7/24 | 1 1/3 |
| Mg_1 Ge_1 O_4 | Fd3m | 16 | 8 | 32 | 2.0 | 3/4 | 582.2 | 10.4 | 2/3 | 1/3 | 1 1/3 |
| Mg_15 Ge_9 O_32 | Fd3m→R-3m | 15 | 9 | 32 | 1.7 | 3/4 | 582.2 | 10.4 | 5/8 | 3/8 | 1 1/3 |
| Mg_14 Ge_10 O_24 | Pbam | 28 | 10 | 48 | 2.8 | 19/24 | 915.2 | 10.6 | 14/19 | 5/19 | 1 5/19 |
| Mg_1 Ge_1 O_3 | Pbca | 16 | 16 | 48 | 1.0 | 2/3 | 938.2 | 11.7 | 1/2 | 1/2 | 1 1/2 |
| Mg_1 Ge_1 O_3 | R3 | 6 | 6 | 18 | 1.0 | 2/3 | 303.1 | 10.1 | 1/2 | 1/2 | 1 1/2 |

FIG. 39A

| formula | SG | N_Mg | N_Ge | N_O | Mg:Ge | E_form(eV) | Eg (eV) |
|---|---|---|---|---|---|---|---|
| Mg_2 Ge_1 O_4 | Pnma | 8 | 4 | 16 | 2.0 | -163.1986 | 6.259 (D) |
| Mg_1 Ge_1 O_3 | C2c | 8 | 8 | 24 | 1.0 | -117.6576 | 5.169 (I) |
| Mg_17 Ge_7 O_32 | Fd3m→P-43m | 17 | 7 | 32 | 2.4 | -321.0783 | 4.394 (D) |
| Mg_1 Ge_1 O_4 | Fd3m | 16 | 8 | 32 | 2.0 | -81.9710 | 5.806 (D) |
| Mg_15 Ge_9 O_32 | Fd3m→R-3m | 15 | 9 | 32 | 1.7 | -327.7524 | 5.641 (D) |
| Mg_14 Ge_10 O_24 | Pbam | 28 | 10 | 48 | 2.8 | -496.0288 | 6.248(D) |
| Mg_1 Ge_1 O_3 | Pbca | 16 | 16 | 48 | 1.0 | -468.7311 | 5.548(D) |
| Mg_1 Ge_1 O_3 | R3 | 6 | 6 | 18 | 1.0 | -58.9645 | 6.259 (I) |

Normal cation Lattice = 16xMg, 8xGe

3902a

| cation | x_pos | x_pos | x_pos | x_pos |
|---|---|---|---|---|
| Mg0 | 0.125 | 0.125 | 0.125 | 0.125 |
| Mg1 | 0.625 | 0.625 | 0.875 | 0.375 |
| Mg2 | 0.875 | 0.875 | 0.875 | 0.125 |
| Mg3 | 0.375 | 0.125 | 0.125 | 0.375 |
| Mg4 | 0.125 | 0.625 | 0.625 | 0.625 |
| Mg5 | 0.625 | 0.375 | 0.375 | 0.875 |
| Mg6 | 0.875 | 0.625 | 0.375 | 0.625 |
| Mg7 | 0.375 | 0.125 | 0.625 | 0.875 |
| Mg8 | 0.625 | 0.875 | 0.125 | 0.625 |
| Mg9 | 0.125 | 0.125 | 0.875 | 0.875 |
| Mg10 | 0.375 | 0.875 | 0.875 | 0.625 |
| Mg11 | 0.875 | 0.125 | 0.125 | 0.875 |
| Mg12 | 0.625 | 0.625 | 0.625 | 0.125 |
| Mg13 | 0.125 | 0.375 | 0.375 | 0.375 |
| Mg14 | 0.375 | 0.375 | 0.375 | 0.125 |
| Mg15 | 0.875 | 0.625 | 0.625 | 0.375 |
| Ge16 | 0.25 | 0.75 | 0.75 | 0.25 |
| Ge17 | 0 | 0 | 0 | 0.5 |
| Ge18 | 0.25 | 0.25 | 0.25 | 0.75 |
| Ge19 | 0 | 0.5 | 0.5 | 0 |
| Ge20 | 0.75 | 0.75 | 0.75 | 0.75 |
| Ge21 | 0.5 | 0 | 0 | 0 |
| Ge22 | 0.75 | 0.25 | 0.25 | 0.25 |
| Ge23 | 0.5 | 0.5 | 0.5 | 0.5 |

Mg→Ge

3902b

| cation | x_pos | x_pos | x_pos | x_pos |
|---|---|---|---|---|
| Mg0 | 0.125 | 0.125 | 0.125 | 0.125 |
| Mg1 | 0.625 | 0.625 | 0.875 | 0.375 |
| Mg2 | 0.875 | 0.875 | 0.875 | 0.125 |
| Mg3 | 0.375 | 0.125 | 0.125 | 0.375 |
| Ge4 | 0.125 | 0.625 | 0.625 | 0.625 |
| Mg5 | 0.625 | 0.375 | 0.375 | 0.875 |
| Mg6 | 0.875 | 0.625 | 0.375 | 0.625 |
| Mg7 | 0.375 | 0.125 | 0.625 | 0.875 |
| Mg8 | 0.625 | 0.875 | 0.125 | 0.625 |
| Mg9 | 0.125 | 0.125 | 0.875 | 0.875 |
| Mg10 | 0.375 | 0.875 | 0.875 | 0.625 |
| Mg11 | 0.875 | 0.125 | 0.125 | 0.875 |
| Mg12 | 0.625 | 0.625 | 0.625 | 0.125 |
| Mg13 | 0.125 | 0.375 | 0.375 | 0.375 |
| Mg14 | 0.375 | 0.375 | 0.375 | 0.125 |
| Mg15 | 0.875 | 0.625 | 0.625 | 0.375 |
| Ge16 | 0.25 | 0.75 | 0.75 | 0.25 |
| Ge17 | 0 | 0 | 0 | 0.5 |
| Ge18 | 0.25 | 0.25 | 0.25 | 0.75 |
| Ge19 | 0 | 0.5 | 0.5 | 0 |
| Ge20 | 0.75 | 0.75 | 0.75 | 0.75 |
| Ge21 | 0.5 | 0 | 0 | 0 |
| Ge22 | 0.75 | 0.25 | 0.25 | 0.25 |
| Ge23 | 0.5 | 0.5 | 0.5 | 0.5 |

FIG. 39C

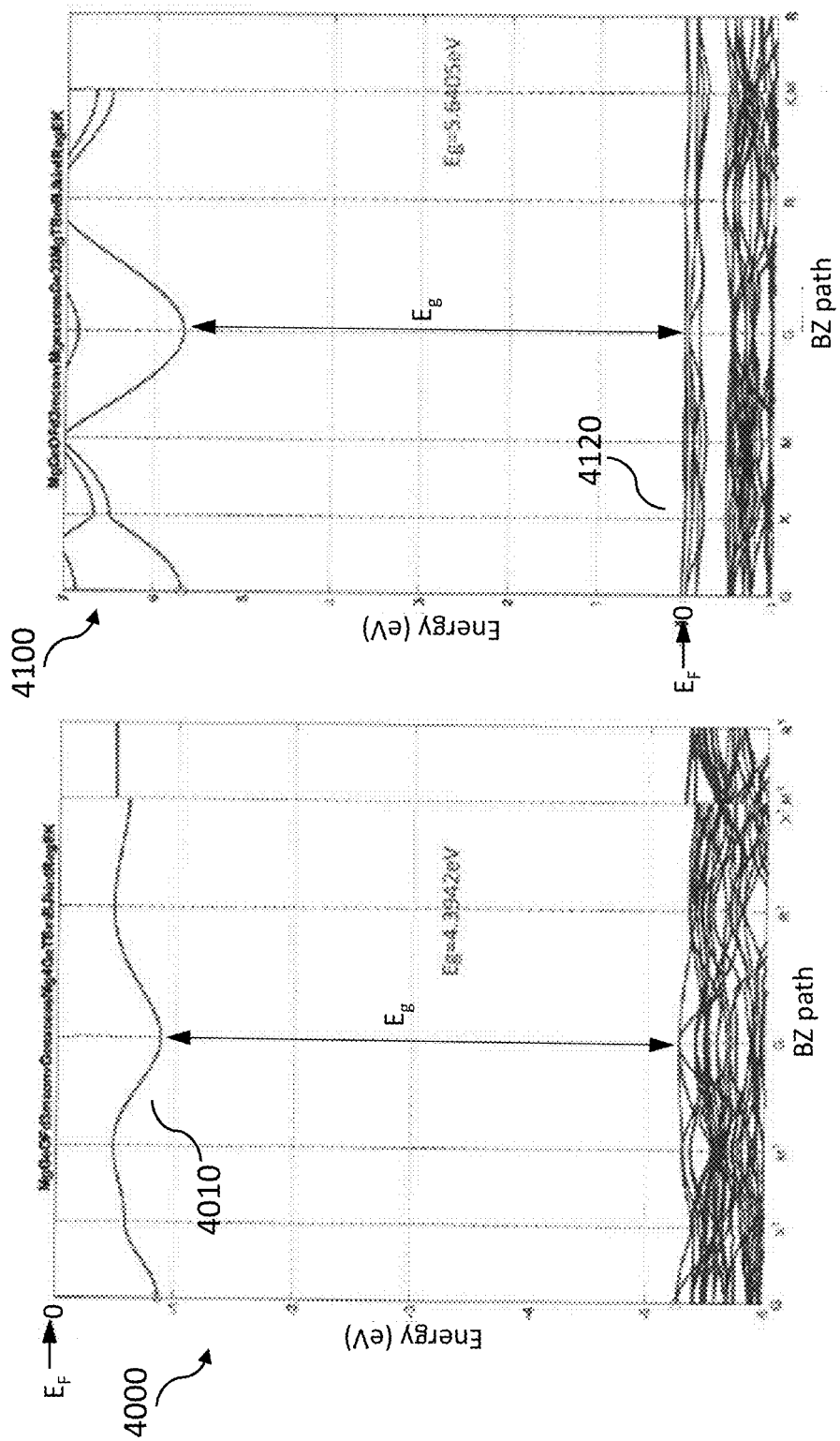

| material | preferred growth orient | SG | a (Ang) | b (Ang) | c (Ang) | % mismatch MgO | % mismatch Al2MgO4 | % mismatch LiF(100) |
|---|---|---|---|---|---|---|---|---|
| MgO | (100), (001) | Fm3m | 4.256484 | 4.256484 | 4.256484 | 0.00% | 4.19% | 4.24% |
| Mg2GeO4 | (100), (001) | Fd3m | 8.349934 | 8.349934 | 8.349934 | -1.92% | 2.19% | 2.24% |
| MgGa2O4 | (100), (001) | Fd3m | 8.456758 | 8.456758 | 8.456758 | -0.66% | 3.50% | 3.55% |
| MgAl2O4 | (100), (001) | Fd3m | 8.170734 | 8.170734 | 8.170734 | 4.02% | 0.00% | 0.05% |
| ZnAl2O4 | (100), (001) | Fd3m | 8.177936 | 8.177936 | 8.177936 | 3.94% | 0.09% | 0.14% |
| ZnGa2O4 | (100), (001) | Fd3m | 8.459002 | 8.459002 | 8.459002 | -0.63% | 3.53% | 3.58% |
| gamma-Ga2O3 | (100), (001) | Fd3m | 8.22 | 8.22 | 8.22 | 3.44% | 0.60% | 0.65% |
| LiF | (100), (001) | Fm3m | 4.083428 | 4.083428 | 4.083428 | 4.07% | -0.05% | 0.00% |

FIG. 46B

Summary Growth Processes Physically Realized

| structure | Space Group | Bulk | SL | quality | substrate |
|---|---|---|---|---|---|
| bulk Mg2GeO4 | Fd3m (cubic) | Y | | pseudomorphic | MgO(100) |
| bulk Ga2MgO4 | Fd3m (cubic) | Y | | pseudomorphic | MgO(100) |
| bulk Ga2O3 | Fd3m & C2m | Y | | pseudomorphic | MgO(100) |
| bulk GeO2 | rutile | Y | | poly/amorph | MgO(100), C-plane, R-plane, rutile-TiO2 |
| SL{ Mg2GeO4 /MgO} | Fd3m/Fd3m | | Y | pseudomorphic | MgO(100) |
| SL{ Mg2GeO4 /MgGa2O4] | Fd3m/Fd3m | | Y | pseudomorphic | MgO(100) |
| SL{ Mg2GeO4 /MgO} | Fd3m/Fd3m | | Y | pseudomorphic | MgO(100) |
| SL{ Mg2GeO4 /Ga2O3} | Fd3m/Fd3m | | Y | pseudomorphic | MgO(100) |
| SL{ MgGa2O4 /MgO} | Fd3m/Fd3m | | Y | pseudomorphic | MgO(100) |
| SL{ MgGa2O4 /Ga2O3} | Fd3m/Fd3m | | Y | pseudomorphic | MgO(100) |
| SL{ MgGa2O4 /MgO} | Fd3m/Fd3m | | Y | pseudomorphic | MgO(100) |
| SL{ MgGa2O4 /MgO} | Fd3m/Fd3m | | Y | pseudomorphic | MgO(100) |
| SL{GeO2/Ga2O3} | | | Y | amorphous | C-plane |

ULTRAWIDE BANDGAP SEMICONDUCTOR DEVICES INCLUDING MAGNESIUM GERMANIUM OXIDES

RELATED APPLICATIONS

This application is a continuation of International Patent Application No. PCT/IB2021/060414, filed on Nov. 10, 2021, and entitled "Ultrawide Bandgap Semiconductor Devices Including Magnesium Germanium Oxides"; which is hereby incorporated by reference for all purposes.

This application is related to U.S. patent application Ser. No. 17/651,711, filed on Feb. 18, 2022, and entitled "Ultrawide Bandgap Semiconductor Devices Including Magnesium Germanium Oxides"; to U.S. patent application Ser. No. 17/651,713, filed on Feb. 18, 2022, and entitled "Ultrawide Bandgap Semiconductor Devices Including Magnesium Germanium Oxides"; to U.S. patent application Ser. No. 16/990,349, filed on Aug. 11, 2020, issued as U.S. Pat. No. 11,342,484, and entitled "Metal Oxide Semiconductor-Based Light Emitting Device"; to International Application No. PCT/IB2021/060413, entitled "Epitaxial Oxide Materials, Structures and Devices," filed on Nov. 10, 2021; and to International Application No. PCT/IB2021/060466, entitled "Epitaxial Oxide Materials, Structures and Devices," filed on Nov. 11, 2021; all of which are hereby incorporated by reference for all purposes.

BACKGROUND

Electronic and optoelectronic devices rely on semiconductor materials to provide properties that enable the devices to function in various ways for different applications. Optoelectronic devices include light emitting diodes (LEDs) that emit light at infrared, visible or ultraviolet wavelengths depending on the bandgaps of the materials used in the LEDs. For example, ultraviolet (UV) emitting LEDs utilize wide bandgap (WBG) semiconductors such as gallium nitride (GaN) and aluminum nitride (AlN). Photodetectors are another type of optoelectronic device, which sense the presence of light. For example, UV detection of light is utilized for diverse applications in communication systems, data storage, biosensing and fluorescence measurements. Lasers and solar blind detectors are other types of optoelectronic devices.

Digital power management systems use electronic devices for direct current (DC) and alternating current (AC) power conversion, such as DC-DC and AC-DC conversion. These power inverters and power conversion devices are fundamentally constructed using high breakdown voltage and fast switching time power transistors. The properties of the semiconductor materials used in the electronic devices affect performance characteristics such as electrical breakdown voltage tolerance, on-state electrical losses, transistor switching speed and overall switching efficiency. High radiofrequency switching transistors are used in telecommunication and radar systems and require in addition the use of low insertion loss materials and high signal gain.

Ongoing development of semiconductor materials is extremely important for continuing improvements and advances in electronic and optoelectronic devices.

SUMMARY

In some embodiments, a semiconductor structure includes a substrate comprising a substantially single crystal substrate material and an epitaxial layer of $Mg_xGe_{1-x}O_{2-x}$ on the substrate, where x has a value of $0 \leq x < 1$. The epitaxial layer of $Mg_xGe_{1-x}O_{2-x}$ has a crystal symmetry compatible with the substrate material.

In some embodiments, a semiconductor device includes a substrate comprising a substantially single crystal substrate material and an active region on the substrate. The active region comprises an epitaxial layer of $Mg_xGe_{1-x}O_{2-x}$, with x having a value of $0 \leq x < 1$. The epitaxial layer of $Mg_xGe_{1-x}O_{2-x}$ has a crystal symmetry compatible with the substrate material.

In some embodiments, a method of forming a semiconductor device includes providing a substrate comprising a substantially single crystal substrate material that has a crystal symmetry compatible with an epitaxial layer of $Mg_xGe_{1-x}O_{2-x}$. Materials are co-deposited onto the substrate to form the epitaxial layer of $Mg_xGe_{1-x}O_{2-x}$, with x having a value of $0 \leq x < 1$. The materials comprise at least two elements selected from Mg, Ge and oxygen in accordance with the value of x, the Mg, Ge and oxygen being supplied by a Mg source, a Ge source, and an activated oxygen source, respectively.

In other embodiments, additional elements are incorporated into the $Mg_xGe_{1-x}O_{2-x}$ crystal to alter the electronic properties, such as the electrical conductivity type.

BRIEF DESCRIPTION OF THE DRAWINGS

FIG. 4 is a table of single crystal compositions that may be formed from various proportions of Mg, Ge and O, in accordance with some embodiments.

FIG. 5 is a table showing examples of possible single crystal compositions that may be formed from Mg, Ge and O, exhibiting low formation energy and therefore stable structures, in accordance with some embodiments.

FIG. 8A is an electron energy-momentum (E-k) diagram for $Mg_2GeO_4$ (Fd3m) showing the calculated valence and conduction band structure at critical points within the Brillouin-zone of the crystal disclosed in FIG. 7C, in accordance with some embodiments.

FIG. 8B is an E-k diagram showing the detailed valence band structure of the E-k diagram for $Mg_2GeO_4$ (Fd3m) illustrated in FIG. 8A, in accordance with some embodiments.

FIG. 10A is an E-k diagram for $MgGeO_3$ (C2/c) showing the calculated valence and conduction band structure at critical points within the Brillouin-zone of the crystal disclosed in FIG. 7B, in accordance with some embodiments.

FIG. 10B is an E-k diagram showing the detailed valence band structure of the E-k diagram for $MgGeO_3$ (C2/c) illustrated in FIG. 10A, in accordance with some embodiments.

FIG. 16 discloses the electronic energy band structure E-k diagram for an epitaxial layer of cubic space group Fd3m $Mg_2GeO_4$ formed on a substrate or rigid layer of cubic Fd3m space group magnesium aluminate $MgAl_2O_4$, in accordance with some embodiments.

FIG. 17 discloses the electronic energy band structure E-k diagram for an epitaxial layer of cubic space group Fd3m $Mg_2GeO_4$ formed on a substrate or rigid layer of cubic Fd3m space group magnesium oxide MgO, in accordance with some embodiments.

FIG. 18A is a table showing normalized x, y, and z positions of cation sites for a $Mg_2GeO_4$ (Fd3m) unit cell, in accordance with some embodiments.

FIG. 18B is a table showing normalized x, y, and z positions of anion sites for a $Mg_2GeO_4$ (Fd3m) unit cell, in accordance with some embodiments.

FIG. 19 is a table summarizing the semiconductor properties of single site trivalent gallium impurity atom substitution in $Mg_2GeO_4$ (Fd3m) lattice, showing that single site substitutions of the Ge sites with Ga results in p-type conductivity and preserves the direct bandgap character, in accordance with some embodiments.

FIG. 22 is a table showing semiconductor properties of Ga-doped $Mg_2GeO_4$ (Fd3m) arising from various single site substitutions of distinct Mg sites with Ga, in accordance with some embodiments.

FIG. 31 is a unit cell crystal structure diagram of cubic nickel-oxide NiO (space group Fd3m) showing the octahedral bonding of Ni with oxygen atoms, in accordance with some embodiments.

FIG. 32 is a unit cell crystal structure diagram of Ni-doped $Mg_2GeO_4$ (Fd3m), showing in this example the octahedral $Mg_1$ site substituted with Ni, in accordance with some embodiments.

FIG. 33A is an E-k diagram for the Ni-doped $Mg_2GeO_4$ (Fd3m) illustrated in FIG. 32, in accordance with some embodiments.

FIG. 33B is the resulting density-of-states diagram for the Ni-doped $Mg_2GeO_4$ (Fd3m) illustrated in FIG. 32, in accordance with some embodiments.

FIG. 37A is the resultant E-k diagram for the anti-site exchange within $Mg_2GeO_4$ (Fd3m) illustrated in FIG. 36B, in accordance with some embodiments.

FIG. 37B is an electronic density of states diagram for the Mg↔Ge anti-site exchange illustrated in FIG. 36B, in accordance with some embodiments.

FIG. 39A is a table of possible compositions of $Mg_xGe_yO_z$, with respective crystalline space groups and the relative number of cations and anions within the crystal unit cell, in accordance with some embodiments.

FIG. 39C is a table indicating the atomic positions within a Fd3m crystal formed with a Ge-excess by substituting a Mg-site with Ge, in accordance with some embodiments.

FIG. 40 is an E-k diagram of a Ge-doped $Mg_2GeO_4$ (Fd3m) where there is an excess of Ge, in accordance with some embodiments.

FIG. 41 is an E-k diagram of a Mg-doped $Mg_2GeO_4$ (Fd3m) where there is an excess of Mg, in accordance with some embodiments.

FIG. 46B is a table of crystal structure properties of example epitaxial films and substrates that are compatible with $Mg_2GeO_4$, in accordance with some embodiments.

FIG. 53 is a summary table of the superlattice properties for example structures comprising MgGeO epilayers, in accordance with some embodiments.

FIG. 68B is a top view of the planar FET illustrated FIG. 68A showing distances between the source to gate and drain to gate electrical contacts, in accordance with some embodiments.

FIG. 69A is a figurative sectional view of a planar field effect transistor (FET) of a similar configuration to that illustrated in FIGS. 68A and 68B except that the source electrical contact is implanted through the semiconductor layer region into the substrate, and the drain electrical contact is implanted into the semiconductor layer region only, in accordance with some embodiments.

FIG. 69B is a top view of the planar FET illustrated in FIG. 69A.

FIG. 70 is a top view of a planar FET comprising multiple interconnected unit cells of the planar FET illustrated in FIG. 68A or 69A, in accordance with some embodiments.

FIG. 71 is a process flow diagram for forming a conduction device comprising a regrown conformal semiconductor layer region on an exposed etched mesa sidewall, in accordance with some embodiments.

DETAILED DESCRIPTION

Figure 1A:
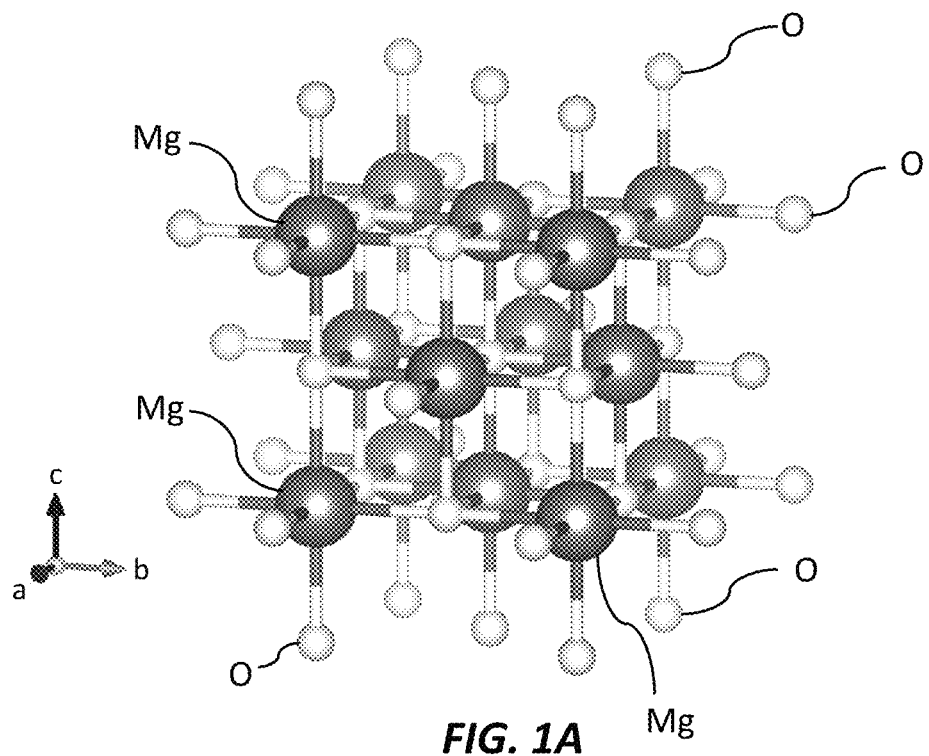
FIG. 1A is a perspective view of a cubic crystal symmetry MgO structure showing the atomic positions of magnesium and oxygen atoms of a unit cell, in accordance with some embodiments.

Semiconductor structures having magnesium germanium oxide epitaxial layers are disclosed, where the magnesium germanium oxide layers and substrate materials are carefully designed and utilized in specific combinations to enable formation of high quality crystal structures. Embodiments of the semiconductor structures include a substantially single crystal substrate having a pre-determined crystal symmetry compatible with the particular form of magnesium germanium oxide in the epitaxial layer. The semiconductor structures involve new forms of magnesium germanium oxide, with substantially single crystal structures formed. The semiconductor structures comprise at least one region of magnesium germanium oxide having a predetermined single crystal symmetry type. Embodiments for conductivity doping of the magnesium germanium oxide materials are disclosed, as well as methods for forming the semiconductor structures. Embodiments of the magnesium germanium oxide materials exhibit ultrawide bandgaps, such as a bandgap of 5.2 eV for the monoclinic crystal form to 6.4 eV for the orthorhombic form. Some embodiments have a direct bandgap, such as the cubic form of magnesium germanium oxide having a direct bandgap of 5.8 eV. The disclosed materials, structures and methods enable high-quality and efficient semiconductor devices including optoelectronic devices operating in the deep ultraviolet range, and electronic devices for radiofrequency (RF) communication, digital computing and power switching.

In this disclosure, magnesium germanium oxide ($Mg_xGe_yO_z$) comprises the elements of germanium (Ge), magnesium (Mg) and oxygen (O), where x, y, and z are mole fractions for x having any values in the range $0 \leq x \leq 1.5$, y having any values in the range $1.0 \leq y \leq 2.5$ and z having any values in the range $2 \leq z \leq 5$. Embodiments are also expressed in this disclosure as $Mg_aGe_bO_c$ (with a, b, c corresponding to x, y, z of $Mg_xGe_yO_z$), or $Mg_xGe_{1-x}O_{2-x}$ with x having any values in the range $0 \leq x < 1$, or as $Mg_{1-y}Ge_yO_{1+y}$ with $0 < y \leq 1$. It shall be understood that instances in this disclosure that list one expression for magnesium germanium oxides (e.g., $Mg_xGe_yO_z$) may be equally replaced with another expression (e.g., $Mg_xGe_{1-x}O_{2-x}$) as described in this paragraph.

In the electronic and optoelectronic industries, semiconductors with new material and functional properties are required for an increasing number of modern applications. Although silicon is the workhorse of the digital computing and the power switching industries, there is a need to increase performance of power switches in digital power management systems in order for new application areas to progress commercially. In particular, there is a need for development of wide bandgap (WBG) semiconducting materials. Additionally, optoelectronic devices such as light emitting diodes (LEDs) require a unique set of materials-specific criteria to enable efficient light emission at infrared, visible and ultraviolet wavelengths. UVLEDs use WBG semiconductors such as GaN and AlN. It is well known by workers in the field that efficient optical emission from semiconductor materials requires the fundamental property of possessing a direct-bandgap energy-momentum configuration.

The advantageous direct bandgap is, however, possible for only a small subset of crystal structure types and atoms comprising single crystal compositions of semiconductors. There are technical and fundamental physics challenges preventing conventional UVLEDs (e.g., AlN-based UVLEDs) from achieving far ultraviolet wavelengths shorter than approximately 260 nm, such as shorter than approximately 220 nanometers (nm). It is desirable to provide UVLEDs that can produce wavelengths farther below 250 nm and to increase the optical output power of UVLEDs for applications such as the inactivation of viral and germicidal contamination of surfaces, liquids, and air.

Short UV wavelength sensors are another type of device that can benefit from further development of WBG semiconducting materials, as short UV wavelength sensors are typically limited by the available semiconductor bandgap energy and technology available.

Another desirable example of WBG semiconductor materials application is directed toward digital power management systems, such as DC-DC and AC-DC conversion. Power switches for such systems are conventionally implemented using semiconductors of the form: Si ($E_g$=1.1 eV), GaN ($E_g$=3.4 eV) and silicon-carbide (SiC, $E_g$=3.1 eV), where $E_g$ is the energy gap between the conduction band minimum and valence band maximum. While GaN and SiC are classified as WBG, there is a pressing need to further increase the available bandgap energy to further improve the electrical breakdown voltage tolerance, reduce on-state electrical losses, increase transistor switching speed and thus increase overall switching efficiency.

Clearly, conventional WBG materials are technologically limiting for many applications, including extremely short UVLEDs and lasers, high efficiency power switching systems and solar blind detectors. There is a pressing need to establish new materials to overcome these shortcomings and limitations. The wide bandgaps of epitaxial oxide materials provide them with high dielectric breakdown voltages, and therefore can be used in electronic devices that require large voltage biases and sustain high electric fields (e.g., high voltage switches, and impact ionization devices). The bandgaps of epitaxial oxide materials are also well suited for use in optoelectronic devices that emit or detect light in the UV range, where materials with bandgaps from about 4.5 eV to about 8 eV can be used to emit or detect UV light with wavelengths from about 150 nm to 280 nm. Other ultrawide bandgap oxide materials disclosed can be used for extreme UV applications <150 nm. Semiconductor heterostructures can also be formed with wide bandgap materials as the emitter or absorber layers, and materials that have wider bandgaps than the emitter or absorber layers can be used in other layers of the structure to be transparent to the wavelength being emitted or absorbed.

The magnesium germanium oxide materials disclosed herein may be utilized in various electronic and optoelectronic devices, such as, but not limited to, light emitting devices (e.g., UVLEDs), light sensors (e.g., short UV wavelength sensors), and power switches as described above. Other applications included functionalized oxide surfaces to form bio-electronic interfaces for biosensing. In embodiments, the magnesium germanium oxide materials may be used in one or more layers of the active regions (e.g., n-type active region or layer(s), i-type active region or layer(s) and/or p-type active region or layer(s)) of a semiconductor device, as shall be described herein. An i-type region shall also be referred to as an intrinsic region or not intentionally doped region.

An "epitaxial oxide" material described herein is a material comprising oxygen and other elements (e.g., metals such as gallium or non-metals such as germanium and silicon) having an ordered crystalline structure configured to be formed on a single crystal substrate, or on one or more layers formed on the single crystal substrate. Epitaxial oxide materials have defined crystal symmetries and crystal orientations with respect to the substrate. Epitaxial oxide materials can form layers that are coherent with the single crystal substrate and/or with the one or more layers formed on the single crystal substrate. Epitaxial oxide materials can be in layers of a semiconductor structure that are strained, wherein the crystal of the epitaxial oxide material is deformed compared to a relaxed state. Epitaxial oxide materials can also be in layers of a semiconductor structure that are unstrained or relaxed.

In this disclosure, the crystal symmetry of the substrate and the epitaxial oxide material can be compatible if they have compatible crystal symmetry, and the in-plane (i.e., parallel with the surface of the substrate) lattice parameters and atomic positions at the surface of the substrate provide a suitable template for the growth of the subsequent epitaxial oxide materials. For example, a substrate and an epitaxial oxide material can be compatible if the in-plane lattice constant mismatch between the substrate and the epitaxial oxide material are less than 0.5%, 1%, 1.5%, 2%, 5% or 10%. For example, in some embodiments the crystal structure of the substrate material has a lattice mismatch of less than or equal to 10% with the epitaxial layer. In some cases, the crystal symmetry of the substrate and the epitaxial oxide material can be compatible if they have a different type of crystal symmetry but the in-plane (i.e., parallel with the surface of the substrate) lattice parameters and atomic positions at the surface of the substrate provide a suitable template for the growth of the subsequent epitaxial oxide materials. In some cases, multiple (e.g., 2, 4 or other integer) unit cells of a substrate surface atomic arrangement can provide a suitable surface for the growth of an epitaxial oxide material with a larger unit cell than that of the substrate. In another case, the epitaxial oxide layer can have a smaller lattice constant (e.g., approximately half) than the substrate. In some cases, the unit cells of the epitaxial oxide layer may be rotated (e.g., by 45 degrees) compared to the unit cells of the substrate.

The epitaxial oxide materials described herein can be formed using an epitaxial growth technique such as molecular beam epitaxy (MBE), metal organic chemical vapor deposition (MOCVD), atomic layer deposition (ALD), and other physical vapor deposition (PVD) and chemical vapor deposition (CVD) techniques.

Crystal Structure

The discovery of the ability to create epitaxial single crystal semiconductor structures of particular forms of $Mg_xGe_yO_z$ are disclosed herein, using substrates that are carefully selected based on crystal symmetry compatibility with the epitaxial $Mg_xGe_yO_z$ films being formed. Insights involving crystal structures will now be described to provide context for the formation of such epitaxial $Mg_xGe_yO_z$ films and the tuning for example properties.

Density functional theory (DFT) enables prediction and calculation of the crystal oxide band structure on the basis of quantum mechanics without requiring phenomenological parameters. DFT calculations applied to understanding the electronic properties of solid-state oxide crystals is based fundamentally on treating the nuclei of the atoms comprising the crystal as fixed via the Born-Oppenheimer approximation, thereby generating a static external potential in which the many-body electron fields are embedded. The crystal structure symmetry of the atomic positions and species imposes a fundamental structure effective potential for the interacting electrons. The effective potential for the many-body electron interactions in three-dimensional spatial coordinates can be implemented by the utility of functionals of the electron density. This effective potential includes exchange and correlation interactions, representing interacting and non-interacting electrons. For application to solid-state semiconductors and oxides there exists a range of improved exchange functionals (XCF) that improve the accuracy of the DFT results. Within the DFT framework the many-electron Schrôdinger equation is divided into two groups: (i) valence electrons; and (ii) inner core electrons. Inner shells electrons are strongly bound and partially screen the nucleus, forming with the nucleus an inert core. Crystal atomic bonds are primarily due to the valence electrons. Therefore, inner electrons can be ignored in a large number of cases, thereby reducing the atoms comprising the crystal to an ionic core that interacts with the valence electrons. This effective interaction is called a pseudopotential and approximates the potential felt by the valence electrons. One notable exception of the effect of inner core electrons is in the case of Lanthanide oxides, wherein partially filled Lanthanide atomic 4f-orbitals are surrounded by closed electron orbitals. The present DFT band structures disclosed herein account for this effect. There exist many improvements for XCF to attain higher accuracy of band structures applied to oxides. For example, improvements over historical XCFs of the known local density approximation (LDA), generalized gradient approximation (GGA) hybrid exchange (e.g., HSE (Heyd-Scuseria-Ernzerhof), PBE (Perdew-Burke-Ernzerhof) and BLYP (Becke, Lee, Yang, Parr)) include the use of the Tran-Blaha modified Becke-Johnson (TBmBJ) exchange functional, and further modifications, such as the KTBmBJ, JTBSm, and GLLBsc forms. It was found in accordance with the present disclosure that in particular for the present materials disclosed, the TBmBJ exchange potential can predict the electron energy-momentum (E-k) band structure, bandgaps, lattice constants, and some mechanical properties of epitaxial oxide materials. A further benefit of the TBmBJ is the lower computational cost compared to HSE when applied to a large number of atoms in large supercells which are used to simulate smaller perturbations to an idealized crystal structure, such as impurity incorporation. It is expected that further improvements over TBmBJ applied specifically to the present oxide systems can also be achieved. DTF calculations are used extensively in the present disclosure to provide ab-initio insights into the electronic and physical properties of the epitaxial oxide materials described herein, such as the bandgap and whether the bandgap is direct or indirect in character. The electronic and physical properties of the epitaxial oxide materials can be used to design semiconductor structures and devices utilizing the epitaxial oxide materials. In some cases, experimental data has also been used to verify the properties of the epitaxial oxide materials and structures described herein.

Calculated E-k band diagrams of epitaxial oxide materials derived using DFT calculations are described herein. There are several features of the E-k diagrams that can be used to provide insight into the electronic and physical properties of the epitaxial oxide materials. For example, the energies and k-vectors of valence band and conduction band extrema indicate the approximate energy width of the bandgap and whether the bandgap has a direct or an indirect character. The curvature of the branches of the valence band and conduction band near the extrema are related to the hole and electron effective masses, which relates to the carrier mobilities in the material. DFT calculations using the TBmBJ exchange functional more accurately shows the magnitude of the bandgap of the material compared to previous exchange functionals, as verified by experimental data. The calculated band diagrams of epitaxial materials in this disclosure may differ from the actual band diagrams of the epitaxial materials in some ways. However, certain features, such as the valence band and conduction band extrema, and the curvature of the branches of the valence band and conduction band near the extrema, may closely correspond to the actual band diagrams of the epitaxial materials. Therefore, even if some details of the band diagrams are inaccurate, the calculated band diagrams of epitaxial materials in this disclosure provide useful insights into the electronic and physical properties of the epitaxial oxide materials, and can be used to design semiconductor structures and devices utilizing the epitaxial oxide materials.

Figure 1B:
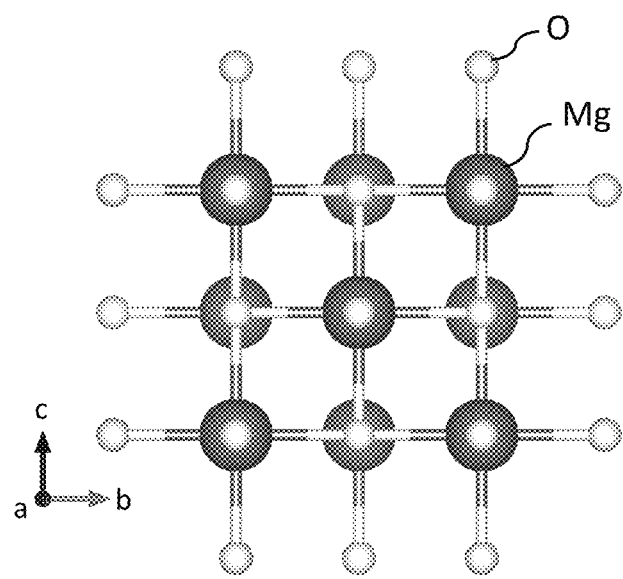
FIG. 1B is a plan view along an axis of the cubic MgO illustrated in FIG. 1A.

FIGS. 1A and 1B show perspective and plan views, respectively, of a cubic crystal symmetry MgO structure. The figures show the atomic positions of magnesium atoms ("Mg") and oxygen atoms ("O") of a single unit cell that is characterized by lattice constant $a_0$. Cubic crystal MgO is the most stable form of this composition which seldom forms any other polytypes where the unit cell is classified in the cubic Fm3m space group. In this crystal structure the Mg atoms are octahedrally bound to the oxygen atoms. Cubic crystal MgO is known and may be formed readily as a bulk substrate or film. However, embodiments of the present disclosure provide unique insights in using materials such as MgO to serve as low crystal lattice mismatch substrates for growing certain forms of epitaxial $Mg_xGe_yO_z$ as a single crystal structure.

Figure 2A:
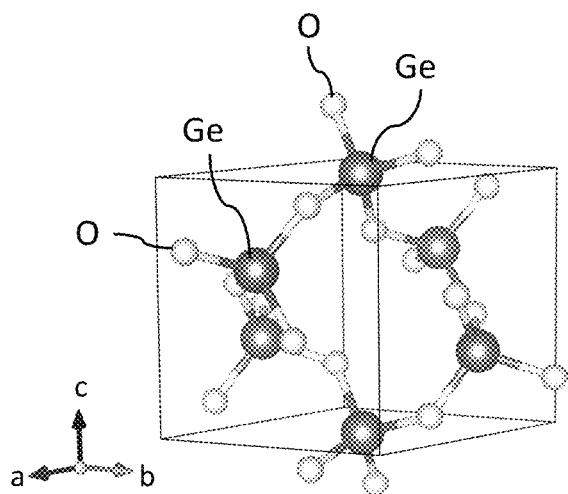
FIG. 2A is a perspective view of a single crystal unit cell comprising trigonal germanium oxide $GeO_2$, in accordance with some embodiments.
Figure 2B:
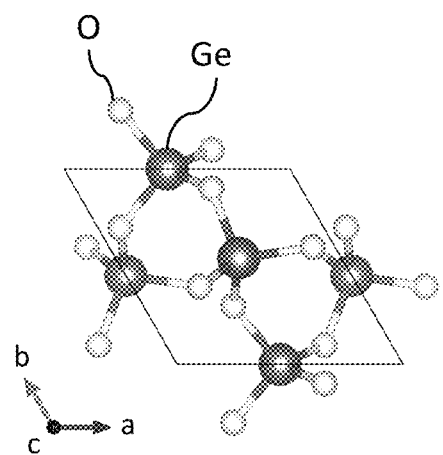
FIG. 2B is a plan view of the single crystal unit cell of trigonal germanium oxide $GeO_2$ illustrated in FIG. 2A.

FIGS. 2A and 2B show perspective and plan views, respectively, of one example of a low formation energy crystal structure for $GeO_2$, in accordance with some embodiments. A low formation energy corresponds to the composition being a stable structure. The structure of FIGS. 2A and 2B is trigonal $GeO_2$ characterized by lattice constants a, b and c where a≠b≠c. As can be seen, the Ge atoms ("Ge") are tetrahedrally bonded to the oxygen atoms ("O").

Figure 3A:
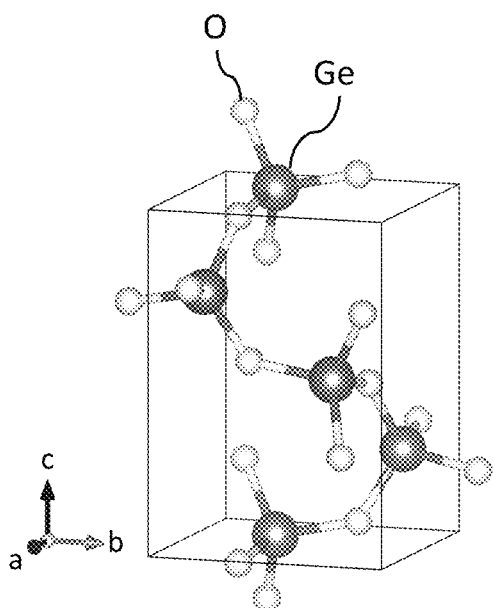
FIG. 3A is a perspective view of a single crystal unit cell comprising tetragonal germanium oxide $GeO_2$, in accordance with some embodiments.
Figure 3B:
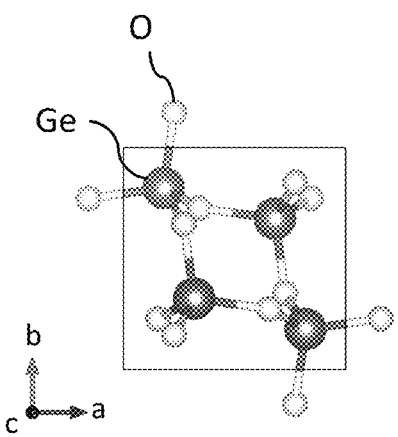
FIG. 3B is a plan view of the single crystal unit cell of tetragonal germanium oxide $GeO_2$ illustrated in FIG. 3A.

FIGS. 3A and 3B, show perspective and plan views, respectively, of a second example of a low formation energy crystal structure for $GeO_2$, in accordance with some embodiments. The structures are tetragonal $GeO_2$ characterized by lattice constants $a_0$ and $c_0$ where $a_0 \neq c_0$. Once again, the Ge atoms are tetrahedrally bonded to the O atoms. The low energy forms of FIGS. 2A-2B and 3A-3B provide stable structures. There are also other types of $GeO_2$ crystal structures, but these are less table than those depicted in FIGS. 2A-2B and 3A-3B.

In practice, the formation of large single crystals of $GeO_2$ is challenging to form and at best polycrystalline or amorphous films are formed. It was found in accordance with the present disclosure after investigation of exhaustive growth parameters that crystalline $GeO_2$ can be stabilized by the addition of other elements, such as Mg and Zn, and even Al and Ga.

The present disclosure uniquely utilizes these relatively stable forms of octahedral Mg—O bonds and tetrahedral Ge—O bonds to enable growth of $Mg_xGe_yO_z$ layers in forming single crystal structures, using carefully selected substrates. Embodiments also enable doping of the $Mg_xGe_yO_z$ materials in various manners, using properties of the octahedral and tetrahedral bonding sites.

Many possible structures of $Mg_xGe_yO$, were investigated in relation to the present disclosure. FIG. 4 shows an example table 400 of potential single crystal compositions that may be formed from Mg, Ge and O, listed in an order transitioning from $GeO_2$ at the top of the table to MgO at the bottom. In this table, a unit cell is classified according to $Mg_xGe_{1-x}O_{2-x}$ with x ranging from 0 to 1 wherein x=0 represents the binary $GeO_2$ and x=1 the binary MgO. As will be seen, the most stable composition corresponds to x=⅔ with resulting composition $Mg_2GeO_4$. The specific unit cell of the crystal structure comprises a range of unique spatial positions of the Mg and Ge cations as well as the oxygen anions. The space and point group of the specific crystal are determined the atomic arrangement within the unit cell. The general formula in FIG. 4 is used to describe the various configurations possible.

From the possible compositions of Mg, Ge and O such as those shown in FIG. 4, a selection of possible single crystal compositions formed from Mg, Ge and O was modeled, taking into consideration the stability of the compositions. Example single crystal compositions are shown in table 500 of FIG. 5, with the structures of group 510 being the most stable of the structures investigated and those of group 520 being the next most stable. Table 500 shows the relevant space group and symmetry classifications for each composition (or structure). Table 500 also shows the type of bonding for both Ge and Mg, where $T_d$ indicates tetrahedral bonding to 0 atoms, and $O_h$ indicates octahedral bonding to O atoms. For $Mg_{14}Ge_5O_{24}$ the Ge bonding to 0 atoms is a combination of $T_d$ and $O_h$ bonding. The most stable $Mg_xGe_{1-x}O_{2-x}$ structures exhibit crystal symmetry group of the type: x=⅔ Cubic (Fd3m), x=⅔ Orthorhombic (Pnma) and x=½ Monoclinic (C2/c), which were of particular interest.

Density function theory (DFT) calculations using the Tran-Blaha modified Becke-Johnson (TBmBJ) exchange potential can predict the electron energy-momentum (E-k) diagrams, bandgaps, lattice constants, and some mechanical properties of epitaxial oxide materials.

Figure 6:
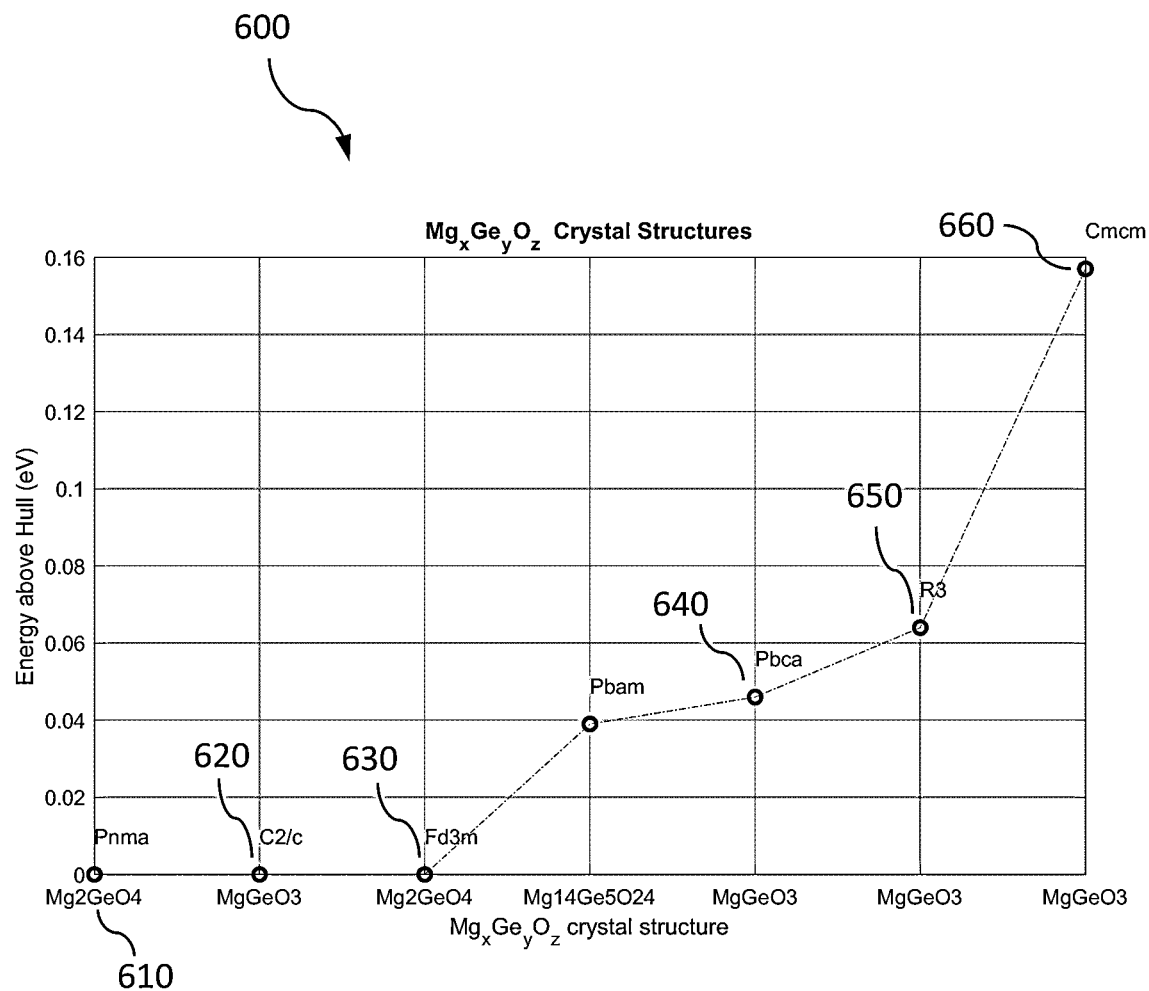
FIG. 6 is a plot showing calculated formation energies of different single crystal compositions formed from Mg, Ge and O (i.e., $Mg_xGe_yO_z$), in accordance with some embodiments.

FIG. 6 illustrates characteristics of the structures of table 500 in graphical form. Plot 600 shows the calculated relative energy above Hull (in electron volts, eV) of different single crystal compositions and space groups formed from Mg, Ge, and O (i.e., $Mg_xGe_yO_z$). Thermodynamically stable compounds exhibit an energy above the convex hull, $E_{hull}$=0.0 eV/atom, and higher values indicate increasing metastability. A value for the energy above Hull of zero represents the most stable crystal form, progressing to less stable forms as the energy above Hull increases (i.e., increasing formation energies). The most stable compositions (i.e., low formation energy) are depicted starting on the left side of the plot 600, with the compositions being less stable (i.e., higher formation energies) progressing toward the right along the plot 600. As can be seen, the single crystal compositions $Mg_2GeO_4$ having Pnma space group (orthorhombic symmetry) at point 610 on plot 600, $MgGeO_3$ having C2/c space group (monoclinic symmetry) at point 620, and $Mg_2GeO_4$ having Fd3m space group (cubic symmetry) at point 630 are equivalent in terms of stability, having thermodynamically stable structures with low formation energy. Plot 600 also illustrates that changing the crystal structure can result in different stability even with the same stoichiometry of $Mg_xGe_yO_z$. For example, $MgGeO_3$ having a crystal structure of having R3 space group (point 650) is less stable than $MgGeO_3$ having Pbca space group (point 640), and $MgGeO_3$ having Cmcm space group (point 660) is even less stable.

Figure 7A:
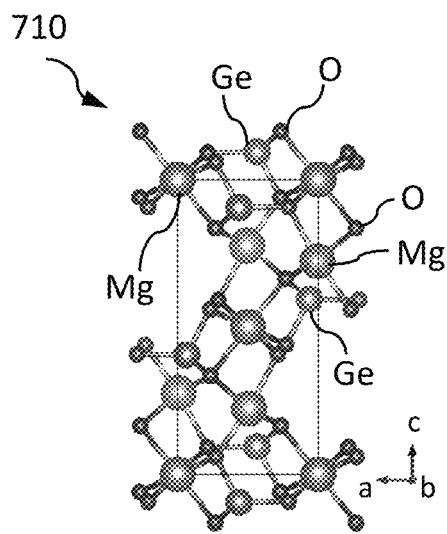
FIG. 7A is a figurative view of the fundamental unit cell defining the single crystal composition of type $Mg_2GeO_4$ (Pnma), in accordance with some embodiments.
Figure 7B:
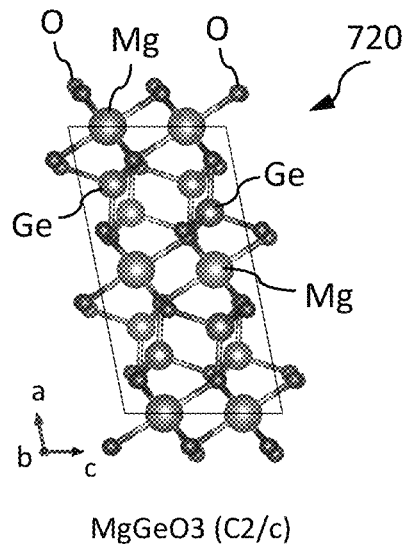
FIG. 7B is a figurative view of the fundamental unit cell defining the single crystal composition of the type $MgGeO_3$ (C2/c), in accordance with some embodiments.
Figure 7C:
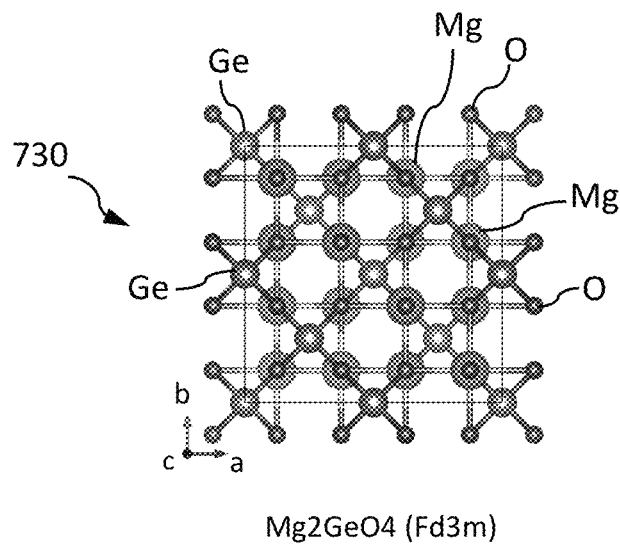
FIG. 7C is a figurative view of the fundamental unit cell defining the single crystal composition of the type $Mg_2GeO_4$ (Fd3m), in accordance with some embodiments.

FIGS. 7A, 7B and 7C are crystal lattice diagrams for examples of $Mg_xGe_yO_z$ that may be formed in single crystal semiconductor structures, in accordance with some embodiments. Each figure shows a fundamental unit cell for single crystal compositions formed from Mg, Ge, and oxygen (O). FIG. 7A is a unit cell 710 for $Mg_2GeO_4$ (Pnma space group), having a bandgap $E_g$ of 6.4066 eV and a formation energy of −163.1986 eV per atom. FIG. 7B is a unit cell 720 for $MgGeO_3$ (C2/c space group), having a bandgap $E_g$ of 5.1694 eV and having a formation energy of −117.6576 eV per atom. FIG. 7C is a unit cell 730 for $Mg_2GeO_4$ (Fd3m space group) having a bandgap $E_g$ of 5.8056 eV and formation energy of −81.9710 eV per atom. Of the three forms depicted, $Mg_2GeO_4$(Fd3m) has the combination of: a bandgap potentially in the UVC band (i.e., approximately 200-280 nm) and exhibiting a direct bandgap, the best formation energy, and being of cubic crystal symmetry which would be expected to be more readily grown by epitaxial methods.

Bandgap characteristics of the forms of $Mg_xGe_yO_z$ in FIGS. 7A, 7B and 7C were calculated and are shown in FIGS. 9A-9B, 10A-10B, and 8A-8B, respectively. FIGS. 8A and 8B show bandgap modeling of the $Mg_2GeO_4$(Fd3m) structure of FIG. 7C. FIG. 8A is an E-k diagram 800 for $Mg_2GeO_4$(Fd3m), showing the calculated valence band 820 and conduction band 810 structure. The diagram 800 shows energy (eV) on the y-axis versus Brillouin-zone (BZ) path along the x-axis. The direct bandgap between the conduction band 810 and the valence band 820 is shown at the Brillouin-zone center, where the bandgap energy Eg is 5.8056 eV. FIG. 8A illustrates that $Mg_2GeO_4$ (Fd3m) is a direct bandgap semiconductor material, where the maximum of the valence band 820 and the minimum of the conduction band 810 occur at the zone center where k=0. FIG. 8B is an enlarged view 825 of the valence band structure. As can be seen in FIG. 8B, the valence band structure in region 827 at the zone center has a relatively large curvature and is parabolic-like, indicating that there will be good mobility (e.g., greater than 1 $cm^2/Vs$, or greater than 10 $cm^2/Vs$, or greater than 100 $cm^2/Vs$) for holes. As also can be seen from FIG. 8A, the Fermi energy ($E_f$=0) is located approximately mid-gap between the valence and conduction bands indicating that $Mg_2GeO_4$ (Fd3m) will be a semiconductor having high resistivity (e.g., an intrinsic or low doped semiconductor).

Figures 9A, 9B:
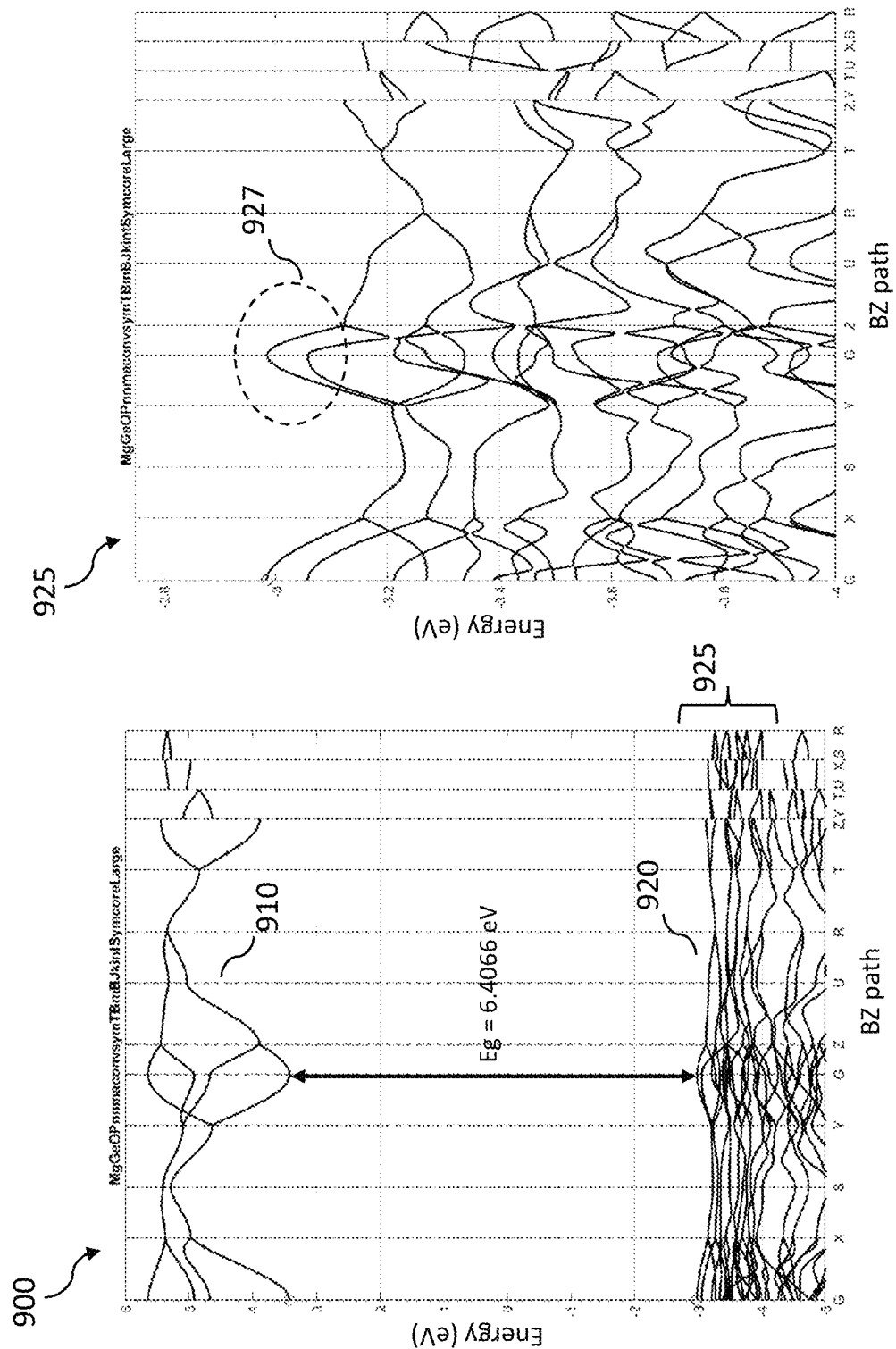
FIG. 9A is an E-k diagram for $Mg_2GeO_4$ (Pnma) showing the calculated valence and conduction band structure at critical points within the Brillouin-zone of the crystal disclosed in FIG. 7A, in accordance with some embodiments.
FIG. 9B is an E-k diagram showing the detailed valence band structure of the E-k diagram for $Mg_2GeO_4$ (Pnma) illustrated in FIG. 9A, in accordance with some embodiments.

FIG. 9A shows an E-k diagram 900 for $Mg_2GeO_4$ (Pnma) (see FIG. 7A), with the calculated valence band 920 and conduction band 910 structure. FIG. 9B is an enlarged view 925 of the valence band structure. The direct bandgap is shown at the Brillouin-zone center, having a bandgap energy $E_g$ of 6.4066 eV. As can be seen, $Mg_2GeO_4$ (Pnma) is a direct bandgap semiconductor material, where the maximum of the valence band and the minimum of the conduction band occur at the zone center where k=0. FIG. 9B illustrates that the valence band structure in region 927 at the zone center has high curvature, which indicates that there will be good mobility for holes. As also can be seen from FIG. 9A, the Fermi energy ($E_f$) is located approximately mid-gap between the valence and conduction bands indicating that $Mg_2GeO_4$ (Pnma) will be a semiconductor having high resistivity (e.g., an intrinsic or low doped semiconductor).

FIG. 10A shows an E-k diagram 1000 for $MgGeO_3$ (C2/c) (see FIG. 7B), with the calculated valence band 1020 and conduction band 1010 structure. FIG. 10B is an enlarged view 1025 of the valence band structure. As can be seen, $MgGeO_3$ (C2/c) is an indirect bandgap semiconductor material as the maximum of the valence band and the minimum of the conduction band occur at different k values and as such would be expected to be a poor optical emitter. That is, in some embodiments the $Mg_xGe_{1-x}O_{2-x}$ is $MgGeO_3$ with a C2/c space group and is an indirect bandgap material. The indirect bandgap is observed for different k-vectors between the conduction band minimum and valence band maximum, with one example being indicated by arrow 1005. As can be seen in FIG. 10B, the valence band structure in region 1027 at the zone center has a curvature, indicating that there will be good mobility for electron holes. As also can be seen from FIG. 10A, the Fermi energy ($E_f$) is located approximately mid-gap between the valence and conduction bands indicating that MgGeO$_3$ (C2/c) will be a semiconductor having high resistivity (e.g., an intrinsic or low doped semiconductor).

Figure 11:
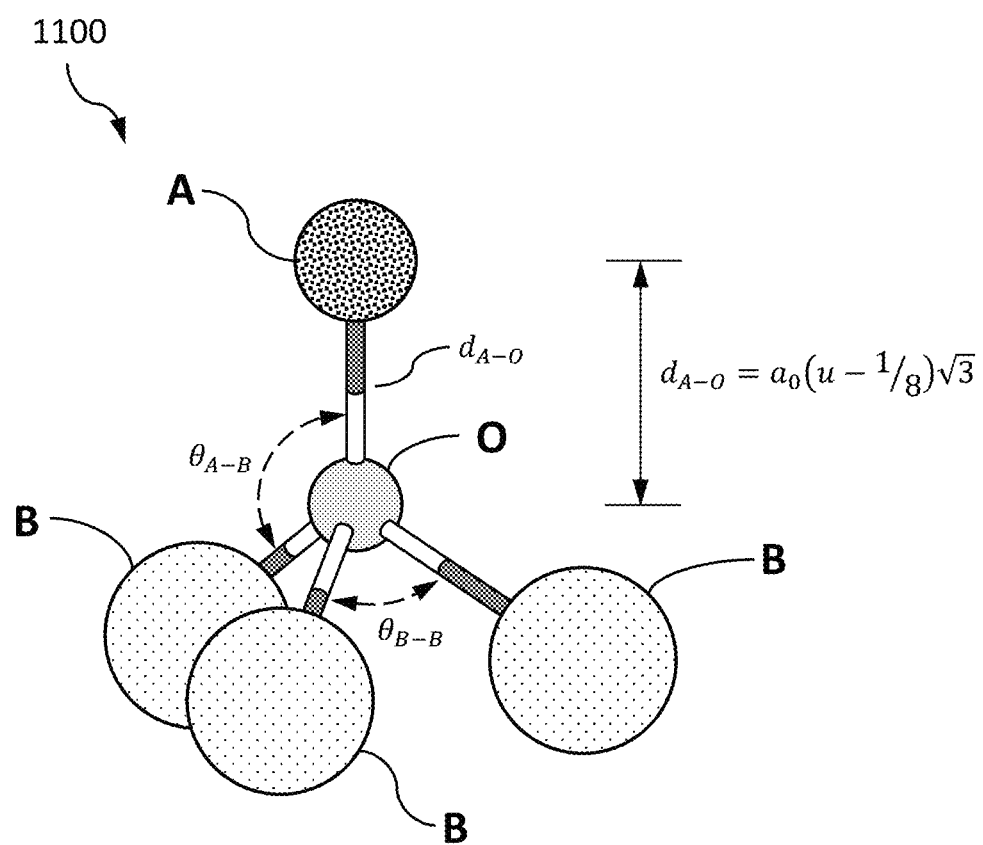
FIG. 11 discloses a local bonding configuration within a Fd3m cubic crystal of the form $AB_2O_4$ where A and B cations are bonded to an oxygen (O) atom, in accordance with some embodiments.

Referring now to FIG. 11, a local tetrahedron bonding configuration 1100 within a Fd3m cubic crystal of the form AB$_2$O$_4$ is shown, where the A and B cations are tetrahedrally and octahedrally bonded to an oxygen (O) atom, respectively. The critical bond length $d_{A-O}$ between the A and O atoms is annotated in FIG. 11. Equation 1 is presented in accordance with the present disclosure to study the stability and cation interchangeability of possible configurations of Mg$_x$Ge$_y$O$_z$ structures. For the case of an ideal Fd3m unit cell, cations in tetrahedral coordination occupy special position 8a (point symmetry 43m at Wyckoff position (⅛, ⅛, ⅛), while the octahedrally coordinated cations reside on special position 16d (point symmetry 3m at (½, ½, ½)). The anions are at equipoint position 32e, which requires one positional parameter u. For u=0.25, an ideal cubic closed packing of anions is realized and therefore variations in u reflect the adjustment of the structure to accommodate cations of different size in octahedral and tetrahedral positions. For example, decreasing values of u below 0.25 moves the anions along [111] direction toward the nearest tetrahedral cation, thereby decreasing the size of the tetrahedron at the extent of the size of the octahedron.

The bond length between the tetrahedral Ge cation and O anion $d_{A-O}$ is given by:

$$d_{A-O} = a_o \left( u - \frac{1}{8} \right) \sqrt{3} \quad \text{(Equation 1)}$$

where $a_0$ is the cubic unit cell lattice constant. For the case of bulk freestanding Fd3m Mg$_2$GeO$_4$ crystal structure it is found that $a_0$=8.3499 Å, $d_{A-O}$=1.8054 Å and thus u=0.2498 Å.

For example, if the B atom has a valence coordination number of +2, such as magnesium (i.e., cation site B=Mg), and the A atom has a valence coordination number of +4, such as germanium (i.e., cation site A=Ge), then the cubic composition AB$_2$O$_4$=GeMg$_2$O$_4$ (i.e., Mg$_2$GeO$_4$) is formed. A consideration in studying growth of Mg$_x$Ge$_y$O$_z$ structures in accordance with the present disclosure is whether Mg$_2$GeO$_4$ will adopt a normal spinel structure, or alternatively will adopt the less stable spinel structure with some interchange between cations on tetrahedral and octahedral sites. That is, a normal spinel structure would be expected to self-assemble exclusively with Mg cations located at octahedral sites and Ge cations located at tetrahedral sites within the crystal and in general enable co-deposition which is desirable for epitaxial growth.

Deformation of the Fd3m unit cell can also alter the oxygen u parameter for example, via biaxial strain during pseudomorphic epitaxial deposition on a lattice mismatched surface. Tetragonal distortion will clearly influence the structural and electronic properties of Mg$_2$GeO$_4$.

Figure 12:
FIG. 12 is a table showing examples of compatible substrates compositions and orientations upon which the single crystal compositions $Mg_2GeO_4$ (Pnma), $MgGeO_3$ (C2/c), and $Mg_2GeO_4$ (Fd3m) may be epitaxially formed, in accordance with some embodiments.

Using these crystal structure considerations, various forms of Mg$_x$Ge$_y$O$_z$ were investigated. In FIG. 12, table 1200 depicts examples of compatible substrates compositions and orientations upon which single crystal compositions 1210 of Mg$_2$GeO$_4$ (Pnma), MgGeO$_3$ (C2/c), Mg$_2$GeO$_4$ (Fd3m) of (001) or (100) orientation may be epitaxially formed. At present in the industry there are no examples of bulk large area single crystal native Mg$_2$GeO$_4$ substrates and therefore heteroepitaxial methods are required. The space group "SG" and crystal symmetry type are listed for each composition. Possible substrates 1230 for the compositions 1210 are disclosed, noting that the seeding substrate may not be ideally lattice matched (i.e., is non-native lattice matching) to the MgGeO composition that is to be epitaxially formed. The crystal structures of the respective unit cells of Mg$_x$Ge$_y$O$_z$ are also disclosed as shown by the unit cell configuration parameters 1220, including the lattice constants a, b, c and angles α, β, γ. The magnitude of lattice mismatch between the Mg$_x$Ge$_y$O$_z$ film and substrate are preferably selected to enable the growth of single crystal epitaxial films with low defect density.

In some embodiments, the crystal symmetry of the substrate material may be cubic or tetrahedral. In some embodiments, the substrate material comprises MgO(001), MgGa$_2$O$_4$(001), MgAl$_2$O$_4$(001), or LiF(100). In some embodiments, the substrate material comprises β-Ga$_2$O$_3$ (100), LiAlO$_2$(100), ZrO$_2$(100), LiNbO$_3$(001), LiTaO$_3$ (001), Fe$_2$O$_3$(100), BN(001), LiGaO$_2$(001), TiO$_2$(001), AlN (100), SiC(100), BaF$_2$(100), BN(100), or CdWO$_4$(001).

Schematics of single crystal structures of Mg$_x$Ge$_y$O$_z$ films (i.e., epitaxial layers) on substrates are depicted in FIGS. 13A-13B and 14A-14B, where the substrate materials are chosen (i.e., pre-determined) for their compatibility with the type of Mg$_x$Ge$_y$O$_z$ being grown.

Figure 13A:
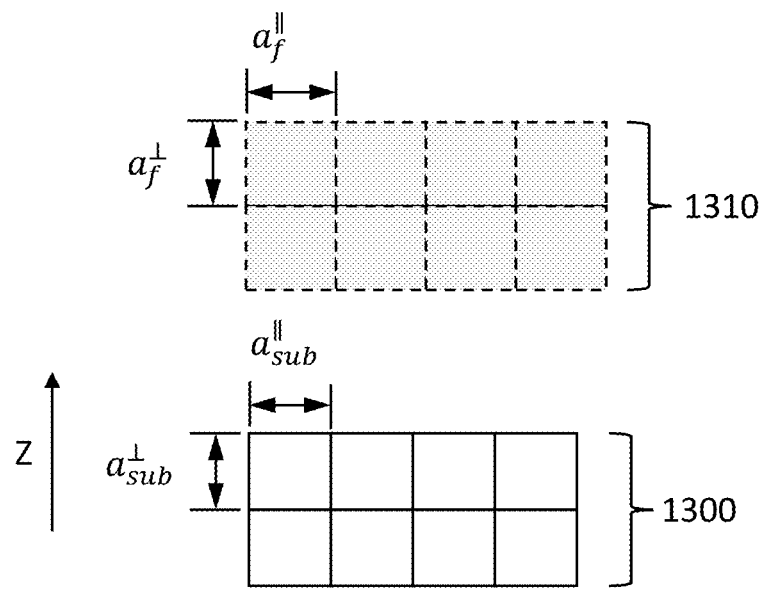
FIG. 13A is a schematic diagram showing two distinct free-standing crystal structures corresponding to a film and a substrate, both having a cubic or tetrahedral symmetry, where the film has a larger parallel (i.e., in-plane) lattice constant than the substrate ($a_f^{\|} > a_{sub}^{\|}$), in accordance with some embodiments.

FIG. 13A is a schematic diagram showing two distinct free-standing crystal structures corresponding to a film 1310 and a substrate 1300 both having a cubic or tetrahedral symmetry. The growth direction Z is shown. The film 1310 has a larger in-plane lattice constant (also referred to as a parallel lattice constant) than the substrate; that is, $a_f^\parallel > a_{sub}^\parallel$. It is noted that free-standing cubic crystals exhibit equal in-plane and perpendicular lattice constants $a_i^\parallel = a_i^\perp$, where i={sub, film}. That is, prior to the formation of any epitaxial layer (i.e., if the film material is in a free-standing state, not grown on the substrate), the parallel and perpendicular lattice constants of the film will be equal to each other ($a_f^\parallel = a_f^\perp$) due the cubic or tetrahedral ($a_f^\parallel \neq a_f^\perp$) symmetry of the film material. Similarly, the parallel and perpendicular lattice constants of the substrate ($a_{sub}^\parallel = a_{sub}^\perp$) will be equal due to the cubic or tetrahedral symmetry of the substrate.

Figure 13B:
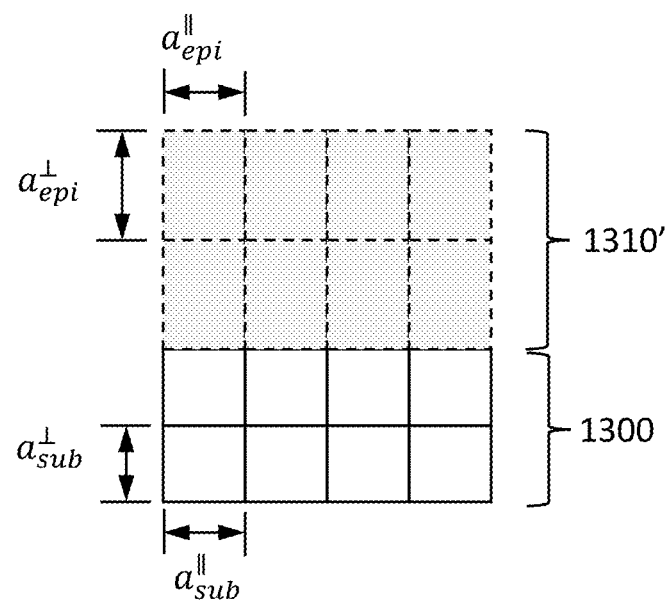
FIG. 13B is a schematic diagram showing the effect of epitaxially forming a layer having cubic symmetry on a substrate also having cubic symmetry as shown in FIG. 13A, where the free-standing in-plane lattice constant of the original film is greater than the in-plane lattice constant of the substrate, in accordance with some embodiments.

FIG. 13B is a schematic diagram showing the film 1310 of FIG. 13A epitaxially grown on the substrate 1300. FIG. 13B illustrates the effect of epitaxially forming a layer having cubic symmetry on a substrate that also has cubic symmetry, where the free-standing in-plane lattice constant of the film is greater than the in-plane lattice constant of the substrate. Upon forming the epitaxial layer 1310', the film material will elastically deform and will be in a strained state as compared to its free-standing (or relaxed) state (film 1310) so that the parallel or in-plane lattice constant of the epitaxial layer ($a_{epi}^\parallel$) will match the parallel or in-plane lattice constant of the substrate 1300 (i.e., $a_{epi}^\parallel = a_{sub}^\parallel$, with $a_{epi}^\parallel \leq a_f^\parallel$). The resulting epitaxial layer 1310' is formed in compression. Due to the Poisson effect, this deformation will result in the perpendicular lattice constant $a_{epi}^\perp$ of the resulting epitaxial layer 1310' to be increased, being greater than the perpendicular lattice constant of the original film material (i.e., $a_{epi}^\perp > a_f^\perp$) according to the Poisson's ratio for the material.

Accordingly, a high-quality epitaxial layer may be formed via elastic deformation of the film unit cell during growth to accommodate the in-plane lattice mismatch. This is defined herein as pseudomorphic epitaxy. FIGS. 13A-13B illustrate that designing semiconductor structures in which both the epitaxial layers and substrates have cubic and tetrahedral symmetry can be used advantageously in accordance with embodiments of the present disclosure. In some embodiments, the substrate and film have cubic or tetrahedral crystal symmetries such that the in-plane lattice constants are equal ($a_f^\parallel = a_f^\perp$ and $a_{sub}^\parallel = a_{sub}^\perp$), and the in-plane lattice constants of the film are greater than those of the substrate ($a_f^\parallel > a_{sub}^\parallel$) In such cases, the perpendicular lattice constant of the epitaxial film will be increased when grown on the substrate, resulting in the film generally accumulating in-plane compressive stress. Furthermore, compression was observed in some cases to facilitate growth of the epitaxial layers.

Figure 14A:
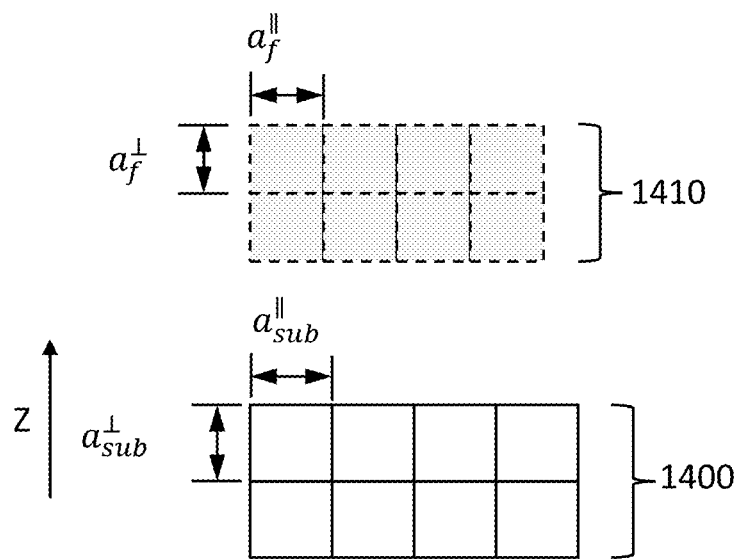
FIG. 14A is a schematic diagram showing two distinct free-standing crystal structures corresponding to a film and a substrate, both having a cubic or tetrahedral symmetry, where the film has a smaller in-plane lattice constant than the substrate ($a_f^{\|} < a_{sub}^{\|}$), in accordance with some embodiments.
Figure 14B:
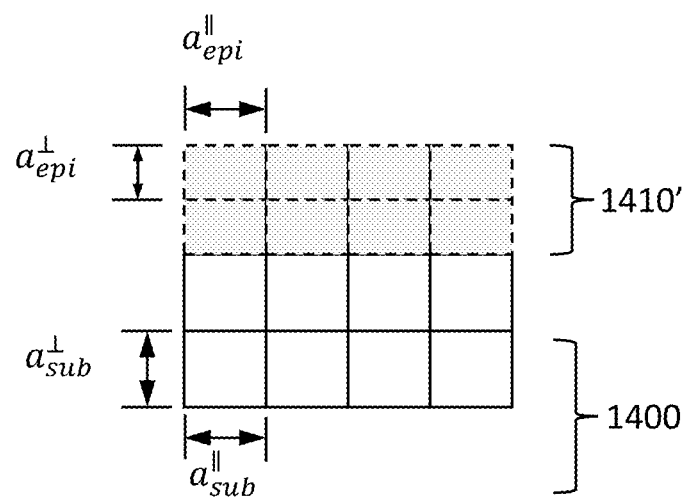
FIG. 14B is a schematic diagram showing the effect of epitaxially forming a layer having cubic symmetry on a substrate also having cubic symmetry as shown in FIG. 14A, where the free-standing in-plane lattice constant of the original film is less than the in-plane lattice constant of the substrate, in accordance with some embodiments.

FIGS. 14A-14B are similar to FIGS. 13A-13B, but with the epitaxial layer being strained in tension. FIG. 14A is a schematic diagram showing two distinct free-standing crystal structures corresponding to a film 1410 and a substrate 1400, both having a cubic or tetrahedral symmetry. The film 1410 has a smaller in-plane (i.e., parallel) lattice constant than the substrate 1400; that is, $a_f^\parallel < a_{sub}^\parallel$. Prior to the formation of any epitaxial layer, the parallel and perpendicular lattice constants of the film will be equal ($a_f^\parallel = a_f^\perp$), and similarly, the parallel and perpendicular lattice constants of the substrate will be equal ($a_{sub}^\parallel = a_{sub}^\perp$) due to the cubic or tetrahedral symmetry of the materials.

FIG. 14B is a schematic diagram showing the effect of epitaxially forming a layer having a cubic (or tetrahedral) symmetry on a substrate that also has a cubic (or tetrahedral) symmetry, where the free-standing in-plane lattice constant of the original film 1410 is less than the in-plane lattice constant of the substrate 1400 (i.e., $a_f^\parallel < a_{sub}^\parallel$ such as shown in FIG. 14A). Upon forming the epitaxial layer 1410', the film material will elastically deform so that the in-plane lattice constant $a_{epi}^\parallel$ will match the in-plane lattice constant of the substrate (i.e., $a_{epi}^\parallel = a_{sub}^\parallel$, with $a_{epi}^\parallel > a_f^\parallel$). Due to the Poisson effect, this deformation will cause the perpendicular lattice constant of the resulting epitaxial layer to be reduced to less than the perpendicular lattice constant of the original film material (i.e., $a_{epi}^\perp < a_f^\perp$). The elastic tetragonal distortion of the film unit cell due to matching the in-plane lattice constant with that of the substrate results in a reduction of the film perpendicular lattice constant (i.e., $a_{epi}^\perp < a_f^\perp$). The resulting epitaxial layer is formed in tension, where the layer in general accumulates in-plane tensile stress.

Figure 15A:
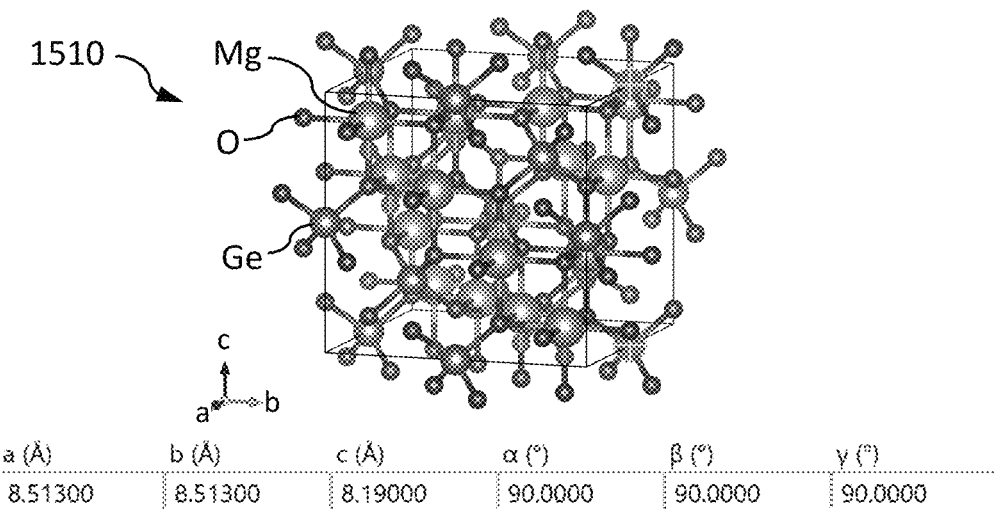
FIG. 15A depicts a unit cell of cubic Fd3m $Mg_2GeO_4$ crystal elastically deformed equally along the in-plane a-b axes, matched to twice the lattice constant of a free-standing cubic MgO crystal, in accordance with some embodiments.
Figure 15B:
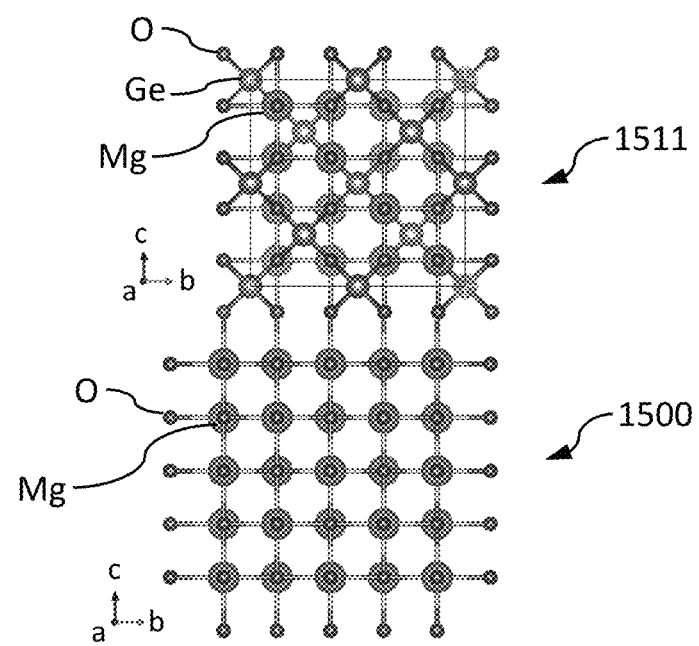
FIG. 15B is a figurative diagram of the lattice mismatched formation of an epitaxial layer of $Mg_2GeO_4$ (Fd3m) formed on a substrate comprising cubic magnesium-oxide MgO (001), showing that the in-plane lattice constant of the film is approximately matched to an integer multiple of the smaller MgO unit cell, in accordance with some embodiments.

FIGS. 15A-15B show crystal structure diagrams of cubic Fd3m $Mg_2GeO_4$ crystal 1510, alone and formed on a substrate 1500. In FIG. 15A, a unit cell of cubic Fd3m $Mg_2GeO_4$ crystal 1510 is elastically deformed equally along the in-plane a- and b-axes, matched to twice the lattice constant of a free-standing cubic MgO crystal. That is, the $Mg_2GeO_4$ crystal 1510 has tensile biaxial strain matched to MgO (001). The crystal symmetry of the cubic Fd3m space group from this tensile elastic deformation is tetragonally deformed into a new I4amd space group. The lattice constants a, b, and c in Angstroms (Å) are disclosed in FIG. 15A, along with the angles α, β, γ.

FIG. 15B is a figurative diagram of lattice mismatched formation of the epitaxial layer 1511 of $Mg_2GeO_4$ (Fd3m) crystal formed on a substrate 1500 of cubic MgO (001) showing that the in-plane lattice constant of the film is approximately matched to an integer multiple of the smaller MgO unit cell. In this example, the epitaxial layer 1511 will have tetragonal symmetry with space group I4amd. In this example, formation of the epitaxial layer results in 2 times unit cell matching where $2 \times a_{MgO} > a_{Mg2GeO4}$ resulting in the $Mg_2GeO_4$ (Fd3m) epitaxial layer 1511 being formed in a state of tension on the MgO substrate 1500.

FIGS. 16 and 17 show the effect of strain on bandgap, for an epitaxial layer of cubic $Mg_2GeO_4$ (Fd3m) on different cubic substrate materials. FIG. 16 is an electronic band structure E-k diagram 1600 for an epitaxial layer of cubic space group Fd3m $Mg_2GeO_4$ formed on a substrate or rigid layer of cubic Fd3m space group magnesium aluminate $MgAl_2O_4$. In this example, the lattice constant mismatch of $Mg_2GeO_4$ and $MgAl_2O_4$ is ~+2.2% resulting in a compressive in-plane stress and the $Mg_2GeO_4$ is formed in a state of compression. The epitaxial layer of cubic space group Fd3m $Mg_2GeO_4$ still has a direct bandgap, and the minimum of the conduction band 1610 and the maximum of the valence band 1620 occurs at the Brillouin-zone center where k=0 as was the case for the unstrained $Mg_2GeO_4$ Fd3m of FIG. 8A. However, the bandgap $E_g$ of the compressively deformed or strained $Mg_2GeO_4$ layer at the zone center in diagram 1600 has increased to 6.004 eV, in contrast to an $E_g$ of 5.8056 eV in FIG. 8A.

FIG. 17 is an electronic band structure E-k diagram 1700 for an epitaxial layer of cubic space group Fd3m $Mg_2GeO_4$ formed on a substrate or rigid layer of cubic Fd3m space group magnesium oxide MgO. In this example, the lattice constant mismatch of $Mg_2GeO_4$ and MgO is ~−1.9% resulting in a tensile in-plane stress, i.e., the $Mg_2GeO_4$ is formed in tension. The strained $Mg_2GeO_4$ bandgap $E_g$ between conduction band 1710 and valence band 1720 at the Brillouin-zone center is observed to decrease to 5.806 eV compared to FIG. 16.

As can be understood by this disclosure, compatible (i.e., having low lattice mismatch) combinations of $Mg_xGe_yO_z$ crystal structures and substrate materials are disclosed that enable epitaxial layers of $Mg_xGe_yO_z$ to be formed as an epitaxial single crystal structure with the substrates. In embodiments, the epitaxial oxide materials and the substrate materials are selected such that epitaxial layers of a semiconductor structure have in-plane (i.e., parallel with the surface of the substrate) lattice constants (or crystal plane spacings) that are within 0.5%, 1%, 1.5%, 2%, 5% or 10% of an in-plane lattice constant (or crystal plane spacing) of the substrate.

Doping

Embodiments provide for the doping of $Mg_xGe_yO_z$, which enables the materials to be used as epitaxial layers in various types of electronic and optoelectronic devices, such as n-type or p-type layers. In various embodiments, the $Mg_xGe_yO_z$ may be a direct bandgap material or an indirect bandgap material. In some embodiments, the direct bandgap material $Mg_2GeO_4$ (Fd3m) is doped. In the crystal structure of $Mg_2GeO_4$ (Fd3m), Ge-sites have tetrahedral ($T_d$) bonding to oxygen and the Mg-sites have octahedral ($O_h$) bonding to oxygen. The following are some of the embodiments in this disclosure:

Ga doping can potentially substitute for $Ge_{Td}$ site with calculations showing that $Ge_{Td}$ sites (e.g., all single $Ge_{Td}$ sites) substituted with $Ga_{Td}$ site result in a direct bandgap p-type material.

Ga doping can potentially substitute for $Mg_{Oh}$ site with calculations showing that $Mg_{Oh}$ sites (e.g., all single $Mg_{Oh}$ sites) substituted with $Ga_{Oh}$ site result in a direct bandgap n-type material.

Al doping can potentially substitute for $Mg_{Oh}$ site with calculations showing that this results in a direct bandgap n-type material.

Al doping can potentially substitute for $Ge_{Td}$ site with calculations showing that this results in a direct bandgap p-type material.

Li doping can potentially substitute for $Ge_{Td}$ or $Mg_{Oh}$ sites with calculations showing a direct bandgap p-type material.

Ni doping can potentially substitute for $Mg_{Oh}$ sites with calculations showing the formation of defect bands and a reduced bandgap.

N doping can potentially substitute for O sites with calculations showing a direct bandgap p-type material.

Anti-site substitution can be implemented within a unit cell, with calculations showing a p-type material. Anti-site substitution may involve Mg and Ge atoms being switched out for each other, which results in $Ge_{Td}$ atoms being placed at an octahedral bonding site ($Ge_{Td} \rightarrow Ge_{Oh}$) and $Mg_{Oh}$ atoms being placed at a tetrahedral bonding site ($Mg_{Oh} \rightarrow Mg_{Td}$).

Doping can be achieved with either excess Mg or excess Ge.

Although embodiments shall be described using $Mg_2GeO_4$ as an example, the embodiments may apply to other forms of $Mg_xGe_{1-x}O_{2-x}$. Methods of doping an epitaxial layer of $Mg_xGe_{1-x}O_{2-x}$ include co-depositing materials onto the substrate to form the epitaxial layer of $Mg_xGe_{1-x}O_{2-x}$, with x having a value of $0 \leq x < 1$. The materials comprise at least two elements selected from Mg, Ge and oxygen in accordance with the value of x; the Mg, Ge and oxygen being supplied by a Mg source, a Ge source, and an activated oxygen source, respectively. Methods may include depositing a buffer layer between the substrate and the epitaxial layer of $Mg_xGe_{1-x}O_{2-x}$. The co-depositing may be performed using a molecular beam epitaxy process.

Referring now to FIGS. 18A and 18B, tables are shown of the normalized x, y and z positions in Cartesian coordinates of cation (i.e., Mg and Ge) sites (FIG. 18A) and anion (i.e., O) sites (FIG. 18B) for the $Mg_2GeO_4$ (Fd3m) unit cell as will be referred to throughout the present disclosure. In this example, the cation unit cell comprises 16 distinct Mg sites ($Mg_i$, i=0-15) and 8 distinct Ge sites ($Ge_j$, j=16-23). The anion unit cell comprises 32 distinct sites ($O_k$, k=24-55). FIGS. 18A-18B thus disclose the crystal structure of $Mg_2GeO_4$ (Fd3m), in accordance with embodiments of the present disclosure.

In some embodiments, $Ge_{Td}$ sites can be substituted with Ga atoms (resulting in $Ga_{Td}$ sites) to create a direct bandgap p-type material, as shall be described in FIGS. 19-21B. FIG. 19 is a table 1900 summarizing the semiconductor properties of single site trivalent gallium impurity atom substitution in $Mg_2GeO_4$ (Fd3m) arising from various single site substitutions of Ge sites with Ga. Shown in table 1900 is the particular Ge site 1910 that is being substituted, corresponding to the $Ge_i$ cation site of FIG. 18A. For example, in the first row of table 1900, Ge site "Ge16" is substituted with a Ga atom, becoming a Ga site "Ga16." Also shown in table 1900 are the normalized x, y and z coordinates and calculated semiconductor properties such as the bandgap classification 1920 and bandgap energy value 1925, the type of semiconductor 1930 ($E_{fermi}$) and the formation energy 1940 ($E_{Formation}$). As can be seen, for the various Ge sites indicated, the resulting doped $Mg_2GeO_4$ (Fd3m) is a direct bandgap p-type material. Embodiments include semiconductor structures and devices in which an epitaxial layer of $Mg_xGe_{1-x}O_{2-x}$ is a direct bandgap p-type material and comprises a Ga dopant (e.g., Ga atoms). The Ga dopant is located in a Ge site of a corresponding undoped (i.e., the corresponding undoped structure is the nominal $Mg_xGe_{1-x}O_{2-x}$ structure that is not doped) $Mg_xGe_{1-x}O_{2-x}$ crystal structure. Methods of doping an epitaxial layer of $Mg_xGe_{1-x}O_{2-x}$ include substituting a Ge site of a corresponding undoped $Mg_xGe_{1-x}O_{2-x}$ crystal structure with Ga to result in a p-type conductivity.

Figure 20:
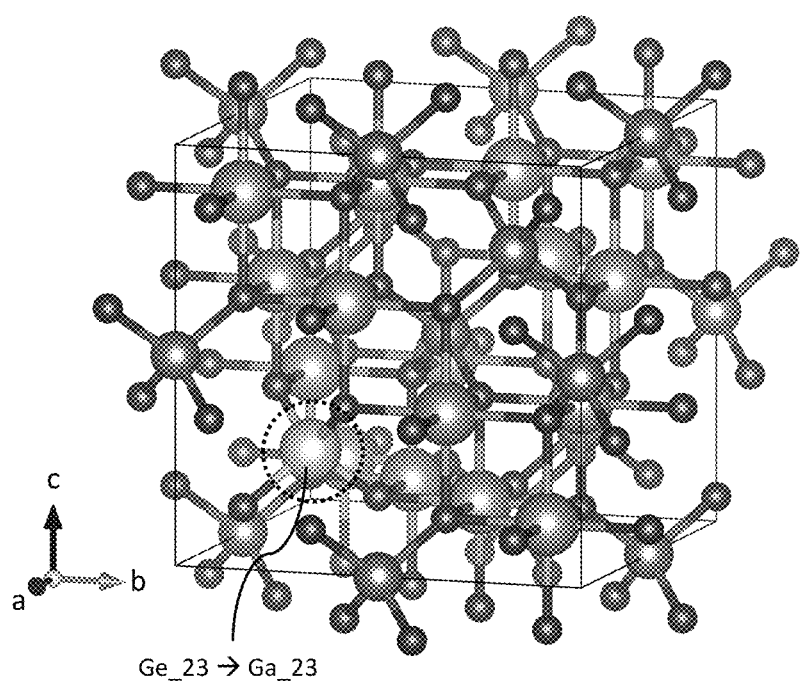
FIG. 20 is a crystal structure diagram of a Ga-doped $Mg_2GeO_4$ (Fd3m), showing in this example the $Ge_{23}$ site substituted with Ga, in accordance with some embodiments.
Figures 21A, 21B:
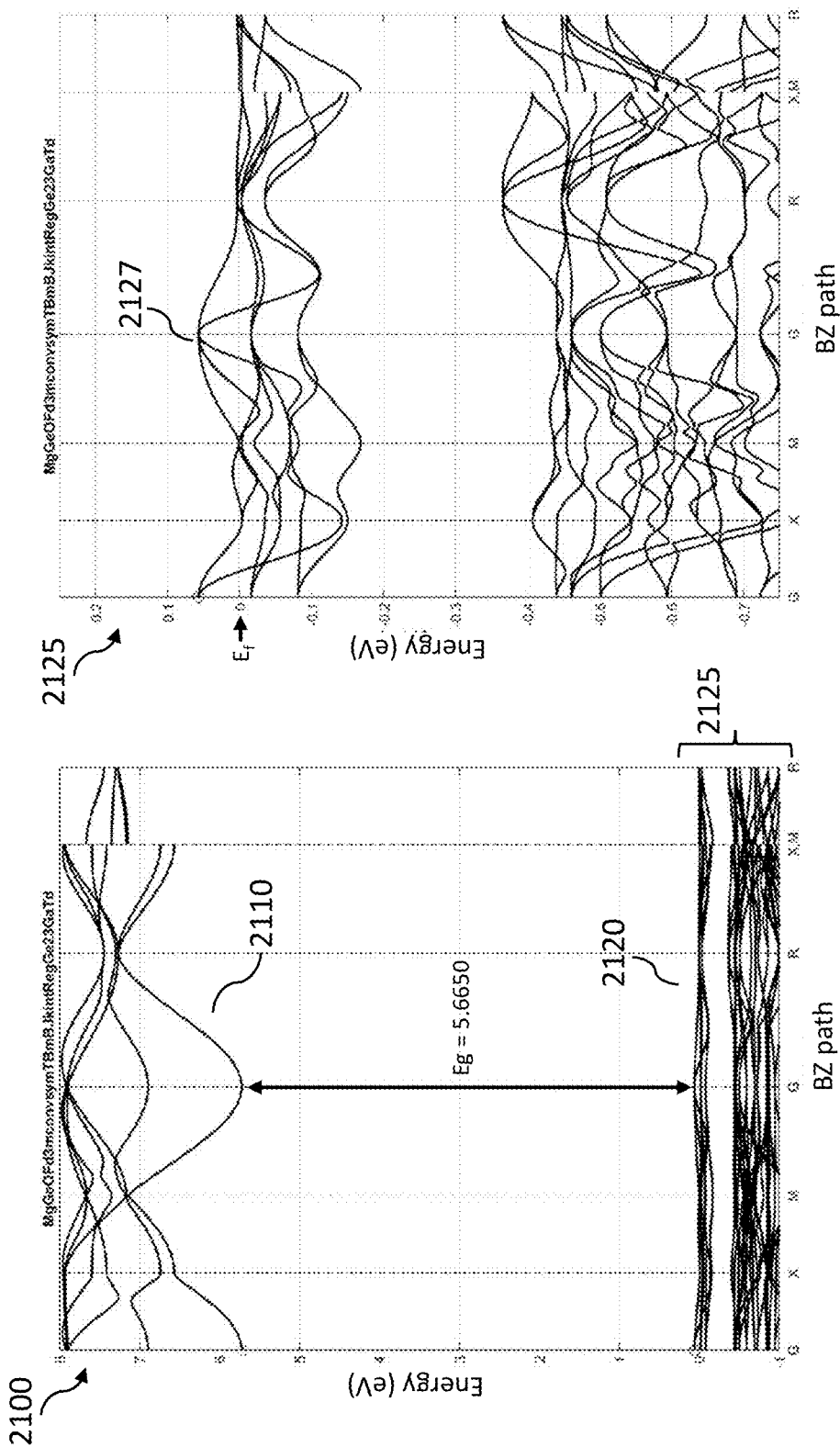
FIG. 21A is an E-k diagram for the doped $Mg_2GeO_4$ (Fd3m) illustrated in FIG. 20, showing the valence and conduction band structure, in accordance with some embodiments.
FIG. 21B is an E-k diagram showing a detailed view of the valence band structure illustrated in FIG. 21A, in accordance with some embodiments.

FIG. 20 shows a crystal structure diagram of a doped $Mg_2GeO_4$ (Fd3m) showing in this example the $Ge_{23}$ site substituted with Ga. FIGS. 21A and 21B show E-k diagrams for $Mg_2GeO_4$ (Fd3m) arising from the Ge site substitution with Ga illustrated in FIG. 20. The diagram 2100 of FIG. 21A shows the valence band 2120 and conduction band 2110 structure, and diagram 2125 of FIG. 21B shows an enlarged view of the valence band structure. As can be seen, the doped $Mg_2GeO_4$ (Fd3m) is a direct bandgap semiconductor material where the maximum of the valence band 2120 and the minimum of the conduction band 2110 occur at the zone center at k=0. As best seen in FIG. 21B, the maximum 2127 of the valence band is above the Fermi energy ($E_f$) indicating that the doped $Mg_2GeO_4$ (Fd3m) in this example is a p-type material. In summary, the degenerate Fermi energy $E_f$ is located within the valence band and the direct bandgap energy is reduced by ~140 meV, being Eg=5.6650 eV for this Ge-site substituted form compared to an $E_g$ of 5.8056 eV for the undoped case in FIG. 8A. The doped $Mg_2GeO_4$ (Fd3m) still has an ultrawide bandgap, being greater than 4 eV.

Figures 23, 24:
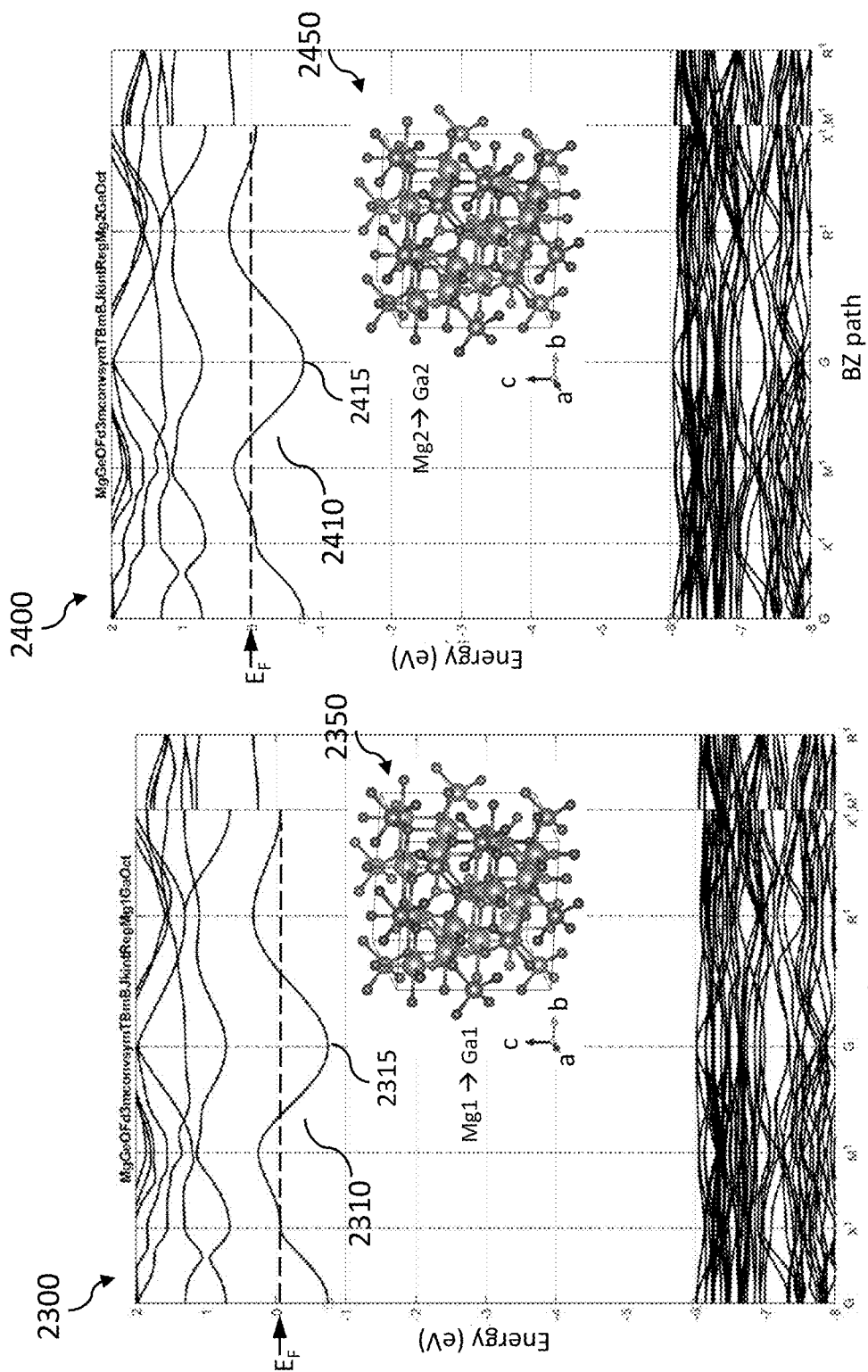
FIG. 23 is a crystal structure diagram and associated E-k diagram of a doped $Mg_2GeO_4$ (Fd3m), showing in this example the $Mg_1$ site substituted with Ga, in accordance with some embodiments.
FIG. 24 is a crystal structure diagram and associated E-k diagram of a doped $Mg_2GeO_4$ (Fd3m), showing in this example the $Mg_2$ site substituted with Ga, in accordance with some embodiments.

In some embodiments, $Mg_{Oh}$ sites can be substituted with Ga (resulting in $Ga_{Oh}$ sites) to create a direct bandgap n-type material, as shall be described in FIGS. 22-24. In FIG. 22, table 2200 discloses calculated semiconductor properties of Ga-doped $Mg_2GeO_4$ (Fd3m) arising from various single site substitutions of distinct Mg sites with Ga. Shown in table 2200 are the Mg sites 2210 that are being substituted and their normalized x, y and z coordinates. Example semiconductor properties such as the bandgap classification 2220 and bandgap energy 2225, type of semiconductor 2230 and the formation energy 2240 are shown for selected substitution cases. The semiconductor properties shown have values that are very similar to each other; the other substitution embodiments shown in table 2200 are expected to exhibit similar results. As can be seen, for the various Mg sites indicated, the resulting doped $Mg_2GeO_4$ (Fd3m) is a direct bandgap n-type material. That is, the single site substitution of a trivalent cation at a divalent Mg site results in n-type conductivity. Embodiments include semiconductor structures and devices in which an epitaxial layer of $Mg_xGe_{1-x}O_{2-x}$ is a direct bandgap n-type material and comprises a Ga dopant (e.g., Ga atoms). The Ga dopant is located in a Mg site of a corresponding undoped (i.e., compared to a nominal) $Mg_xGe_{1-x}O_{2-x}$ crystal structure. Methods of doping an epitaxial layer of $Mg_xGe_{1-x}O_{2-x}$ include substituting a Mg site of a corresponding undoped $Mg_xGe_{1-x}O_{2-x}$ crystal structure with Ga to result in an n-type conductivity.

FIG. 23 shows a crystal structure diagram 2350 of a doped $Mg_2GeO_4$ (Fd3m) in which for this example the $Mg_1$ site is substituted with Ga. Also shown in FIG. 23 is the associated E-k diagram 2300 for the n-type doped semiconducting material. As can be seen, the resulting doped $Mg_2GeO_4$ (Fd3m) is a direct bandgap semiconductor material. The minimum 2315 of the conduction band 2310 is below the Fermi energy ($E_f$) indicating that the doped $Mg_2GeO_4$ (Fd3m) in this example is a n-type material.

FIG. 24 is similar to FIG. 23, but for the $Mg_2$ site substituted with Ga. FIG. 24 includes a crystal structure diagram 2450 of a doped $Mg_2GeO_4$ (Fd3m) and the associated E-k diagram 2400 for the n-type doped semiconducting material. As can be seen, the resulting doped $Mg_2GeO_4$ (Fd3m) is a direct bandgap semiconductor material, and the minimum 2415 of the conduction band 2410 is below the Fermi energy ($E_f$) indicating that the doped $Mg_2GeO_4$ (Fd3m) in this example is a n-type material.

Figure 25:
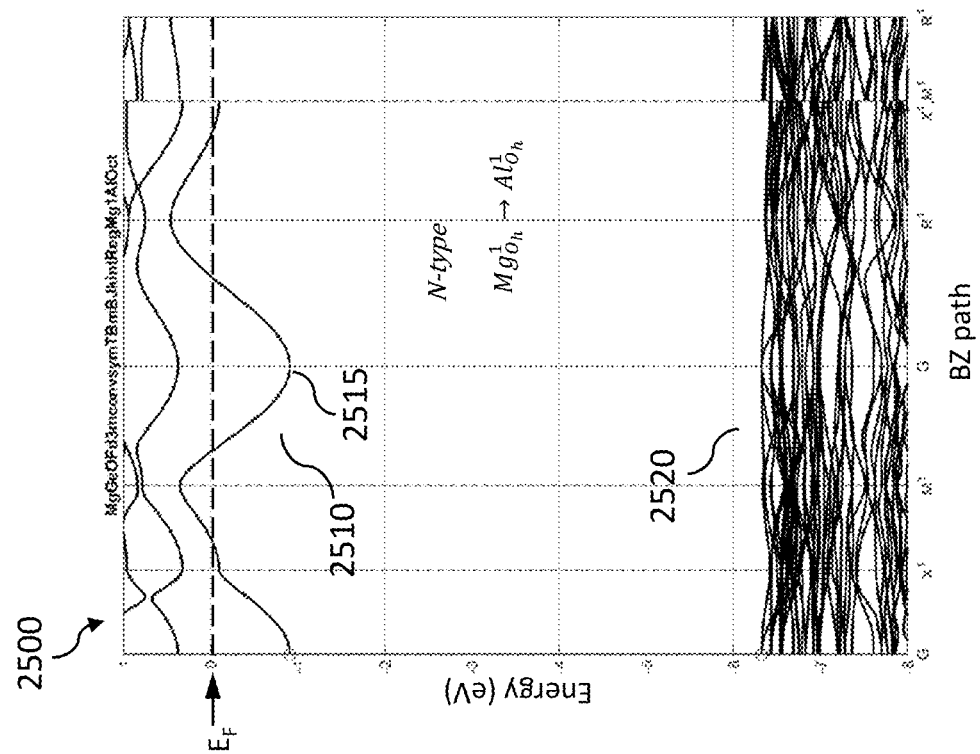
FIG. 25 is an E-k diagram for a doped $Mg_2GeO_4$ (Fd3m) arising from the octahedral $Mg_1$ site being substituted with trivalent Al, in accordance with some embodiments.
Figure 42A:
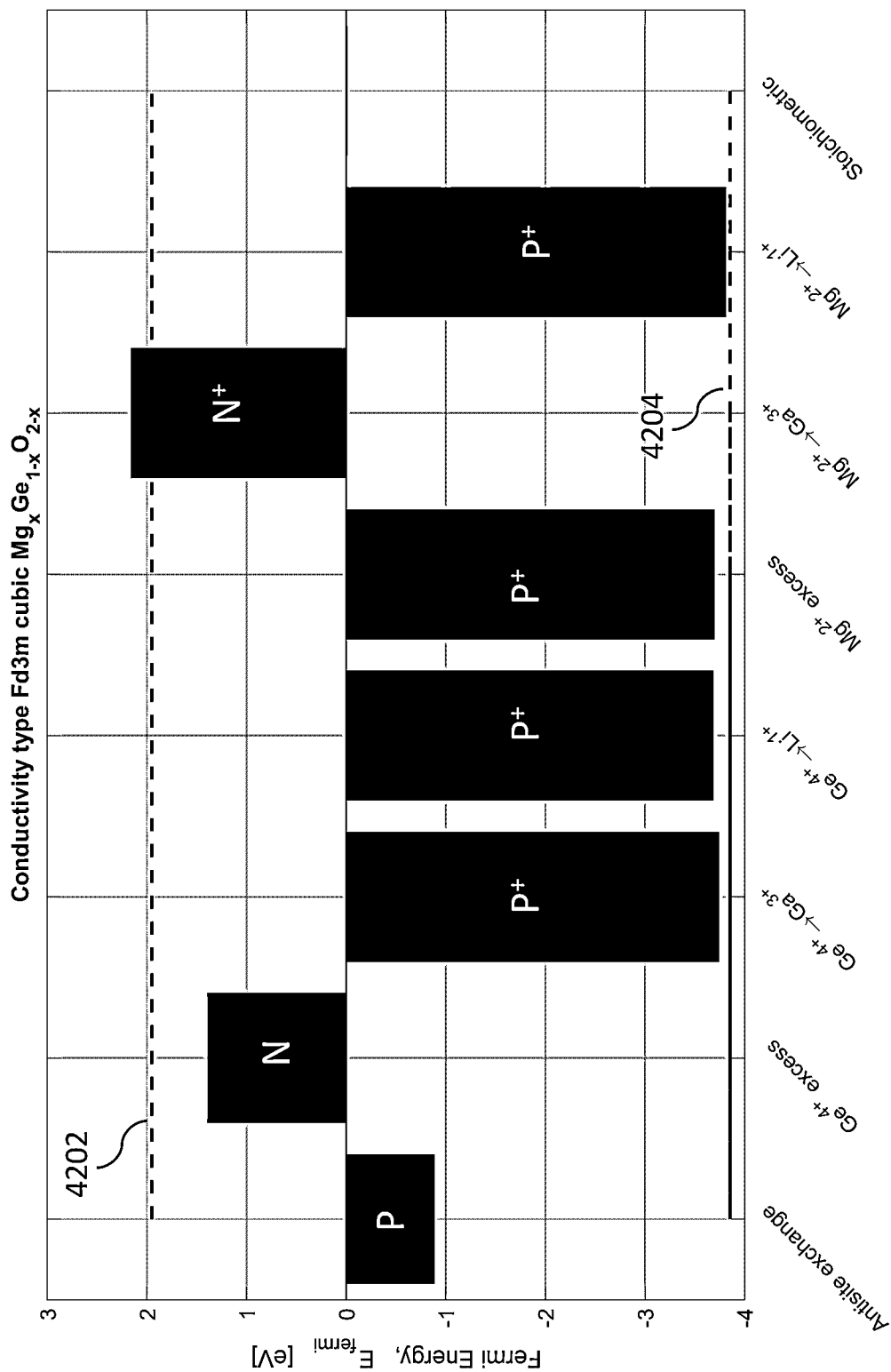
FIG. 42A is a diagram of possible conductivity types (n-type or p-type) using the doping strategies disclosed herein, for the case of $Mg_2GeO_4$ (Fd3m), in accordance with various embodiments.
Figure 42B:
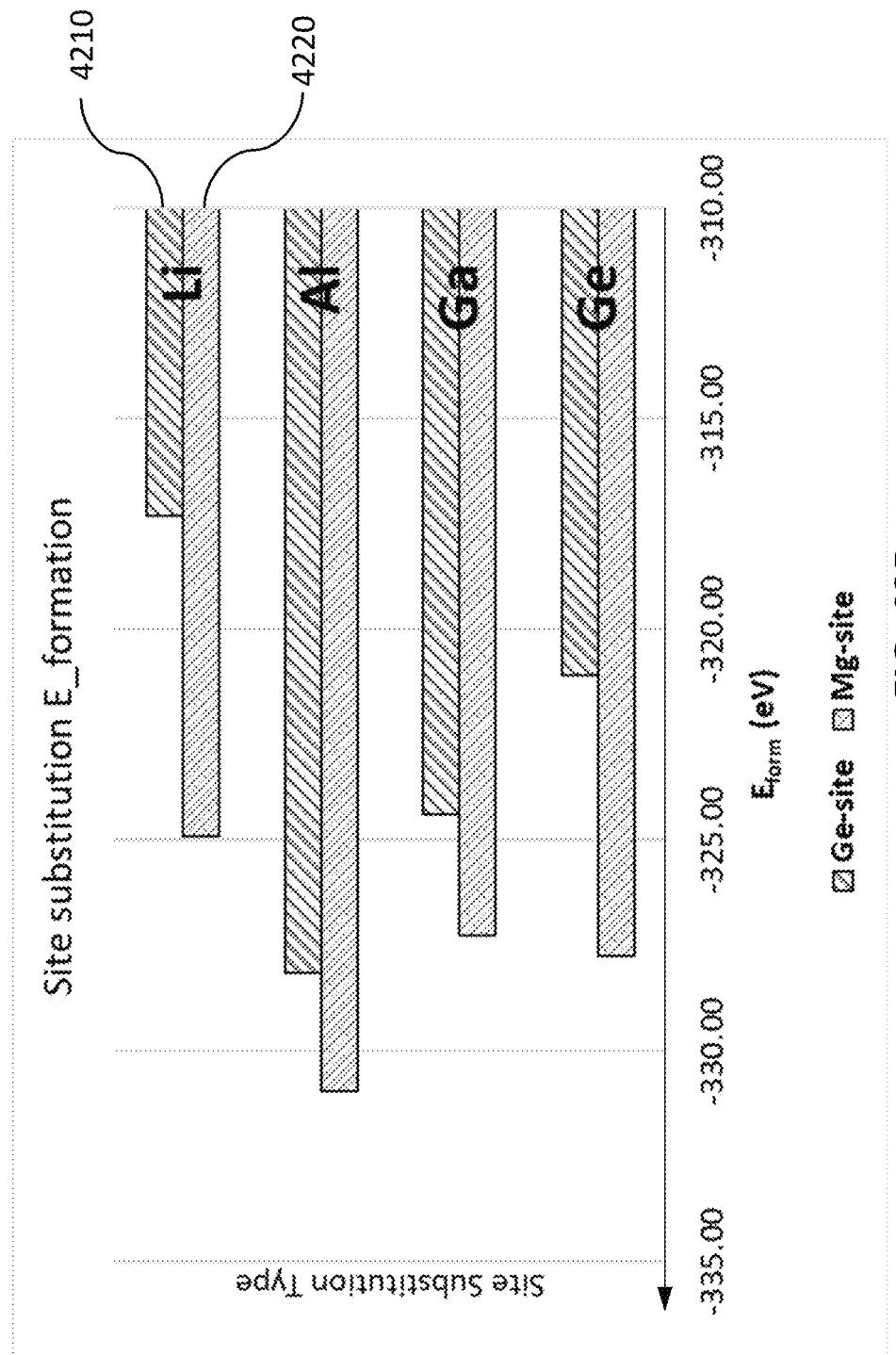
FIG. 42B is a diagram showing relative formation energies for selected substitutional impurity doping of the Mg-site or Ge-site in $Mg_2GeO_4$ (Fd3m), in accordance with some embodiments.

In some embodiments, Al may be substituted at $Mg_{Oh}$ sites to create a direct bandgap n-type material by, in one example, co-deposition using an additional elemental aluminum source (e.g., see FIG. 42B). FIG. 25 is an E-k diagram 2500 showing the valence band 2520 and conduction band 2510 structure for a doped $Mg_2GeO_4$(Fd3m) arising from the octahedral $Mg_1$ site being substituted with Al. As can be seen, the resulting doped $Mg_2GeO_4$(Fd3m) is a direct bandgap semiconductor material. The minimum 2515 of the conduction band 2510 is below the Fermi energy ($E_f$), indicating that the doped $Mg_2GeO_4$ (Fd3m) in this example is a n-type material. That is, the Fermi energy is positioned within the conduction band 2150 and is expected to exhibit n-type conductivity. Embodiments include semiconductor structures and devices in which an epitaxial layer of $Mg_xGe_{1-x}O_{2-x}$ is a direct bandgap n-type material and comprises an Al dopant (e.g., Al atoms). The Al dopant is located in a Mg site of a corresponding undoped $Mg_xGe_{1-x}O_{2-x}$ crystal structure. Methods of doping an epitaxial layer of $Mg_xGe_{1-x}O_{2-x}$ include substituting a Mg site of a corresponding undoped $Mg_xGe_{1-x}O_{2-x}$ crystal structure with Al to result in an n-type conductivity.

Figure 26:
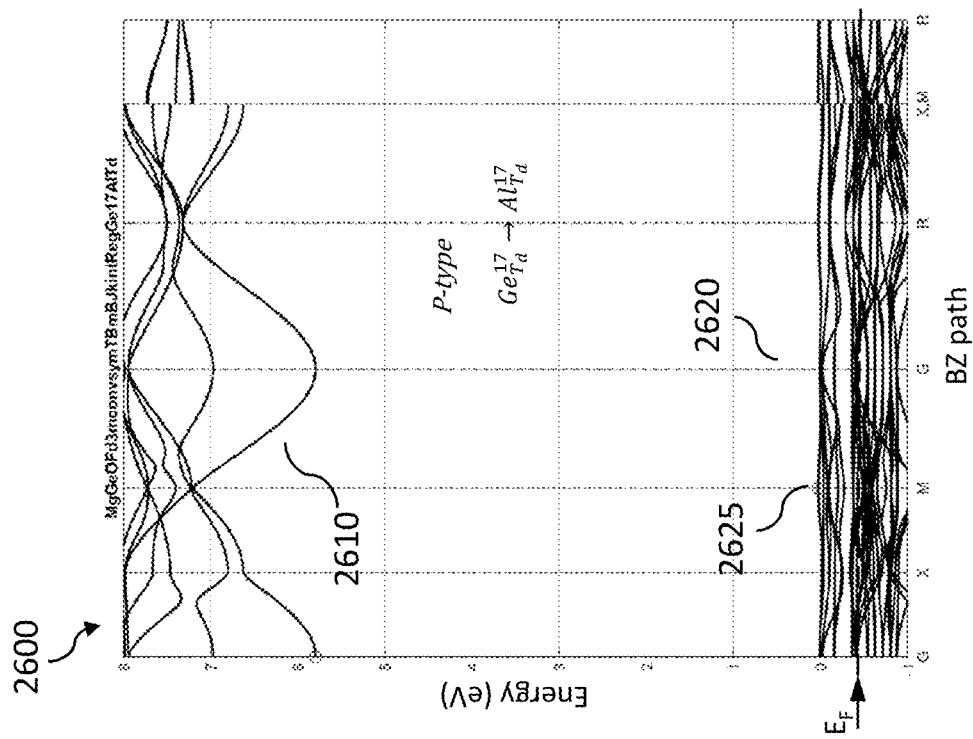
FIG. 26 is an E-k diagram for a doped $Mg_2GeO_4$(Fd3m) arising from the tetrahedral $Ge_{17}$ site being substituted with trivalent Al, in accordance with some embodiments.

In some embodiments, Al may be substituted at $Ge_{Td}$ sites to create a direct bandgap p-type material. FIG. 26 is an E-k diagram 2600 showing the valence band 2620 and conduction band 2610 structure for a doped $Mg_2GeO_4$ (Fd3m) arising from the tetrahedral $Ge_{17}$ site being substituted with Al. As can be seen, the resulting doped $Mg_2GeO_4$(Fd3m) is a direct bandgap semiconductor material. The maximum 2625 of the valence band 2620 is above the Fermi energy ($E_f$), indicating that the doped $Mg_2GeO_4$ (Fd3m) in this example is a p-type material. That is, the Fermi energy is positioned within the valence band 2620 and is expected to exhibit p-type conductivity. Embodiments include semiconductor structures and devices in which an epitaxial layer of $Mg_xGe_{1-x}O_{2-x}$ is a direct bandgap p-type material and comprises an Al dopant (e.g., Al atoms). The Al dopant is located in a Ge site of a corresponding undoped $Mg_xGe_{1-x}O_{2-x}$ crystal structure. Methods of doping an epitaxial layer of $Mg_xGe_{1-x}O_{2-x}$ include substituting a Ge site of a corresponding undoped $Mg_xGe_{1-x}O_{2-x}$ crystal structure with Al to result in a p-type conductivity.

Figure 27:
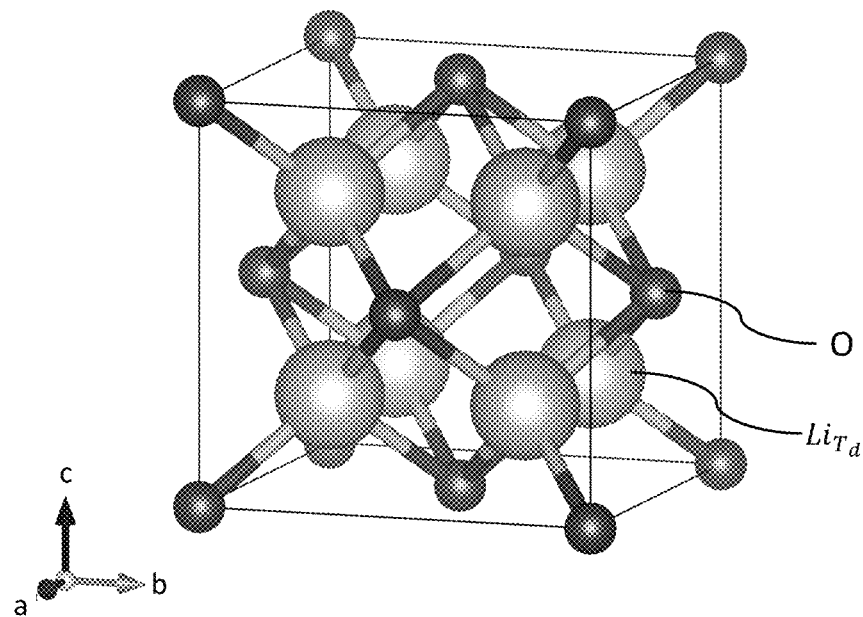
FIG. 27 is a unit cell crystal structure diagram of cubic lithium-oxide $Li_2O$ (Fm3m), showing the monovalent $Li^+$ atoms tetrahedrally bonded to oxygen, in accordance with some embodiments.

In some embodiments, $Ge_{Td}$ or $Mg_{Oh}$ sites can be substituted with Li doping to create a direct bandgap p-type material, as shall be described by FIGS. 27-30. FIG. 27 shows a unit cell crystal structure diagram of cubic lithium-oxide $Li_2O$ (Fm3m) showing the monovalent $Li^+$ atoms tetrahedrally bonded to oxygen. $Li_2O$ is a stable oxide where the Li atoms are tetrahedrally bonded ($T_d$) to oxygen atoms.

Figure 28:
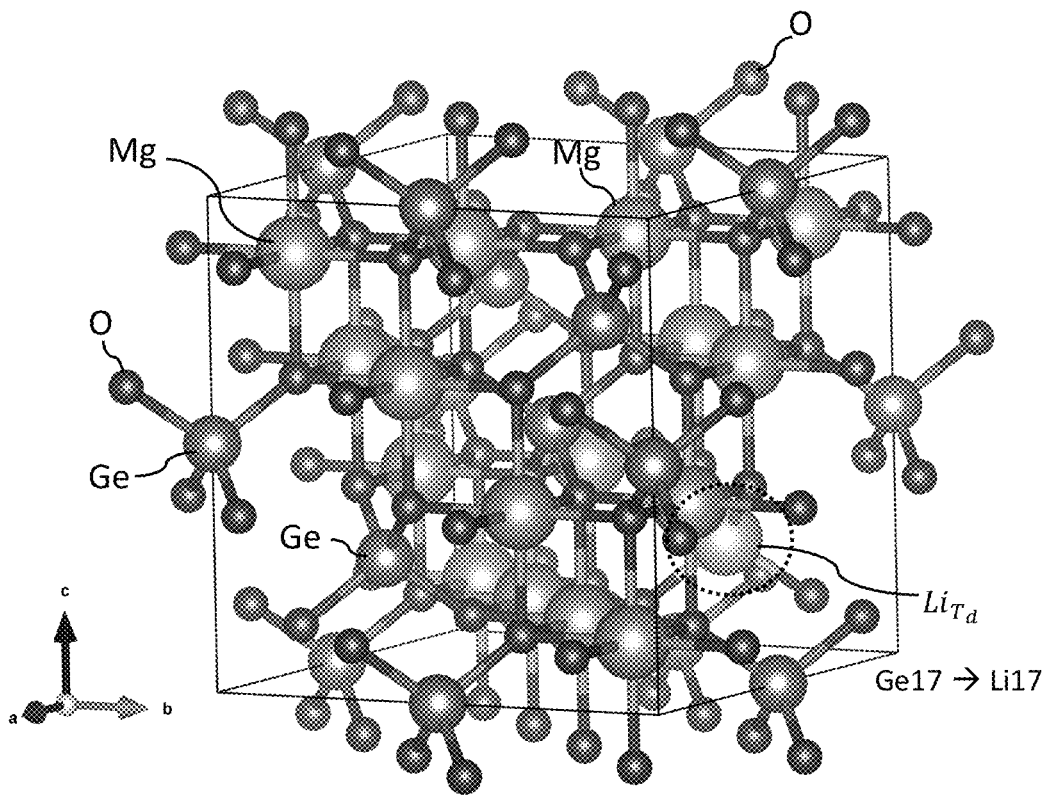
FIG. 28 is a unit cell crystal structure diagram of doped $Mg_2GeO_4$ (Fd3m), showing in this example the tetrahedral site of $Ge_{17}$ intentionally substituted with Li, in accordance with some embodiments.

FIG. 28 shows a unit cell crystal structure diagram of doped $Mg_2GeO_4$ (Fd3m), showing in this example the tetrahedral $Ge_{17}$ site substituted with $Li^+$ as an impurity atom. Both oxides of $Li^+$ and $Ge^{4+}$ energetically prefer tetrahedral bonding with oxygen and therefore it is expected that $Li^+$ preferentially substitutes for Ge-sites compared to octahedral sites.

Figures 29A, 29B:
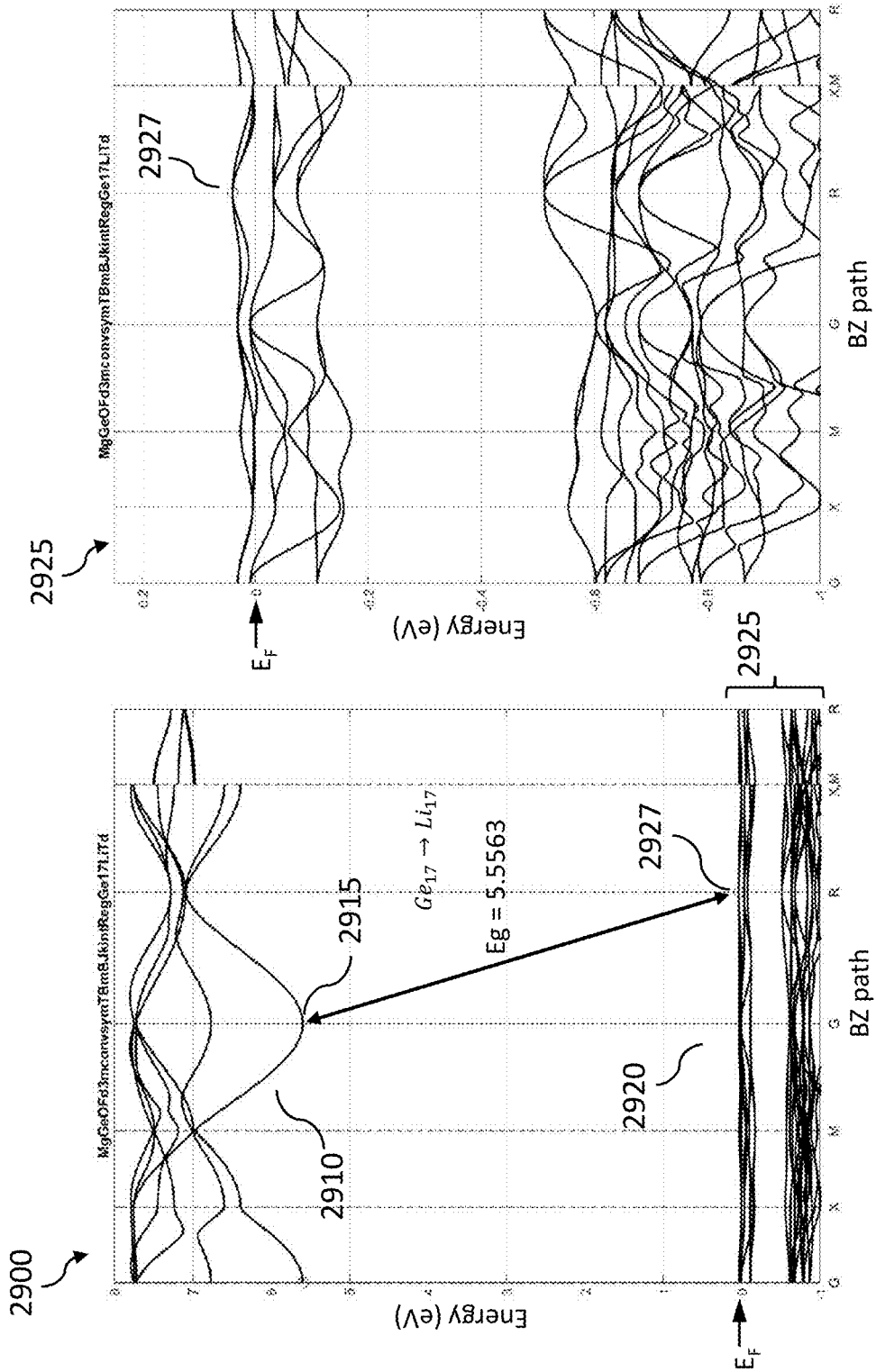
FIG. 29A is an E-k diagram for the Li-doped $Mg_2GeO_4$ (Fd3m) illustrated in FIG. 28, in accordance with some embodiments.
FIG. 29B is an E-k diagram showing the detailed valence band structure of the E-k diagram illustrated in FIG. 29A, in accordance with some embodiments.

FIG. 29A is an E-k diagram 2900 for the Li-doped $Mg_2GeO_4$(Fd3m) arising from the Li substitution at a Ge site illustrated in FIG. 28. Valence band 2920 and conduction band 2910 structure are shown. FIG. 29B is an enlarged view 2925 of the valence band structure 2920 of FIG. 29A. As can be seen, the doped $Mg_2GeO_4$(Fd3m) is an indirect bandgap semiconductor with a bandgap energy of 5.5563 eV between the conduction band minimum 2915 and the valence band maximum 2927. As best seen in FIG. 29B, the doped $Mg_2GeO_4$ (Fd3m) in this example is a degenerate p-type material. That is, the Fermi energy ($E_f$) is positioned within the valence band 2920 (view 2925) and therefore creates p-type conductivity, and the valence band maximum 2927 is no longer at the Brillouin-zone center.

Figure 30:
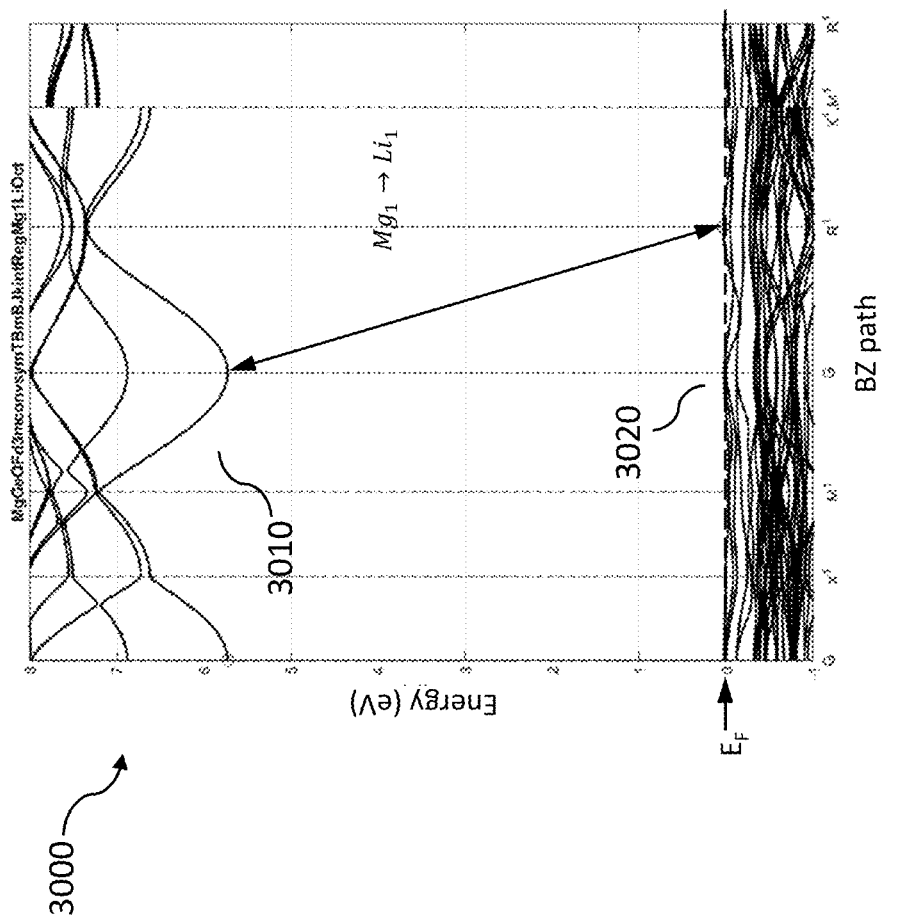
FIG. 30 shows an E-k diagram corresponding to Li-doped $Mg_2GeO_4$(Fd3m) where the $Mg_1$ site is substituted with Li, in accordance with some embodiments.

FIG. 30 is an E-k diagram 3000 corresponding to doped $Mg_2GeO_4$ (Fd3m) where the $Mg_1$ site is substituted with Li. Conduction band 3010 and valence band 3020 structures are shown. FIG. 30 shows that the Li-doping at the $Mg_1$ site results in an indirect bandgap semiconductor. In viewing FIG. 29A and FIG. 30, both show that the effect of substituting a $Ge_{17}$ atom or $Mg_1$ atom with Li creates p-type materials, with the Ge substitution resulting in a degenerate p-type material. Embodiments include semiconductor structures and devices in which an epitaxial layer of $Mg_xGe_{1-x}O_{2-x}$ is a direct bandgap p-type material and comprises a $Li^+$ dopant (e.g., $Li^+$ atoms). The $Li^+$ dopant is located in a Ge site or a Mg site of a corresponding undoped $Mg_xGe_{1-x}O_{2-x}$ crystal structure. Methods of doping an epitaxial layer of $Mg_xGe_{1-x}O_{2-x}$ include substituting a Ge site or a Mg site of a corresponding undoped $Mg_xGe_{1-x}O_{2-x}$ crystal structure with $Li^+$ to result in an p-type conductivity.

In some embodiments, $Mg_{Oh}$ sites can be substituted with Ni atoms to create defect bands and a reduced bandgap compared to an undoped form, as shall be described by FIGS. 31-33B. FIG. 31 shows a crystal structure diagram of a cubic NiO (space group Fd3m) unit cell. NiO is a stable oxide where the Ni atoms are octahedrally bonded ($Ni_{Oh}$) to oxygen atoms. $Ni_{Oh}$ atoms are chosen to substitute for Mg.

FIG. 32 shows a unit cell crystal structure diagram of Ni-doped $Mg_2GeO_4$ (Fd3m), showing in this example the octahedral $Mg_1$ site substituted with $Ni^+$ as an impurity atom.

FIG. 33A is an E-k diagram 3300 for the Ni-doped $Mg_2GeO_4$ (Fd3m) illustrated in FIG. 32, showing structures for valence band 3320 and conduction band 3310. As can be seen, the resulting doped material has an indirect bandgap with a bandgap energy $E_g$ that is reduced to approximately 2 eV. Furthermore, there are a number of defect bands 3328 and 3329 in addition to the normal valence band 3320, and also parasitic absorption within the gap between defect bands. The Ni atom substitution at a Mg site results in deep levels created within the bandgap due to the Ni p- and d-orbitals. These calculated results demonstrate that Ni does not appreciably alter the conductivity type of $Mg_2GeO_4$ but does introduce parasitic optical absorption within the bandgap.

FIG. 33B is a density of states (DOS) diagram for the Ni-doped $Mg_2GeO_4$(Fd3m) illustrated in FIG. 32. The DOS indicates the disadvantageous sub-bandgap energy states due to Ni p- and d-orbitals. Embodiments include semiconductor structures and devices in which an epitaxial layer of $Mg_xGe_{1-x}O_{2-x}$ comprises a $Ni^+$ dopant (e.g., $Ni^+$ atoms). The $Ni^+$ dopant is located in a Mg site of a corresponding undoped $Mg_xGe_{1-x}O_{2-x}$ crystal structure. Methods of doping an epitaxial layer of $Mg_xGe_{1-x}O_{2-x}$ include substituting a Mg site of a corresponding undoped $Mg_xGe_{1-x}O_{2-x}$ crystal structure with $Ni^+$.

Figure 34:
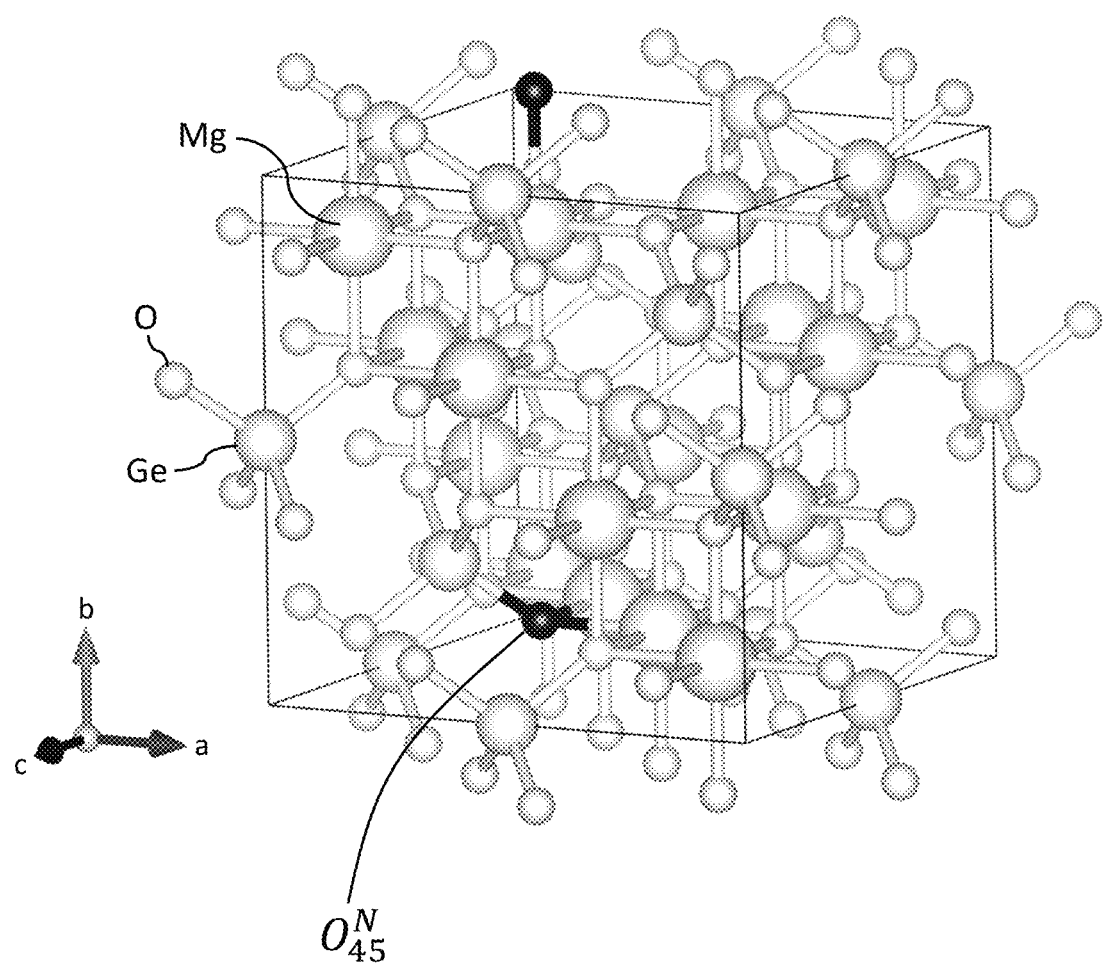
FIG. 34 is a unit cell crystal structure diagram of a nitrogen (N) atom substituted at one of the possible 32 oxygen sites within $Mg_2GeO_4$ (Fd3m), in accordance with some embodiments.
Figures 35A, 35B:
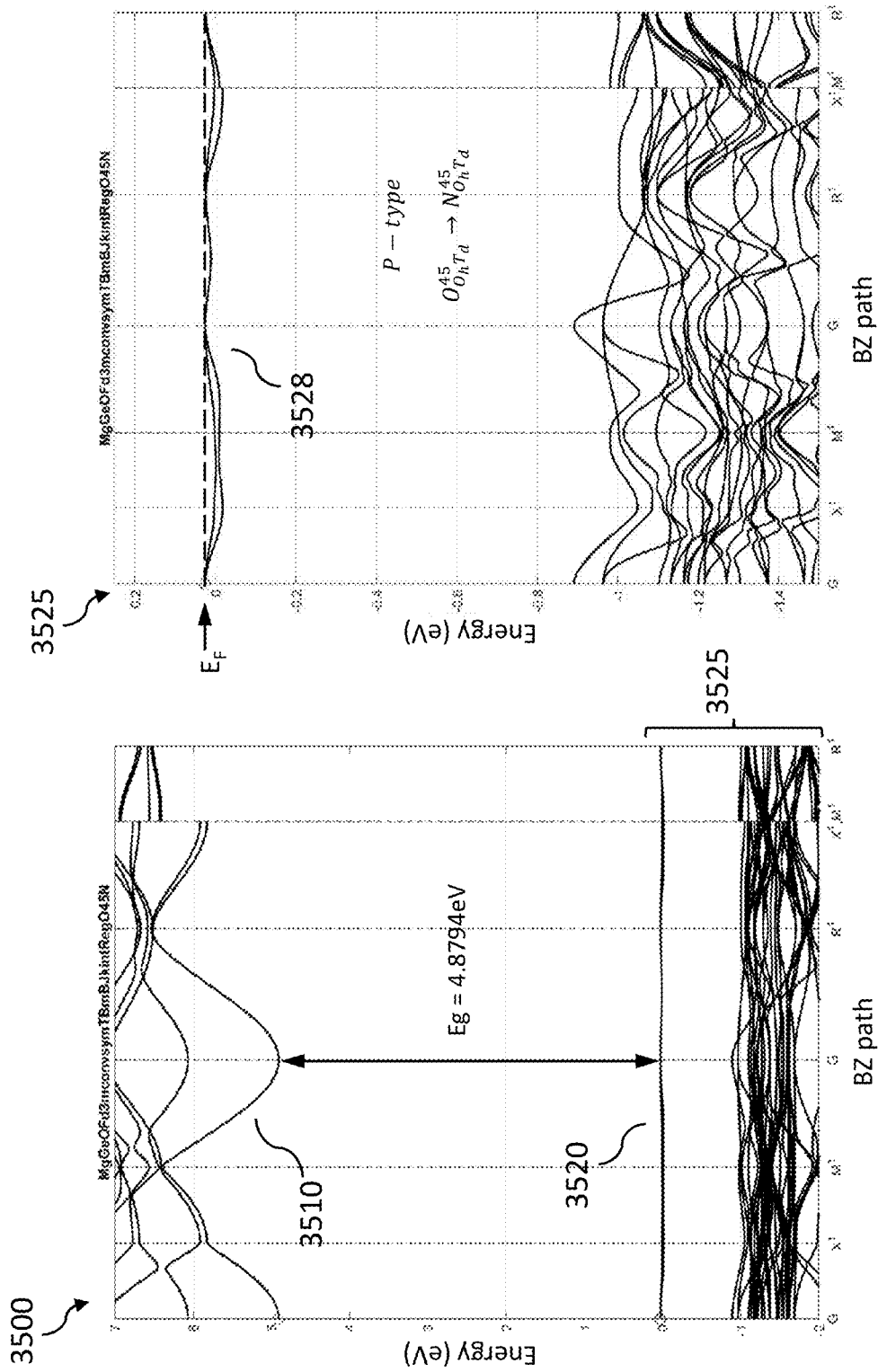
FIG. 35A is an E-k diagram for the N-doped $Mg_2GeO_4$ (Fd3m) illustrated in FIG. 34, in accordance with some embodiments.
FIG. 35B shows a detailed view of the valence band structure illustrated in FIG. 35A, in accordance with some embodiments.

In some embodiments, O sites can be substituted with N atoms (nitrogenic doping, $N^{3+}$) to create a direct bandgap p-type material, as shall be described in FIGS. 34-35B. FIG. 34 shows a unit cell crystal structure diagram of an N atom substituted at an oxygen site within $Mg_2GeO_4$ (Fd3m). In this example, the anion $O_{45}$ site is substituted with a trivalent nitrogen as an impurity atom, labelled as $O_{45}^N$.

FIG. 35A is an E-k diagram 3500 for the N-doped $Mg_2GeO_4$(Fd3m) arising from the N site substitution illustrated in FIG. 34. The valence band 3520 and conduction band 3510 structure are shown. FIG. 35B is an enlarged view 3525 of the valence band structure in FIG. 35B. As can be seen from FIG. 35A, the N-doped $Mg_2GeO_4$(Fd3m) is a direct bandgap semiconductor with a bandgap energy reduced to approximately 4.88 eV compared to the undoped $E_g$ of 5.8056 eV in FIG. 8A. As best seen in FIG. 35B, for the N-doped $Mg_2GeO_4$(Fd3m) the induced relatively shallow energy band 3528 close to the Fermi energy $(E_f)$ due to the nitrogenic impurity results in a p-type material. Embodiments include semiconductor structures and devices in which an epitaxial layer of $Mg_xGe_{1-x}O_{2-x}$ is a direct bandgap p-type material and comprises a $N^{3+}$ dopant (e.g., $N^{3+}$ atoms). The $N^{3+}$ dopant is located at an oxygen site of a corresponding undoped $Mg_xGe_{1-x}O_{2-x}$ crystal structure. Methods of doping an epitaxial layer of $Mg_xGe_{1-x}O_{2-x}$ include substituting an oxygen site of a corresponding undoped $Mg_xGe_{1-x}O_{2-x}$ crystal structure with $N^{3+}$.

In some embodiments, atoms within a unit cell can be replaced by each other to create a p-type material. This replacement technique shall be referred to in this disclosure as anti-site substitution or anti-site doping, such as Mg and Ge being substituted with the other type of atom (Ge and Mg, respectively) at their respective tetrahedrally and octahedrally bonded locations. Anti-site substitution shall be described in FIGS. 36A-37F.

Figure 36A:
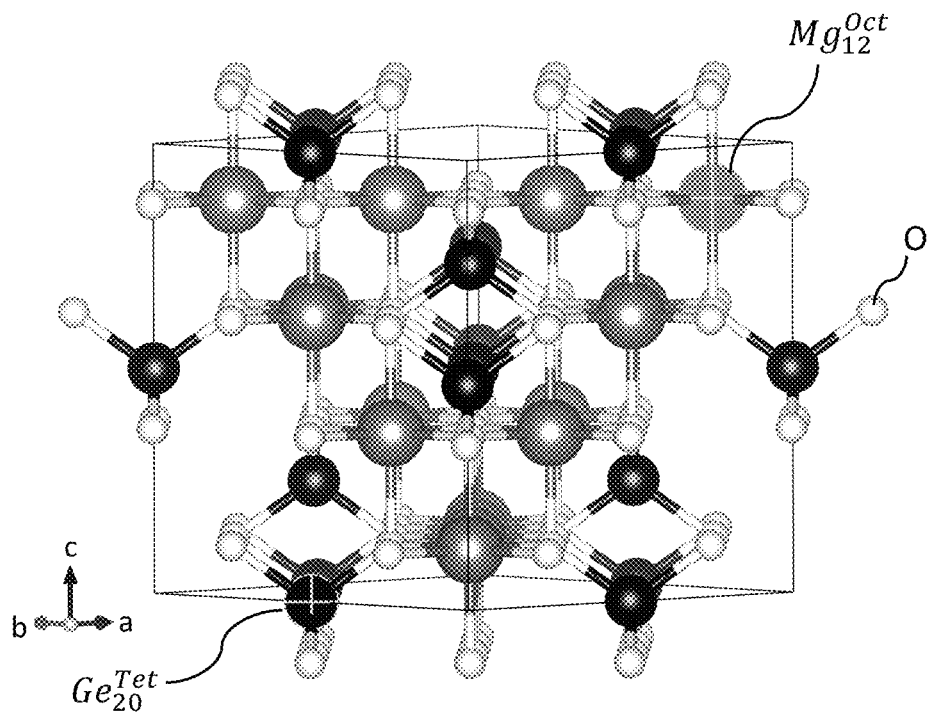
FIG. 36A shows the stoichiometric unit cell crystal structure of cubic $Mg_2GeO_4$ (Fd3m), identifying the nominal structural positions of selected Mg and Ge atomic sites, in accordance with some embodiments.

In FIG. 36A, the stoichiometric unit cell crystal structure of cubic $Mg_2GeO_4$ (Fd3m) is shown, identifying normal structural positions of selected Mg and Ge atomic sites that will be used in a cation anti-site doping process. In this example, atoms in the tetrahedrally bonded $Ge_{20}$ location $(Ge_{20}^{Tet})$ and the octahedrally bonded $Mg_{12}$ location $(Mg_{12}^{Oct})$ will be replaced by another atom.

Figure 36B:
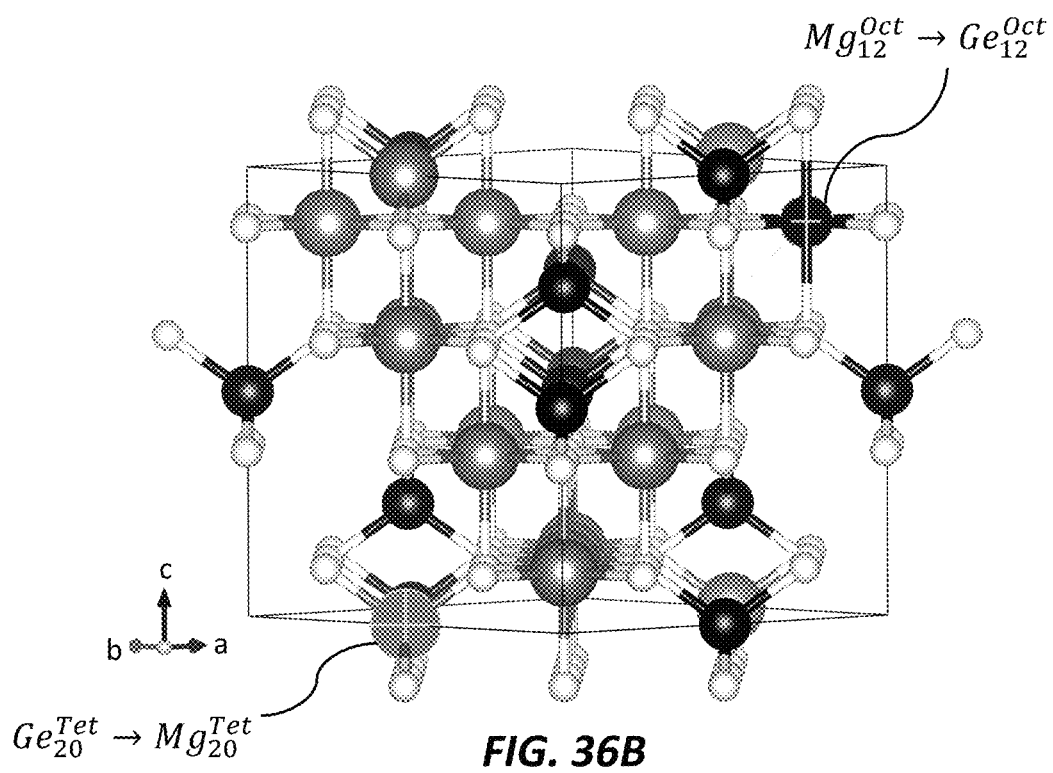
FIG. 36B shows an example of an anti-site cross-substitution process where the exchange process comprises a nominal $Mg_{12}$ site that is exchanged for a Ge atom and a nominal $Ge_{20}$ site that is exchanged for a Mg atom, in accordance with some embodiments.

FIG. 36B shows an embodiment of an anti-site cross-substitution where in this example the exchange process comprises a nominal $Mg_{12}$ site that is replaced by a Ge atom during formation of the crystal structure to become $Ge_{12}^{Oct}$, and where also a nominal $Ge_{20}$ site is replaced by a Mg atom during formation of the crystal structure to become $Mg_{20}^{Tet}$. It is noted that the total number of Mg and Ge cations within the unit cell remain unchanged, thus preserving the total number of Mg and Ge atoms in the unit cell. As a result of the anti-site substitution, the original Fd3m (cubic) space group crystal becomes Cm (monoclinic) space group.

FIG. 37A shows the resultant E-k diagram 3700 for the anti-site exchange within $Mg_2GeO_4$ (Fd3m) illustrated in FIG. 36B, showing the valence band 3720 and conduction band 3710 structure. In this example, the selective Mg↔Ge anti-site cross-substitution results in a non-ideal character of the E-k band structure by altering the new unit cell space group symmetry from that of a normally cubic (i.e., no anti-site exchange) into a monoclinic structure. Anti-site exchange is energetically unfavorable for a simple swap of the atomic position of one Mg atom into a local tetrahedral site and conversely one Ge atom into a local octahedral site. The band structure becomes reduced in magnitude compared to the most stable normal Fd3m configuration. The intermediate bands (e.g., defect bands 3728, 3729) created deep within the gap indicate the electronic structure is self-compensated as the Fermi level $(E_f)$ is positioned between the lowest energy s-orbital and highest p-orbital energy across the k-vectors in the Brillouin-zone. FIG. 37B is an electronic density of states diagram for the Mg↔Ge anti-site exchange example of FIG. 36B.

Figure 37C:
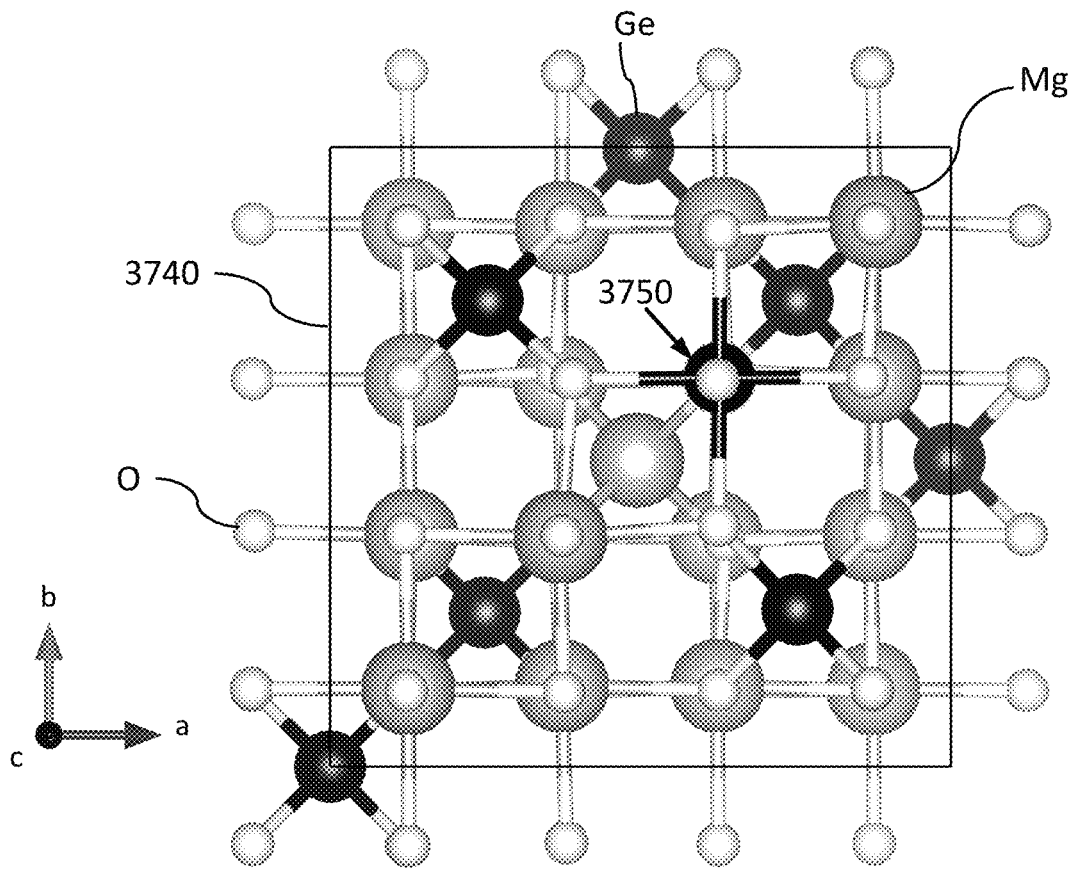
FIG. 37C shows a distorted crystal unit cell resulting from geometric optimization via the process of energy minimization for the single Mg↔Ge anti-site atom exchange as illustrated in FIG. 36B, in accordance with some embodiments.

FIG. 37C shows the distorted crystal unit cell 3740 resulting from geometric optimization via the process of energy minimization for a single Mg↔Ge anti-site atom exchange in the $Mg_2GeO_4$ crystal structure illustrated in FIG. 36B. An example Ge atom local environment 3750 is highlighted.

Figure 37D:
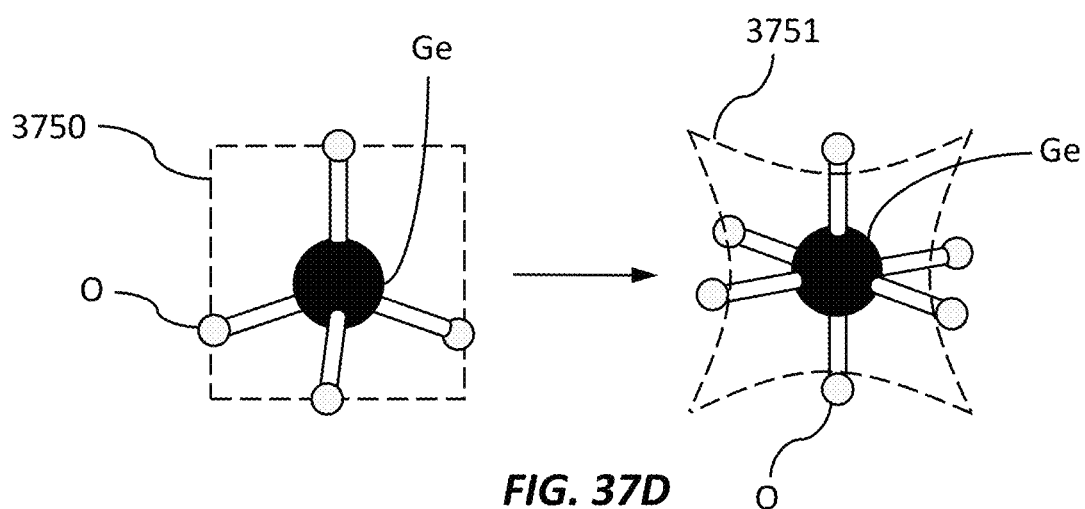
FIG. 37D is a schematic diagram of the cubic bonding environment of a Ge atom within a nominal Fd3m crystal, and the resulting distorted crystal field when the Ge atom is substituted into an octahedral bonding site, in accordance with some embodiments.

FIG. 37D is a schematic diagram of the cubic bonding local environment 3750 of a Ge atom (tetrahedrally bonded) within a nominal Fd3m crystal and the resulting distorted crystal field 3751 when the Ge atom is substituted into an octahedral bonding site. The lattice distortion minimizes the resulting unit cell formation energy.

Figure 37E:
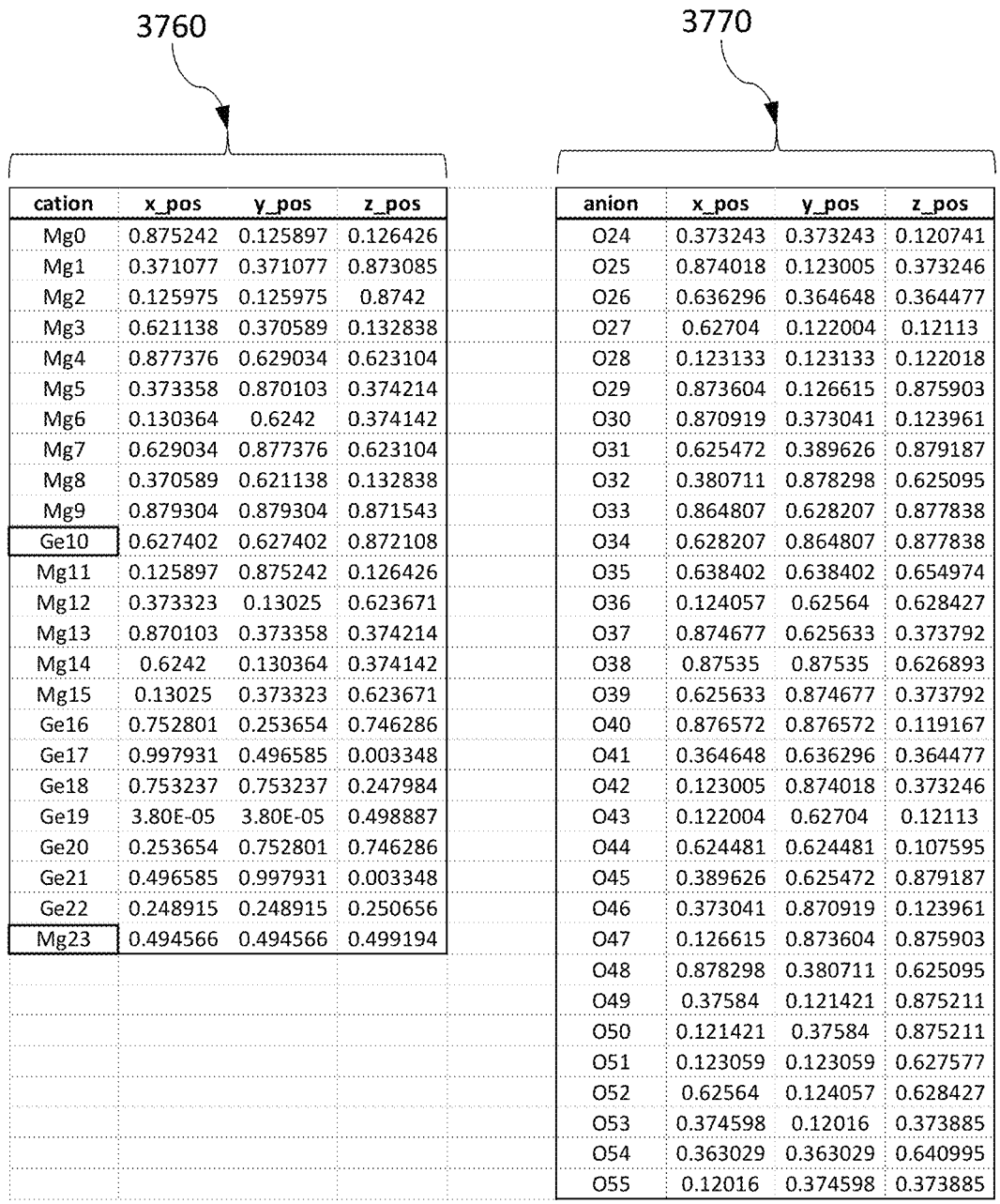
FIG. 37E are tables of the cation and anion positions for a distorted crystal structure in the case of a single anti-site substitution, in accordance with some embodiments.

Shown in FIG. 37E are table 3760 and table 3770 of cation and anion positions, respectively, for a distorted crystal structure, for the case of a single anti-site substitution. In this example of FIG. 37E, the $Mg_{10}$ site is substituted with Ge $(Ge_{10})$, and the $Ge_{23}$ site is substituted with Mg $(Mg_{23})$.

Figure 37F:
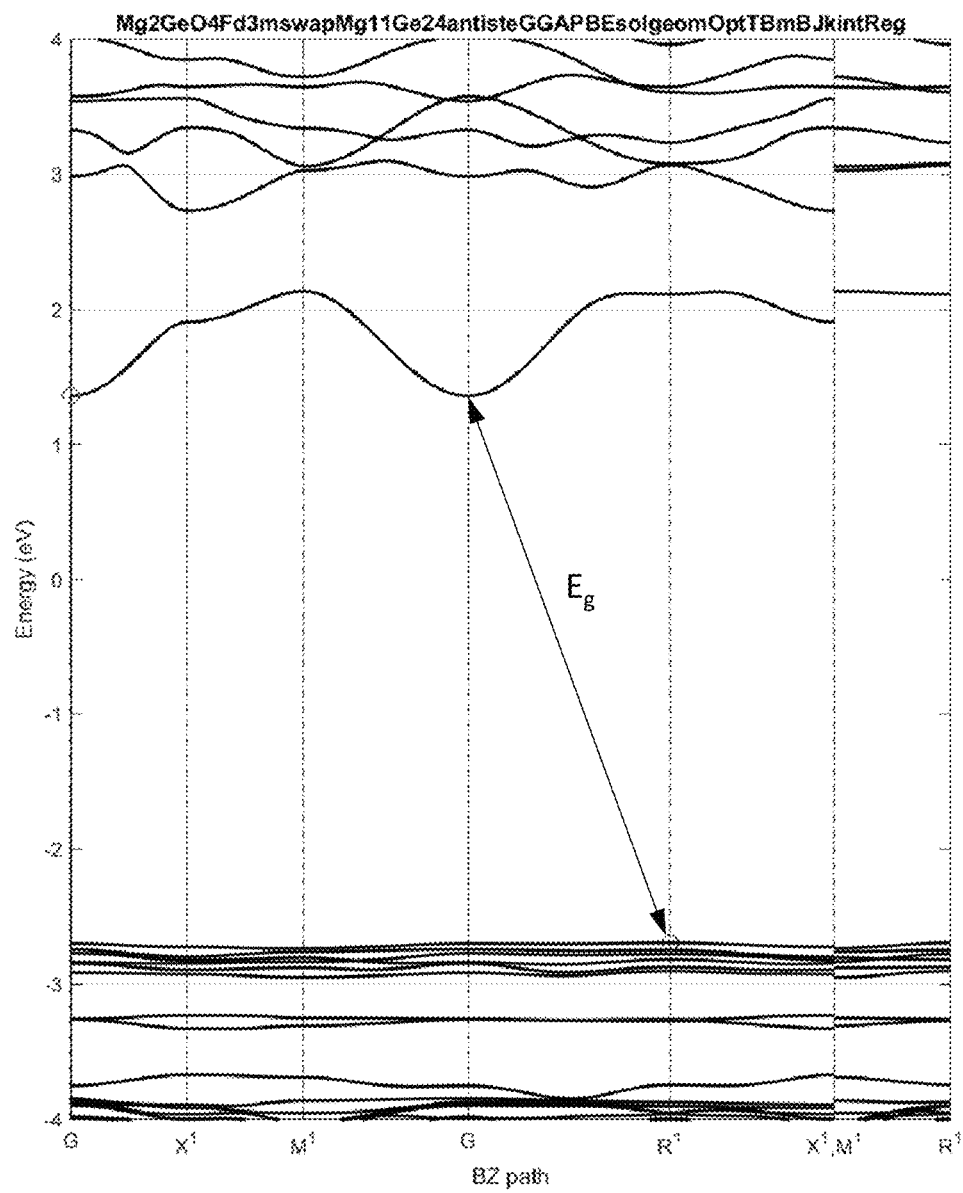
FIG. 37F is an E-k band structure diagram of a geometry-optimized single anti-site substitution, in accordance with some embodiments.

FIG. 37F is an E-k band structure of a geometry-optimized single anti-site substitution in which $Mg_{11}$ site is substituted with Ge $(Ge_{11})$, and the $Ge_{24}$ site is substituted with Mg $(Mg_{24})$. The resulting bandgap $E_g$ is indirect type and is smaller than the nominal stoichiometric Fd3m case. Embodiments include semiconductor structures and devices in which an epitaxial layer of $Mg_xGe_{1-x}O_{2-x}$ has a doped unit cell structure and a corresponding undoped unit cell structure (i.e., the corresponding undoped structure is the nominal $Mg_xGe_{1-x}O_{2-x}$ structure that is not doped). With the doped unit cell structure, the $Mg_xGe_{1-x}O_{2-x}$ is an indirect bandgap p-type material; where the doped unit cell structure comprises a Ge atom in a first location that is occupied by Mg in the corresponding undoped unit cell structure; and the doped unit cell structure comprises a Mg atom in a second location that is occupied by Ge in the corresponding undoped unit cell structure. In the doped unit cell structure, the Ge atom is octahedrally bonded and the Mg atom in the second location is tetrahedrally bonded. Methods of doping an epitaxial layer of $Mg_xGe_{1-x}O_{2-x}$ include placing a Ge atom in a first location that is occupied by Mg in a corresponding undoped unit cell structure of the $Mg_xGe_{1-x}O_{2-x}$ and placing a Mg atom in a second location that is occupied by Ge in the corresponding undoped unit cell structure.

Figure 38:
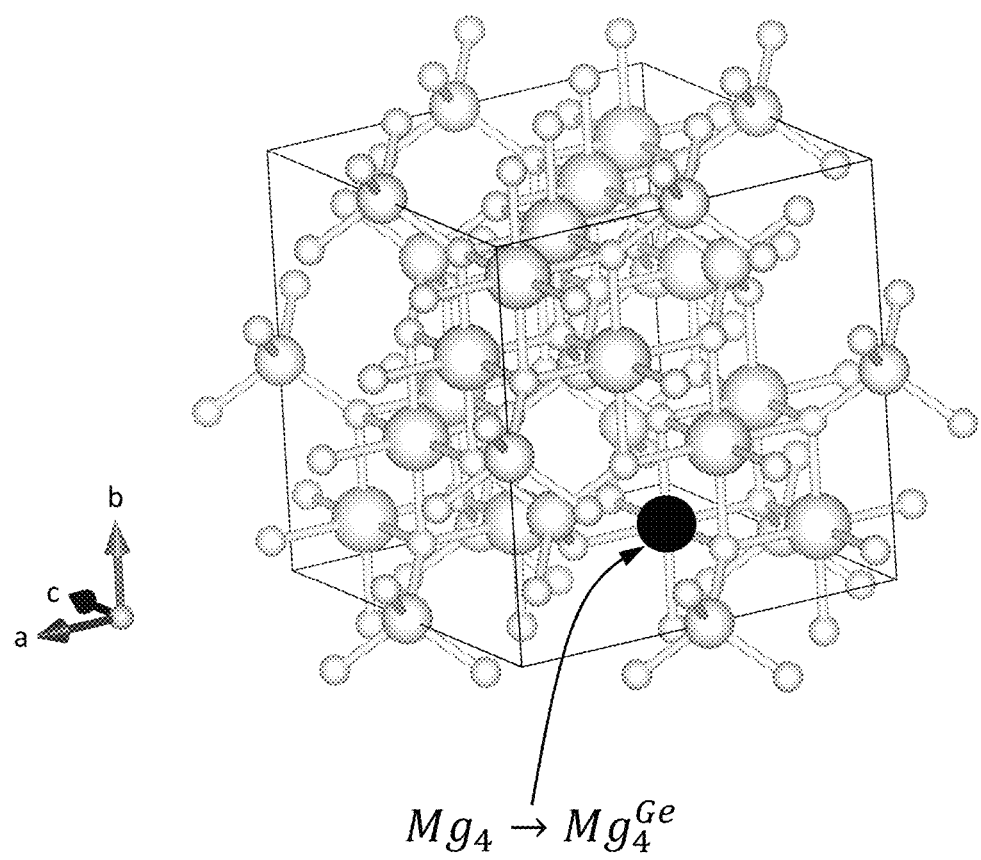
FIG. 38 is a unit cell crystal structure diagram of the cation lattice positions for the case of a space group Fd3m, transformed from a normal configuration to a germanium-rich configuration, in accordance with some embodiments.

In some embodiments, either excess Mg or excess Ge atoms can be utilized to create a doped material, as shall be described by FIGS. 38-41. Embodiments include semiconductor structures and devices in which an epitaxial layer of $Mg_xGe_{1-x}O_{2-x}$ is doped with excess Ge atoms or excess Mg atoms. Methods of doping an epitaxial layer of $Mg_xGe_{1-x}O_{2-x}$ include doping with excess Ge atoms or excess Mg atoms. FIG. 38 shows a unit cell crystal structure diagram of the cation lattice positions for a space group Fd3m transformed from a normal configuration to a germanium-rich configuration. In this example, an excess of Ge-atoms is created by transforming, for example, the $Mg_4$ site into an additional Ge atom. The resulting composition exhibits a new space group symmetry of R3m, the resulting composition being equivalent to:

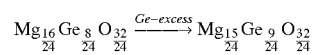

$$Mg_{\underset{24}{16}}Ge_{\underset{24}{8}}O_{\underset{24}{32}} \xrightarrow{Ge-excess} Mg_{\underset{24}{15}}Ge_{\underset{24}{9}}O_{\underset{24}{32}}$$

FIG. 39A is a table 3900 of possible compositions (formula 3910) of $Mg_xGe_yO_z$, in accordance with some embodiments, with respective crystalline space groups 3920. The number of Mg atoms (N_Mg), Ge atoms (N_Ge) and oxygen atoms (N_O) in each unit cell are listed, along with the relative number 3940 of cations and anions within the crystal unit cell. The ratio 3930 of Mg:Ge atoms within each unit cell is calculated for a given space group. For the example case of a nominal $Mg_2GeO_4$ Fd3m crystal space group, the ratio of cations to anions Mg:Ge is 2.0 (marked by arrow 3932). With excess Ge atoms (9 atoms instead of 8 atoms in the nominal state), the ratio Mg:Ge is 1.7 (arrow 3934), and with excess Mg atoms (17 atoms instead of 16 in the nominal state), the ratio Mg:Ge is 2.4 (arrow 3936).

Figure 39B:
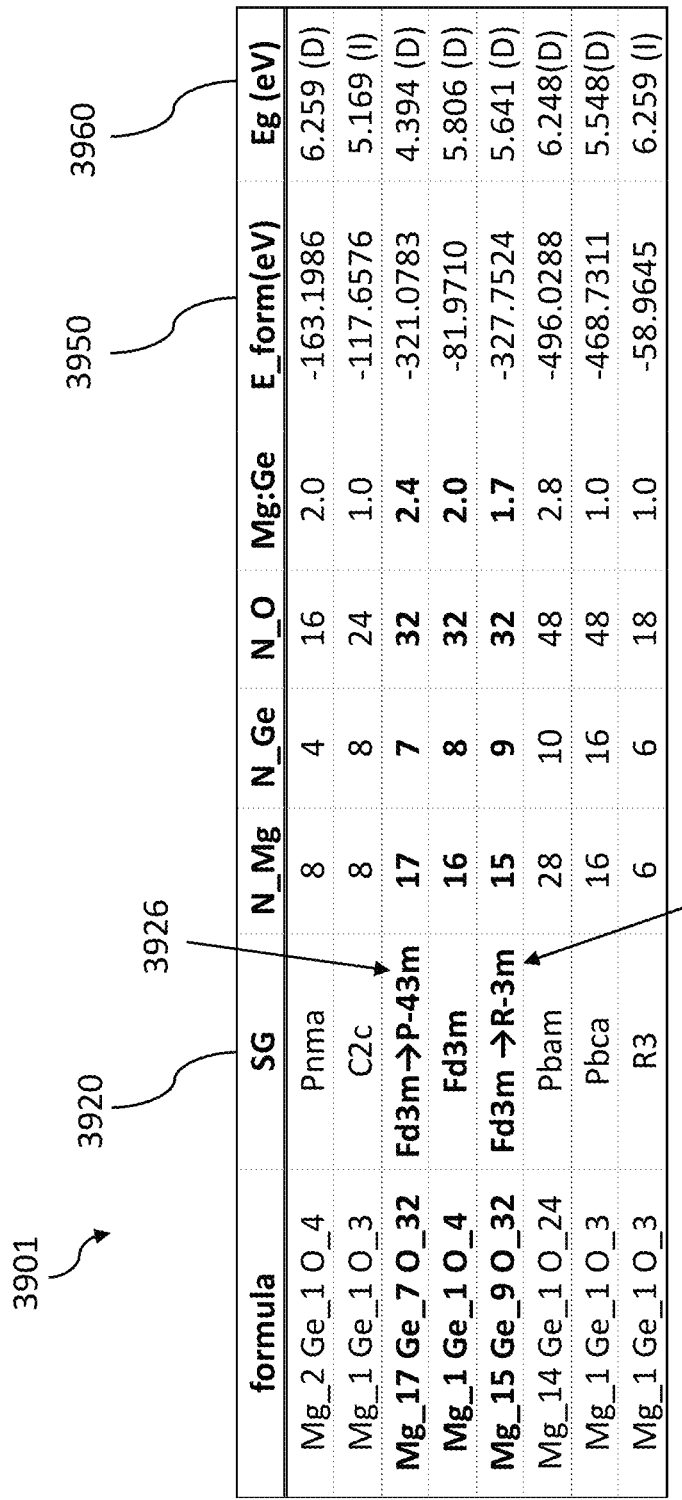
FIG. 39B is a table of the formation energy and lowest energy bandgap for the example $Mg_xGe_yO_z$ compounds referred to in FIG. 39A, in accordance with some embodiments.

FIG. 39B is a table 3901 of the formation energy 3950 and lowest energy bandgap 3960 for the example $Mg_xGe_yO_z$ compounds referred to in FIG. 39A. For the case of Fd3m $Mg_2GeO_4$ crystal when modified into Mg-excess, this composition exhibits P-43m symmetry (marked by arrow 3926), and with Ge-excess the composition exhibits R-3m symmetry (marked by arrow 3924). Both cases of Mg-rich or Ge-rich structures are less energetically favorable with intrinsically higher formation energy; that is, the doped forms are less stable.

In FIG. 39C, table 3902a shows the atomic positions within a normal Fd3m crystal, and table 3902b shows a Fd3m crystal formed with Ge-excess. In this embodiment, the excess Ge atom is inserted by substituting a Mg-site (Mg4 in this example) with Ge. While the total number of cations (Mg and Ge) is preserved, the number of Ge atoms per unit cell is increased.

FIG. 40 is an E-k diagram 4000 of Ge-doped $Mg_2GeO_4$ (Fd3m) where there is an excess of Ge. As can be seen, the doped $Mg_2GeO_4$(Fd3m) is a direct bandgap semiconductor with a bandgap energy of 4.3942 eV at zone center that is less than the undoped case of FIG. 8A. The Fermi energy ($E_f$) is deep within the conduction band 4010 and therefore exhibits n-type conductivity.

FIG. 41 is an E-k diagram 4100 of Mg-doped $Mg_2GeO_4$ (Fd3m) where there is an excess of Mg. As can be seen, the doped $Mg_2GeO_4$ (Fd3m) is a direct bandgap semiconductor with a bandgap energy of 5.6405 eV that is less than the undoped case of FIG. 8A. The Fermi energy ($E_f$) is positioned close to the edge of the valence band 4120 and therefore exhibits p-type conductivity.

FIG. 42A is a diagram summarizing some of the doping strategy embodiments described with respect to FIGS. 19 to 41. The diagram indicates the resulting type (i.e., n-type or p-type) of the doped $Mg_2GeO_4$ (Fd3m). The embodiments may also be applied to other forms of $Mg_xGe_{1-x}O_{2-x}$. The Fermi energy is plotted on the y-axis relative to the undoped intrinsic bands, labeled as conduction band 4202 and valence band 4204. As can be seen, the opportunity for p-type conductivity, which is very challenging conventionally, is possible using Ge-site substitutional doping by Ga and Li, and also by Mg-site substitutional doping by Ge (i.e., Mg excess) and Li. Lithium is distinguished by the ability to create p-type character materials for substitution on either or both Ge and Mg-sites. Ga substitution results in either p-type or n-type doping, depending on whether the Ga is substituted at a Ge site or Mg site, respectively. Controlling where the Ga is inserted can be achieved by, for example, creating deficiencies in the desired lattice sites during formation. For example, the $Mg_xGe_{1-x}O_{2-x}$ structure (e.g., epitaxial layer) can be grown to be Ge-deficient, providing open Ge sites to be substituted by Ga. Similarly, Ga substitution at Mg sites can be achieved by growing the $Mg_xGe_{1-x}O_{2-x}$ structure in a Mg-deficient manner. Aluminum doping (not shown in this chart) can be achieved using similar techniques, where Mg-deficient growth encourages Al to substitute in Mg sites, resulting in an n-type material, and Ge-deficient growth encourages Al to substitute in Ge sites, resulting in a p-type material. These substitution strategies are further explained by the formation energies in FIG. 42B.

FIG. 42B is a diagram showing the relative formation energy for selected substitutional impurity doping embodiments of the Mg-site or Ge-site in $Mg_2GeO_4$ (Fd3m). In this diagram, the impurity specie is selected from Li, Al, Ga and Ge; however, others may also be possible such as Si, Bi, and/or Zn. Using the dopant Li as an example, bar 4210 represents the formation energy in eV for a Ge site being substituted with Li, and bar 4220 represents the formation energy in eV for a Mg site being substituted with Li. The diagram of FIG. 42B shows that the case of Li-doping exhibits the lowest formation energy of the impurity species presented, with both cases resulting in p-type conductivity character. In another example considering Ga as a dopant, FIG. 42B shows that the insertion of Ga at a Ge site requires more energy than inserting Ge at the Ge site. However, growing the $Mg_xGe_{1-x}O_{2-x}$ structure with Ge deficiencies will allow the Ga atoms to substitute at the Ge sites.

Growth of $Mg_xGe_yO_z$ Films and Semiconductor Structures

Figure 43A:
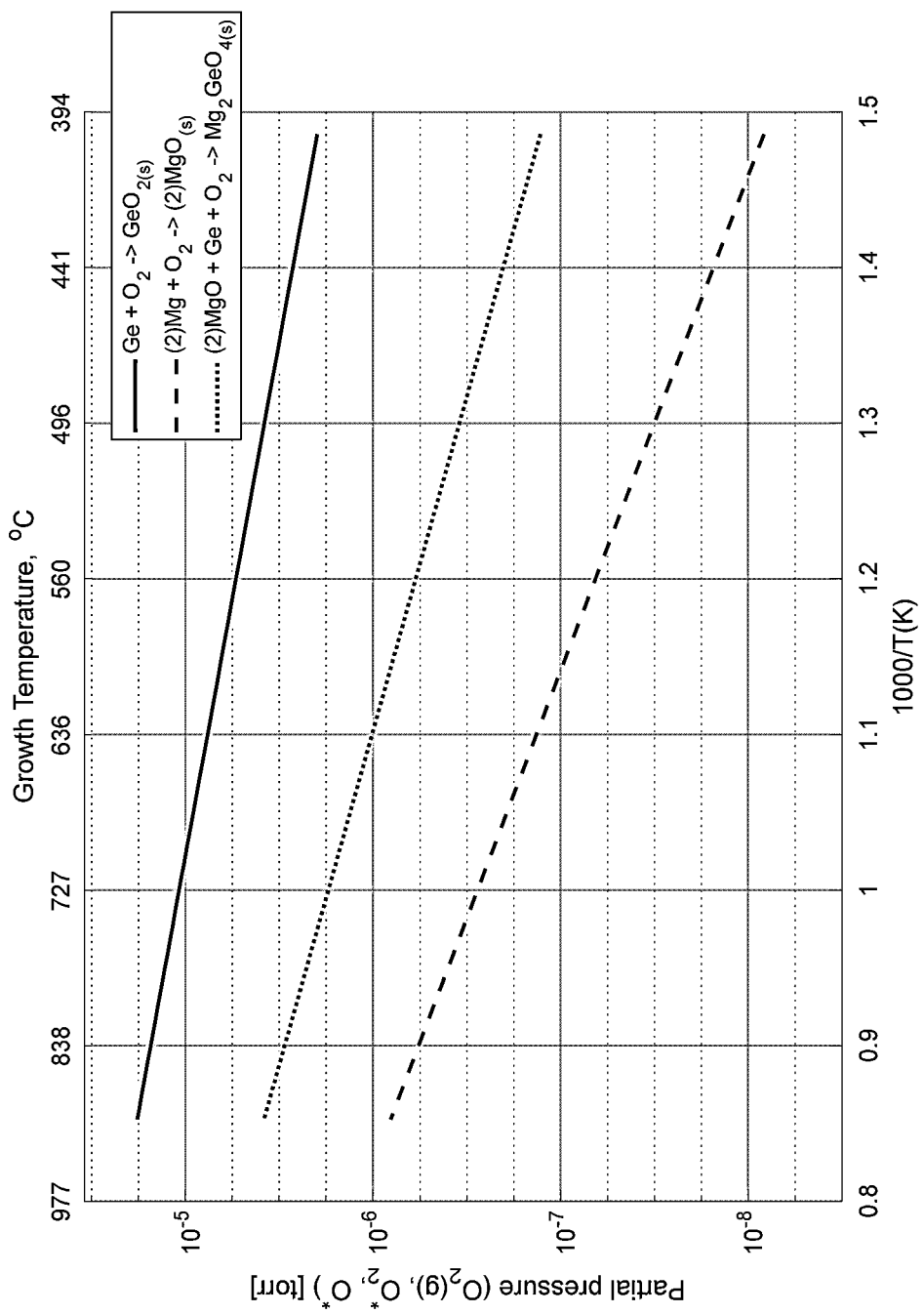
FIG. 43A is thermodynamic oxidation Ellingham diagram for the formation of binary oxides $2Mg+O_2 \rightarrow 2MgO$ and $Ge+O_2 \rightarrow GeO_2$ and ternary oxide $2MgO+Ge+O_2 \rightarrow Mg_2GeO_4$, in accordance with some embodiments.

Methods of forming epitaxial layers of $Mg_xGe_yO_z$ require thermokinetic insights described herein to properly grow the structures, such as with molecular beam epitaxy (MBE). FIG. 43A shows a plot of a thermodynamic oxidation Ellingham diagram for the formation of binary oxides $2Mg+O_2 \rightarrow 2MgO$ and $Ge+O_2 \rightarrow GeO_2$ and ternary oxide $2MgO+Ge+O_2 \rightarrow Mg_2GeO_4$. For a given growth temperature and metal specie there exists an oxygen partial pressure where the metal begins to oxidize. A boundary line between the metal remaining oxide-free (below the boundary line) or the formation of the respective oxide (above the boundary line) is shown for each oxide reaction.

In general, the growth phase diagram to deposit a selected oxide compound from constituent species indicates that sufficient oxygen species is required at a given growth temperature to optimize the reaction pathway. The oxygen source can be selected from molecular oxygen, excited metastable molecular oxygen and atomic oxygen. In one embodiment, activated oxygen such as atomic oxygen is utilized for growth of the oxides described in the present disclosure. The activated oxygen can be from an excited plasma source or an ozone source. For $Mg_xGe_yO_z$ thin film growth from elemental sources (e.g., solid effusion sources such as Knudsen cells), the Ellingham diagram of FIG. 43A (partial pressure of oxygen in Torr vs. 1000/temperature T in Kelvin) supports the need to supply a large incident excess of Ge-flux arriving at the surface throughout the temperature range with respect to the Mg-flux in order to create a $Mg_xGe_yO_z$ compound. If sufficient Ge is not supplied during co-deposition, the germanium oxide formed on a surface would be reduced to elemental Ge in the presence of Mg.

Figure 43B:
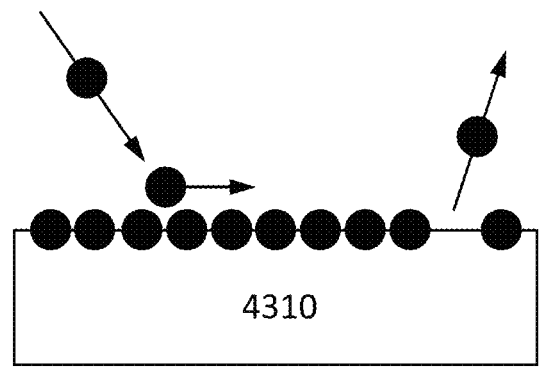
FIGS. 43B, 43C and 43D schematically show surface kinetics of film formation at an epitaxial surface using elemental fluxes of constituent specie, in accordance with some embodiments.
Figure 43C:
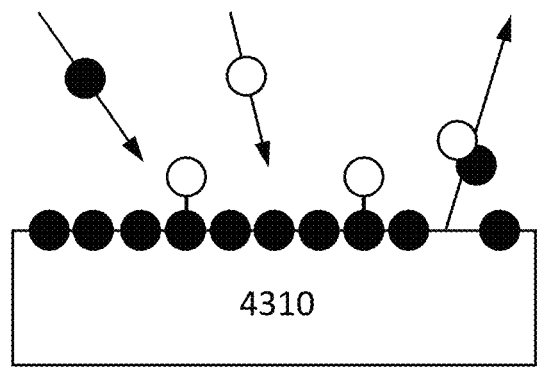
Figure 43D:
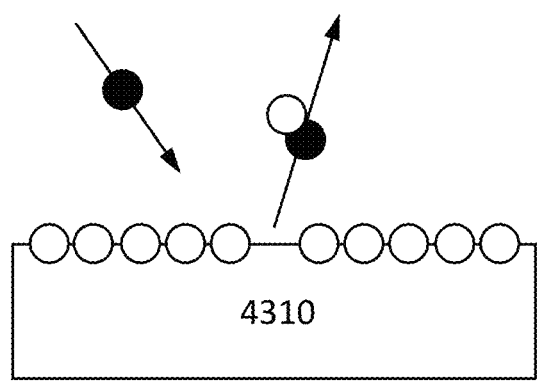

FIGS. 43B, 43C and 43D show schematic diagrams depicting the surface kinetics of film formation at an epi-surface 4310 using elemental fluxes of constituent specie. FIG. 43B shows the surface kinetics of incident Ge or Mg atoms in the absence of oxygen. The arrival rate of incident atoms minus the desorption rate results in a net deposited surface coverage. The desorption rate is dependent on surface temperature. For the growth conditions of interest in this disclosure, the desorption rate of the Mg dominates due to the low activation energy for desorption compared to Ge and follows an Arrhenius behavior. Furthermore, both Ge and Mg exhibit a sticking probability less than 1 for chemisorption and physisorption to the epi-surface 4310 which is also dependent upon the binding energy of the crystal-surface complex (which is intimately related to the surface reconstruction of the bound surface atoms and is a function crystal symmetry, surface temperature and oxygen environment). Higher growth temperatures in general favor surface migration of cations which aid in layer-by-layer growth regimes. At high growth temperatures for surface 4310, molecular oxygen readily dissociates; however, it is found that an activated form of oxygen, ideally atomic neutral or ionized oxygen atoms, are preferred, with neutral species more preferred. FIG. 43B shows the co-deposition of cations and anions toward the surface. For the case of Ge and O co-deposition the ratio of Ge:O determines where an oxide can form. Furthermore, GeO bound to the surface in crystalline form can readily decompose into GeO(g) vapor at sufficiently high temperature, such as >500° C. In the example of growth on MgO substrates, in considering the sticking coefficients $\delta_i$ of Mg and Ge, it was found experimentally in accordance with the present disclosure that $\delta_{Mg}$~10 ×$\delta_{Ge}$ with $\delta_{Mg}$~0.5. That is, Mg tends to deposit more easily on the MgO substrate than Ge.

FIG. 43C shows the arrival towards the epi-surface 4310 of cations (filled circles) and anions (open circles). For the case of a cation=Mg and an anion=O, the formation of MgO occurs. Similarly, for the case of cation=Ge the surface formation of $GeO_2$ is possible. For high enough surface temperature, the solid $GeO_2$ formed on the epi-surface will decompose into a volatile GeO vapor with the activation temperature for $GeO_2$ decomposition being ~500° C.

FIG. 43D shows a case where high Ge fluxes are incident with respect to the co-deposition oxygen flux. In such a scenario, Ge can etch either the $GeO_2$ or MgO formed on the epi-surface 4310. The growth limit between deposition and etching can be controlled by the Ge:[active-O] ratio, where deposition for the conditions of Ge:O<1 and growth temperatures are less than ~600° C. For the etching process of the surface, Ge:O>1 with increasing etch rate for surface temperatures 400-800° C.

FIGS. 43C and 43D illustrate that for successful formation of a desired $Mg_xGe_yO_z$ layer, a careful balance must be maintained with the growth temperature and the flux ratios between Mg, Ge, and O, to enable the Ge to be deposited while preventing Ge and/or Mg from being removed from the surface. For example, as described in FIG. 43A, a large incident excess of Ge-flux with respect to the Mg-flux is needed in order to create and stabilize $Mg_xGe_yO_z$ compound. However, too much Ge flux can result in temperature-dependent effects that are counter-productive to $Mg_xGe_yO_z$ formation, such as the Ge becoming a volatile vapor as explained in FIG. 43C or having the Ge etch away either the $GeO_2$ or MgO as explained in FIG. 43D. Furthermore, pure $GeO_2$ single crystal films are found to be challenging due to the surface kinetics and equally possible polymorphs, resulting in polycrystalline and amorphous construction. In embodiments of the present disclosure, Mg and Zn are ideal crystal growth modifiers that stabilize the formation of GeO-based compounds, and the compounds can attain extremely high crystallinity in a predetermined crystal structure.

Figure 43E:
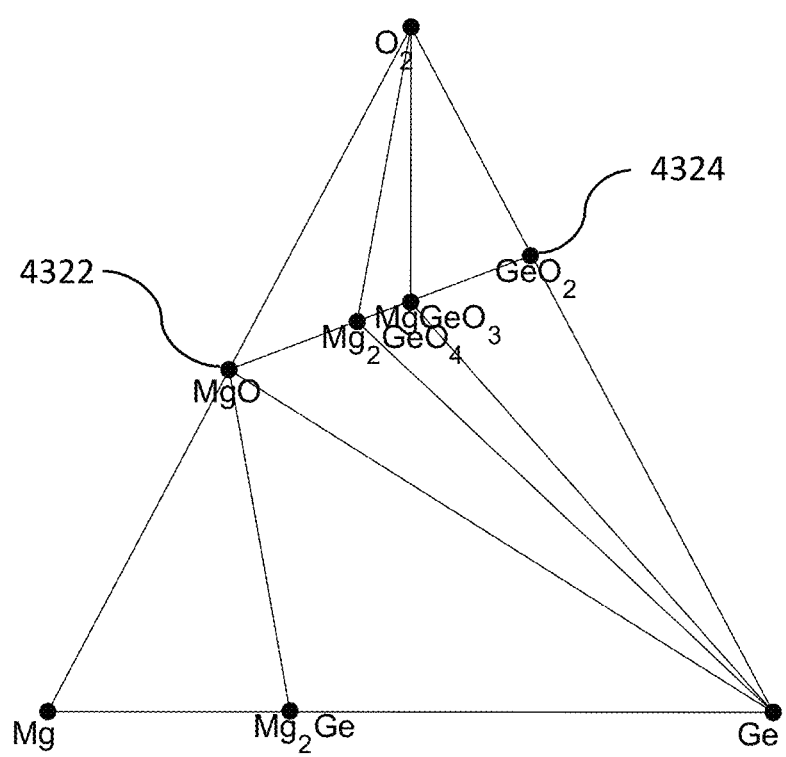
FIG. 43E is a summary ternary phase diagram for the Mg—Ge—O system as calculated using density functional theory (DFT), showing the stable compositions of MgO, $GeO_2$, $Mg_2GeO_4$ and $MgGeO_3$ in accordance with some embodiments.

FIG. 43E shows a summary ternary phase diagram for the Mg—Ge—O system as calculated using DFT, showing the stable compositions of MgO, $GeO_2$, $Mg_2GeO_4$ and $MgGeO_3$, all being along the same line from point 4322 (MgO) to point 4324 ($GeO_2$). The relative mole fractions are represented by the configuration points on the phase diagram. Note the absence of continuous alloy compositions, as the compositions shown represent the most stable forms.

Figure 44A:
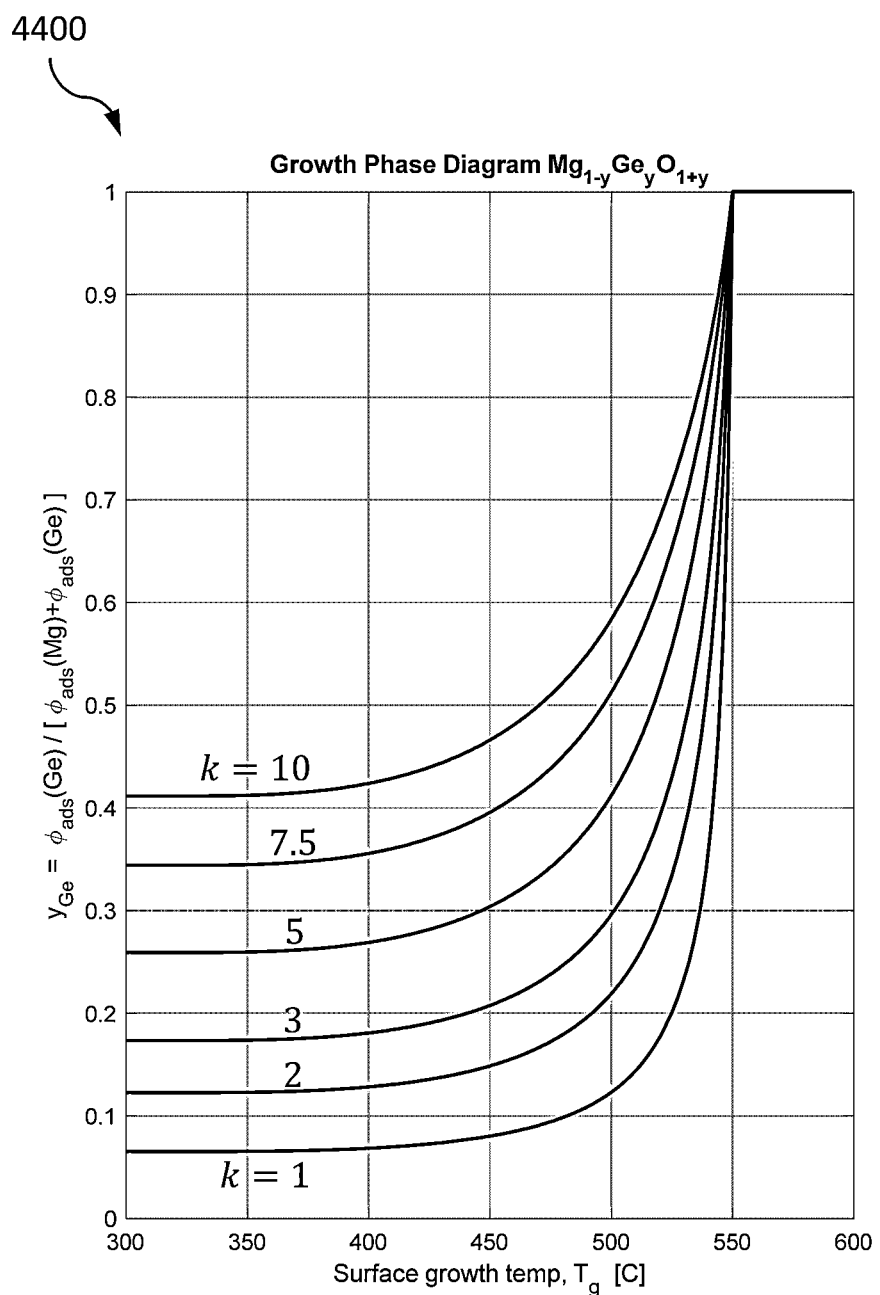
FIG. 44A is a representative growth phase diagram for epitaxial co-deposition of $Mg_{1-y}Ge_yO_{1+y}$ compound using elemental Ge, Mg and active-O fluxes as a function of surface growth temperature, in accordance with some embodiments.

FIG. 44A shows a representative growth phase diagram 4400 for epitaxial co-deposition of $Mg_{1-y}Ge_yO_{1+y}$ (0≤y<1) compound (equivalent to $Mg_xGe_{1-x}O_{2-x}$, 0<x≤1) using elemental Ge, Mg and active-O fluxes as a function of surface growth temperature. Note x=0 and y<1 are excluded in the above formulae only to emphasize that the single crystal form of $GeO_2$ is challenging to realize as a single crystal film. It is however possible that small amounts of stabilizing species operating as a surfactant may indeed stabilize crystalline $GeO_2$ films. For example, Bi may be used as a surfactant. For a given growth temperature and incident Ge:Mg flux ratio, the resulting surface adatom ratio $y_{Ge}$ is plotted in FIG. 44A.

Isotherms of incident flux ratio $k=\Phi_{Ge}^{inc}/\Phi_{Mg}^{inc}$ ranging from 1 to 10 are shown. The constructed phase diagram ($y_{Ge}$, $T_g$, k) illustrates the underlying kinematic process where Mg deposited on a surface exhibits an Arrhenius desorption rate as a function of temperature. Ge deposited on the epi-surface reacts with oxygen to form either an oxide compound or decomposes into GeO monoxide vapor, with an activation temperature of approximately 500-550° C. Therefore, the elemental incident flux ratio $\Phi_{Ge}^{inc}/\Phi_{Mg}^{inc}$ is modified by the deposition surface temperature to retain an adsorbed surface species ratio given by $\Phi_{Ge}^{ads}/\Phi_{Mg}^{ads}$.

Figure 44B:
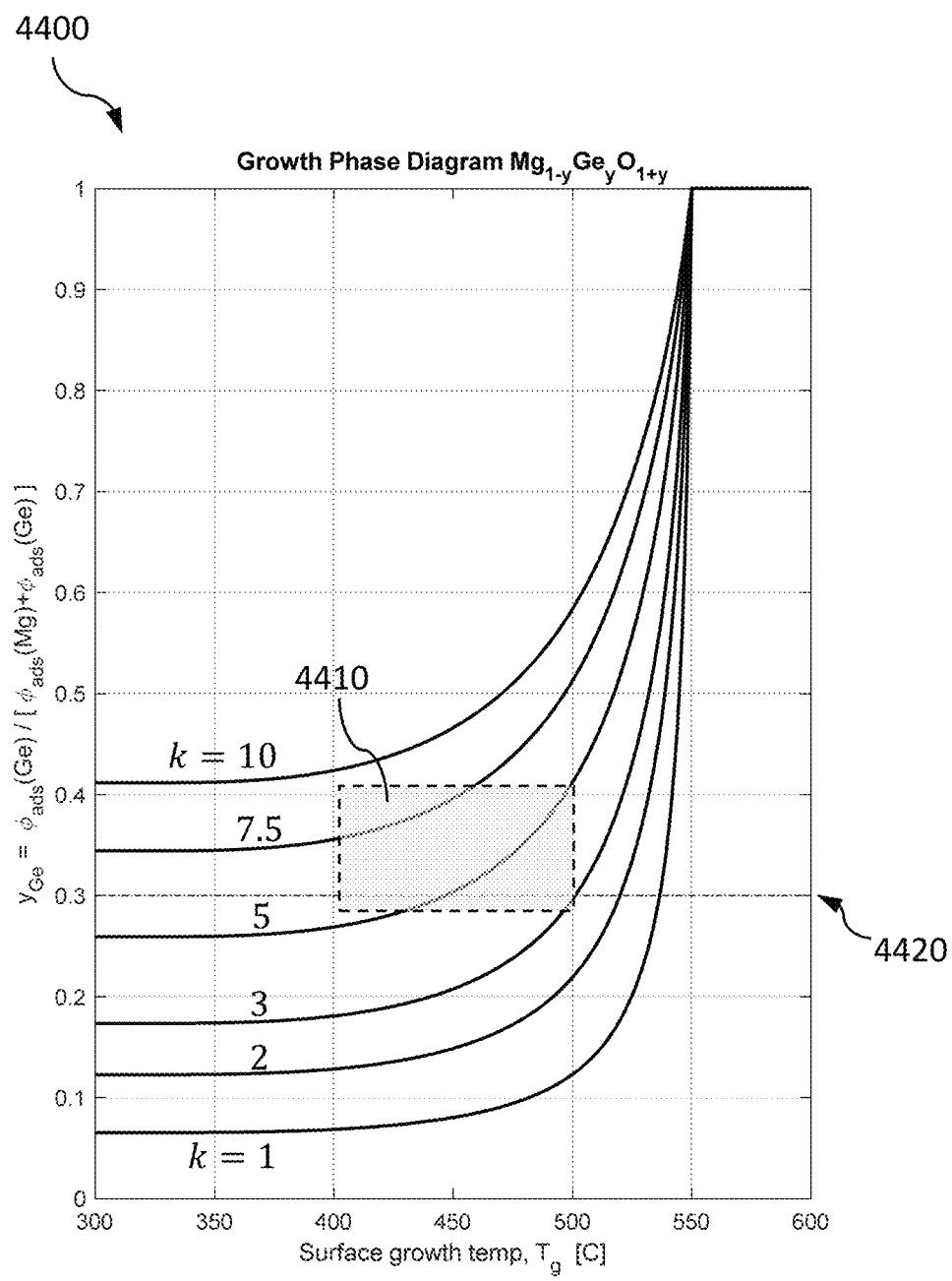
FIG. 44B is a growth phase diagram similar to that illustrated in FIG. 44A and depicting an experimentally determined growth window for high quality single crystal $Mg_2GeO_4$ with Fd3m crystal structure deposited on MgO substrate, in accordance with some embodiments.

FIG. 44B shows the same growth phase diagram 4400 of FIG. 44A but depicting an experimentally determined growth window 4410 for high quality single crystal $Mg_2GeO_4$ with Fd3m crystal structure deposited on an MgO substrate. The surface growth temperature in this window 4410 is from about 400° C. to about 500° C., with values of $k=\Phi_{Ge}^{inc}/\Phi_{Mg}^{inc}$ of approximately k=3 to 9, and the surface adatom ratio $y_{Ge}$ is from about 0.28 to about 0.4. The line marked by arrow 4420 indicates the stoichiometric value $y_{Ge}=1/3$ (i.e., to achieve the desired stoichiometry of $Mg_2GeO_4$). The growth window 4410 demonstrates conditions in which actual growth of $Mg_2GeO_4$ was verified experimentally, where the growth window 4410 is overlaid on the theoretical projections graphed in the chart.

Figure 45:
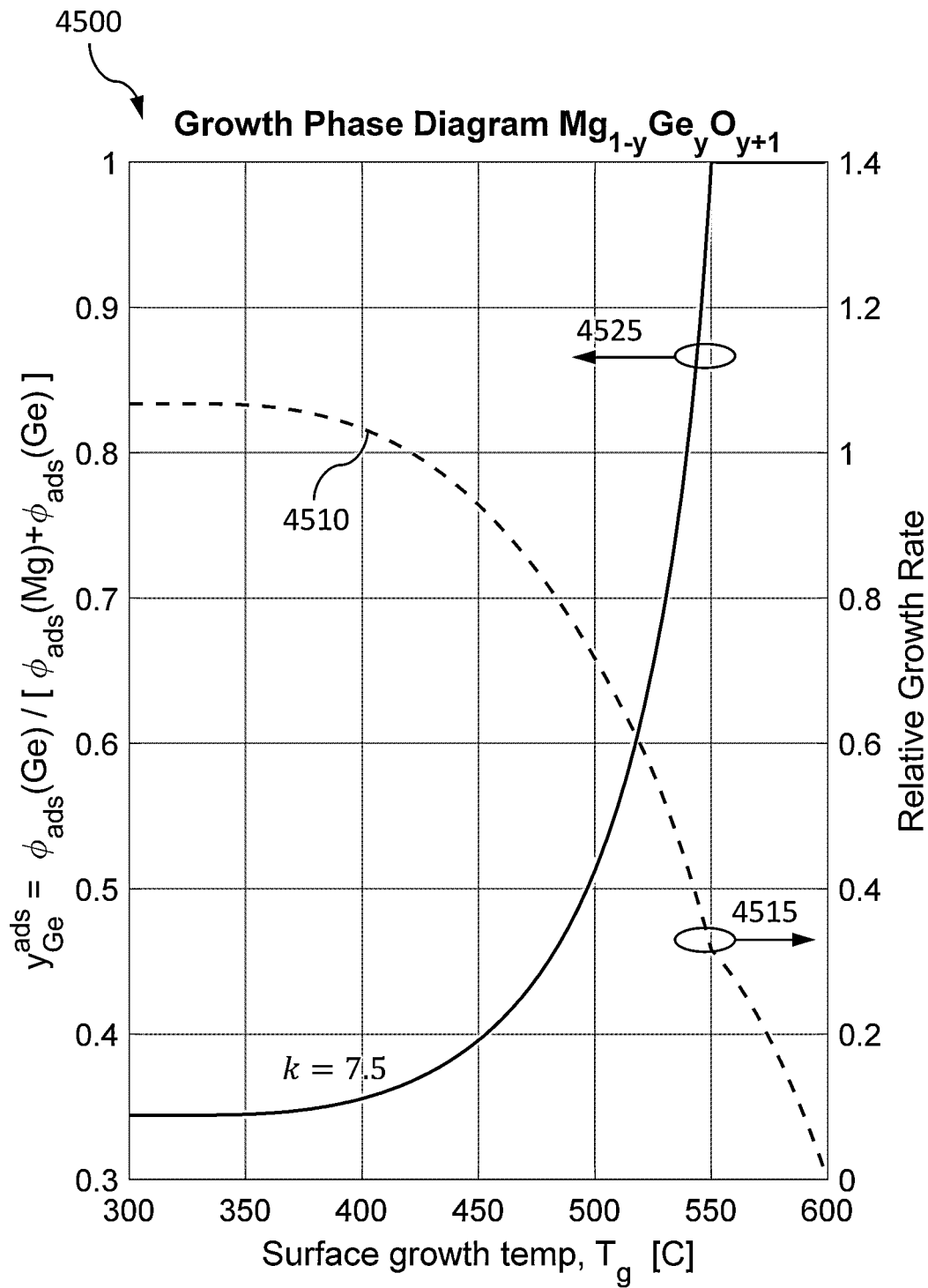
FIG. 45 is a growth phase diagram for $Mg_{1-y}Ge_yO_{1+y}$ for the case of $k=\Phi_{Ge}^{inc}/\Phi_{Mg}^{inc}=7.5$ and the resulting variation in growth rate of the film, in accordance with some embodiments.

FIG. 45 shows a growth phase diagram 4500 for $Mg_{1-y}Ge_yO_{1+y}$ for the case of $k=\Phi_{Ge}^{inc}/\Phi_{Mg}^{inc}=7.5$. The resulting variation in growth rate 4510 of the film is shown, with the units shown on the right-hand y-axis relating to the relative growth rate where zero corresponds to negligible adsorbed species on the growth surface and values above one indicate net accumulation of surface species. Two kinetic effects limit the growth rate, namely, Mg surface desorption and GeO decomposition. For fixed incident Ge:Mg flux ratio the stoichiometric control window of $y_{Ge}=1/3$ required for $Mg_2GeO_4$ has an optimal growth temperature 450° C.<Tg<500° C. as discussed above. The inherent self-assembly of the stable $Mg_2GeO_4$ during co-deposition allows slight deviations from optimal fluxes and temperatures. In FIG. 45, as the growth temperature increases and exceeds the growth window, the growth rate decreases dramatically as indicated by arrow 4515. Arrow 4525 indicates that as temperature decreases, the adatom $y_{Ge}$ ratio decreases.

Methods of forming a semiconductor device include providing a substrate comprising a substantially single crystal substrate material that has a crystal symmetry compatible with an epitaxial layer of $Mg_xGe_{1-x}O_{2-x}$; and co-depositing materials onto the substrate to form the epitaxial layer of $Mg_xGe_{1-x}O_{2-x}$, with x having a value of 0≤x<1. The materials comprise at least two elements selected from Mg, Ge, and oxygen in accordance with the value of x, the Mg, Ge and oxygen being supplied by a Mg source, a Ge source, and an activated oxygen source, respectively. In some embodiments, the epitaxial layer is a substantially single crystal structure and strained to a lattice mismatched layer or substrate. In yet another embodiment the epitaxial film and substrate may each have different space group symmetry by configured to have favorable surface configuration for low lattice mismatched heterointerface. In some embodiments, the co-depositing is performed using a molecular beam epitaxy process or a co-deposition process of elemental fluxes. Organometallic or other precursor species are also possible for transporting Ge, Mg and O to the growth surface. In some embodiments, methods include depositing a buffer layer between the substrate and the epitaxial layer of $Mg_xGe_{1-x}O_{2-x}$, for example a buffer layer comprising MgO or other forms of magnesium germanium oxides. In some embodiments, in the co-depositing, the epitaxial layer of $Mg_xGe_{1-x}O_2$ self-assembles. Embodiments may include determining an elemental incident flux ratio of the Ge source to the Mg source ($\Phi_{Ge}^{inc}/\Phi_{Mg}^{inc}$) according to a deposition surface temperature, to retain an adsorbed surface species ratio of the Ge to the Mg ($\Phi_{Ge}^{ads}/\Phi_{Mg}^{ads}$). In some embodiments, the co-depositing comprises using a growth temperature of 400-500° C., and a flux ratio k of the Ge source to the Mg source ($\Phi_{Ge}^{inc}/\Phi_{Mg}^{inc}$) of k=3 to 9. For example, the flux ratio k may have a value from 3 to 7.5 and the $Mg_xGe_{1-x}O_{2-x}$ may be $Mg_2GeO_4$. Methods may include forming a superlattice on the substrate, wherein the superlattice has a unit cell comprising a first layer and a second layer, wherein the first layer in the superlattice is the epitaxial layer of $Mg_xGe_{1-x}O_{2-x}$. In some embodiments, the second layer of the superlattice is a second epitaxial layer of $Mg_yGe_{1-y}O_{2-y}$, wherein y ranges from 0 to 1 and x≠y.

Various semiconductor structures for electronic devices and optoelectronic devices can be formed with the ultrawide bandgap epitaxial layers of $Mg_xGe_{1-x}O_{2-x}$ grown as epitaxial single crystal structures on deliberately chosen substrates, in accordance with the present disclosure. For example, any of the substrate materials listed in FIG. 12 may be utilized, such as for growing epitaxial layers of $Mg_2GeO_4$ or $MgGeO_3$. In some embodiments, a semiconductor structure includes a substrate comprising a substantially single crystal substrate material; and an epitaxial layer of $Mg_xGe_{1-x}O_{2-x}$ on the substrate, with x having a value of 0≤x<1; where the epitaxial layer of $Mg_xGe_{1-x}O_{2-x}$ has a crystal symmetry compatible with the substrate material.

Figure 46A:
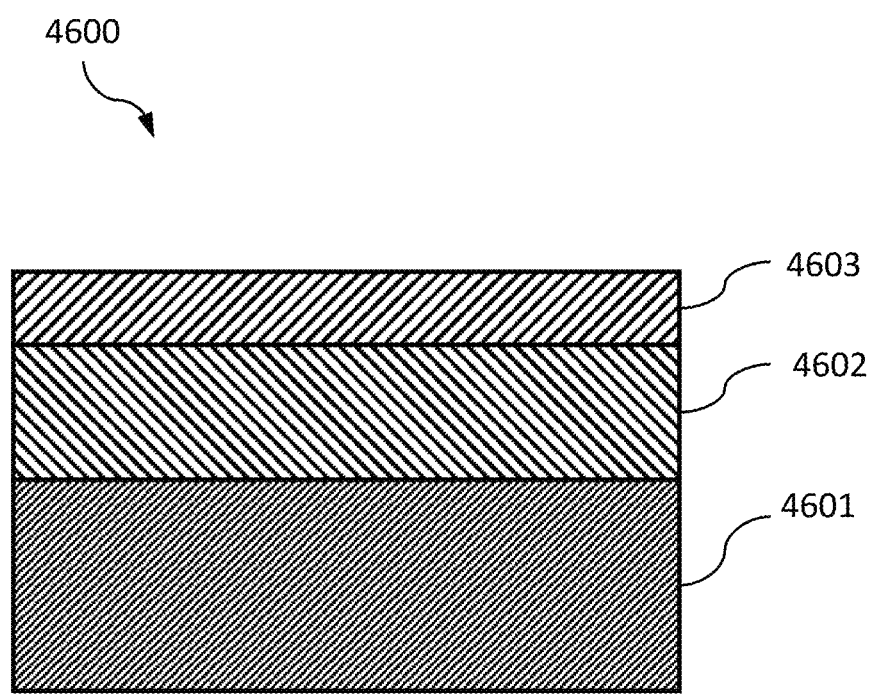
FIG. 46A is a sectional view of an epitaxially formed layered semiconductor structure comprising a substrate, a substantially single crystal epilayer comprising $Mg_2GeO_4$ (Fd3m) and an optional cap formed of MgO, in accordance with some embodiments.

FIG. 46A shows a sectional view of an epitaxially formed layered semiconductor structure 4600 comprising a substrate 4601, a substantially single crystal epilayer (i.e., epitaxial layer) 4602 (which may include one or more epilayers), and an optional cap 4603. In some embodiments, the substrate 4601 may be MgO, the epilayer 4602 may comprise $Mg_2GeO_4$ (Fd3m), and the cap 4603 may be formed of MgO. In this example, the epilayer(s) 4602 are formed via a deposition process on a prepared substrate 4601 having a surface crystal structure advantageous for growth of the epilayer as described herein.

FIG. 46B shows a table 4605 of crystal structure properties of example epitaxial film materials 4610 and substrates that are compatible with $Mg_2GeO_4$, in accordance with some embodiments. It was found experimentally that the misfit in lattice matching between $Mg_2GeO_4$ and the substrate or other listed cubic oxides can be managed to form extremely low defect density structures with high coherence. The smallest lattice mismatch between $Mg_2GeO_4$ and substrate was found to be for the substrate material MgO (column 4620) followed by $Al_2MgO_4$ (column 4622) and LiF (column 4624). These substrates are important because of their high optical transparency in the extreme ultraviolet range. All the compounds listed are cubic, with MgO and LiF having approximately half the lattice constant for the $AB_2O_4$ compounds, where {A,B} are selected from {Al, Ga, Ge, Zn}.

Figure 46C:
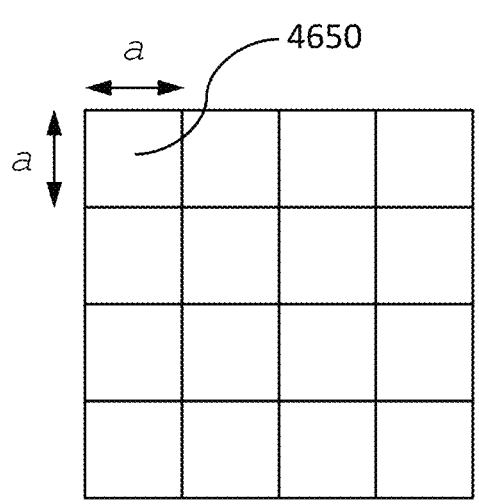
FIG. 46C is a cubic crystal structure diagram of a substrate made from MgO or LiF, having a symmetric lattice constant, a, in accordance with some embodiments.

FIG. 46C shows a cubic crystal structure diagram of a substrate selected from MgO or LiF or similar crystal structure, having a symmetric lattice constant, a, for each unit cell 4650. Other substrates such as monoclinic beta-phase $Ga_2O_3$ are also possible using the unique (100)-oriented surface.

Figure 46D:
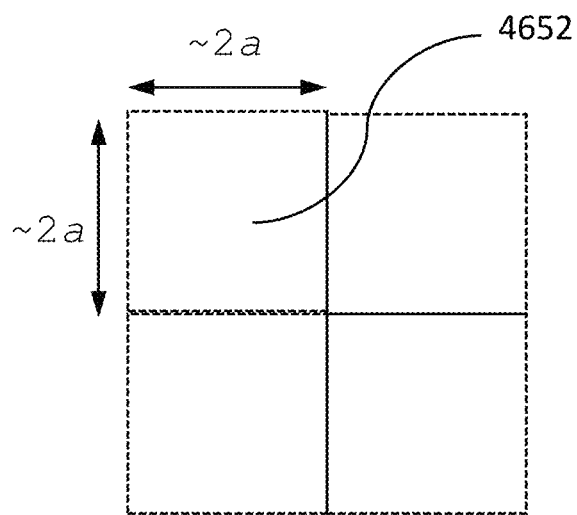
FIG. 46D is a cubic crystal structure diagram of a substrate or epilayer having symmetric lattice constant approximately twice as large as that illustrated in FIG. 46C, in accordance with some embodiments.

FIG. 46D shows a cubic crystal structure diagram of a substrate or epilayer selected from $Mg_2GeO_4$, $MgGa_2O_4$, $ZnGa_2O_4$ or $MgAl_2O_4$ (or similar), having a symmetric lattice constant for each unit cell 4652 approximately twice as large as that illustrated in FIG. 46C, namely 2a.

Figure 46E:
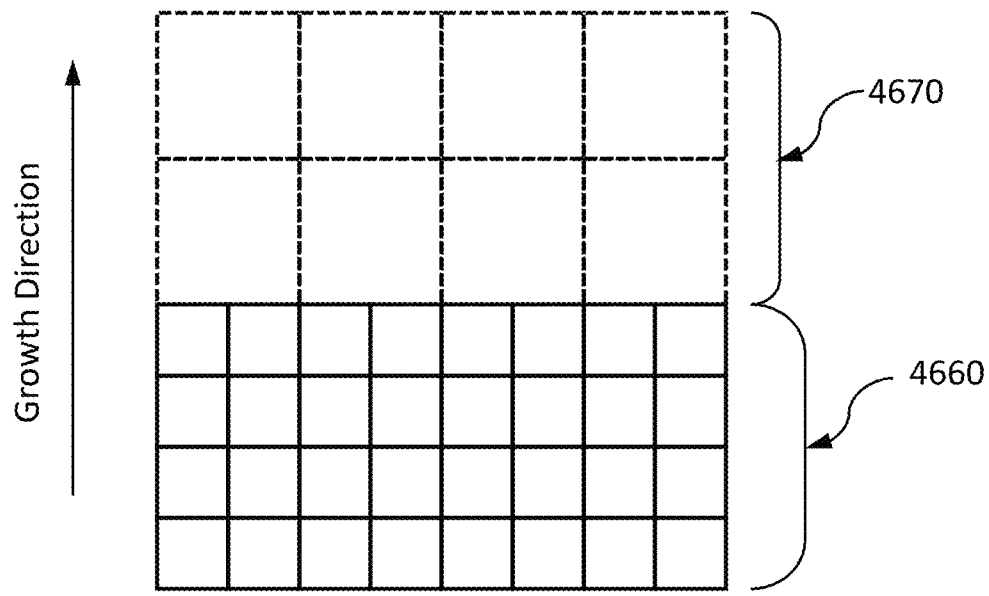
FIG. 46E is a schematic diagram depicting coherent epitaxial layer formation along a growth direction of two distinct cubic crystal structures having a large difference in lattice constants, in accordance with some embodiments.

FIG. 46E shows a schematic diagram depicting coherent epitaxial layer formation along a growth direction of two distinct cubic crystal structures having large difference in lattice constants. Layer 4660 has a lattice constant a (see FIG. 46C), and layer 4670 has a lattice constant ~2×a (see FIG. 46D). For example, an epilayer 4670 of $Mg_2GeO_4$ (or γ-Ga2O3, $MgGa_2O_4$, $ZnGa_2O_4$ or $MgAl_2O_4$) can be formed with low dislocation density at the growth interface between layers 4660 and 4670 by matching the epilayer lattice constant with a multiple (e.g., integer multiple) of the lattice constant of the underlying film or substrate (layer 4660). In the example of FIG. 46E, the lattice constants are matched with an integer multiple of about 2 in the plane of the heterointerface; that is, the lattice constant a of layer 4660 matched with the lattice constant 2a of layer 4670. Put another way, within an x-y growth plane perpendicular to the growth direction, the lattice constants are matched with an integer multiple of 2 corresponding to a 2×2 array of unit cells. For example, this may be achieved in the cubic $Mg_2GeO_4$ deposited on MgO substrate.

FIGS. 47-50 show X-ray diffraction (XRD) diagrams (intensity versus angle in an Ω-2θ scan) of example layered semiconductor structures for different flux values of $k=\Phi_{Ge}^{inc}/\Phi_{Mg}^{inc}$, demonstrating the effect of flux ratio of the impinging species on the resulting grown layers, in accordance with some embodiments.

Figure 47:
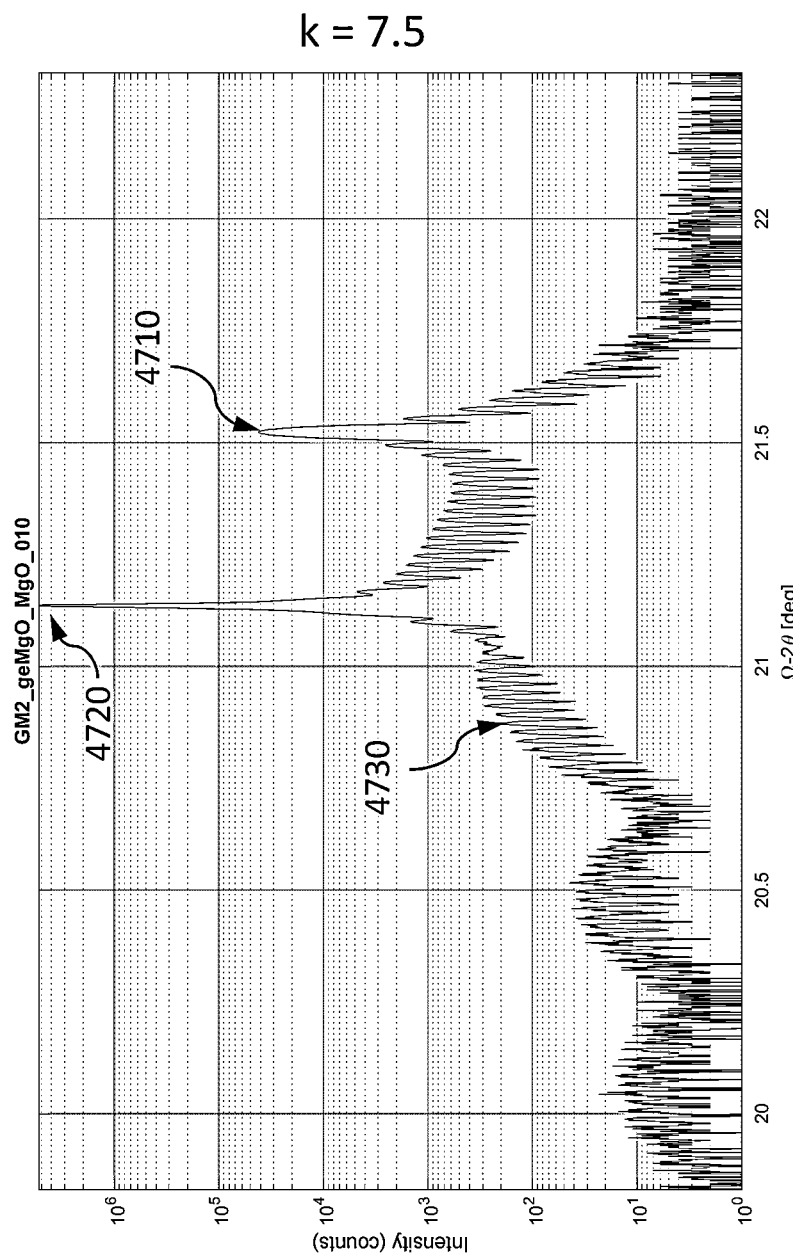
FIG. 47 is an experimentally determined triple axis X-ray diffraction (XRD) diagram of a layered semiconductor structure as illustrated in FIG. 46A where a $Mg_2GeO_4$ (Fd3m) layer was formed with k=7.5, in accordance with some embodiments.

In FIG. 47, an experimentally determined triple axis XRD diagram is shown of the layered semiconductor structure illustrated in FIG. 46A. A 240 nm $Mg_2GeO_4$ (Fd3m) epitaxial layer was formed with incident Ge and Mg fluxes of $\Phi_{Ge}^{inc}/\Phi_{Mg}^{inc}$~7.5 and a growth temperature of 425° C. A thin MgO cap (~11 nm) was deposited on the surface to form an X-ray Fabry-Perot structure. In this example, the extremely narrow full-width half-max (FWHM) of the $Mg_2GeO_4$ peak 4710 compared to the MgO substrate peak 4720 clearly shows the high quality of the structure. Furthermore, the MgO cap layer further induces high frequency Pendellosung oscillations 4730 in the XRD curve indicative of a fully coherent structure, of extremely high quality, with low defect density. The MgO substrate, cubic $Mg_2GeO_4$ film and MgO cap were highly crystalline and plane parallel on an atomic scale with coherence throughout the structure thereby inducing an X-ray Fabry-Perot effect, as shown. The bulk $Mg_2GeO_4$(400) 4710 peak separation from the substrate MgO(200) peak 4720 is 1395.9 s.

Figure 48:
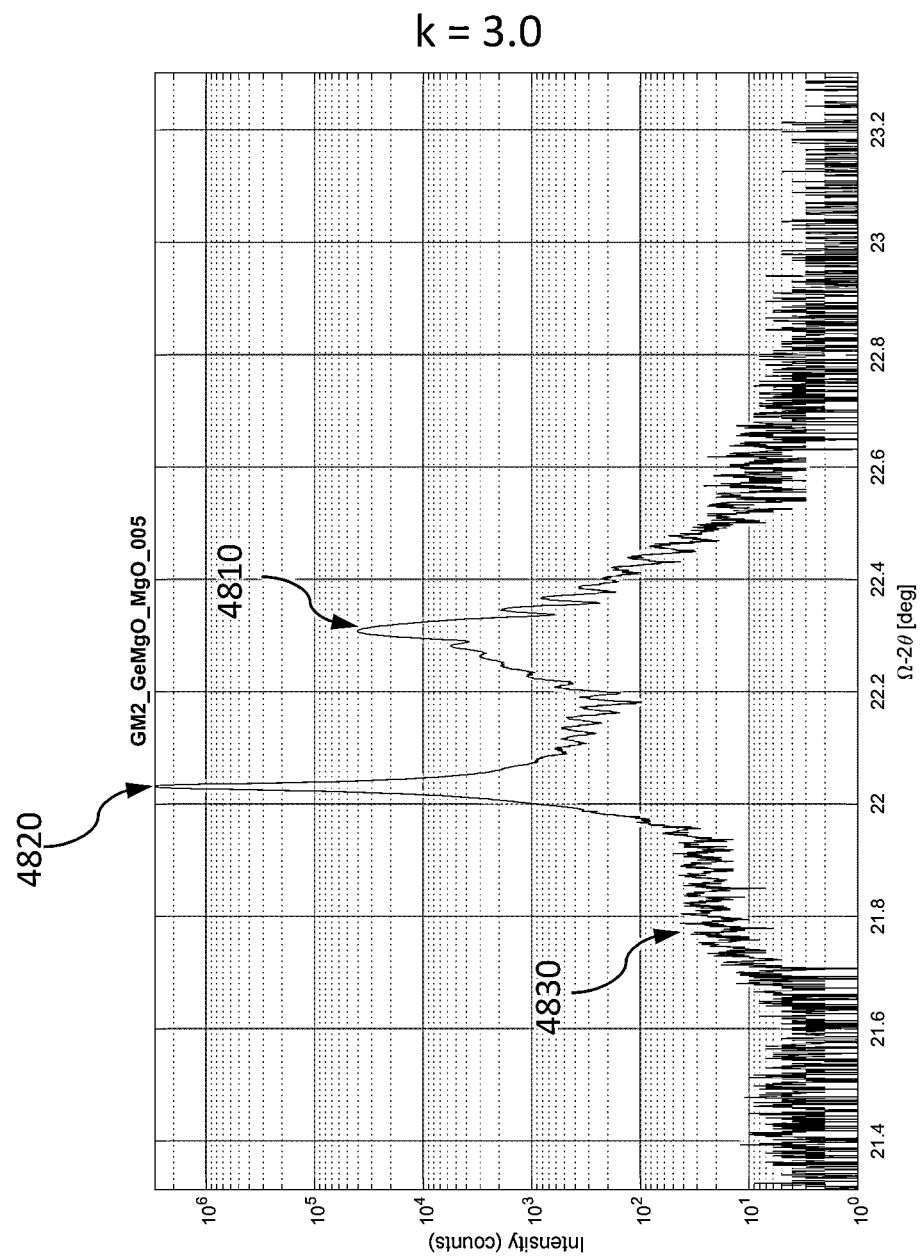
FIG. 48 is an experimentally determined triple axis XRD diagram of a layered semiconductor structure as illustrated in FIG. 46A where a $Mg_2GeO_4$ (Fd3m) layer was formed with k=3, in accordance with some embodiments.

FIG. 48 shows an experimentally determined triple axis XRD diagram of the layered semiconductor structure illustrated in FIG. 46A where an approximately 254 nm thick $Mg_2GeO_4$ (Fd3m) layer was formed with incident Ge and Mg fluxes of $\Phi_{Ge}^{inc}/\Phi_{Mg}^{inc}$~3 and a growth temperature of 425° C. A substrate of MgO (peak 4820) and an $Mg_2GeO_4$ peak 4810 show that a crystalline film of $Mg_2GeO_4$ was formed. A cap of MgO similar to FIG. 47 was also included in the structure, however, there are less high frequency fringes indicating that the crystal structure is less coherent than in FIG. 47.

Figure 49:
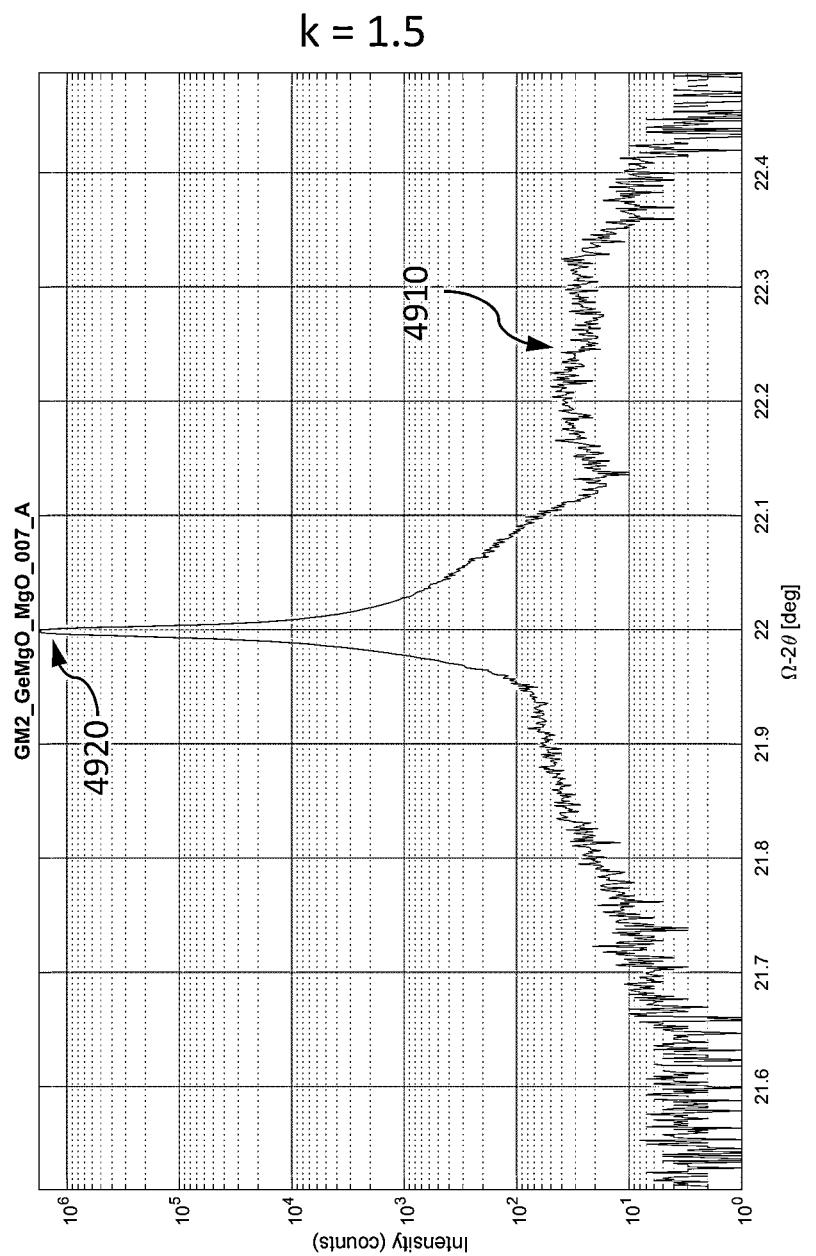
FIG. 49 is an experimentally determined triple axis XRD diagram of a layered semiconductor structure as illustrated in FIG. 46A where a $Mg_2GeO_4$ (Fd3m) layer was formed with k=1.5, in accordance with some embodiments.

FIG. 49 shows an experimentally determined triple axis XRD diagram of the layered semiconductor structure illustrated in FIG. 46A where a Mg$_2$GeO$_4$ (Fd3m) layer was formed with incident Ge and Mg fluxes of $\Phi_{Ge}^{inc}/\Phi_{Mg}^{inc}$~1.5 and a growth temperature of 425° C. As can be seen from the substrate peak 4920 and the Mg$_2$GeO$_4$ peak 4910, only minimal formation of a Mg$_2$GeO$_4$ (Fd3m) layer appeared.

Figure 50:
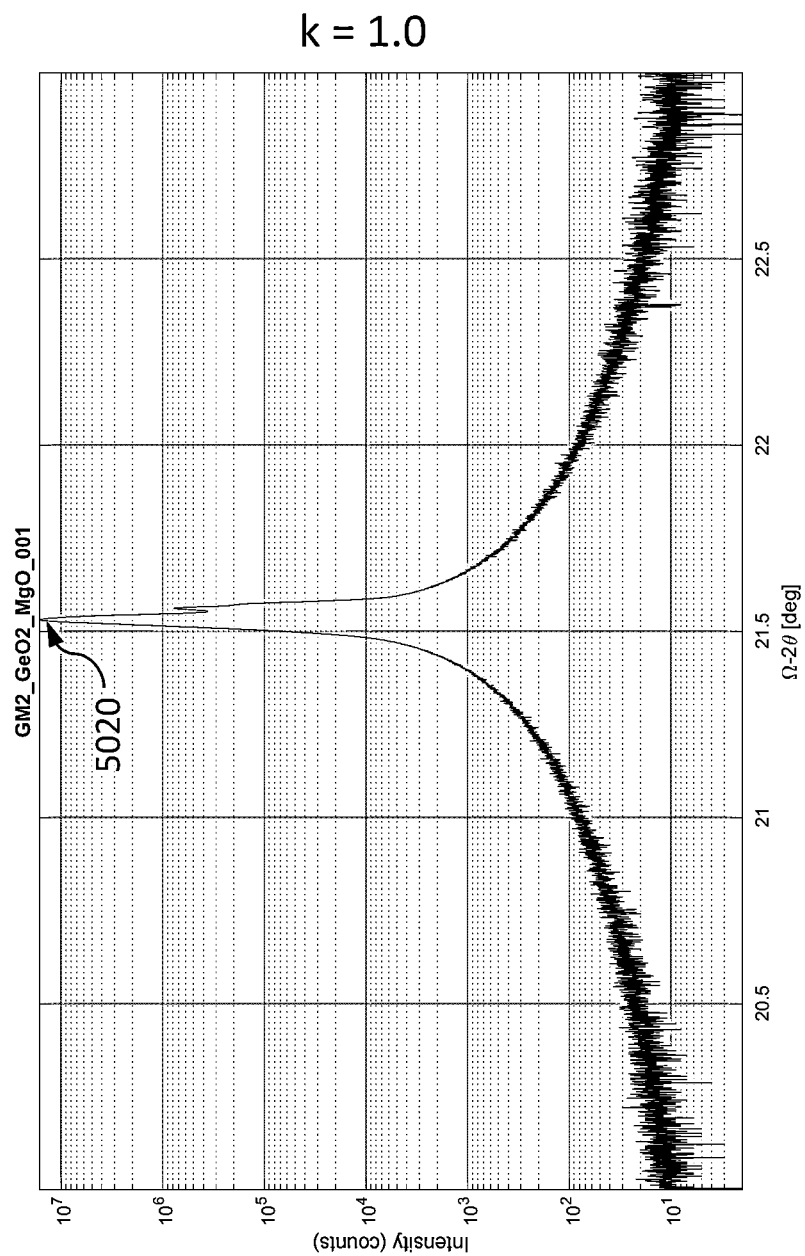
FIG. 50 is an experimentally determined triple axis XRD diagram of a semiconductor structure where a $Mg_2GeO_4$ (Fd3m) layer was attempted to be formed with k=~1.0, in accordance with some embodiments.

FIG. 50 is an experimentally determined triple axis XRD diagram of the layered semiconductor structure illustrated in FIG. 46A where the incident Ge and Mg fluxes were $\Phi_{Ge}^{inc}/\Phi_{Mg}^{inc}$~1.0 and the growth temperature was 425° C. As can be seen, there was no formation of a Mg$_2$GeO$_4$ (Fd3m) layer, with the layered semiconductor structure only comprising MgO (peak 5020). FIGS. 47-50 illustrate that higher relative amounts of Ge flux (k=$\Phi_{Ge}^{inc}/\Phi_{Mg}^{inc}$) in the molecular beam epitaxy process improved the quality of the epitaxial Mg$_2$GeO$_4$ (Fd3m) layer for the growth conditions used. A very high quality Mg$_2$GeO$_4$ (Fd3m) epitaxial layer on MgO was achieved, as demonstrated by FIG. 47.

Multilayered Structures

Epitaxial layers of Mg$_x$Ge$_y$O$_z$ as disclosed herein may be used in various semiconductor device structures, such as those including multilayered structures and chirp layers. Multilayered structures may be, for example, a superlattice ("SL", which may include short-period superlattices), multiple superlattices, a compositionally varied (or graded) layer, or a compositionally varied (or graded) multilayer structure (or region). Embodiments of multilayered structures shall be described by FIGS. 51-53. Although certain combinations of substrate materials, buffer layers and multilayered layers shall be described, other combinations are possible using the Mg$_x$Ge$_y$O$_z$ materials and compatible substrates as described throughout this disclosure.

Embodiments include semiconductor structures and devices having a superlattice, the superlattice comprising a unit cell having a first layer, where the epitaxial layer of Mg$_x$Ge$_{1-x}$O$_{2-x}$ is the first layer in the superlattice. In some embodiments, the unit cell of the superlattice further comprises a second layer of Mg$_y$Ge$_{1-y}$O$_{2-y}$, wherein y ranges from 0 to 1 and x≠y. For example, the first layer may be MgO having a Fm3m space group, where in some embodiments, the unit cell of the superlattice further comprises a second layer, the second layer made of Mg$_2$GeO$_4$ that has a Fd3m space group. In some embodiments, the unit cell of the superlattice further comprises a second layer of MgGa$_2$O$_4$ or gamma-Ga$_2$O$_3$.

Figure 51:
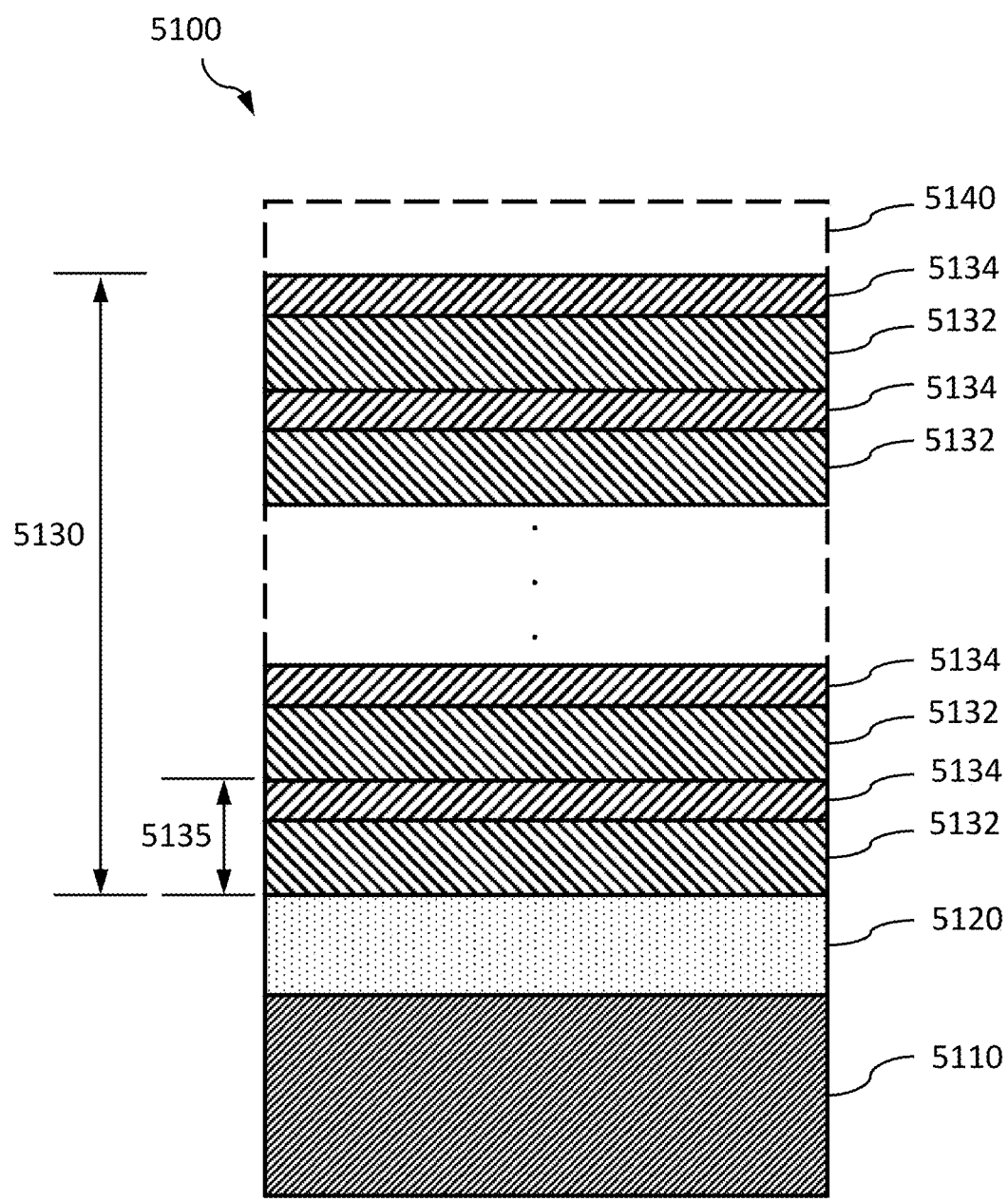
FIG. 51 is a sectional view of an epitaxially formed layered semiconductor structure comprising a substrate, an optional buffer layer, and a superlattice or multilayered periodic structure, in accordance with some embodiments.

FIG. 51 shows a sectional view of an epitaxially formed layered semiconductor structure 5100 comprising a substrate 5110, an optional buffer layer 5120, a superlattice or multilayered periodic structure 5130, and an optional cap 5140. The periodic structure 5130 (e.g., superlattice) comprises repeated unit cells 5135 consisting of two layers 5132 and 5134 in this example. The figure shows layer 5132 being thicker than layer 5134; however, in other embodiments, layer 5132 may be thinner than layer 5134 or the layers 5132 and 5134 may be equal in thickness. In an example embodiment, the layered semiconductor structure 5100 comprises a MgO(100)-oriented substrate 5110, superlattice (periodic structure 5130) comprising a unit cell 5135 of MgGeO and MgO having a definite period, and a final cap 5140 of MgO. Substrate 5110 may be prepared for deposition using an oxygen plasma source to terminate the MgO surface with oxygen specie.

FIGS. 52A-52F show experimentally determined XRD diagrams for embodiments of the semiconductor structure illustrated in FIG. 51, where the structures included superlattices. In FIGS. 52A-52F, the peak representing the substrate is marked as "SUB." The additional arrows point to "satellite peaks," which are features of the XRD pattern caused by the periodic SL structure. FIGS. 52H-52I show experimentally determined XRD diagrams for embodiments of the semiconductor structure illustrated in FIG. 52G.

Figure 52A:
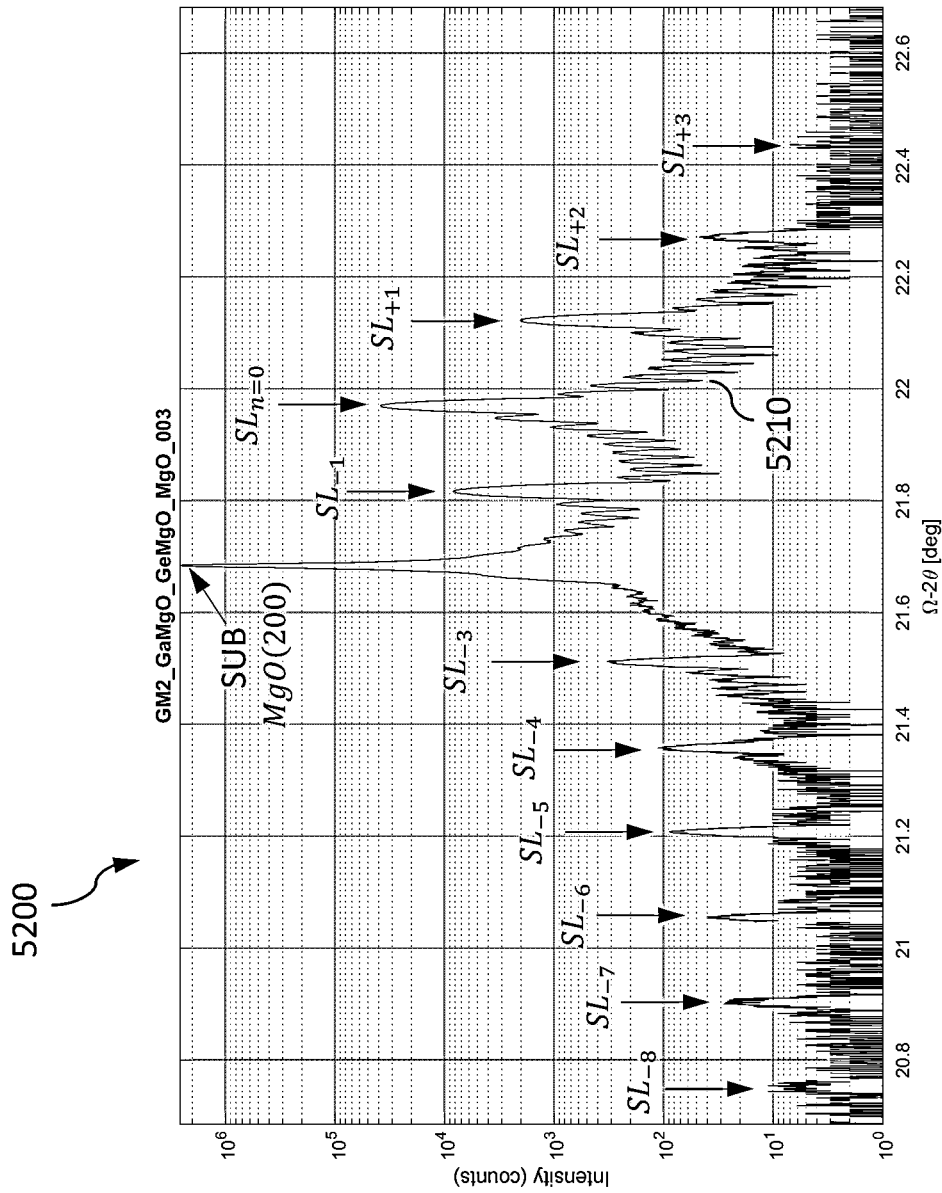
FIG. 52A is an experimentally determined XRD diagram of a layered semiconductor structure as illustrated in FIG. 51 for a superlattice where one layer was MgO and another layer was $Mg_2GeO_4$ (Fd3m), deposited on a MgO buffer layer and a MgO(100) substrate, in accordance with some embodiments.

FIG. 52A is an experimentally determined XRD diagram 5200 of the layered semiconductor structure illustrated in FIG. 51 for a superlattice 5130 where layer 5132 was a Fd3m MgGa$_2$O$_4$ and layer 5134 was Mg$_2$GeO$_4$ (Fd3m). The Mg$_2$GeO$_4$ (Fd3m) layer was formed with incident Ge and Mg fluxes of $\Phi_{Ge}^{inc}/\Phi_{Mg}^{inc}$~7 deposited upon a MgO buffer layer 5120 which was deposited on a MgO(100) substrate 5110. As can be seen, the high frequency fringes (one example labeled as fringes 5210) indicate an extremely high crystal quality, implying excellent matching between the in-plane lattice constants of the MgGa$_2$O$_4$ and Mg$_2$GeO$_4$ (Fd3m) layers forming the superlattice. The sharp satellite peaks (marked by arrows SL$_n$) persist to higher orders without broadening and are indicative of a coherently grown structure of high structural quality. The SL period is 26 nm and the MgO(200) substrate separation from the SL$_{n=0}$ peak is 1024.8s.

Figure 52B:
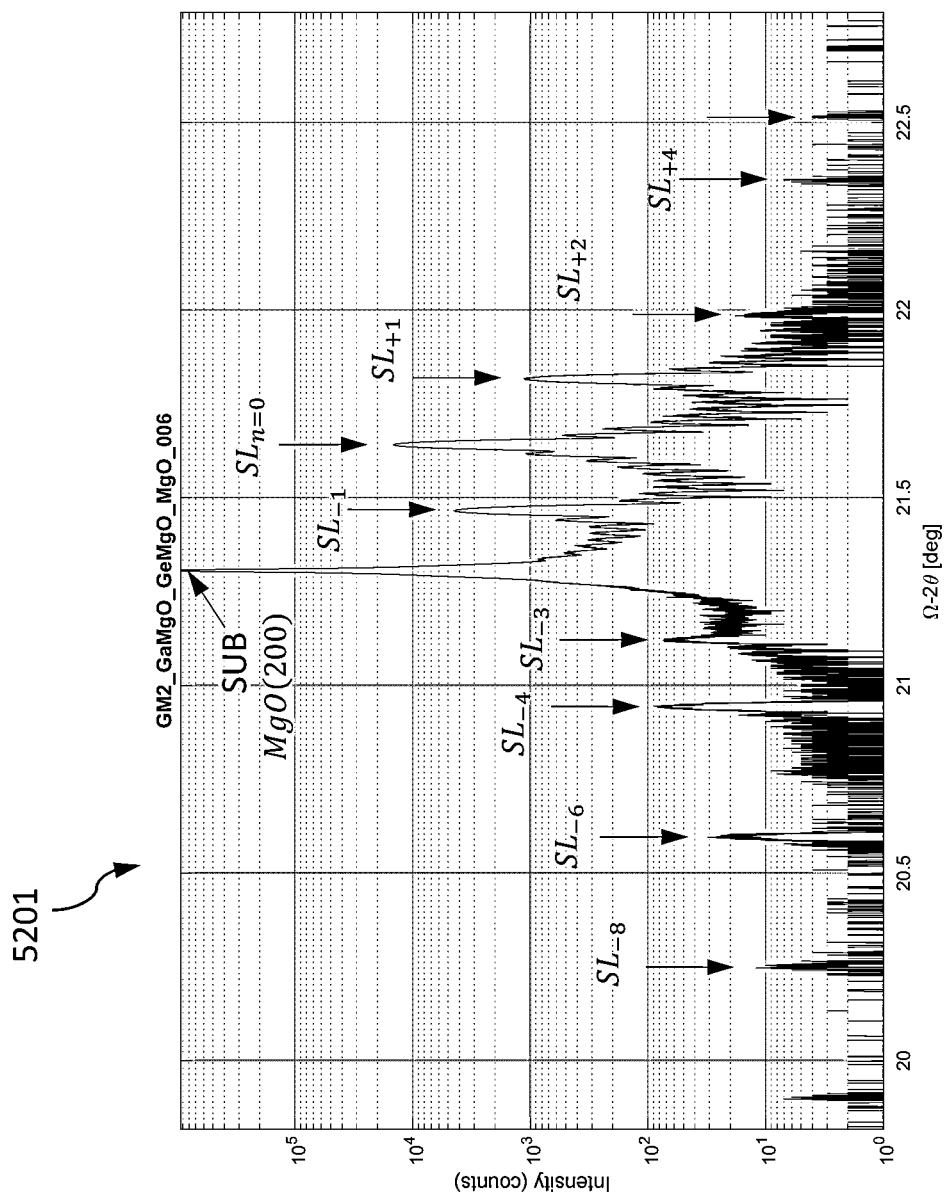
FIG. 52B is an experimentally determined XRD diagram of a layered semiconductor structure as illustrated in FIG. 51 for a superlattice where one layer was $Mg_2GeO_4$ (Fd3m) and another layer was $MgGa_2O_4$ (Fd3m), deposited upon a MgO buffer layer and a MgO(100) substrate, in accordance with some embodiments.

FIG. 52B shows an experimentally determined XRD diagram 5201 of the layered semiconductor structure illustrated in FIG. 51 for a superlattice 5130 where layer 5132 was Mg$_2$GeO$_4$ (Fd3m) and layer 5134 was MgGa$_2$O$_4$ (Fd3m). The superlattice was deposited upon a MgO buffer layer 5120 and a MgO(100) substrate 5110. The sharp satellite peaks (SL$_n$) are again indicative of a coherently grown structure of high structural quality. FIG. 52B demonstrates a superlattice having a unit cell in which the first layer of the unit cell is Mg$_2$GeO$_4$ having a Fd3m space group, and a second layer of the unit cell is MgGa$_2$O$_4$ having a Fd3m space group. The SL period is 27.2 nm with 10 periods, and the MgO(200) substrate separation from the SL$_{n=0}$ peak is 1206.7 s indicating a thicker MgGe$_2$O$_4$ layer compared to FIG. 52A.

Figure 52C:
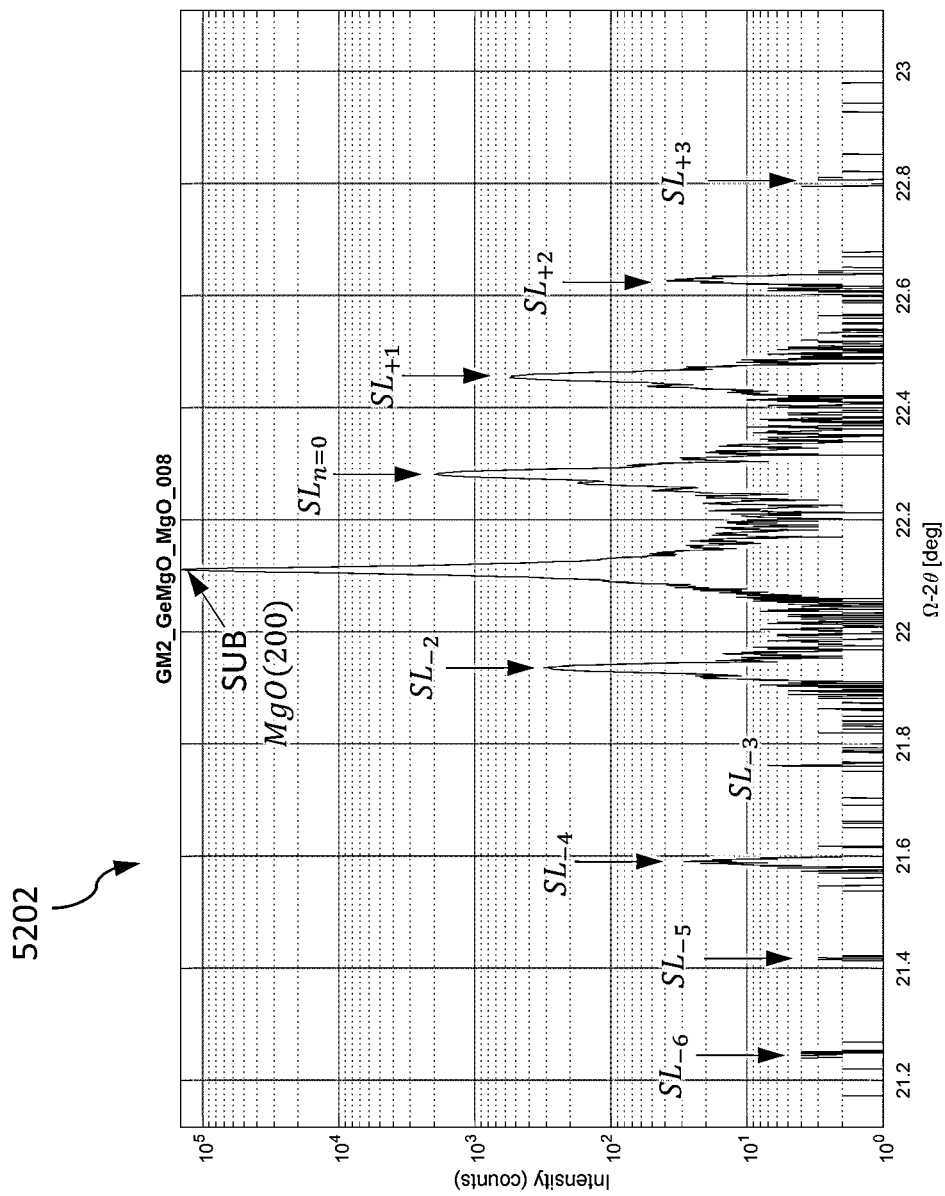
FIG. 52C is an experimentally determined XRD diagram of a layered semiconductor structure as illustrated in FIG. 51 for a superlattice where one layer was $Mg_2GeO_4$ (Fd3m) and another layer was MgO (Fm3m), the superlattice being deposited upon a MgO buffer layer and a MgO(100) substrate, in accordance with some embodiments.

FIG. 52C is an experimentally determined XRD diagram 5202 of the layered semiconductor structure illustrated in FIG. 51 for a superlattice 5130 where layer 5132 was Mg$_2$GeO$_4$ (Fd3m) and layer 5134 was MgO (Fm3m). The superlattice was deposited upon a MgO buffer layer 5120 and a MgO(100) substrate 5110. The sharp satellite peaks (SL$_n$) are indicative of a coherently grown structure of high structural quality. FIG. 52C demonstrates a superlattice having a unit cell in which the first layer of the unit cell is MgO having a Fm3m space group, and a second layer of the unit cell is made of Mg$_2$GeO$_4$ that has a Fd3m space group. This result demonstrates that Mg$_2$GeO$_4$ can be formed on MgO and also MgO can be formed on Mg$_2$GeO$_4$. The SL period is 26.6 nm and has N=10 periods with N−2 thickness oscillations between the satellite peaks. The SL$_{n=0}$ separation to the MgO(200) substrate is 614.2 s indicating the SL effective alloy of (Mg$_O$)$_x$(GeMg$_2$O$_4$)$_{1-x}$ is $$x = \frac{614.2}{1395.5} = 0.44.$$

Figure 52D:
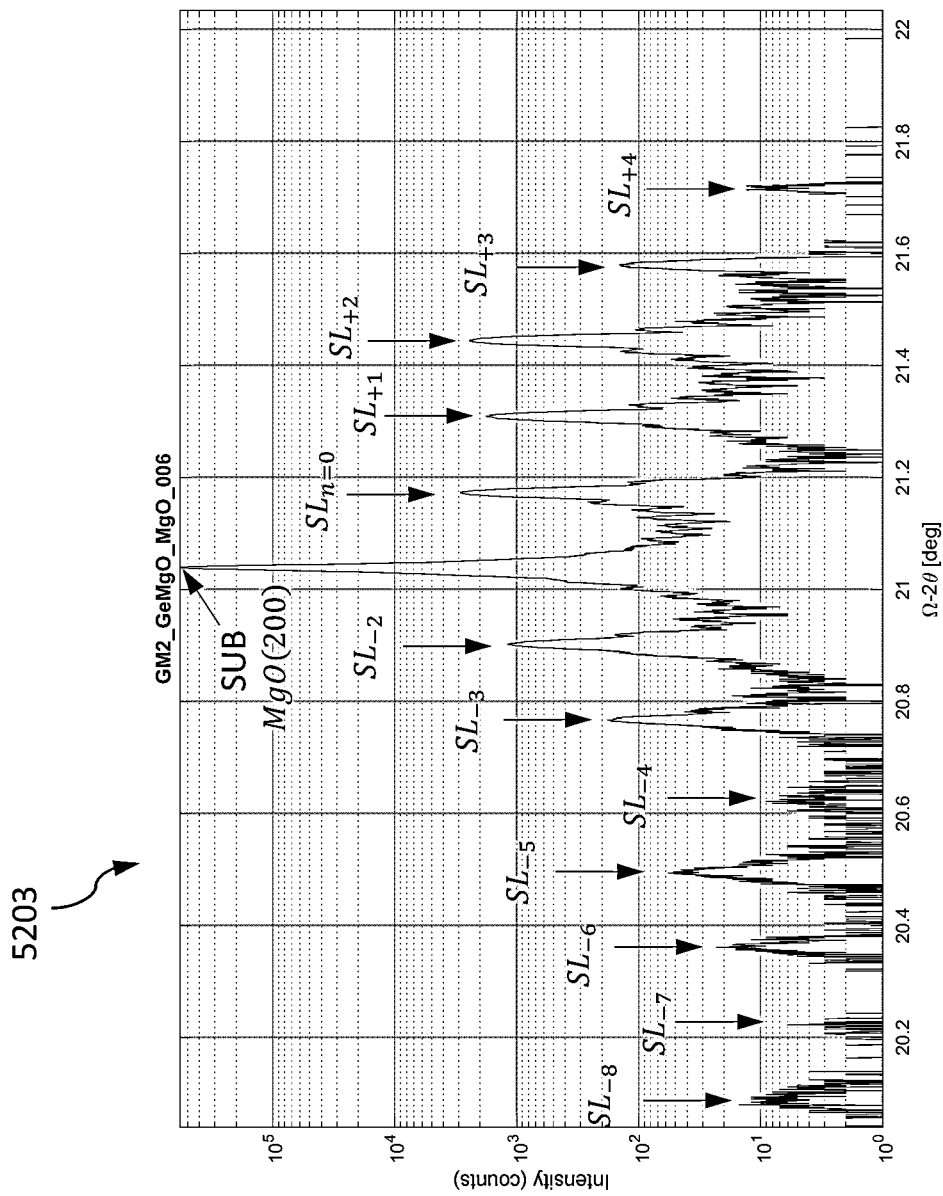
FIG. 52D is an experimentally determined XRD diagram of a layered semiconductor structure as illustrated in FIG. 51 for a superlattice where one layer was $Mg_2GeO_4$ (Fd3m) and another layer was MgO (Fm3m), deposited upon a MgO buffer layer and a MgO(100) substrate, in accordance with some embodiments.

FIG. 52D shows an experimentally determined XRD diagram 5203 of the layered semiconductor structure illustrated in FIG. 51 for a superlattice 5130 where layer 5132 was $Mg_2GeO_4$ (Fd3m) and layer 5134 was MgO (Fm3m). The layers of the structure represented in FIG. 52D were thicker than in FIG. 52C, as evidenced by there being more satellite peaks ($SL_n$) in FIG. 52D than in FIG. 52C. The superlattice was deposited upon a MgO buffer layer 5120 and a MgO(100) substrate 5110. The sharp satellite peaks are indicative of a coherently grown structure of high structural quality. The SL period is 35.6 nm and grown with 10 periods.

Figure 52E:
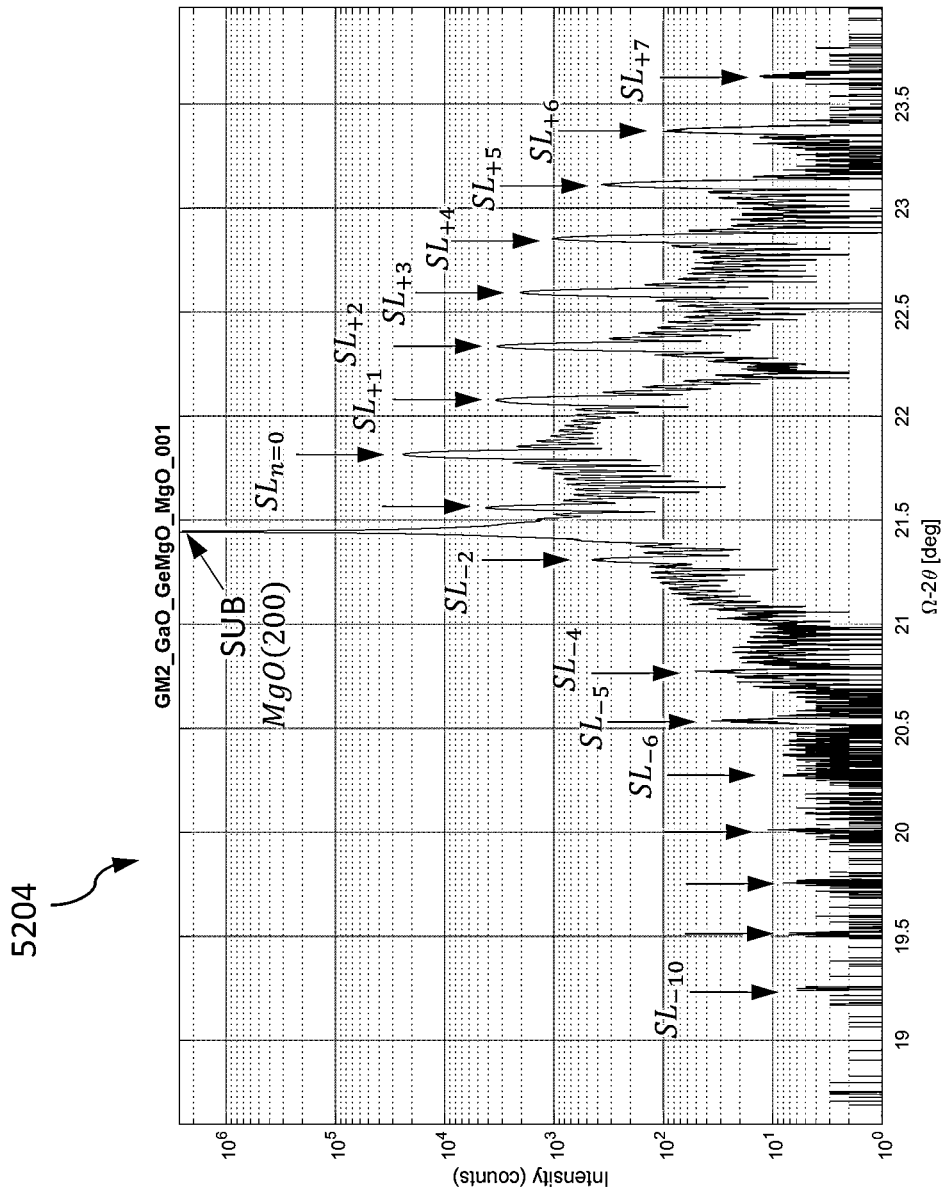
FIG. 52E is an experimentally determined XRD diagram of a layered semiconductor structure as illustrated in FIG. 51 for a superlattice where one layer was $Mg_2GeO_4$ (Fd3m) and another layer was stabilized cubic gamma-$Ga_2O_3$, the superlattice being deposited upon a MgO buffer layer and a MgO(100) substrate, in accordance with some embodiments.

FIG. 52E is an experimentally determined XRD diagram 5204 of the layered semiconductor structure illustrated in FIG. 51 for a superlattice 5130 where layer 5132 was $Mg_2GeO_4$ (Fd3m) and layer 5134 was stabilized cubic gamma-$Ga_2O_3$. The superlattice was deposited upon a MgO buffer layer 5120 and a MgO(100) substrate 5110. The sharp satellite peaks ($SL_n$) are indicative of a coherently grown structure of high structural quality. The superlattice period is 18.4 nm and has 10 periods. The MgO(200) substrate separation from the $SL_{n=0}$ peak is 1337.6 s indicating an effective digital alloy comprising $(\gamma Ga_2O_3)_x(GeMg_2O_4)_{1-x} \equiv Ga_{2x}Ge_{1-x}Mg_{2(1-x)}O_{4-x}$. The cubic $\gamma Ga_2O_3$ layers are stabilized by intentionally growing the layers below the critical layer thickness (CLT) wherein it becomes energetically favorable to form $\beta Ga_2O_3$ unless stabilized with another species.

Figure 52F:
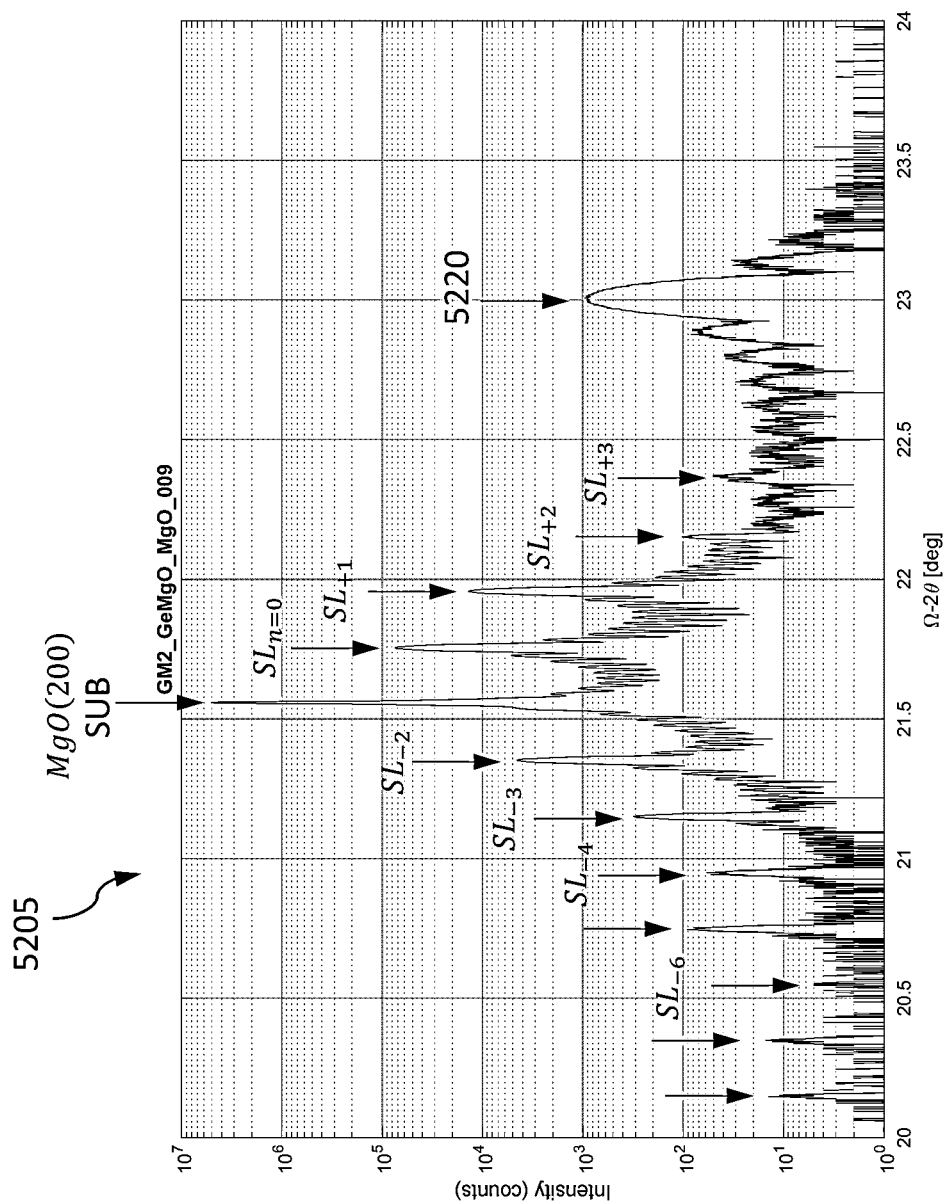
FIG. 52F is an experimentally determined XRD diagram of a layered semiconductor structure as illustrated in FIG. 51 for a superlattice where one layer was $Mg_2GeO_4$ (Fd3m) and another layer was stabilized cubic gamma-$Ga_2O_3$, the superlattice being deposited upon a MgO buffer layer and a MgO(100) substrate, in accordance with some embodiments.

FIG. 52F is an experimentally determined XRD diagram 5205 of the layered semiconductor structure illustrated in FIG. 51 for a superlattice 5130 where layer 5132 was $Mg_2GeO_4$ (Fd3m) and layer 5134 was MgO. After the deposition of a 10× period SL [MgO/$Mg_2GeO_4$], a thick beta-$Ga_2O_3$ cap layer was formed with thickness exceeding the CLT (note: below the CLT a stabilized gamma-$Ga_2O_3$ can be formed). The superlattice was deposited upon a MgO buffer layer 5120 and a MgO(100) substrate 5110. In this example, a thick beta-phase $Ga_2O_3$ film 5220 was grown as the cap layer 5140 showing highly coherent structure. The sharp satellite peaks ($SL_n$) are indicative of a coherently grown structure of high structural quality. The SL acts as a pseudo-substrate for the formation of high-quality beta-$Ga_2O_3$(100) oriented films with biaxial strain suitable for tuning of the valence band edge. FIG. 52F demonstrates a superlattice having a unit cell in which the first layer of the unit cell is $Mg_2GeO_4$ having a Fd3m space group, and a second layer of the unit cell is MgO having a cubic symmetry, and a further thick epitaxial beta-phase $Ga_2O_3$ is grown on the SL acting as a pseudosubstrate.

Figure 52G:
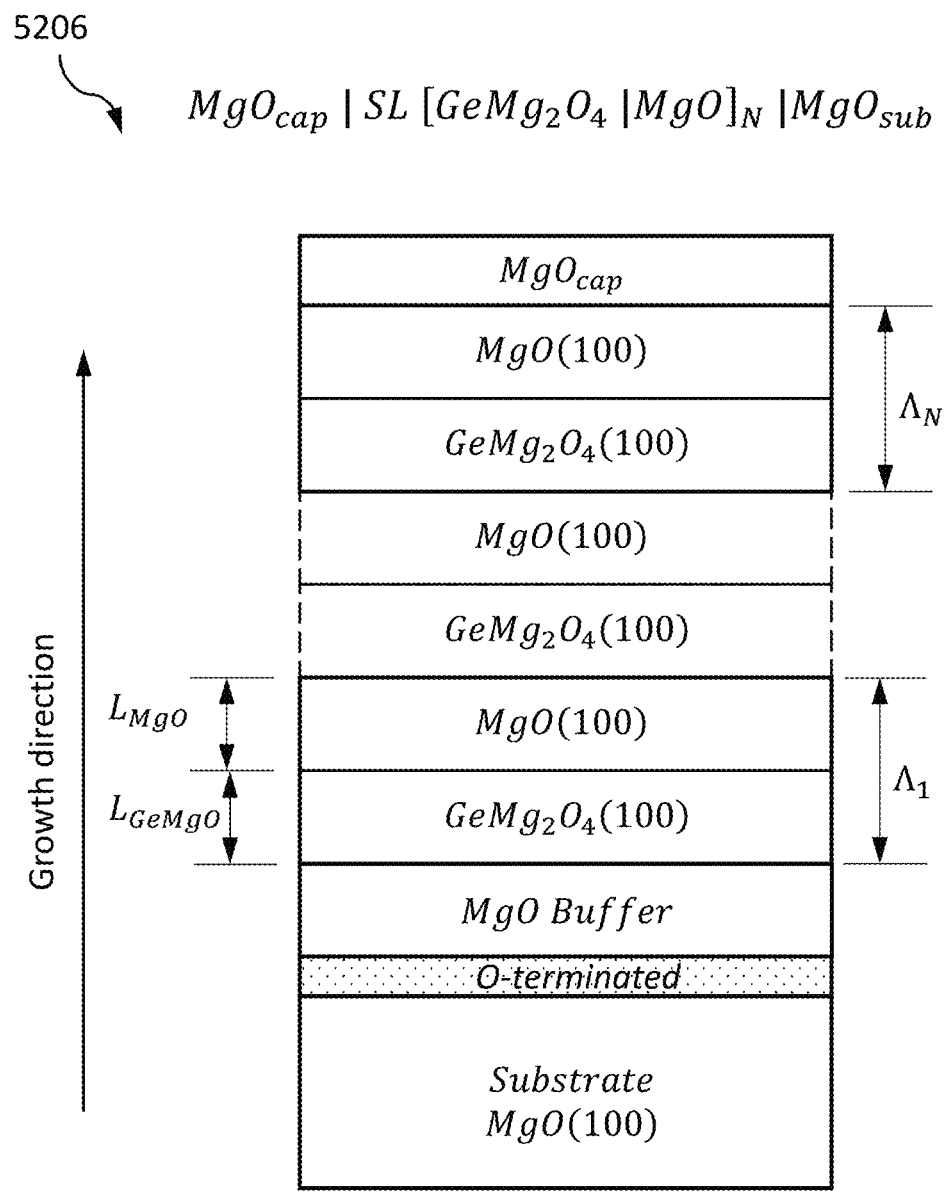
FIG. 52G shows the complex epilayer structure of dissimilar cubic oxide layers integrated into a superlattice or multi-heterojunction structure, in accordance with some embodiments.
Figure 52H:
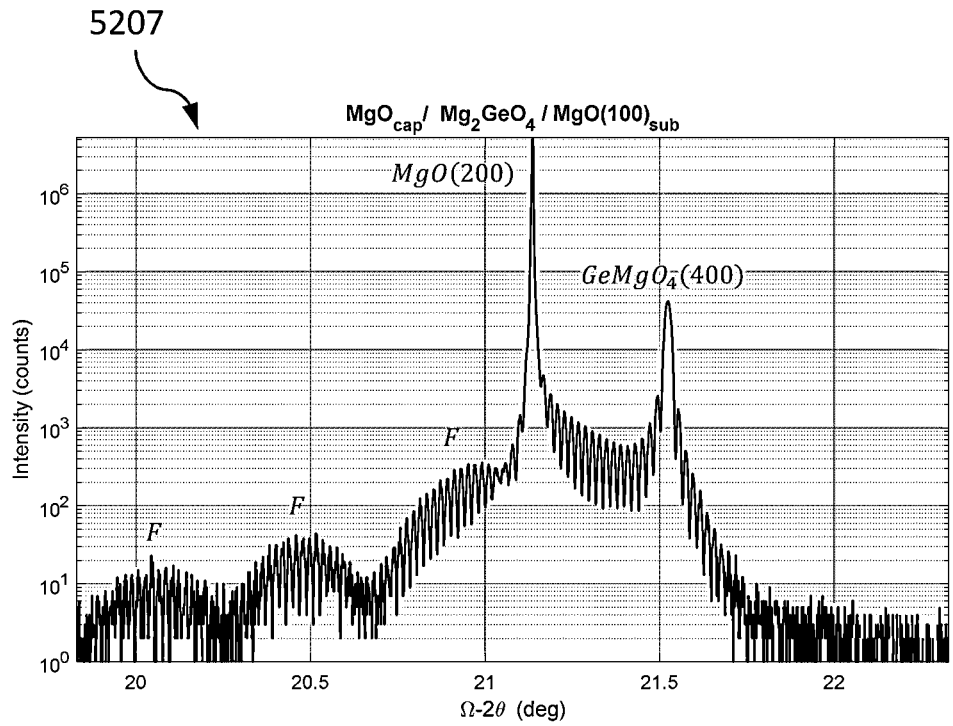
FIG. 52H shows the experimental XRD data of a Fd3m crystal structure $GeMg_2O_4$ deposited as a high quality bulk layer on a Fm3m MgO(100) substrate and further comprising a MgO cap, in accordance with some embodiments.
Figure 52I:
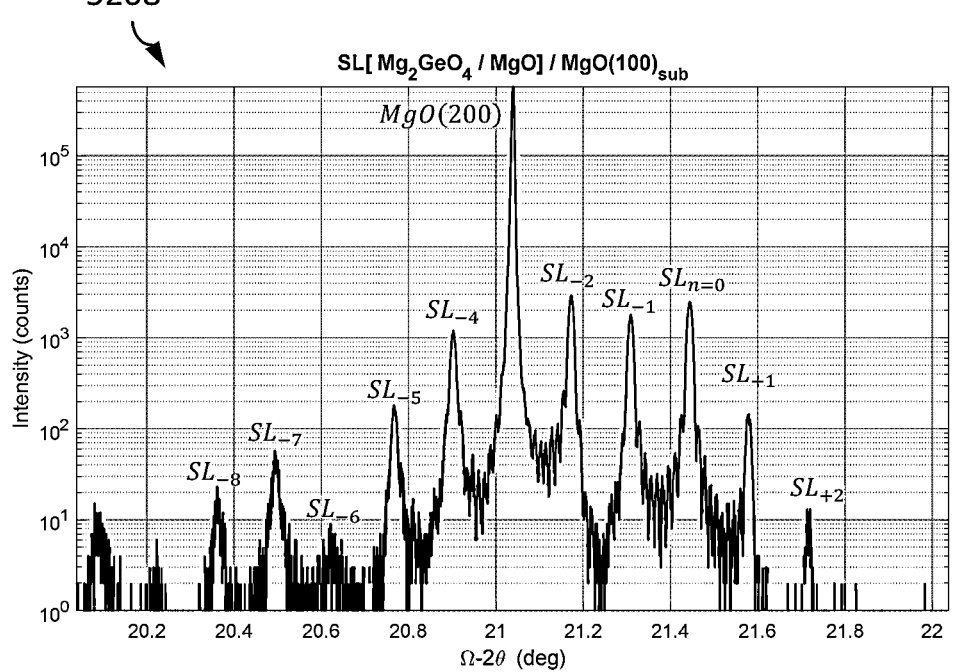
FIG. 52I shows the experimental XRD data of a Fd3m crystal structure $GeMg_2O_4$ when incorporated as a SL structure comprising 20× period $SL[GeMg_2O_4/MgO]$ on a Fm3m MgO(100) substrate, in accordance with some embodiments.

FIG. 52G shows a complex epilayer structure 5206 of dissimilar cubic oxide layers integrated into a superlattice or multi-heterojunction structure in a further example. Shown are large lattice constant cubic $GeMg_2O_4$ (i.e., $Mg_2GeO_4$) and small lattice constant MgO layers forming a superlattice having a repeating period Λ with N repetitions, grown along a growth direction. A MgO(100)-oriented substrate enables the lattice "2×" cube-on-cube matching to $GeMg_2O_4$. The direct bandgap E-k of both materials enables unique electronic band structure tuning using quantized energy levels pre-selected from specific layer thicknesses comprising the SL period. If the layers thicknesses "L" comprising the SL are thin, such that each of $L_{GeMgO}$ and $L_{MgO}$ are less than approximately 10-20× their respective unit cells in thickness (i.e., layer thicknesses less than about 150 nm), then a digital pseudo-alloy can be formed having an effective composition $(MgO)_x(GeMg_2O_4)_{1-x} \equiv Ge_{1-x}Mg_{2-x}O_{4-3x}$ where $0 \le (x = L_{MgO}/\Lambda) \le 1$. An optional MgO cap layer is shown that can be used to protect the final surface of the structure.

FIG. 52H shows the experimental XRD data 5207 of a Fd3m crystal structure $Mg_2GeO_4$ deposited as a high quality bulk layer on a Fm3m MgO(100) substrate and further comprising a MgO cap.

FIG. 52I shows the experimental XRD data 5208 of a Fd3m crystal structure $Mg_2GeO_4$ when incorporated as a SL structure comprising 20× period SL[$Mg_2GeO_4$/MgO] on a Fm3m MgO(100) substrate.

As shown in FIG. 52H, the extraordinarily high quality $Mg_2GeO_4$ is evidenced by the small FWHM epilayer (labelled "$GeMgO_4$ 400") diffraction peak and the high frequency thickness oscillations generated by the X-ray Fabry-Perot effect of the parallel atomic planes of the film and MgO cap layer, which are strained and coherent with the underlying substrate crystal. As shown in FIG. 52I, this high degree of lattice matching between $Mg_2GeO_4$ and MgO can be further utilized to form complex SL structures. FIG. 52I shows such a SL comprising 20× period SL[$Mg_2GeO_4$/MgO]/$MgO_{sub}$(100). Again, the large number of sharp SL satellite peaks $SL_n$ is evidence of a coherently strained structure. Both $Mg_2GeO_4$ and MgO constituent materials are direct bandgap with $E_g(Mg_2GeO_4) < E_g(MgO)$.

For a thin layer of smaller bandgap material ~1-5 crystal unit cells in thickness, the conduction band minimum and valence band maximum can be quantum confined when sandwiched between a larger bandgap material such as MgO. The transition energy between the lowest quantized energy level in the conduction band and the highest quantized energy level in the valence band of $Mg_2GeO_4$ can be tuned by varying the thickness via the quantum confined effect. This tuning method enables a transition energy to vary from about 5.81 eV to 7.69 eV. This energy range is ideal for optoelectronic emissive devices operating in the deep ultraviolet (161-213 nm) portion of the electromagnetic spectrum.

FIG. 53 is a summary table of properties of example structures comprising $Mg_xGe_yO_z$ epilayers that were physically realized, in accordance with embodiments of the present disclosure. The table lists the epilayer structures built, the space group of the structures, whether the structure layers were bulk or superlattice, the quality, and the substrate material. As is demonstrated by these examples, the compatibility of $MgGa_2O_4$, $Mg_2GeO_4$, MgO, beta-$Ga_2O_3$ and gamma-$Ga_2O_3$ is advantageous for bandgap energy designs for electronic and optoelectronics devices.

Conduction Devices

Semiconductor structures, such as conduction devices, comprising the $Mg_xGe_yO_z$ epitaxial oxide materials and compatible substrates disclosed herein shall be described. A semiconductor structure comprising epitaxial oxide materials described herein can be a single layer on a substrate or multiple layers on a substrate. Such a semiconductor structure with multiple layers can include a single quantum well, multiple quantum wells, a superlattice, multiple superlattices, a compositionally varied (or graded) layer, a compositionally varied (or graded) multilayer structure (or region), a doped layer (or region), and/or multiple doped layers (or regions). Such semiconductor structures with one or more doped layers (or regions) can include layers (or regions) that are doped p-n, p-i-n, n-i-n, p-i-p, n-p-n, p-n-p, p-metal (to form a Schottky junction), and/or n-metal (to form a Schottky junction).

In some embodiments, semiconductor devices include a substrate comprising a substantially single crystal substrate material; and an active region on the substrate, the active region comprising an epitaxial layer of $Mg_xGe_{1-x}O_{2-x}$, with x having a value of $0 \leq x < 1$. The epitaxial layer of $Mg_xGe_{1-x}O_{2-x}$ has a crystal symmetry compatible with the substrate material. In some embodiments, the semiconductor device is an optoelectronic device comprising a light emitting diode or a photodetector. For example, the optoelectronic device emits or absorbs light having a wavelength in a range from 150 nm to 280 nm, such as from 150 nm to 260 nm, or less than approximately 260 nm, or less than approximately 250 nm, or less than approximately 220 nm. In some embodiments, the semiconductor device is an electronic device comprising a diode or a transistor. In some embodiments, the epitaxial layer of $Mg_xGe_{1-x}O_{2-x}$ is an intrinsic layer of the semiconductor device. In some embodiments, the epitaxial layer of $Mg_xGe_{1-x}O_{2-x}$ is a doped layer comprising n-type or p-type conductivity, being doped by methods as disclosed herein.

The devices comprising the semiconductor structures comprising the magnesium germanium oxide materials described herein can include electronic and optoelectronic devices. For example, the devices described herein can be resistors, capacitors, inductors, diodes, transistors (switches, e.g., field effect transistors, RF power switches), amplifiers, sensors, photodetectors, LEDs, lasers. In some embodiments, the devices comprising the semiconductor structures comprising the magnesium germanium oxide materials described herein are optoelectronic devices, such as photodetectors, LEDs and lasers, that detect or emit UV light (e.g., with a wavelength from 150 nm to 280 nm). In some cases, the device comprises an active region wherein the detection or emission of light occurs, and the active region comprises a magnesium germanium oxide material with a bandgap selected to detect or emit UV light (e.g., with a wavelength from 150 nm to 280 nm).

Doped layers in the conduction devices may comprise a donor (n-type), or acceptor (p-type) impurity (or dopant) material. The impurities can act as extrinsic dopants providing the doped layer with an n-type or p-type conductivity. For example, a doped layer can be formed by co-depositing (e.g., using molecular beam epitaxy or chemical vapor deposition) an epitaxial oxide semiconductor with a high concentration (e.g., doping concentrations of about 1e17 cm$^{-3}$ to about 1e20 cm$^{-3}$, or greater than about 1e20 cm$^{-3}$) of an impurity (or dopant) that can act as a donor (n-type), or acceptor (p-type) material. Doping can be achieved by various doping strategies disclosed herein, such as described in relation to FIGS. 18A-42B.

Figure 54A:
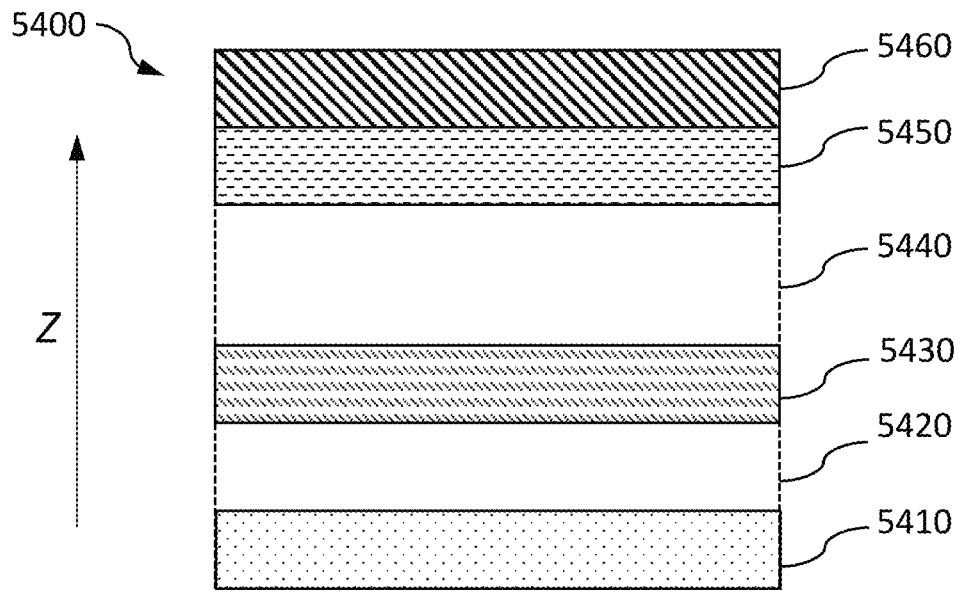
FIG. 54A shows an epitaxial multiple layer structure for forming an electronic or optoelectronic device, comprising a substrate, optional buffer layer, a first conductivity type layer, a second conductivity type region, a third conductivity type region and an electrical contact layer, in accordance with some embodiments.

Referring now to FIG. 54A, there is shown an epitaxial multiple layer structure 5400 for forming an electronic or optoelectronic device, comprising a substrate 5410, optional buffer layer 5420, a first conductivity type layer 5430, a second conductivity type region 5440, a third conductivity type region 5450 and an electrical contact layer 5460. The structure 5400 is formed sequentially layer-by-layer along a growth direction Z. The first, second and third conductivity types may be selected from p-, i-, and n-types, and may be used in various combinations such as p-n, n-p, p-i-n, n-i-n, p-i-p, n-p-n, or p-n-p. Bulk layers or superlattices of the $Mg_xGe_yO_z$ epitaxial oxide materials disclosed herein may be used for the layers 5420, 5430, 5440, 5450 and/or 5460.

Figure 54B:
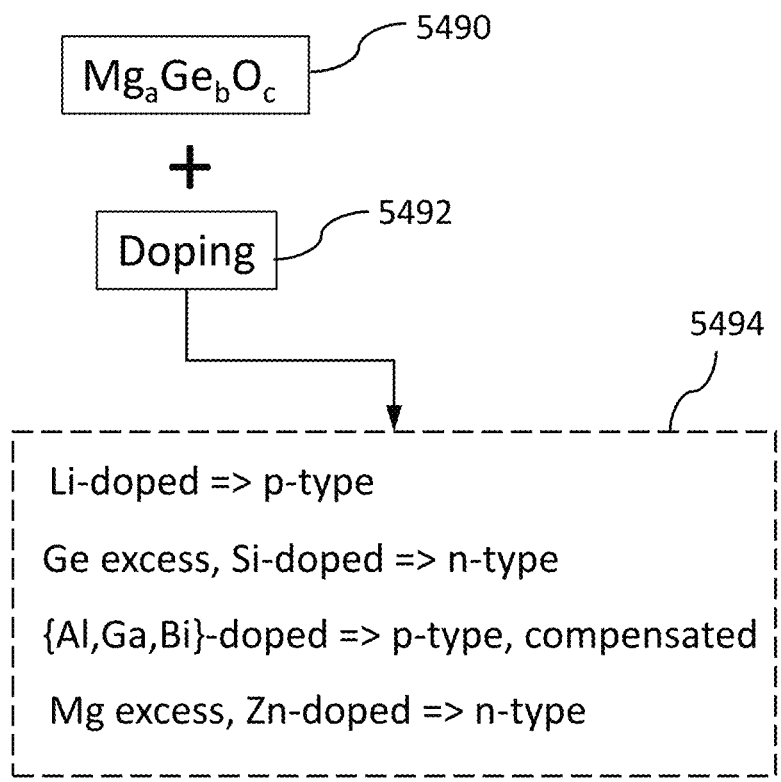
FIG. 54B is a figurative diagram showing possible electrical conductivity types for $Mg_aGe_bO_c$ using co-doping or crystal growth modification during epitaxial layer formation, in accordance with some embodiments.

FIG. 54B shows possible electrical conductivity types for $Mg_aGe_bO_c$ that may be used in the semiconductor structure 5400. A process for creating the conductivity is schematically drawn, illustrating $Mg_aGe_bO_c$ 5490 plus doping 5492 resulting in conductivity type 5494. In one example, $Mg_aGe_bO_c$ may be $Mg_2GeO_4$ (a=2, b=0, c=4). The conductivity types of FIG. 54B may use co-doping or crystal growth modification during epitaxial layer formation. The doped layer can be formed in any of the regions described in FIG. 54A. In some embodiments, the electrically activated doped or conductivity type regions can have an atomically abrupt interface with the other dissimilar regions, or the regions may be graded over a predetermined distance.

Figure 55A:
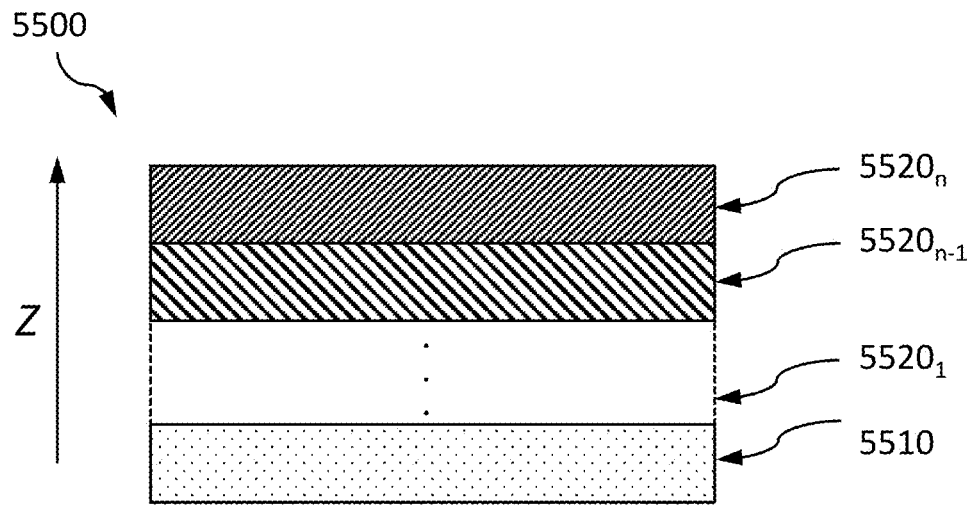
FIG. 55A shows a multilayer structure used to form an electronic device having distinct regions comprising at least one layer of $Mg_aGe_bO_c$, in accordance with some embodiments.

FIG. 55A shows a multilayer structure 5500 used to form an electronic device having distinct regions comprising at least one layer of $Mg_aGe_bO_c$. A substrate 5510 has epitaxial layers 5520. (e.g., films or regions) deposited along a growth direction Z. The layers $5520_n$ comprising the device are selected from at least one $Mg_2GeO_4$ form and may be integrated with, for example, compositions of the type selected from: $Zn_xGe_yO_z$, $Zn_xGa_yO_z$, $Al_xGe_yO_z$, $Al_xZn_yO_z$, $Al_xMg_yO_z$, $Mg_xGa_yO_z$, $Mg_xZn_yO_z$, and $Ga_xO_z$, where x, y, z represent relative mole fractions.

Figure 55B:
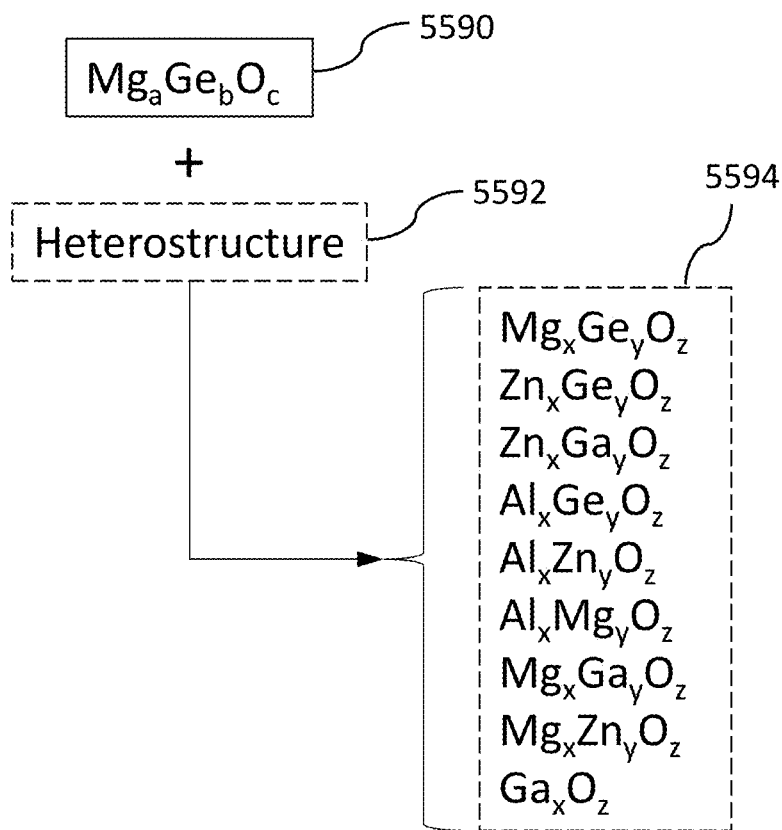
FIG. 55B is a figurative diagram showing example materials that may be combined with $Mg_aGe_bO_c$ to form a heterostructure, in accordance with some embodiments.
Figure 55C:
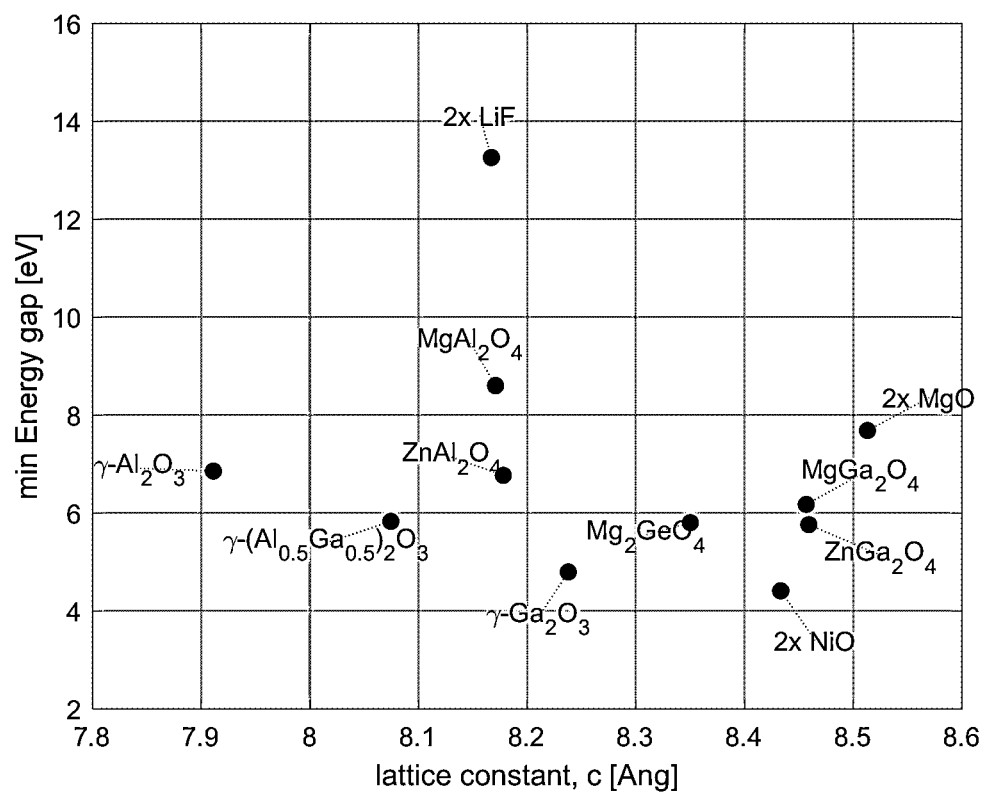
FIG. 55C is a plot of the bandgap energy as a function of lattice constant for various materials that may be used in semiconductor structures, in accordance with some embodiments.

FIG. 55B is a figurative diagram showing example compositions that may be combined with $Mg_aGe_bO_c$ to form a heterostructure. The combination is schematically drawn, illustrating $Mg_aGe_bO_c$ 5590 plus a heterostructure material 5592 where in this example the heterostructure material compositions 5594 comprise $Mg_xGe_yO_z$, $Zn_xGe_yO_z$, $Zn_xGa_yO_z$, $Al_xGe_yO_z$, $Al_xZn_yO_z$, $Al_xMg_yO_z$, $Mg_xGa_yO_z$, $Mg_xZn_yO_z$ and $Ga_xO_z$. FIG. 55C is a plot of minimum energy gap (eV) versus lattice constant (c, in Angstroms) for $Mg_2GeO_4$ and other materials that may be used in heterostructures for semiconductor structures of the present disclosure. The plot may be used to determine compatible crystal structure lattice matching for materials combinations. Embodiments include semiconductor structures and devices (and methods for making the structures and devices) in which an epitaxial layer of $Mg_xGe_{1-x}O_{2-x}$ is on a substrate, with x having a value of $0 \leq x < 1$, and a second epitaxial layer forms a heterostructure with the epitaxial layer of $Mg_xGe_{1-x}O_{2-x}$. The second epitaxial layer may comprise $Zn_xGe_yO_z$, $Zn_xGa_yO_z$, $Al_xGe_yO_z$, $Al_xZn_yO_z$, $Al_xMg_yO_z$, $Mg_xGa_yO_z$, $Mg_xZn_yO_z$, or $Ga_xO_z$, where x, y and z are mole fractions.

Figure 56A:
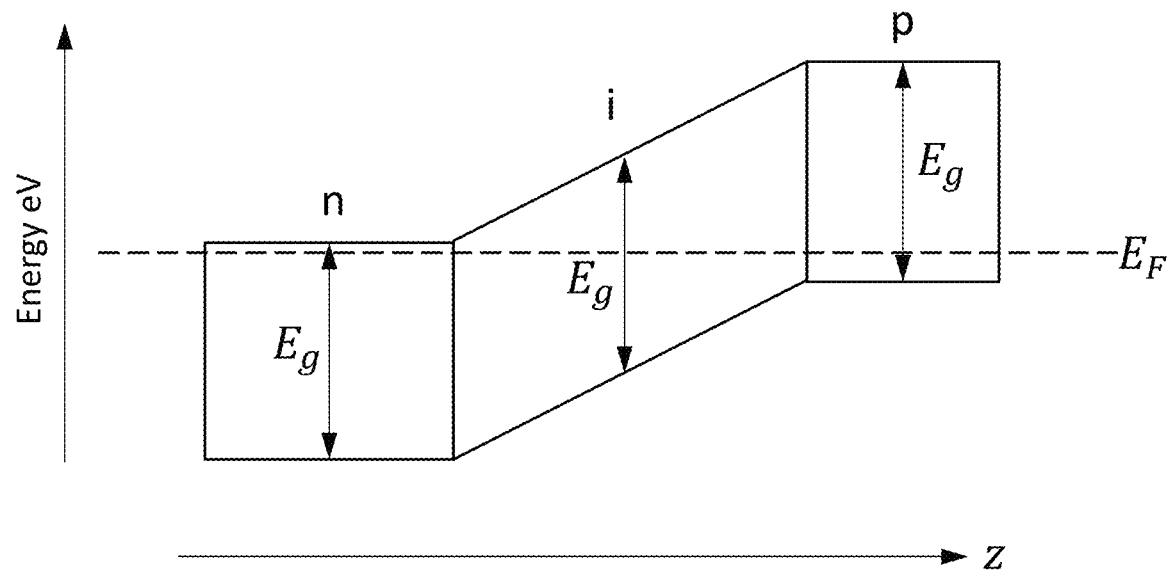
FIG. 56A shows a band structure diagram for a homojunction device comprising a p-i-n structure, in accordance with some embodiments.

FIG. 56A is a band structure diagram of bandgap energy (eV) as a function of growth direction Z, representing a homojunction device comprising a p-i-n structure. The structure is formed along a growth direction Z, using spatial control of the doping regions. Moving from left to right along the growth direction, first an n-type region is formed, followed by a not-intentionally doped region (intrinsic "i" region), and then a p-type region. In various embodiments, the doping transition between the n-, i-, and p-regions may be abrupt or graded over a distance. The height of the bandgaps for each region is the same, showing that the bandgap energies $E_g$ for the n-, i-, and p-regions are equal. The p- and n-regions form a diode. An electric field between the p- and n-regions is applied across the central intrinsic region along the Z-axis, causing electrons and holes to be injected into the i-region. In embodiments, a device having the structure of FIG. 56A may comprise $Mg_xGe_yO_z$, such as $Mg_2GeO_4$, for one or more of the p-i-n layers.

Figure 56B:
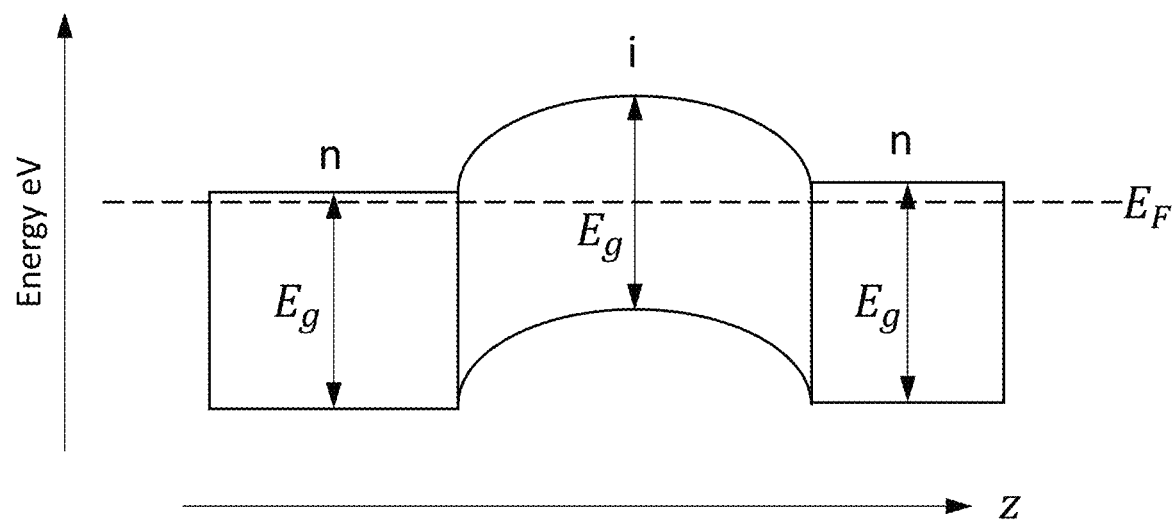
FIG. 56B shows a band structure diagram for a homojunction device comprising an n-i-n structure, in accordance with some embodiments.

FIG. 56B is a band structure diagram representing a homojunction device, such as a diode, with an n-i-n structure. The n-i-n structure is formed along a growth direction Z, using spatial control of the doping regions. In various examples, the n-i local junctions can be abrupt or graded in doping concentration across a predetermined distance. In embodiments, a device having the structure of FIG. 56B may comprise $Mg_xGe_yO_z$, such as $Mg_2GeO_4$, for one or more of the n-i-n layers.

Figure 56C:
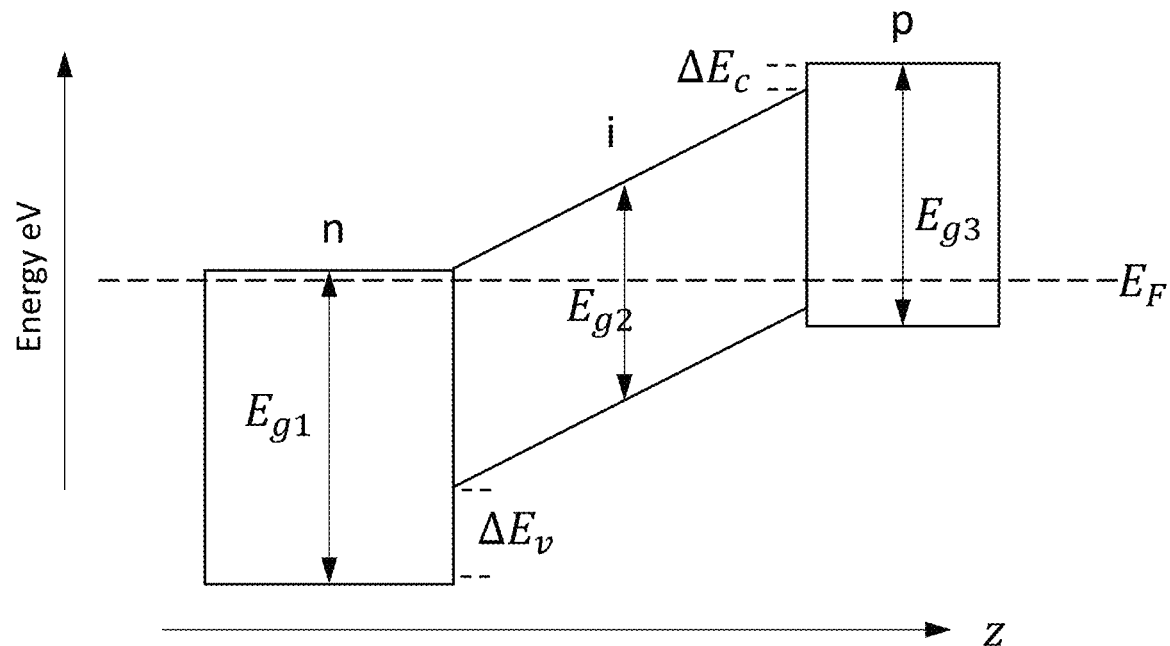
FIG. 56C shows a band structure diagram for a heterojunction device comprising a p-i-n structure, in accordance with some embodiments.

FIG. 56C is a band structure diagram representing a heterojunction device, such as a diode, with a p-i-n structure. The structure is sequentially formed along the growth direction Z, using spatial control of the composition and doping of the distinct regions. In various embodiments, the composition and doping can be abrupt or graded across a predetermined distance. The bandgap energies $E_g$ of the p- and n-regions do not have to be the same, where in this example the bandgap of the n-region is larger than that of the p-region. Heterojunction conduction band offset $\Delta E_C$ and valence band offset $\Delta E_v$ provide energy barriers for controlling carrier flow/confinement. The p-i-n-structure forms a diode, and the built-in electric field applies an electric field along the direction Z across the i-region, as shown. The heterojunction structure is useful for light emitting devices, as light generated from the center region will not absorbed by the p- and n-regions and therefore will escape. In other words, heterojunction structure in FIG. 56C can advantageously be used as a light emitting device (e.g., an LED) because the wider bandgap n- and p-regions have low absorption coefficients of light emitted from the narrower bandgap i-layer. In embodiments, a device having the structure of FIG. 56C may comprise $Mg_xGe_yO_z$, such as $Mg_2GeO_4$, for one or more of the layers.

Figure 56D:
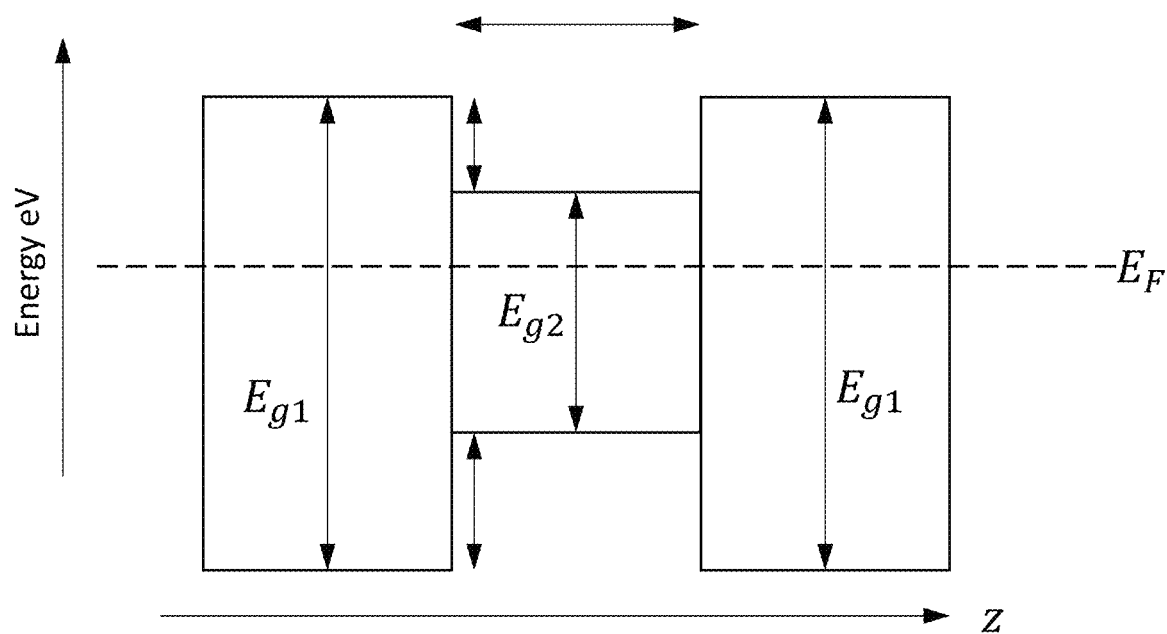
FIG. 56D shows a band structure diagram for a double heterojunction device, in accordance with some embodiments.

FIG. 56D is band structure diagram representing a double heterojunction device, such as a quantum well. The structure is sequentially formed along a growth direction Z, using spatial control of the composition. The structure comprises a wide bandgap $E_{g1}$ layer composition and a narrow bandgap region/layer $E_{g2}$, such that $E_{g2} < E_{g1}$. The narrow bandgap region is between two wide bandgap regions. For sufficiently thin narrow bandgap region, quantization occurs for the allowed energy levels within the quantum well. In various examples, this can be used for optoelectronic and electronic devices. In embodiments, a device having the structure of FIG. 56D may comprise $Mg_xGe_yO_z$, such as $Mg_2GeO_4$, for one or more of the layers. As $Mg_2GeO_4$ is a direct bandgap material, optical emission is possible for electrons and holes spatially recombining.

Figure 56E:
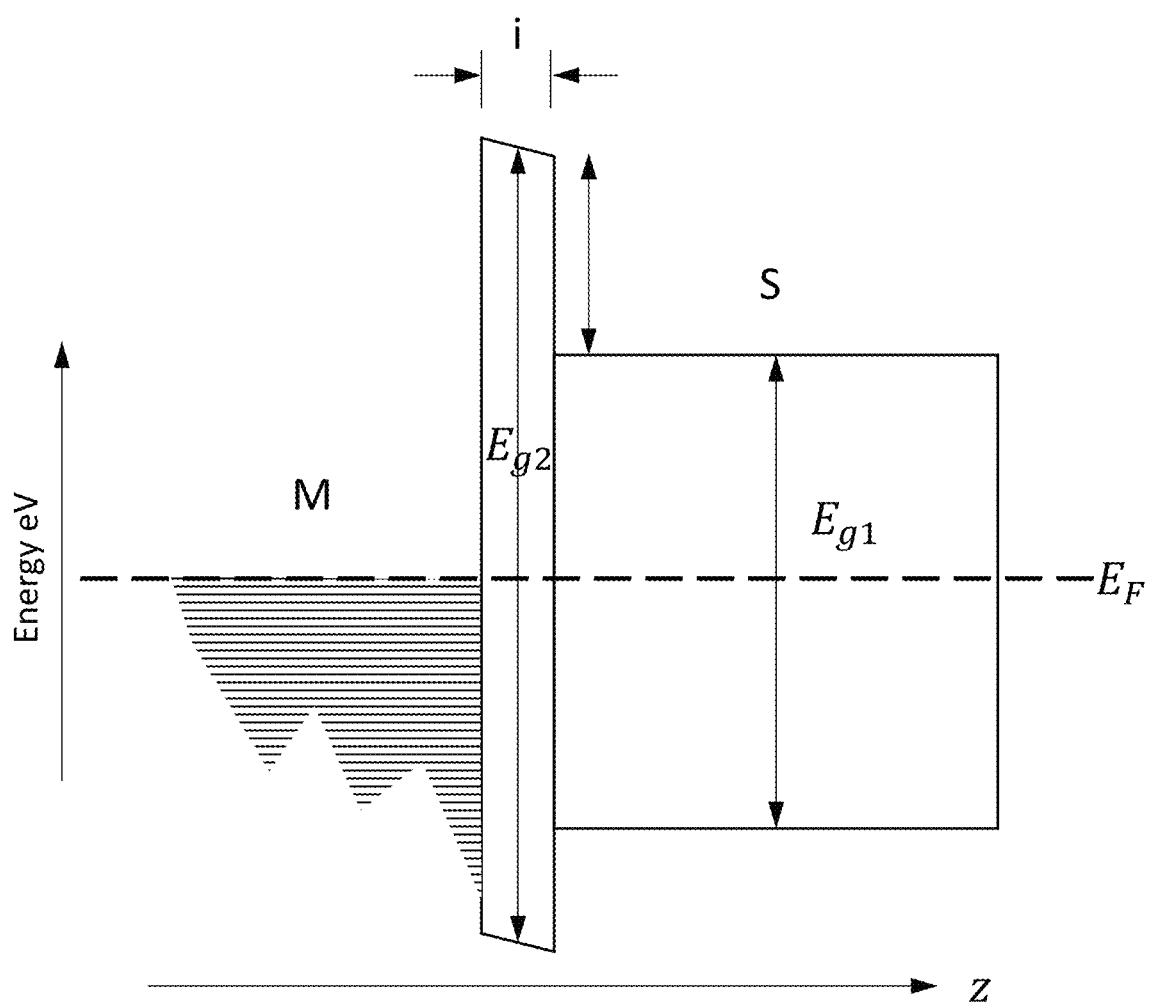
FIG. 56E shows a band structure diagram for a metal-insulator-semiconductor (MIS) structure, in accordance with some embodiments.

FIG. 56E shows a band structure diagram for a metal-insulator-semiconductor (MIS) structure. The semiconductor region has a bandgap $E_{g1}$, and the insulator region has a bandgap $E_{g2}$. In embodiments, a device having the structure of FIG. 56E may comprise $Mg_xGe_yO_z$, such as $Mg_2GeO_4$, for one or more of the layers. For example, an $Mg_2GeO_4$ layer may be used as either the insulator or semiconductor. If the $Mg_2GeO_4$ semiconductor is used to form a metal-insulator-semiconductor structure, then the insulator can be selected from wider bandgap materials that are compatible as shown in FIG. 55C.

Figure 56F:
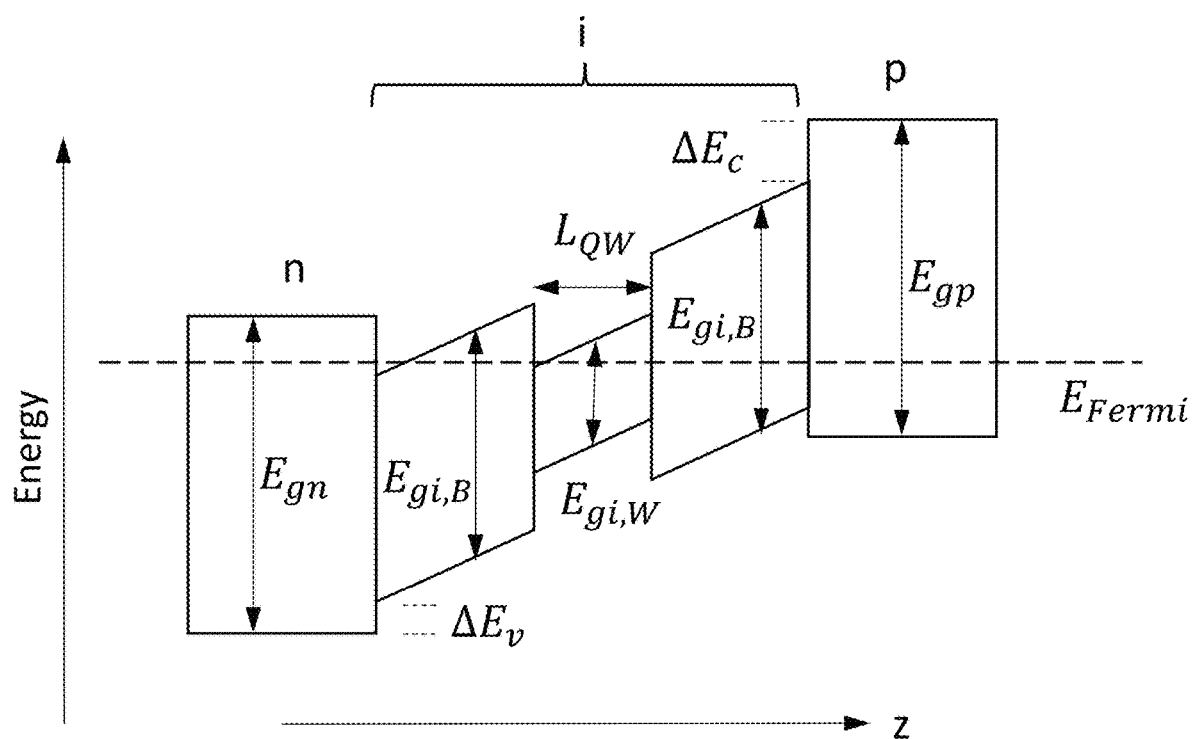
FIG. 56F shows a band structure diagram for a multiple heterojunction device comprising a p-i-n structure and a quantum well, in accordance with some embodiments.

FIG. 56F is a band structure diagram representing a multiple heterojunction device, such as a diode, with a p-i-n structure and a single quantum well QW. In this example, the bandgaps of the n- and p-regions ($E_{gn}$, $E_{gp}$ respectively) are greater than that of the barriers (bandgap $E_{gi,B}$) and quantum well ($E_{gi,W}$) of the QW region, where $E_{gi,B} > E_{gi,w}$. Electrons and holes are injected into the intrinsic region from their respective reservoir regions. Heterojunction conduction band offset $\Delta E_c$ and valence band offset $\Delta E_v$ provide energy barriers for controlling carrier flow/confinement. The heterojunction structure is useful for light emitting devices, as light generated from the center region will not absorbed by the p- and n-regions and therefore will escape; that is, the wider bandgap n- and p-regions have low absorption coefficients of light emitted from the quantum well in the narrower bandgap i-layer. The quantum well, with bandgap $E_{gi,W}$, is designed such that the thickness $L_{QW}$ can tune the quantized energy levels in the conduction and valence bands confined between the barriers, with bandgaps $E_{gi,B}$. In other embodiments, the structure can have more than one, or multiple quantum wells in the intrinsic region. The energy levels in the multiple quantum well structure influence various properties of the structure, such as the minimum effective bandgap. In some cases, such as in light emitting devices, having more than one quantum well improves optical emission, such as due to increased quantum well capture rates of carriers injected into the i-region from the p- and n-regions. In embodiments, a device having the structure of FIG. 56F may comprise $Mg_xGe_yO_z$, such as $Mg_2GeO_4$, for one or more of the layers.

Figure 56G:
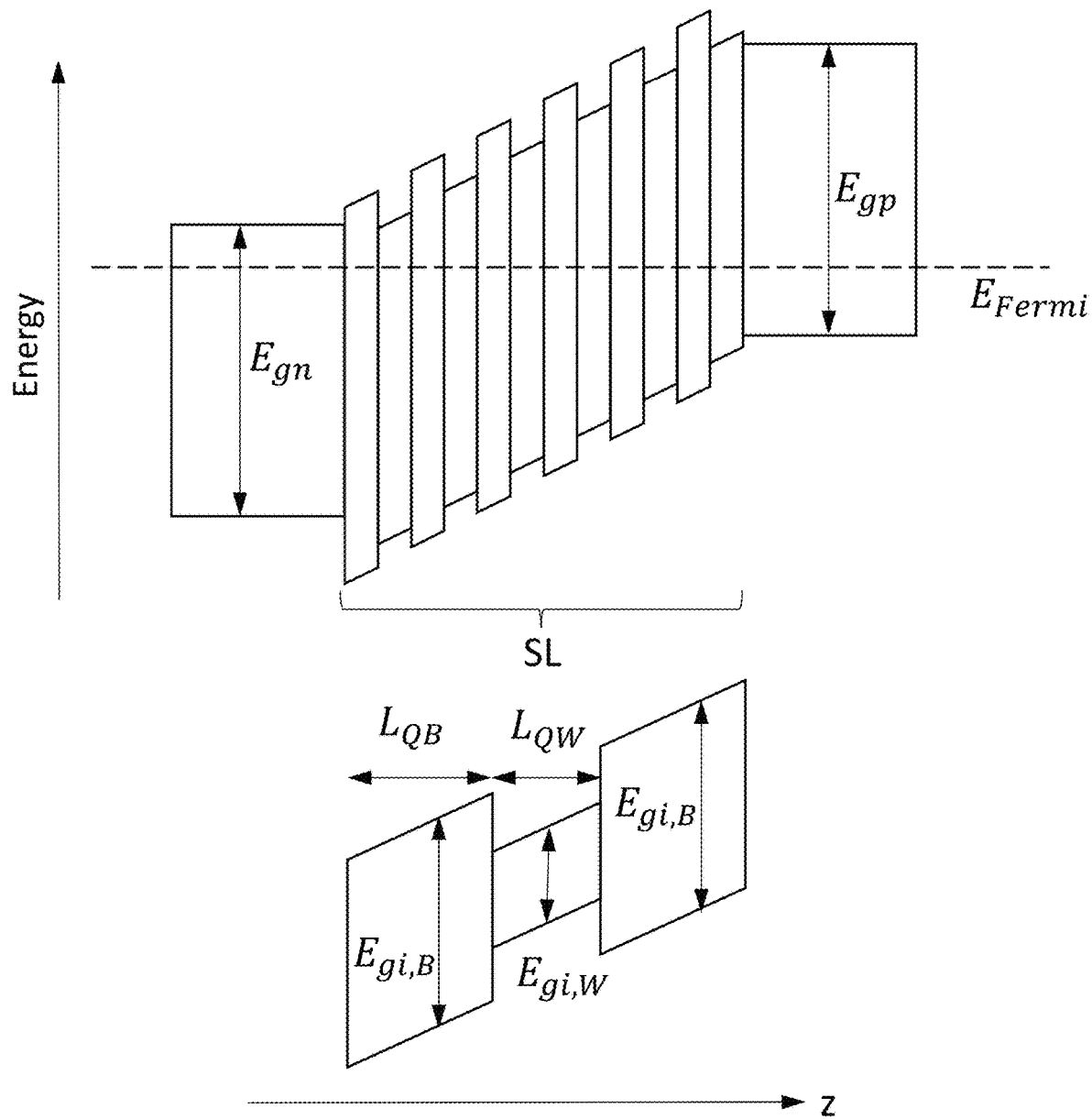
FIG. 56G shows a band structure diagram for a p-i-n structure with a superlattice in the i-region, in accordance with some embodiments.

FIG. 56G is a band structure diagram for a p-i-n structure with a superlattice (SL) in the i-region. The p-i-n structure has multiple quantum wells, where the barrier layers of the multiple quantum well structure in the i-region have larger bandgaps than the bandgap of the n- and p-layers. In other cases, the bandgaps of the barrier layers in the multiple quantum wells can be narrower than those of the n- and p-layers. The diagram in the bottom half of FIG. 56G shows a single quantum well of the multiple quantum well structure. The thickness $L_{QB}$ of the barrier layers can be made thin enough that electrons and holes can tunnel through them (e.g., within the i-region, and/or when being transferred between the n- and/or p-layers into and/or out of the i-region). Such a multiple quantum well structure can behave as a digital alloy, whose properties are dependent on the materials comprising the barriers and the wells, and with the thicknesses of the barriers and the wells. In embodiments, a device having the structure of FIG. 56G may comprise $Mg_xGe_yO_z$, such as $Mg_2GeO_4$, for one or more of the layers.

Figure 56H:
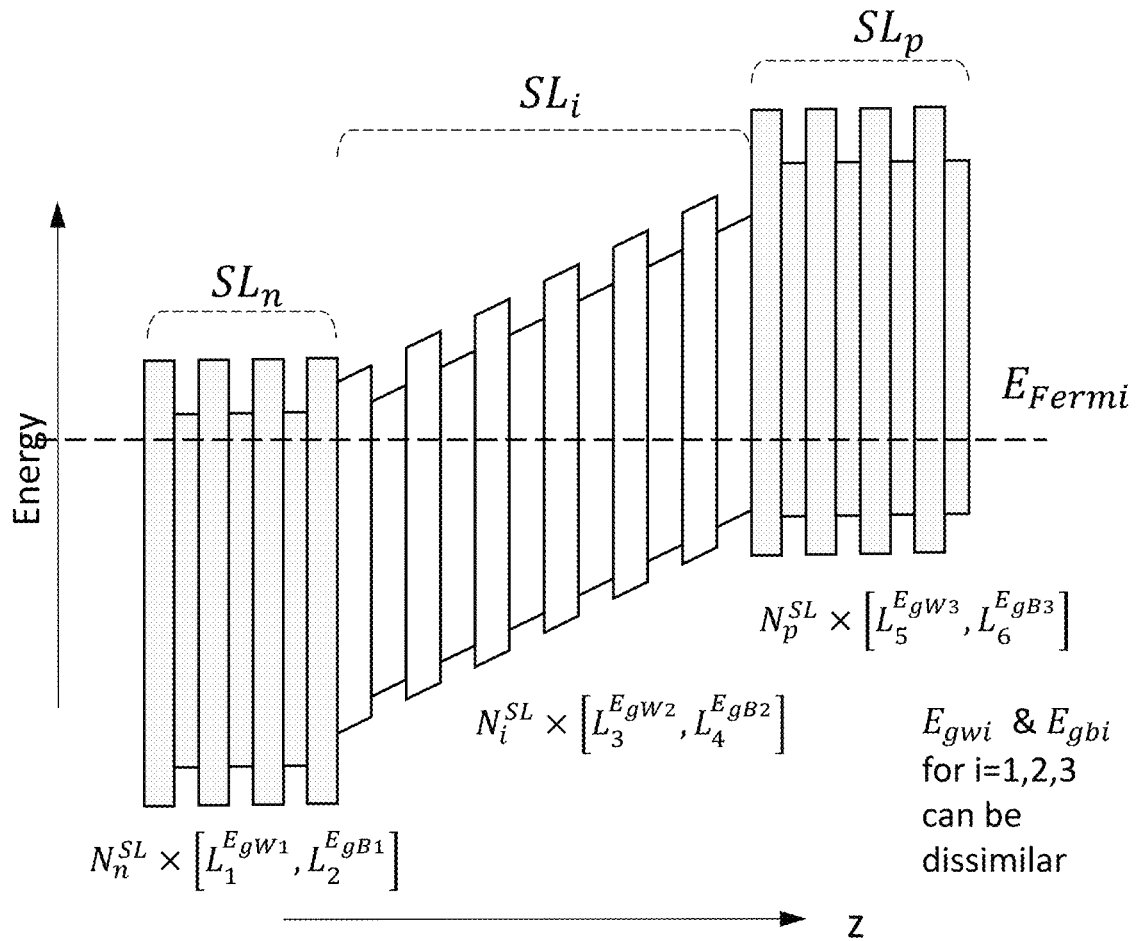
FIGS. 56H and 56I show band structure diagrams for a p-i-n structure with a superlattice in the p-, i-, and n-regions, in accordance with some embodiments.

FIG. 56H is a band structure diagram for a p-i-n structure with a superlattice in the p-, i-, and n-regions. For this full superlattice structure of p(SL)-i(SL)-n(SL), the p-, i-, and n-regions may be the same or different compositions. The n-region comprises $N_n^{SL}$ pairs of wells (thickness $L_1$ and bandgap $E_{gW1}$) and barriers (thickness $L_2$ and bandgap $E_{gB1}$). The i-region comprises $N_i^{SL}$ pairs of wells (thickness $L_3$ and bandgap $E_{gW2}$) and barriers (thickness $L_4$ and bandgap $E_{gB2}$). The p-region comprises $N_p^{SL}$ pairs of wells (thickness $L_5$ and bandgap $E_{gW3}$) and barriers (thickness $L_6$ and bandgap $E_{gB3}$). The bandgaps of the barriers and wells in the i-region are narrower than those of the barriers and wells in both the n- and p-layers in this example. In other cases of structures with multiple quantum wells, the bandgaps of the barrier layers can be wider than those of the n- and p-layers. Additionally, in some cases, the thicknesses and/or bandgaps of the barriers and/or wells in the n-, i- and/or p-region can change throughout an individual region (e.g., to form a graded structure, or a chirp layer). The thicknesses $L_2$, $L_4$, and/or $L_6$ of the barrier layers can be made thin enough that electrons and holes can tunnel through them (e.g., within the i-region, and/or when being transferred between the n- and/or p-layers into and/or out of the i-region). Each region in the structure can behave as a digital alloy, whose properties are dependent on the materials comprising the barriers and the wells, and with the thicknesses of the barriers and the wells. For example, the materials and layer thicknesses can be chosen such that the n- and p-regions have wider bandgaps and are therefore transparent (or have a low absorption coefficient) to the wavelength of light emitted from the i-region superlattice. In embodiments, a device having the structure of FIG. 56H may comprise $Mg_xGe_yO_z$, such as $Mg_2GeO_4$, for one or more of the layers.

Figure 56I:
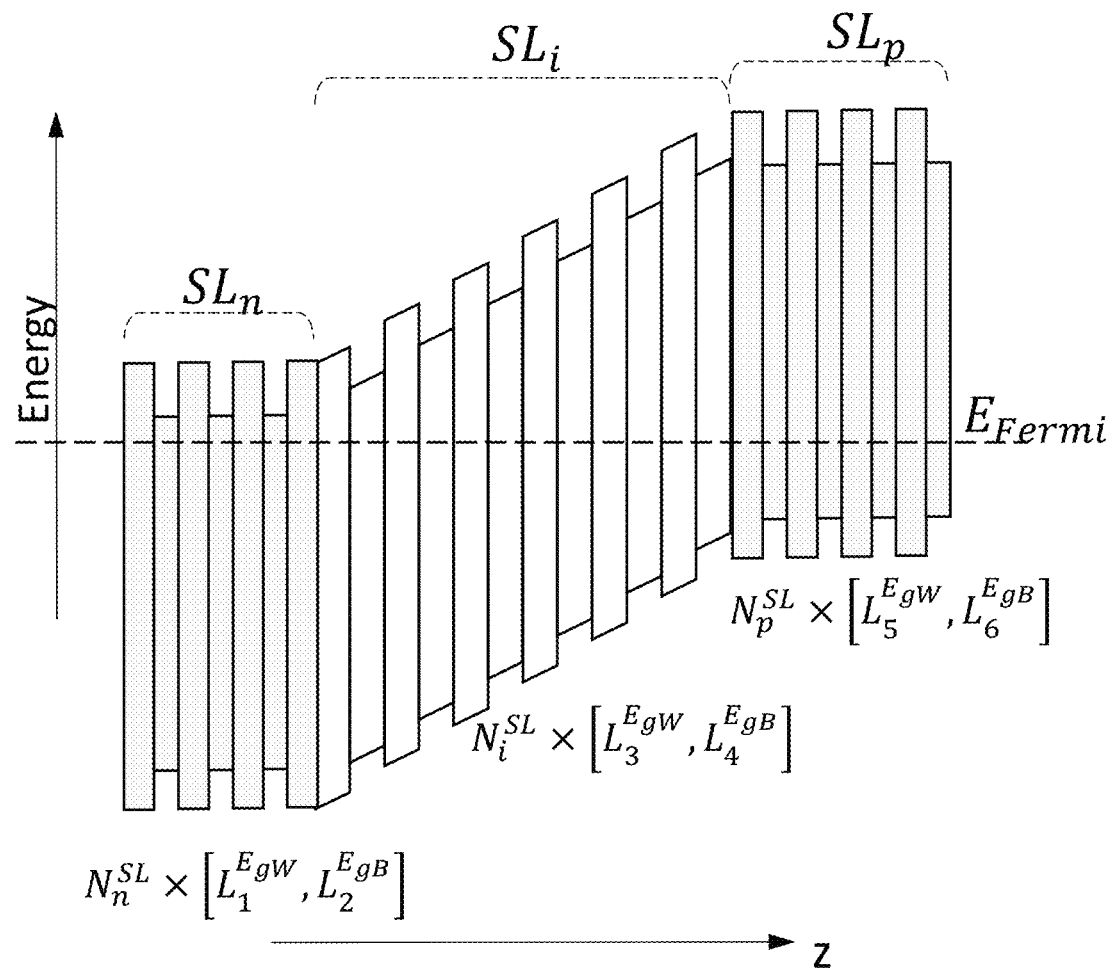

FIG. 56I is a band structure diagram for a p-i-n structure similar to FIG. 56H. The bandgap and the thicknesses of the barriers and well in the n-, i- and p-regions are defined as in FIG. 56H. The superlattices in the n-, i- and p-regions in this example have the same alternating pairs of materials, with different well (or well and barrier) thicknesses in the i-region tuning the optical properties. The structure has a material A and a material B, where the barriers of the superlattice in the n-region comprise material A and the wells in the superlattice in the n-region comprise material B. In this example, the barriers of the i- and p-regions also comprise material A and the wells in the i- and p-regions also comprise material B. The wells in the i-region have been made thicker so that the quantized energy levels in the potential well are lower in energy with respect to the band edge of the host well, thereby making the effective bandgap of the superlattice in the i-region have a narrower bandgap (i.e., closer to that of material A in a bulk form) than that of the superlattices in the n- and p-region. Such a structure could therefore be used in a light emitting device (e.g., and LED), as described herein. In embodiments, a device having the structure of FIG. 56I may comprise $Mg_xGe_yO_z$, such as $Mg_2GeO_4$, for one or more of the layers.

In the following conduction devices described in FIGS. 57-71, one or more layers of the active regions may comprise $Mg_xGe_yO_z$. The semiconductor layer regions may be formed as a unitary layer of a single composition, or may comprise multiple layers of different compositions, or a multilayered structure comprising repeating layers that are each formed of individual sub-layers. In the conduction devices, electrical materials forming the contacts to the electron and hole injector regions are selected from low- and high-work function metals, respectively. In one example, the metal ohmic contacts are formed in-situ directly on the final metal oxide surface, as a result reducing any mid-level traps/defects created at the semiconducting oxide-metal interface. Some examples of high work function metals that can be used in ohmic (or low resistance) contacts to a p-type epitaxial oxide layer are Ni, Os, Se, Pt, Pd, Ir, Au, and alloys thereof. Some examples of low work function materials that can be used in ohmic (or low resistance) contacts to an n-type epitaxial oxide layer are Cs, Na, and Lanthanides, however Al, Ti, Ti—Al alloys, and titanium nitride (TiN) being common metals can also be used. In some cases, the metal contact layer can contain two or more layers of metals with different compositions (e.g., a Ti layer and an Al layer).

Figure 57:
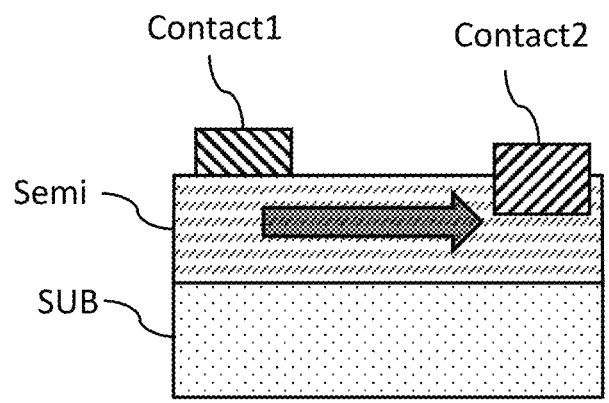
FIG. 57 is a figurative sectional view of an in-plane conduction device comprising an insulating substrate and a semiconductor layer region formed on the substrate with the electrical contacts positioned on the top semiconductor layer of the device, in accordance with some embodiments.

FIG. 57 shows an in-plane conduction device comprising in this example an insulating substrate and a semiconductor layer region formed on the substrate, with electrical contacts positioned on the top semiconductor layer of the device. In this example, a first electrical contact or electrode (Contact1) is located on the top surface of semiconductor layer, and a second electrical contact (Contact2) is spaced laterally from first electrical contact and embedded into the semiconductor layer to cause in-plane current flow, as indicated by the large arrow.

Figure 58:
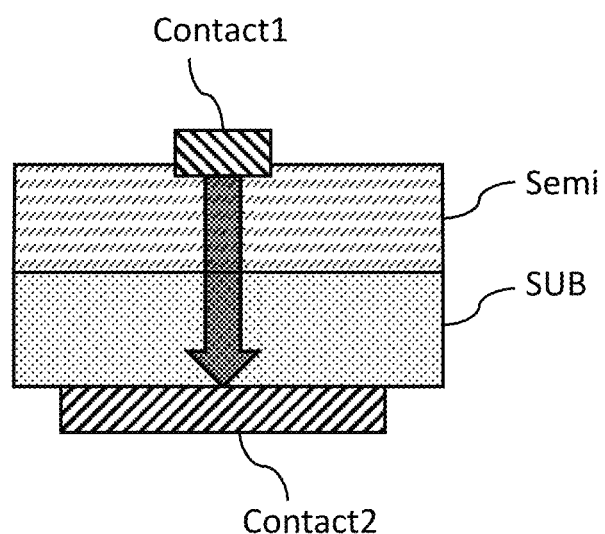
FIG. 58 is figurative sectional view of a vertical conduction device comprising a conducting substrate and a semiconductor layer region formed on the substrate with the electrical contacts positioned on the top and bottom of the device, in accordance with some embodiments.

FIG. 58 shows a vertical conduction device comprising in this example a conducting substrate and a semiconductor layer region formed on the substrate, with the electrical contacts positioned on the top and bottom of the device. In this example, a first electrical contact (Contact1) of the electrical contacts is located on the top of the semiconductor layer region (either embedded in or on the top surface). A second electrical contact (Contact2) is located on the underside of the substrate, vertically spaced from first electrical contact to cause vertical current flow as indicated by the large arrow.

Figure 59:
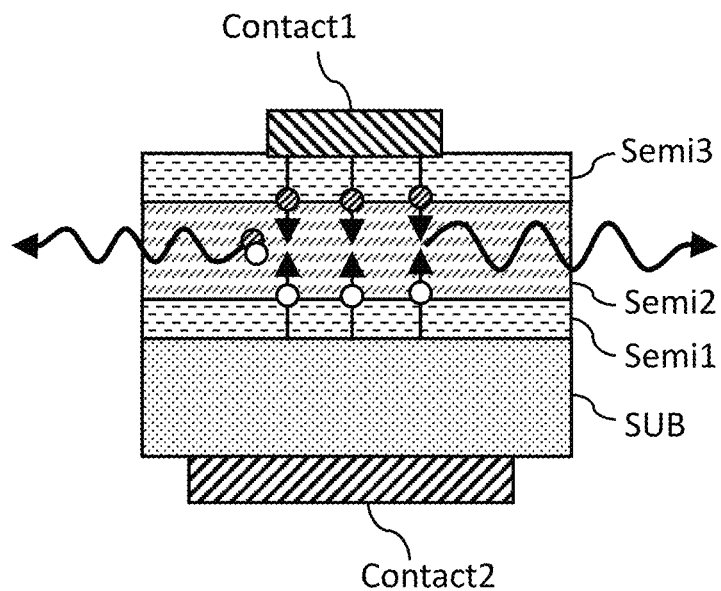
FIG. 59 is a figurative sectional view of a vertical conduction device for light emission having the electrical contact configuration illustrated in FIG. 58, configured as a plane parallel waveguide for the emitted light, in accordance with some embodiments.

FIG. 59 shows a figurative sectional view of a vertical conduction device for light emission (e.g., a light emitting diode) having the electrical contact configuration illustrated in FIG. 58 configured as a plane parallel waveguide for the emitted light. The device comprises a substrate, a first semiconductor layer (Semi1) having a first conductivity type, a second semiconductor layer having a second conductivity type (Semi2), and a third semiconductor layer having a second conductivity type (Semi3). For example, the first, second and third conductivity types may be, n-, i-, and p-as described throughout in this disclosure. A first electrical contact (Contact1) is on a top surface of the device, and a second electrical contact (Contact2) is on the bottom surface. Electrons and holes are injected into the central semiconductor layer, with light being emitted in a plane parallel to the plane of the layers (i.e., perpendicular to the growth direction).

Figure 60:
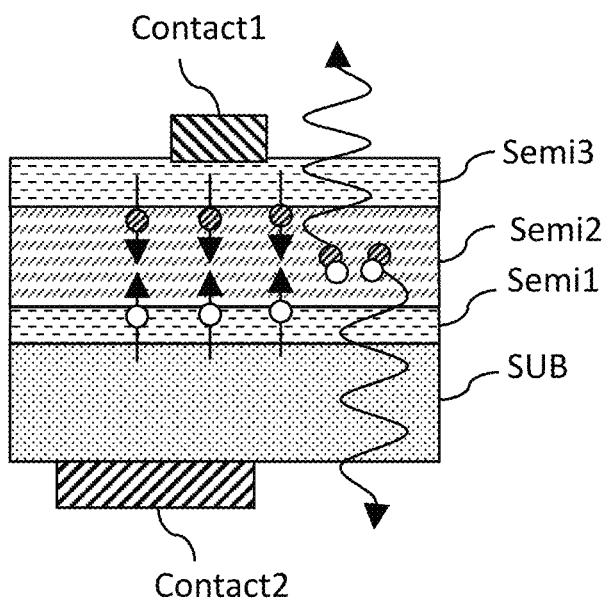
FIG. 60 is a figurative sectional view of a vertical conduction device for light emission having the electrical contact configuration illustrated in FIG. 58, configured as a vertical light emission device, in accordance with some embodiments.

FIG. 60 shows a figurative sectional view of a vertical conduction device for light emission (e.g., a light emitting diode) having the electrical contact configuration illustrated in FIG. 58, configured as a vertical light emission device. The device comprises a substrate, a first semiconductor layer (Semi1) having a first conductivity type, a second semiconductor layer having a second conductivity type (Semi2), and a third semiconductor layer having a second conductivity type (Semi3). For example, the first, second and third conductivity types may be, n-, i-, and p- as described throughout in this disclosure. A first electrical contact (Contact1) is on a top surface of the device, and a second electrical contact (Contact2) is on the bottom surface. Electrons and holes are injected into the central semiconductor layer. The substrate and other layers of the device can be designed to be transparent to the wavelength of light being emitted, such that light is emitted through one or both of the top and/or bottom surfaces of the device. As can be seen, the first and second electrical contacts are disposed on their respective surfaces to allow the passage of light.

Figure 61:
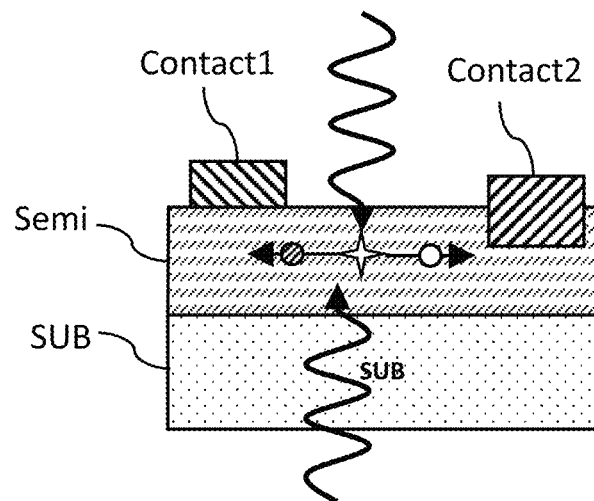
FIG. 61 is a figurative sectional view of an in-plane conduction device for photo-detection, having the electrical contact configuration illustrated in FIG. 57, and configured to receive light passing through the semiconductor layer region and/or the substrate, in accordance with some embodiments.

FIG. 61 shows a figurative sectional view of an in-plane conduction device for photo-detection (e.g., a photodetector) having the electrical contact configuration illustrated in FIG. 57, and configured to receive light passing through the semiconductor layer region and/or the substrate. The device includes a substrate and a semiconductor layer region formed on the substrate, with electrical contacts positioned on the top semiconductor layer of the device. In this example, a first electrical contact or electrode (Contact1) is located on the top surface of semiconductor layer, and a second electrical contact (Contact2) is spaced laterally from first electrical contact and embedded into the semiconductor layer. The substrate material is transparent to the wavelength of interest. Light received by the device causes a current to be generated, where the current may be measured at the first and second electrical contacts.

Figure 62:
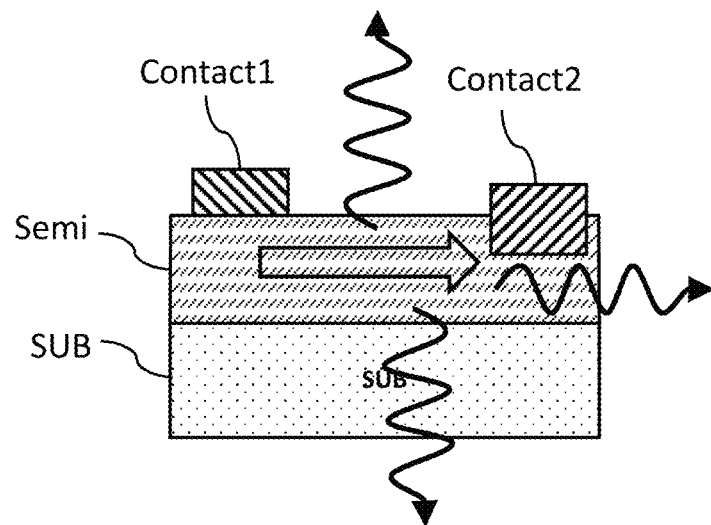
FIG. 62 is a figurative sectional view of an in-plane conduction device for light emission, having the electrical contact configuration illustrated in FIG. 57, and configured to emit light either vertically or in-plane, in accordance with some embodiments.

FIG. 62 shows a figurative sectional view of an in-plane conduction device for light emission (e.g., a light emitting diode), having the electrical contact configuration illustrated in FIG. 57, and configured to emit light either vertically or in-plane. The device includes a substrate and a semiconductor layer region formed on the substrate, with electrical contacts positioned on the top semiconductor layer of the device. In this example, a first electrical contact or electrode (Contact1) is located on the top surface of semiconductor layer, and a second electrical contact (Contact2) is spaced laterally from first electrical contact and embedded into the semiconductor layer. In embodiments where the light is emitted vertically, the substrate material is transparent to the wavelength being generated.

Figure 63:
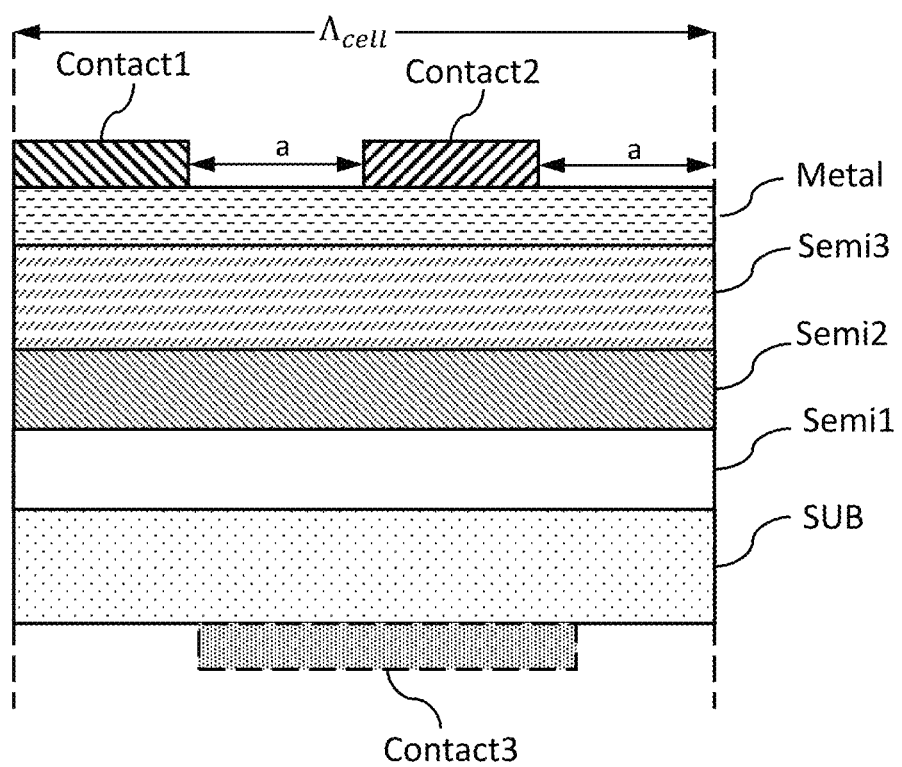
FIG. 63 is a figurative sectional view of an in-plane surface metal-semi-conductor-metal (MSM) conduction device comprising a substrate and a semiconductor layer region comprising multiple semiconductor layers, with a top layer comprising a pair of planar interdigitated electrical contacts, in accordance with some embodiments.

FIG. 63 shows a figurative sectional view of an in-plane surface MSM conduction device comprising a substrate and a semiconductor layer region comprising multiple semiconductor layers (Semi1, Semi2, Semi3). The top layer of metal comprises a pair of planar interdigitated electrical contacts (Contact1, Contact2), spaced apart by a distance "a." The width of the repeating portion of the device is shown as $\Lambda_{cell}$. In this example, the in-plane MSM conduction device comprises an optional third electrical contact (Contact3) located on the bottom surface of the substrate. For the case of a conductive substrate, Contact3 can act as a vertical conduction collector or drain. For an insulating substrate, Contact3 may act as a back gate of a field effect device.

Figure 64A:
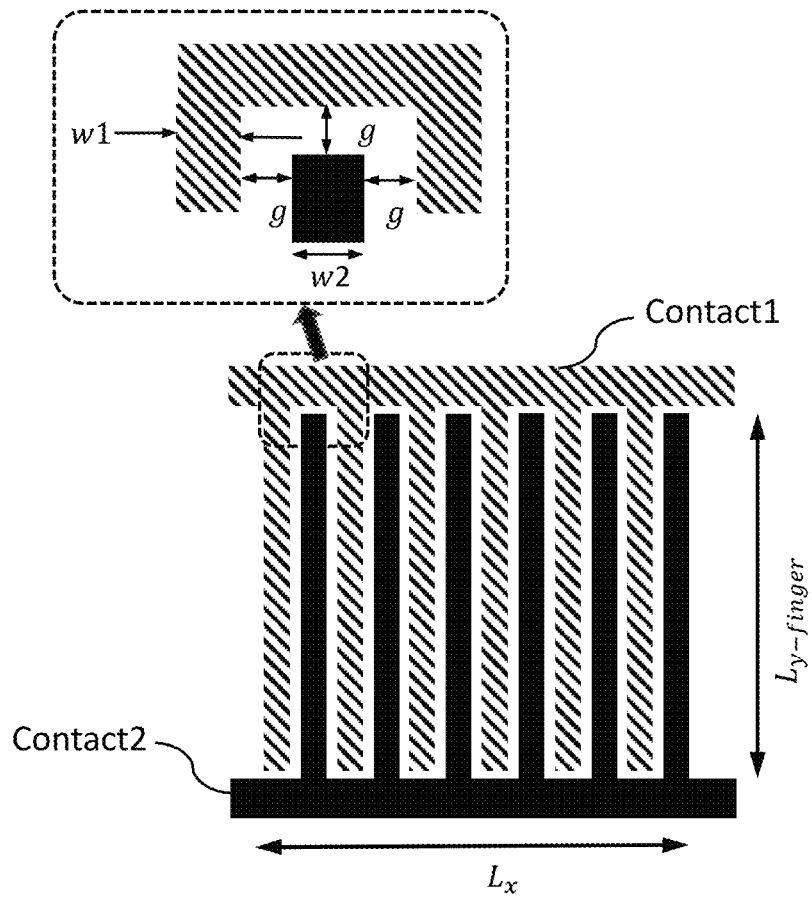
FIG. 64A is a top view of an in-plane dual metal MSM conduction device comprising a first electrical contact formed of a first metallic substance interdigitated with a second electrical contact formed of a second metallic substance, in accordance with some embodiments.

FIG. 64A shows a top view of an in-plane dual metal MSM conduction device comprising a first electrical contact (Contact1) formed of a first metallic substance interdigitated with a second electrical contact (Contact2) formed of a second metallic substance. As can be seen in the enlarged view of a portion of the interdigitated contacts, the first electrical contact has a finger width of $w_1$, and second electrical contact has a finger width of $w_2$ with a spacing of g between the contacts. The lateral gap, g, between the respective electrodes governs the in-plane electric field strength. Contact1 and Contact2 may be formed from dissimilar metals, for example a high- and low-work function metal may be used. In other embodiments the metal-Semi1 heterointerface may form a Schottky barrier.

Figure 64B:
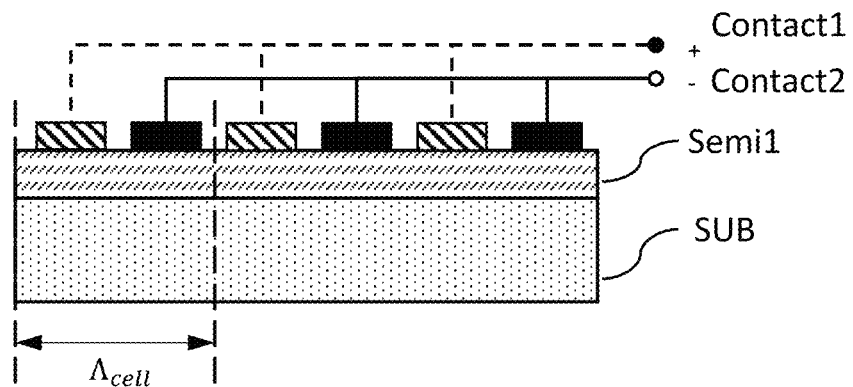
FIG. 64B is a figurative sectional view of the in-plane dual metal MSM conduction device illustrated FIG. 64A formed of a substrate and a semiconductor layer region showing the unit cell arrangement, in accordance with some embodiments.

FIG. 64B shows a figurative sectional view of the in-plane dual metal MSM conduction device illustrated FIG. 64A formed of a substrate and a semiconductor layer region epitaxially formed on the substrate, showing the electrical contact unit cell arrangement.

Figure 65:
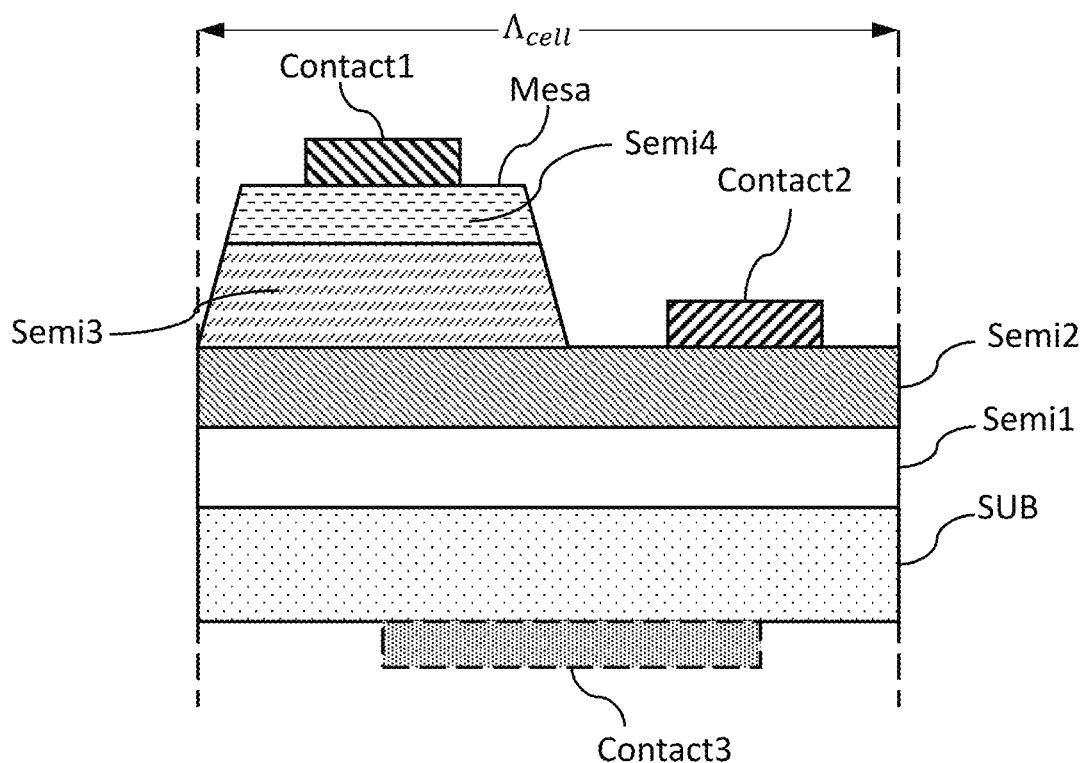
FIG. 65 is a figurative sectional view of a multilayered semiconductor device having a first electrical contact formed on a mesa surface and a second electrical contact spaced both horizontally and vertically from the first electrical contact, in accordance with some embodiments.

FIG. 65 shows a figurative sectional view of a multilayered semiconductor device having a first electrical contact (Contact1) formed on a mesa surface and a second electrical contact (Contact2) spaced both horizontally and vertically from the first electrical contact. The device includes a substrate and semiconductor layers (Semi1, Semi2, Semi3, Semi4). In this illustrative embodiment, the first electrical contact is formed on an initial top surface of the semiconductor layer region which is etched to expose a sublayer for locating the second electrical contact. In this example, the multilayered semiconductor device further comprises a third electrical contact (Contact3) located on the underside of the substrate. The 3-Terminal device comprising Contact1, Contact2 and Contact3 may act as a vertical heterojunction bipolar transistor or a vertical conduction FET switch.

Figure 66:
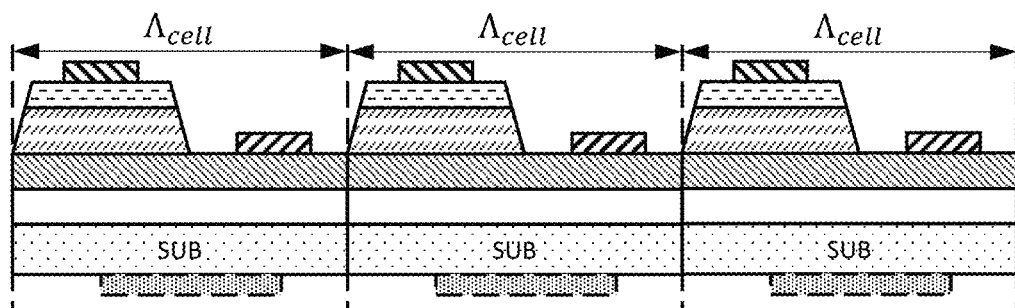
FIG. 66 is figurative sectional view of an in-plane MSM conduction device comprising multiple unit cells of the mesa structure illustrated in FIG. 65 disposed laterally to form the device, in accordance with some embodiments.

FIG. 66 shows a figurative sectional view of an in-plane MSM conduction device comprising multiple unit cells of the mesa structured device illustrated in FIG. 65. The unit cells $\Lambda_{cell}$ are disposed adjacent to each other in a lateral direction. The cells may form elongated fingers in the plane of the figure.

Figure 67:
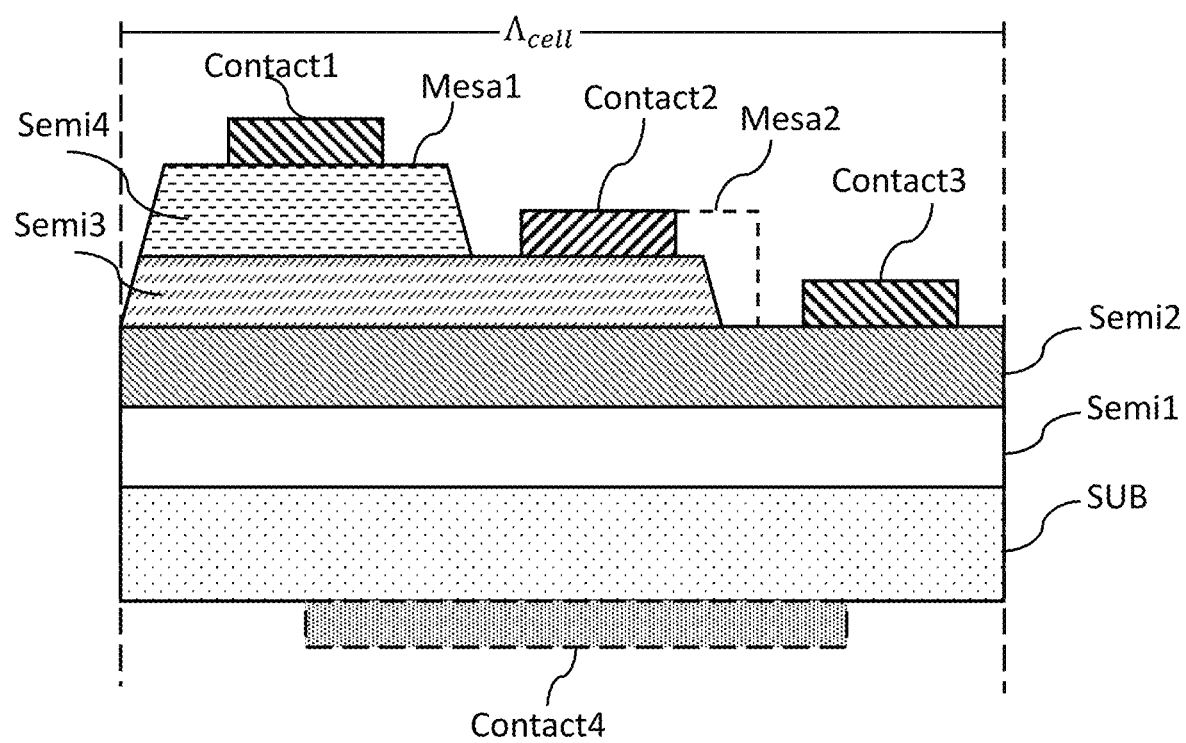
FIG. 67 is a figurative sectional view of a multi-electrical terminal device having multiple mesa structures, in accordance with some embodiments.

FIG. 67 shows a figurative sectional view of a multi-electrical terminal device having multiple semiconductor layers (Semi1, Semi2, Semi3, Semi4). The device has a first electrical contact (Contact1) formed on a first mesa structure (Mesa1). A second electrical contact (Contact2) is spaced both horizontally and vertically from the first electrical contact and is formed on second mesa structure (Mesa2). A third electrical contact (Contact3) is spaced both horizontally and vertically from the second electrical contact. In this illustrative embodiment, the first electrical contact is formed on an initial top surface of the semiconductor layer region (Semi4) which is etched to expose a first sublayer (Semi3) for locating the second electrical contact. The first sublayer is further etched to expose another second sublayer (Semi2) for locating the third electrical contact. In this example, multi-electrical terminal device further comprises a fourth electrical contact (Contact4) located on the underside of substrate. For an electrically insulating substrate, the fourth electrical contact is optional.

Figure 68A:
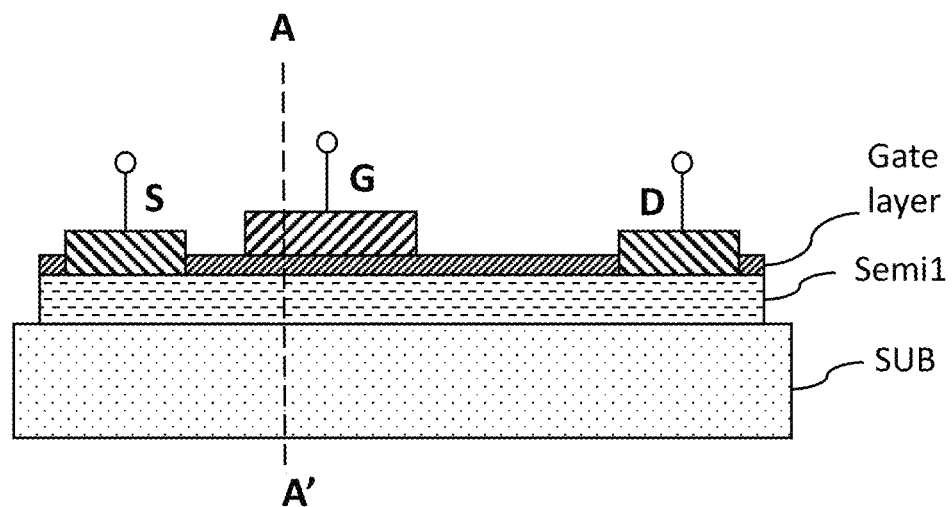
FIG. 68A is a figurative sectional view of a planar field effect transistor (FET) comprising source, gate and drain electrical contacts where the source and drain electrical contacts are formed on a semiconductor layer region that is formed on an insulating substrate, and the gate electrical contact is formed on a gate layer formed on the semiconductor layer region, in accordance with some embodiments.

FIG. 68A shows a figurative sectional view of a planar field effect transistor (FET) comprising source (S), gate (G) and drain (D) electrical contacts. The source and drain electrical contacts are formed on a semiconductor layer region (Semi1) that is formed on an insulating substrate. The gate electrical contact is formed on a gate layer formed on the semiconductor layer region. The $Mg_xGe_yO_y$ material layer may be used in two different ways. One function of the $Mg_xGe_yO_y$ layer is to be the active conduction channel region Semi1 with a wider bandgap material used to form the Gate layer. For example, the Gate layer may be itself epitaxially formed on Semi1 (e.g., cubic gamma-$Al_2O_3$, MgO or $MgAl_2O_4$), or may be substantially amorphous (e.g., amorphous $Al_2O_3$). The composition of $Mg_xGe_yO_y$ may alternatively be used as the Gate layer, wherein for example, the active channel Semi1 is a smaller bandgap material. The metals forming S and D contacts are ideally ohmic and the gate metal can be selected to control the threshold voltage of the FET.

Figure 68B:
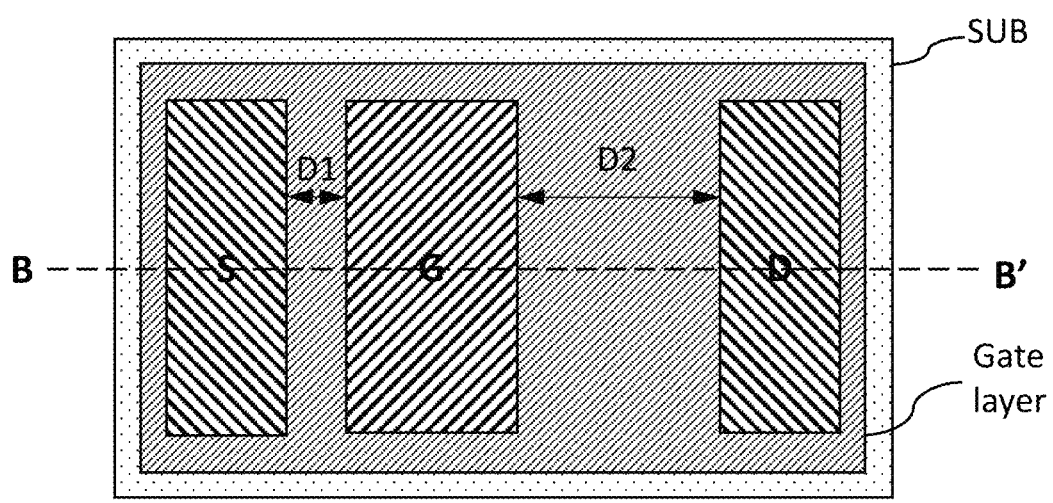

FIG. 68B shows a top view of the planar FET illustrated in FIG. 68A, depicting the distance D1 between the source to gate electrical contacts and the distance D2 between the drain to gate electrical contacts. Section B-B indicates the cross-section according to FIG. 68A. Distance D2>D1 can be utilized to control the breakdown voltage along the channel Semi1 between the G and D regions.

Figure 69A:
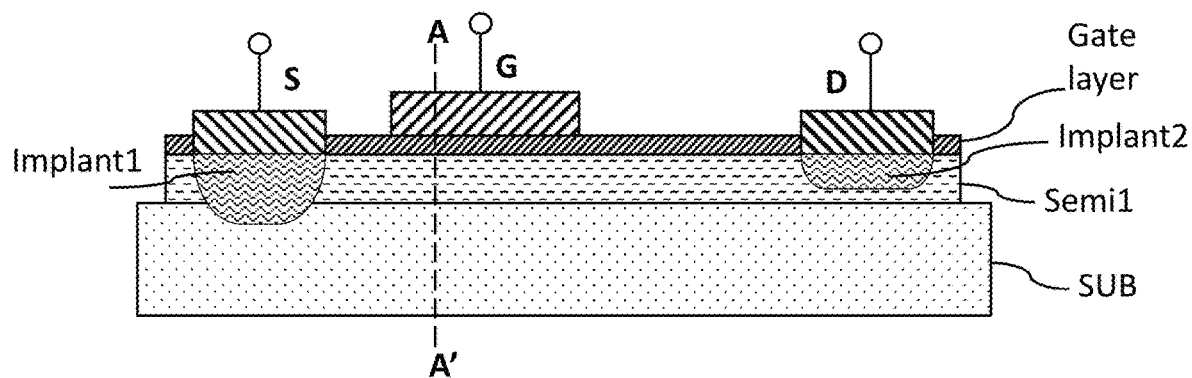

FIG. 69A shows a figurative sectional view of a planar FET of a similar configuration to that illustrated in FIGS. 68A and 68B. In FIG. 69A, the source electrical contact (S) is implanted (Implant1) through the semiconductor layer region (Semi1) into the substrate, and the drain electrical contact is implanted (Implant2) into the semiconductor layer region only. The use of selective area ion-implantation to spatially alter the electrical conductivity of specific regions, such as the S and D regions, is advantageous to provide improved lateral contact to the channel layer Semi1. It is expected that selection of ion implant species such as Ga, Al, Li and Ge may be used to impart p-type and n-type conductivity regions. Implantation of O may also be used to create locally insulating compositions. An alternative to the ion implantation method is the use of a diffusion process wherein a material can be spatially formed on the surface of Semi1 and then driven into the interior of Semi 1 via a thermally activated diffusion process. For example, a Li-based glass can be deposited, and Li driven into the Semi1 via an annealing process in an inert environment. This process of rapid thermal annealing is possible.

Figure 69B:
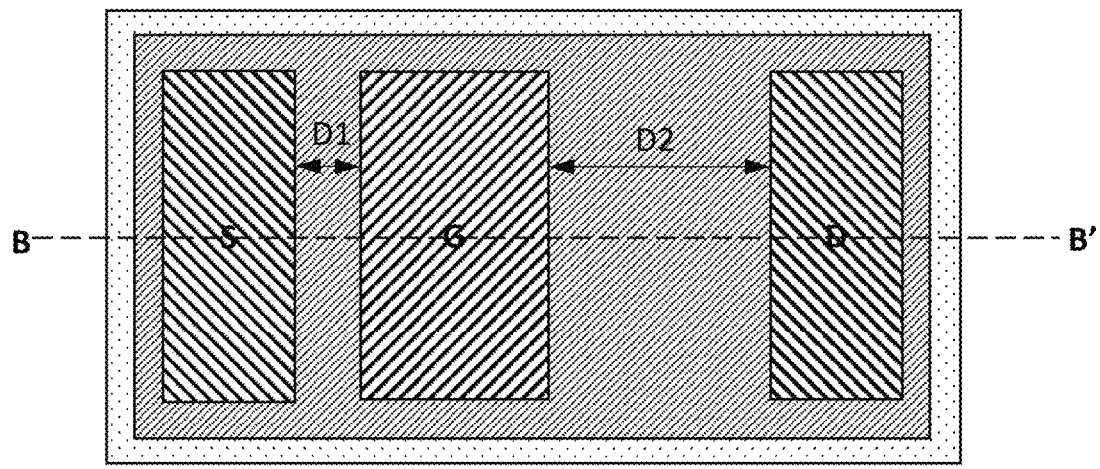

FIG. 69B shows a top view of the planar FET illustrated in FIG. 69A. Section B-B indicates the cross-section according to FIG. 69A.

Figure 70:
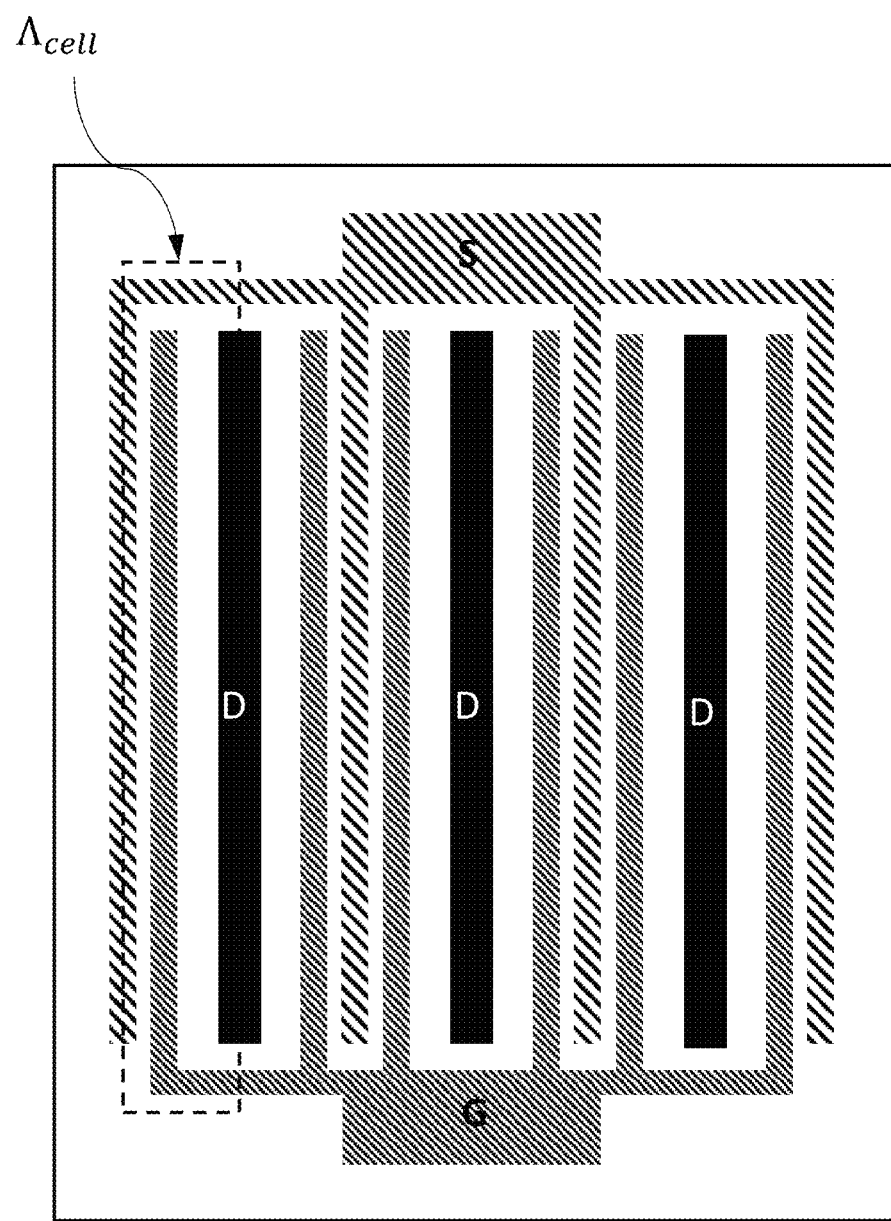

FIG. 70 shows a top view of a planar FET comprising multiple interconnected unit cells of the planar FET illustrated in FIG. 68A or 69A. The repeating unit cell $\Lambda_{cell}$ is shown, with this embodiment illustrating a 3-terminal device.

Figure 71:
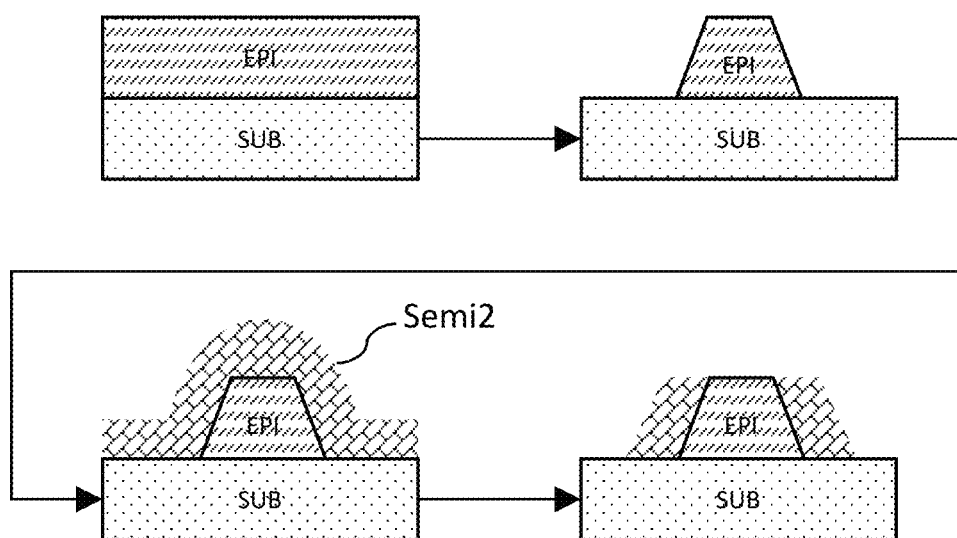

FIG. 71 shows a process flow diagram for forming a conduction device comprising a regrown conformal semiconductor layer region on an exposed etched mesa sidewall. Initially, a semiconductor device is formed having a substrate (SUB) and an epitaxially formed semiconductor layer region (EPI). This semiconductor layer region is then etched to leave a remaining mesa structured semiconductor layer region. An additional conformal semiconductor layer region (Semi2) is then grown on the mesa structure which may then be optionally planarized in a subsequent planarization step. For example, the conformal coating Semi2 can be another oxide deposited via atomic layer deposition. Semi2 can be used as a passivation region or may be used as an active region forming a FET.

It will be understood that the terms "comprise" and "include" and any of their derivatives (e.g., comprises, comprising, includes, including) as used in this specification are to be taken to be inclusive of features to which the term refers, and are not meant to exclude the presence of any additional features unless otherwise stated or implied The reference to any prior art in this specification is not, and should not be taken as, an acknowledgement of any form of suggestion that such prior art forms part of the common general knowledge.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only and is not intended to limit the invention.

What is claimed is:

1. A semiconductor device comprising:
   a substrate comprising a substantially single crystal substrate material; and
   an active region on the substrate, the active region comprising an epitaxial layer of $Mg_xGe_{1-x}O_{2-x}$, with x having a value of $0 \leq x < 1$;
   wherein the epitaxial layer of $Mg_xGe_{1-x}O_{2-x}$ has a crystal symmetry compatible with the substrate material;
   wherein the semiconductor device is an optoelectronic device comprising a light emitting diode or a photodetector, or the semiconductor device is an electronic device comprising a diode or a transistor.

2. The semiconductor device of claim 1, wherein the semiconductor device is the optoelectronic device, and the optoelectronic device emits or absorbs light having a wavelength in a range from 150 nm to 280 nm.

3. The semiconductor device of claim 1, wherein the epitaxial layer of $Mg_xGe_{1-x}O_{2-x}$ is an intrinsic layer.

4. The semiconductor device of claim 1, wherein the epitaxial layer of $Mg_xGe_{1-x}O_{2-x}$ is a doped layer comprising n-type or p-type conductivity.

5. The semiconductor device of claim 1, wherein the $Mg_xGe_{1-x}O_{2-x}$ is $Mg_2GeO_4$.

6. A semiconductor structure comprising:
   a substrate comprising a substantially single crystal substrate material; and
   an epitaxial layer of $Mg_xGe_{1-x}O_{2-x}$ on the substrate, with x having a value of $0 \leq x < 1$;
   wherein the epitaxial layer of $Mg_xGe_{1-x}O_{2-x}$ has a crystal symmetry compatible with the substrate material, wherein the epitaxial layer of $Mg_xGe_{1-x}O_{2-x}$ is an active region of the semiconductor structure; and
   wherein the semiconductor structure is an optoelectronic device or an electronic device.

7. The semiconductor structure of claim 6, further comprising a superlattice, the superlattice comprising a unit cell having a first layer;
   wherein the epitaxial layer of $Mg_xGe_{1-x}O_{2-x}$ is the first layer in the superlattice.

8. The semiconductor structure of claim 7, wherein the unit cell of the superlattice further comprises a second layer of $Mg_yGe_{1-y}O_{2-y}$, wherein y ranges from 0 to 1 and $x \neq y$.

9. The semiconductor structure of claim 7, wherein the first layer is MgO having a Fm3m space group.

10. The semiconductor structure of claim 9, wherein the unit cell of the superlattice further comprises a second layer, the second layer made of $Mg_2GeO_4$ that has a Fd3m space group.

11. The semiconductor structure of claim 7, wherein the unit cell of the superlattice further comprises a second layer of $MgGa_2O_4$ or gamma-$Ga_2O_3$.

12. The semiconductor structure of claim 6, wherein the semiconductor structure is the optoelectronic device, and the optoelectronic device emits or absorbs light having a wavelength in a range from 150 nm to 280 nm.

13. The semiconductor structure of claim 6, further comprising a second epitaxial layer forming a heterostructure with the epitaxial layer of $Mg_xGe_{1-x}O_{2-x}$.

14. The semiconductor structure of claim 13, wherein the second epitaxial layer comprises $Zn_xGe_yO_z$, $Zn_xGa_yO_z$, $Al_xGe_yO_z$, $Al_xZn_yO_z$, $Al_xMg_yO_z$, $Mg_xGa_yO_z$, $Mg_xZn_yO_z$, or $Ga_xO_z$, wherein x, y and z are mole fractions.

* * * * *